US012628554B2

(12) United States Patent
Sugiura et al.

(10) Patent No.: US 12,628,554 B2
(45) Date of Patent: May 12, 2026

(54) PHOTOELECTRIC CONVERSION ELEMENT, IMAGING ELEMENT, OPTICAL SENSOR, AND COMPOUND

(71) Applicant: FUJIFILM Corporation, Tokyo (JP)

(72) Inventors: Hiroki Sugiura, Kanagawa (JP); Yasunori Yonekuta, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 557 days.

(21) Appl. No.: 18/069,969

(22) Filed: Dec. 21, 2022

(65) Prior Publication Data

US 2023/0143982 A1 May 11, 2023

Related U.S. Application Data

(63) Continuation of application No. PCT/JP2021/023409, filed on Jun. 21, 2021.

(30) Foreign Application Priority Data

Jun. 22, 2020 (JP) ................................ 2020-107133

(51) Int. Cl.
*H10K 85/60* (2023.01)
*H10K 10/46* (2023.01)
(Continued)

(52) U.S. Cl.
CPC ......... *H10K 85/655* (2023.02); *H10K 10/488* (2023.02); *H10K 30/30* (2023.02);
(Continued)

(58) Field of Classification Search
CPC .... H10K 85/655; H10K 10/488; H10K 39/32; H10K 71/60; H10K 85/113; H10K 30/30;
(Continued)

(56) References Cited

U.S. PATENT DOCUMENTS 11,183,637 B2 11/2021 Mitchell et al.
2012/0302763 A1* 11/2012 Zhou .................... H10K 85/113
549/43

(Continued)

FOREIGN PATENT DOCUMENTS

JP H02226159 9/1990
JP 2000143607 5/2000

(Continued)

OTHER PUBLICATIONS

"International Search Report (Form PCT/ISA/210) of PCT/JP2021/023409", mailed on Aug. 24, 2021, with English translation thereof, pp. 1-7.

(Continued)

*Primary Examiner* — Angelo Trivisonno
(74) *Attorney, Agent, or Firm* — JCIPRNET

(57) ABSTRACT

A first object of the present invention is to provide a photoelectric conversion element having a high external quantum efficiency and small variation in response. A second object of the present invention is to provide an imaging element, an optical sensor, and a compound related to the photoelectric conversion element.

The photoelectric conversion element includes, in the following order, a conductive film, a photoelectric conversion film, and a transparent conductive film, in which the photoelectric conversion film contains a compound represented by Formula (1).

(Continued)

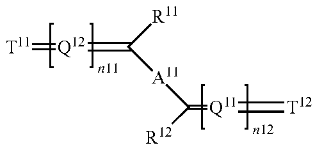

(1)

18 Claims, 1 Drawing Sheet

(51) Int. Cl.

| | |
|---|---|
| ***H10K 30/30*** | (2023.01) |
| ***H10K 39/32*** | (2023.01) |
| ***H10K 71/60*** | (2023.01) |
| ***H10K 85/10*** | (2023.01) |
| *H10K 102/10* | (2023.01) |

(52) U.S. Cl.
CPC ............. *H10K 39/32* (2023.02); *H10K 71/60* (2023.02); *H10K 85/113* (2023.02); *H10K 2102/101* (2023.02)

(58) Field of Classification Search
CPC .......... H10K 2102/101; H10K 85/6576; Y02E 10/549; C07D 333/24; C07D 333/76; C07D 409/14; C07D 471/04; C07D 487/04; C07D 493/04; C07D 495/04; C07D 495/14; C07D 513/04; C07D 519/00
See application file for complete search history.

(56) References Cited

U.S. PATENT DOCUMENTS

| | | | | |
|---|---|---|---|---|
| 2017/0062726 | A1 | 3/2017 | Choi et al. | |
| 2017/0250345 | A1* | 8/2017 | Hirai .................... | C08G 61/126 |
| 2018/0315933 | A1 | 11/2018 | Han et al. | |
| 2021/0175289 | A1 | 6/2021 | Miyata | |

FOREIGN PATENT DOCUMENTS

| | | |
|---|---|---|
| JP | 2010278155 | 12/2010 |
| JP | 2013516510 | 5/2013 |
| JP | 2019533044 | 11/2019 |
| WO | 2020050265 | 3/2020 |

OTHER PUBLICATIONS

"Written Opinion of the International Searching Authority (Form PCT/ISA/237) of PCT/JP2021/023409", mailed on Aug. 24, 2021, with English translation thereof, pp. 1-8.

Madhurima Poddar et al., "NIR-Absorbing Donor-Acceptor Based 1,1,4,4-Tetracyanobuta-1,3-Diene (TCBD)- and Cyclohexa-2,5-Diene-1,4-Ylidene-Expanded TCBD-Substituted Ferrocenyl Phenothiazines," Chemistry—An Asian Journal, Sep. 2017, pp. 1-9.

Yongsheng Mi et al., "Synthesis and Third-Order Nonlinear Optical Properties of Triphenylene Derivatives Modified by Click Chemistry," ChemPhysChem, Dec. 2013, pp. 1-8.

Xueshan Li et al., "Non-Fullerene Organic Solar Cells Based on Benzo [1,2-b:4,5-b']difuran-Conjugated Polymer with 14% Efficiency", Advanced Functional Materials, Nov. 15, 2019, pp. 1-7, vol. 30, Article No. 1906809.

"Office Action of Japan Counterpart Application", issued on Jul. 2, 2024, with English translation thereof, p. 1-p. 6.

"Office Action of Japan Counterpart Application", issued on Jan. 23, 2024, with English translation thereof, p. 1-p. 8.

* cited by examiner

PHOTOELECTRIC CONVERSION ELEMENT, IMAGING ELEMENT, OPTICAL SENSOR, AND COMPOUND

CROSS-REFERENCE TO RELATED APPLICATIONS

This application is a Continuation of PCT International Application No. PCT/JP2021/023409 filed on Jun. 21, 2021, which claims priority under 35 U.S.C. § 119(a) to Japanese Patent Application No. 2020-107133 filed on Jun. 22, 2020. The above applications are hereby expressly incorporated by reference, in its entirety, into the present application.

BACKGROUND OF THE INVENTION

1. Field of the Invention

The present invention relates to a photoelectric conversion element, an imaging element, an optical sensor, and a compound.

2. Description of the Related Art

As a known solid-state imaging element, a planar solid-state imaging element in which photodiodes (PDs) are arranged two-dimensionally, and signal charges generated in each PD are read out through a circuit is widely used.

In order to achieve a color solid-state imaging element, a structure in which a color filter that transmits light at a specific wavelength is disposed on a light incident surface side of the planar solid-state imaging element is commonly adopted. Currently, a single plate-type solid-state imaging element in which color filters that transmit blue (B) light, green (G) light, and red (R) light are regularly arranged on each PD arranged two-dimensionally is well known. However, in this single plate-type solid-state imaging element, the light that has not passed through the color filters is not used, which causes poor light utilization efficiency.

In order to solve this disadvantage, a photoelectric conversion element having a structure in which an organic photoelectric conversion film is disposed on a substrate for reading signals has been developed in recent years.

For example, it is disclosed in JP2019-533044A that a photoelectric conversion element has a photoelectric conversion film containing a compound as described below, for example.

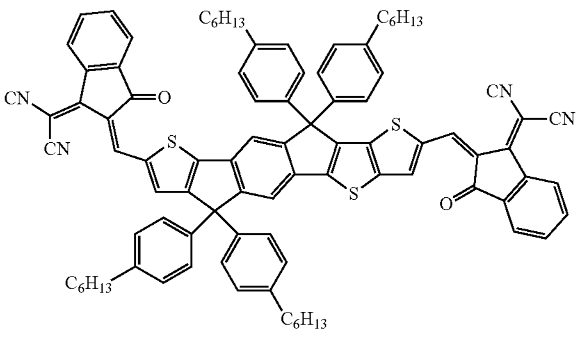

SUMMARY OF THE INVENTION

In recent years, along with the demand for improving the performance of imaging elements, optical sensors, and the like, further improvements are required for various characteristics required for photoelectric conversion elements used therein.

As a result of examining a photoelectric conversion element described in JP2019-533044A, the present inventors have clarified that there is another room for improving an external quantum efficiency and variation in response.

Therefore, an object of the present invention is to provide a photoelectric conversion element having a high external quantum efficiency and small variation in response.

Another object of the present invention is to provide an imaging element, an optical sensor, and a compound related to the photoelectric conversion element.

The present inventors have conducted extensive studies on the above-described problems, and as a result, the inventors have found that it is possible to solve the above-described problems by configurations described below and have completed the present invention.

[1] A photoelectric conversion element comprising, in the following order, a conductive film, a photoelectric conversion film, and a transparent conductive film, the photoelectric conversion film containing a compound represented by Formula (1) described below.

[2] The photoelectric conversion element according to [1], in which $A^{11}$ is a group represented by any of Formula (A1) to Formula (A2), $$*\text{—}Ar^{11}\text{—}* \quad (A1)$$

in Formula (A1), $Ar^{11}$ represents a divalent monocyclic aromatic ring group, which may have a substituent, a divalent conjugate fused ring group, which may have a substituent, or a divalent conjugate group represented by any of Formulae (a21) to (a24) described below, * represents a bonding position, $$*\text{—}(Ar^{12}\text{-}L^{11})_{m11}\text{-}Ar^{13}\text{—}* \quad (A2)$$

in Formula (A2), $Ar^{12}$ and $Ar^{13}$ each independently represent a divalent monocyclic aromatic ring group, which may have a substituent, a divalent conjugate fused ring group, which may have a substituent, or a divalent conjugate group represented by any of Formulae (a21) to (a24) described below, $L^{11}$ represents a single bond or a divalent conjugate linking group, m11 represents an integer of 1 or more, and * represents a bonding position.

[3] The photoelectric conversion element according to [1] or [2], in which Formula (Q) represents any quinoid-type conjugate linking group selected from the group consisting of Formulae (Q1) to (Q11) described below.

[4] The photoelectric conversion element according to [3], in which $Q^{11}$ and $Q^{12}$ each independently represent a quinoid-type conjugate linking group represented by any of Formulae (Q1) to (Q5).

[5] The photoelectric conversion element according to any one of [1] to [4], in which $R^{11}$ and $R^{12}$ each independently represent a hydrogen atom or an alkyl group, an aryl group, or a heteroaryl group, which may have a substituent.

[6] The photoelectric conversion element according to any one of [1] to [5], in which $T^{11}$ and $T^{12}$ each independently represent Formula (T1), and $X^{11}$ and $X^{12}$ each independently represent —CN.

[7] The photoelectric conversion element according to any one of [1] to [5], in which $T^{11}$ and $T^{12}$ each independently represent a group represented by any of Formula (T21), Formula (T22), and Formula (T25).

[8] The photoelectric conversion element according to any one of [1] to [7], in which the photoelectric conversion film satisfies any of A to C, A: the photoelectric conversion film has a bulk heterostructure formed in a state in which two or more compounds represented by Formula (1) are mixed with each other;

B: the photoelectric conversion film has a bulk heterostructure formed in a state in which the compound represented by Formula (1) and a p-type organic semiconductor are mixed with each other; and C: the photoelectric conversion film has a bulk heterostructure formed in a state in which the compound represented by Formula (1) and a n-type semiconductor are mixed with each other.

[9] The photoelectric conversion element according to any one of [1] to [8], further comprising one or more interlayers between the conductive film and the transparent conductive film, in addition to the photoelectric conversion film.

[10] An imaging element comprising the photoelectric conversion element according to any one of [1] to [9].

[11] An optical sensor comprising the photoelectric conversion element according to any one of [1] to [9].

[12] A compound represented by Formula (1) described below.

According to the present invention, it is possible to provide the photoelectric conversion element having a high external quantum efficiency and small variation in response.

In addition, according to the present invention, it is possible to provide the imaging element, the optical sensor, and the compound related to the photoelectric conversion element.

DESCRIPTION OF THE PREFERRED EMBODIMENTS

Figure 1:
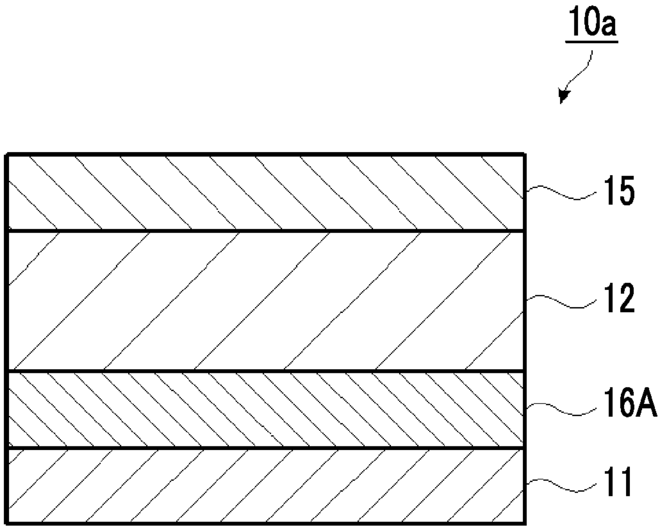
FIG. 1 is a schematic cross-sectional view illustrating a configuration example of a photoelectric conversion element.

Hereinafter, the present invention will be described in detail.

Configuration requirements will be described below based on the representative embodiments of the present invention, but the present invention is not limited to such embodiments.

In the present specification, a substituent for which whether it is substituted or unsubstituted is not specified may be further substituted with a substituent (for example, a substituent W described below) within the scope not impairing an intended effect. For example, the term "alkyl group" means an alkyl group, which may be substituted with a substituent (for example, a substituent W described below).

In addition, in the present specification, the numerical range represented by "to" means a range including numerical values denoted before and after "to" as a lower limit value and an upper limit value.

The bonding direction of a divalent group described in the present specification is not particularly limited, and for example, in a case of —CO—O—, both —CO—O— and —O—CO— may be adopted.

In the present specification, the term (hetero)aryl means aryl and heteroaryl.

[Photoelectric Conversion Element]

As a feature point of the present invention, compared to the related art, there is a point that a compound represented by Formula (1) described below (hereinafter, also referred to as a "specific compound") is used in a photoelectric conversion film.

By adopting the above-described configuration, a photoelectric conversion element according to an embodiment of the present invention has a high external quantum efficiency and small variation in response.

Although the mechanism of action by which the photoelectric conversion element according to the embodiment of the present invention exerts the above-described effect is not clear, it is presumed that the specific compound has a highest occupied molecular orbital (HOMO) and a lowest unoccupied molecular orbital (LUMO), which are delocalized, and has excellent orbital overlap between molecules in a film (particularly, a film having a bulk heterostructure) as compared with a compound described in JP2019-533044A due to structures of $Q^{11}$ and $Q^{12}$. It is presumed that the specific compound exhibits an effect of excellent external quantum efficiency due to delocalization of HOMO and LUMO, and an effect of small variation in response due to excellent orbital overlap between molecules in the film.

In addition, a photosensitive wavelength of the specific compound can be appropriately selected within a wide band from the visible light range to the near infrared range, depending on a structure of $A^{11}$. That is, by using the specific compound, a photoelectric conversion element having a high external quantum efficiency and small variation in response with respect to light that has a wavelength in the visible light range, and a photoelectric conversion element having a high external quantum efficiency and small variation in response with respect to light in the near infrared range can be obtained.

Hereinafter, the fact that an external quantum efficiency is higher and/or variation in response is smaller is also simply referred to as the "effect of the present invention is more excellent".

Hereinafter, suitable embodiments of the photoelectric conversion element of the present invention will be described with reference to the drawings.

Figure 2:
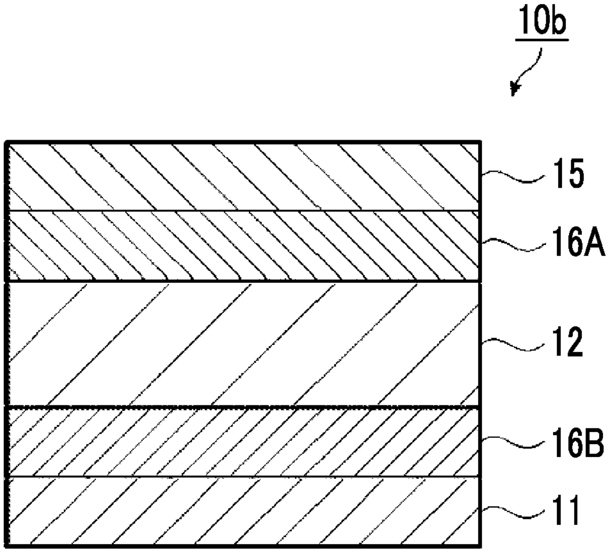
FIG. 2 is a schematic cross-sectional view illustrating a configuration example of the photoelectric conversion element.

FIG. 1 is a schematic cross-sectional view of one embodiment of a photoelectric conversion element of the present invention. A photoelectric conversion element 10*a* illustrated in FIG. 1 has a configuration in which a conductive film (hereinafter, also referred to as a lower electrode) 11 functioning as a lower electrode, an electron blocking film 16A, a photoelectric conversion film 12 containing the specific compound described later, and a transparent conductive film (hereinafter, also referred to as an upper electrode) 15 functioning as an upper electrode are laminated in this order. FIG. 2 is a schematic cross-sectional view of another embodiment of the photoelectric conversion element of the present invention. A photoelectric conversion element 10*b* illustrated in FIG. 2 has a configuration in which a positive hole blocking film 16B, the photoelectric conversion film 12, the electron blocking film 16A, and the upper electrode 15 are laminated on the lower electrode 11 in this order. The lamination order of the electron blocking film 16A, the photoelectric conversion film 12, and the positive hole blocking film 16B in FIGS. 1 and 2 may be appropriately changed according to the application and the characteristics.

In the photoelectric conversion element 10*a* (or 10*b*), it is preferable that light is incident on the photoelectric conversion film 12 through the upper electrode 15.

In a case where the photoelectric conversion element 10*a* (or 10*b*) is used, a voltage can be applied. In this case, it is preferable that the lower electrode 11 and the upper electrode 15 form a pair of electrodes, and a voltage of $1\times10^{-5}$ to $1\times10^{7}$ V/cm is applied between the pair of electrodes. From the viewpoint of the performance and power consumption, the applied voltage is more preferably $1\times10^{-4}$ to $1\times10^{7}$ V/cm, and still more preferably $1\times10^{-3}$ to $5\times10^{6}$ V/cm.

Regarding a voltage application method, in FIGS. 1 and 2, it is preferable that the voltage is applied such that the electron blocking film 16A side is a cathode and the photoelectric conversion film 12 side is an anode. In a case where the photoelectric conversion element 10*a* (or 10*b*) is used as an optical sensor, or also in a case where the photoelectric conversion element 10*a* (or 10*b*) is incorporated in an imaging element, the voltage can be applied by the same method.

As described in detail below, the photoelectric conversion element 10*a* (or 10*b*) can be suitably applied to applications of the optical sensor and the imaging element.

Hereinafter, the form of each layer constituting the photoelectric conversion element according to the embodiment of the present invention will be described in detail.

[Photoelectric Conversion Film]

<Compound (Specific Compound) Represented by Formula (1)>

Hereinafter, the specific compound will be described.

In Formula (1) of the present specification described below, Formula (1) includes both cis- and trans-isomers for geometric isomers, which can be distinguished based on a C═C double bond composed of a carbon atom in $T^{11}$ at a bonding position where $Q^{11}$ is bonded and a carbon atom in $Q^{11}$ at a bonding position where $T^{11}$ is bonded. That is, both the cis-isomer and the trans-isomer, which are distinguished based on the C═C double bond, are included in the specific compound. In Formula (1) described below, Formula (1) includes both cis- and trans-isomers for geometric isomers, which can be distinguished based on a C═C double bond composed of a carbon atom to which $R^{11}$ and $A^{11}$ are bonded and a carbon atom in $Q^{11}$ at a bonding position where the carbon atom is bonded. That is, both the cis-isomer and the trans-isomer, which are distinguished based on the C═C double bond, are included in the specific compound. In Formula (1) described below, Formula (1) includes both cis- and trans-isomers for geometric isomers, which can be distinguished based on a C═C double bond composed of a carbon atom in $T^{12}$ at a bonding position where $Q^{12}$ is bonded and a carbon atom in $Q^{12}$ at a bonding position where $T^{12}$ is bonded. That is, both the cis-isomer and the trans-isomer, which are distinguished based on the C═C double bond, are included in the specific compound. In Formula (1) described below, Formula (1) includes both cis- and trans-isomers for geometric isomers, which can be distinguished based on a C═C double bond composed of a carbon atom to which $R^{12}$ and $A^{11}$ are bonded and a carbon atom in $Q^{12}$ at a bonding position where the carbon atom is bonded. That is, both the cis-isomer and the trans-isomer, which are distinguished based on the C═C double bond, are included in the specific compound.

(1)

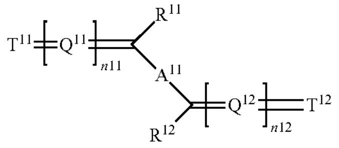

In Formula (1), $A^{11}$ represents a divalent conjugate group having a cyclic structure.

The divalent conjugate group represented by $A^{11}$ is a divalent linking group having a conjugated system formed between one bonding position and the other bonding position.

A cyclic structure, which the divalent conjugate group represented by $A^{11}$ has, may be a monocyclic structure or a polycyclic structure obtained by two or more monocyclic rings forming a fused ring.

The above-described cyclic structure preferably contains 71 electrons that can contribute to the conjugated system of the divalent conjugate group represented by $A^{11}$, and is more preferably a divalent monocyclic aromatic ring group or a divalent conjugate fused ring group. The divalent monocyclic aromatic ring group and a divalent conjugate fused ring group each may further have a substituent. The kind of a substituent is not particularly limited, and examples thereof include a group exemplified for a substituent W described later. Among these, an alkyl group, an aryl group, or a heteroaryl group, which may have a halogen atom or a substituent, is preferable. The divalent conjugate group represented by $A^{11}$ may contain a plurality of cyclic structures.

The divalent conjugate group represented by $A^{11}$ preferably contains at least a conjugate fused ring group as a cyclic structure from the viewpoint that the effect of the present invention is more excellent.

A monocyclic aromatic ring in the divalent monocyclic aromatic ring group may be either a monocyclic aromatic hydrocarbon ring or a monocyclic aromatic heterocyclic ring.

The monocyclic aromatic hydrocarbon ring is preferably a 5- or 6-membered ring, and more preferably a benzene ring.

Examples of the heteroatoms contained in the monocyclic aromatic heterocyclic ring (atoms other than carbon atoms and hydrogen atoms) include a sulfur atom, an oxygen atom, a nitrogen atom, and a selenium atom, and a sulfur atom, an oxygen atom, or a nitrogen atom is preferable.

The number of heteroatoms contained in the monocyclic aromatic heterocyclic ring is not particularly limited, but is preferably 1 to 4 and more preferably 1 or 2.

The monocyclic aromatic heterocyclic ring is preferably a 5- or 6-membered ring, and for example, furan, thiophene, selenophene, pyrrole, thiazole, isothiazole, oxazole, isoxazole, thiadiazole, oxadiazole, imidazole, pyrazole, triazole, pyridine, pyrimidine, pyridazine, pyrazine, triazine, or tetrazine is preferable, and thiophene or thiazole is more preferable.

The divalent conjugate fused ring group is a group formed by removing two hydrogen atoms from different ring-constituting atoms in a fused ring formed by combining two or more monocyclic rings, and is intended to be a group having a conjugated system formed between one bonding position and the other bonding position. A conjugate fused ring constituting the divalent conjugate fused ring group may or may not exhibit aromaticity by itself.

The conjugate fused ring constituting the divalent conjugate fused ring group may contain a heteroatom. In a case where the conjugate fused ring contains a heteroatom, examples of the heteroatom include a nitrogen atom, an oxygen atom, a sulfur atom, a selenium atom, a silicon atom, a germanium atom, and other atoms. In addition, in the above-described conjugate fused ring, the atom constituting the ring may be $>C{=}P^{S1}$ ($P^{S1}$ represents an oxygen atom, a sulfur atom, $=C(CN)_2$, $=C[S(=O)_2R^{3S}]_2$, $=C[S(=O)R^{3S}]_2$, $=C[C(=O)R^{3S}]_2$, $=C[CN][S(=O)_2R^{3S}]$, $=C[CN][S(=O)R^{3S}]$, $=C[CN][C(=O)R^{3S}]$, $=C[C(=O)R^{3S}][S(=O)_2R^{3S}]$, or $=C[C(=O)R^{3S}][S(=O)R^{3S}]$. $R^{3S}$ represents a monovalent substituent. The kind of the monovalent substituent represented by $R^{3S}$ is not particularly limited, and examples thereof include groups exemplified by the substituent W described later).

Examples of the conjugate fused ring constituting the divalent conjugate fused ring group include a fused ring formed by two or more monocyclic aromatic rings being combined, a fused ring formed by one or more monocyclic aromatic rings and one or more rings other than a monocyclic aromatic ring (specifically, an anti-aromatic ring or a non-aromatic ring) being combined, a fused ring formed by two or more rings other than a monocyclic aromatic ring (specifically, an anti-aromatic ring or a non-aromatic ring) being combined, and other fused rings. The aromatic ring is a ring in which the number of electrons included in the n-electron system is 4n+2 (n is an integer of 0 or more), and the anti-aromatic ring is a ring in which the number of electrons included in the 7-electron system is 4n (n is an integer of 1 or more), and the non-aromatic ring is intended to be a ring that does not satisfy the aromatic ring and the anti-aromatic ring.

Examples of the kind of the monocyclic aromatic ring constituting the divalent conjugate fused ring group include the monocyclic aromatic hydrocarbon ring and the monocyclic aromatic heterocyclic ring described above, and for example, benzene, furan, thiophene, selenophene, pyrrole, thiazole, isothiazole, oxazole, isoxazole, thiadiazole, oxadiazole, imidazole, pyrazole, triazole, pyridine, pyrimidine, pyridazine, pyrazine, triazine, or tetrazine is preferable, and benzene, thiophene or thiazole is more preferable.

In addition, examples of the kind of the above-described anti-aromatic ring constituting the divalent conjugate fused ring group include cyclobutadiene, pentalene, cyclooctatetraene, and other anti-aromatic rings.

In addition, examples of the kind of the above-described non-aromatic ring constituting the divalent conjugate fused ring group include cyclopentadiene, 1,3-cyclohexadiene, 1,3-cycloheptadiene, and 1,3-cyclooctadien, 1-silacyclopenta-2,4-diene, 1-germacyclopenta-2,4-diene, and other non-aromatic rings.

For example, a 2,7-fluorenylene group has a structure in which two benzene rings (aromatic rings) and one cyclopentadiene ring (non-aromatic ring) are fused, as described below. The 2,7-fluorenylene group corresponds to a divalent conjugate fused ring group because two benzene rings are bonded between one bonding position and the other bonding position, and as a result, a conjugated system is formed between one bonding position and the other bonding position.

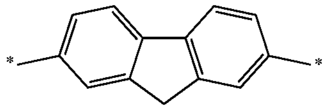

In addition, as described below, a dibenzo[a,e]pentalenylene group has a structure in which two benzene rings (aromatic rings) and one pentalene ring (anti-aromatic ring) are fused. The dibenzo[a,e]pentalenylene group corresponds to a divalent conjugate fused ring group because of a conjugated system formed between one bonding position and the other bonding position.

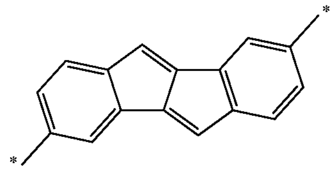

Hereinafter, specific examples of a divalent monocyclic aromatic ring group and a divalent conjugate fused ring group will be illustrated.

An example of the divalent monocyclic aromatic ring group includes a divalent group derived from a monocyclic ring represented by any of Formulae (a1) and (a2) described below.

Examples of the divalent conjugate fused ring group include a divalent conjugate fused ring group derived from a fused ring formed by combining two or more monocyclic rings selected from the group consisting of Formulae (a1) to (a3) described below, a divalent conjugate fused ring group derived from a fused ring formed by combining a monocyclic ring selected from the group consisting of Formulae (a1) to (a3) described below and a fused ring represented by Formula (a8) described below, a group selected from the group consisting of Formulae (a4) to (a7) and Formulae (a9) to (a20) described below, and a group selected from the group consisting of Formulae (b1) to (b3) described below.

In a fused ring formed by combining two or more monocyclic rings selected from the group consisting of Formulae (a1) to (a3) described below, and a fused ring formed by combining a monocyclic ring selected from the group consisting of Formulae (a1) to (a3) and a fused ring represented by Formula (a8) described below, adjacent rings are bonded so as to share one side of each ring. In a case where a ring represented by Formula (a1) is a benzene ring and a ring represented by Formula (a2) is a thiophene ring, examples of a fused ring formed by combining one benzene ring and one thiophene ring are as follows.

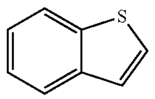

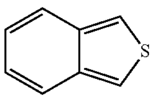

(a1)

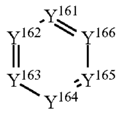

(a2)

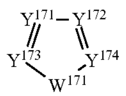

(a3)

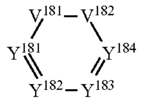

-continued
(a4)
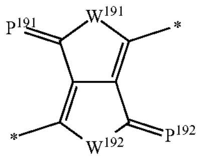
(a5)
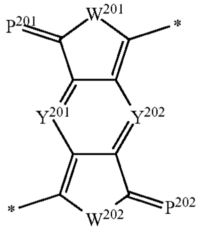
(a6)
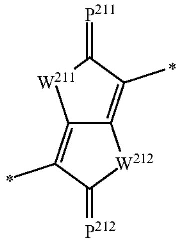
(a7)
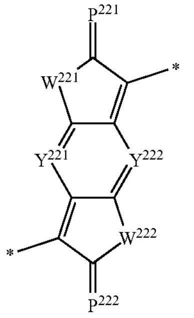
(a8)
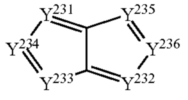
(a9)
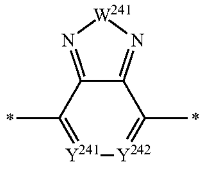
(a10)
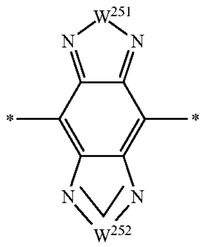
-continued
(a11)
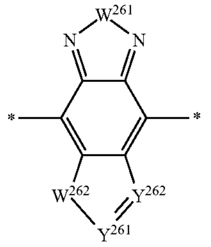
(a12)
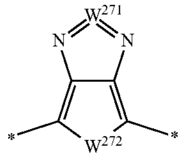
(a13)
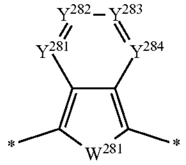
(a14)
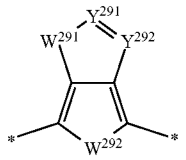
(a15)
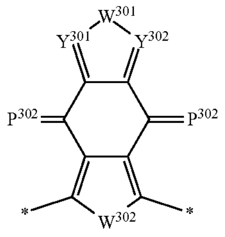
(a16)
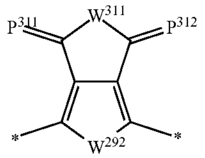
(a17)
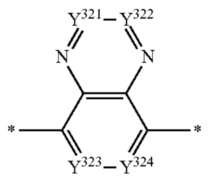
(a18)
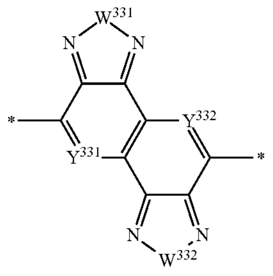

-continued (a19)

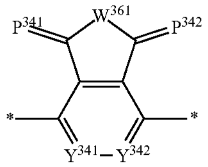

(a20)

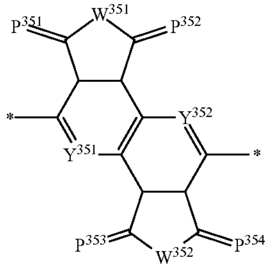

(b1)

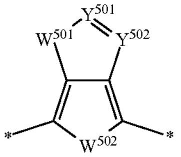

(b2)

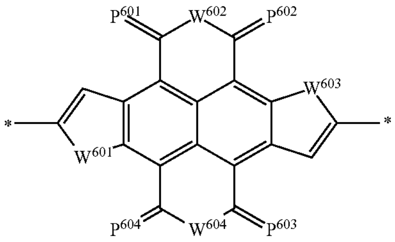

(b3)

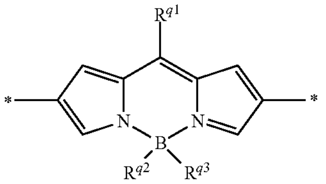

In Formulae (a1) to (a3), $Y^{161}$ to $Y^{166}$, $Y^{171}$ to $Y^{174}$, and $Y^{181}$ to $Y^{184}$ each independently represent $=CR^O-$ or a nitrogen atom.

$R^O$ represents a hydrogen atom or a monovalent substituent. The kind of the monovalent substituent represented by $R^O$ is not particularly limited, and examples thereof include a group exemplified for a substituent W described later. Among these, an alkyl group, an aryl group, or a heteroaryl group, which may have a halogen atom or a substituent, is preferable.

A divalent group derived from the monocyclic ring represented by Formula (a1) is intended to be a group in which the monocyclic ring represented by Formula (a1) is an aromatic ring, and two or more of $Y^{161}$ to $Y^{166}$ each represent $=CR^O-$, and two of $R^O$'s each represent a bonding position. In addition, a divalent group derived from the monocyclic ring represented by Formula (a2) is intended to be a group in which the monocyclic ring represented by Formula (a2) is an aromatic ring, and two or more of $Y^{171}$ to $Y^{174}$ in Formula (a2) each represent $=CR^O-$, and two of $R^O$'s each represent a bonding position.

Furthermore, as the divalent conjugate fused ring group derived from a fused ring formed by combining two or more monocyclic rings selected from the group consisting of Formulae (a1) to (a3) described below and the divalent conjugate fused ring group derived from a fused ring formed by combining a monocyclic ring selected from the group consisting of Formulae (a1) to (a3) and a fused ring represented by Formula (a8), it is intended to be a group in which at least two or more $=CR^O-$ are present on a side that is not shared by the adjacent monocyclic rings in the fused ring, and two of $R^O$'s each represent a bonding position.

In Formula (a5), Formulae (a7) to (a9), Formula (a11), Formulae (a13) to (a15), Formulae (a17) to (a20), and Formula (b1), $Y^{201}$, $Y^{202}$, $Y^{221}$, $Y^{222}$, $Y^{231}$, $Y^{232}$ to $Y^{236}$, $Y^{241}$, $Y^{242}$, $Y^{261}$, $Y^{262}$, $Y^{281}$ to $Y^{284}$, $Y^{291}$, $Y^{292}$, $Y^{301}$, $Y^{302}$, $Y^{321}$ to $Y^{324}$, $Y^{331}$, $Y^{332}$, $Y^{341}$, $Y^{342}$, $Y^{351}$, $Y^{352}$, $Y^{501}$ and $Y^{502}$ each independently represent $=CR^P-$, or a nitrogen atom.

$R^P$ represents a hydrogen atom or a monovalent substituent. The kind of the monovalent substituent represented by $R^P$ is not particularly limited, and examples thereof include a group exemplified for a substituent W described later. Among these, an alkyl group, an aryl group, or a heteroaryl group, which may have a halogen atom or a substituent, is preferable.

In Formula (a2), $W^{171}$ represents a sulfur atom, an oxygen atom, a selenium atom, $>NR^Q$, $>C(R^Q)_2$, $>Si(R^Q)_2$, and $>Ge(R^Q)_2$.

$R^Q$ represents a hydrogen atom or a monovalent substituent. The kind of the monovalent substituent represented by $R^Q$ is not particularly limited, and examples thereof include a group exemplified for a substituent W described later. Among these, an alkyl group, an aryl group, or a heteroaryl group, which may have a halogen atom or a substituent, is preferable.

In Formulae (a4) to (a7), Formulae (a9) to (a16), Formulae (a18) to (a20), Formula (b1), and Formula (b2), $W^{191}$, $W^{192}$, $W^{201}$, $W^{202}$, $W^{211}$, $W^{212}$, $W^{221}$, $W^{222}$, $W^{241}$, $W^{251}$, $W^{261}$, $W^{262}$, $W^{272}$, $W^{281}$, $W^{291}$, $W^{292}$, $W^{301}$, $W^{302}$, $W^{311}$, $W^{312}$, $W^{331}$, $W^{332}$, $W^{341}$, $W^{351}$, $W^{352}$, $W^{501}$, $W^{502}$ and $W^{601}$ to $W^{604}$ each independently represent a sulfur atom, an oxygen atom, a selenium atom, or $>NR^S$.

$R^S$ represents a hydrogen atom or a monovalent substituent. The kind of the monovalent substituent represented by $R^S$ is not particularly limited, and examples thereof include a group exemplified for a substituent W described later. Among these, an alkyl group, an aryl group, or a heteroaryl group, which may have a halogen atom or a substituent, is preferable.

$W^{252}$ in Formula (a10) and $W^{271}$ in Formula (a12) each independently represent a sulfur atom or a selenium atom.

In Formula (a3), $V^{181}$ and $V^{182}$ each independently represent $>C(R^{2S})_2$, $>NR^{2S}$, $>C{=}O$, $>C{=}S$, an oxygen atom, a sulfur atom, or a selenium atom.

$R^{2S}$ represents a hydrogen atom or a monovalent substituent. The kind of the monovalent substituent represented by $R^{2S}$ is not particularly limited, and examples thereof include a group exemplified for a substituent W described later. Among these, an alkyl group, an aryl group, or a heteroaryl group, which may have a halogen atom or a substituent, is preferable.

In Formulae (a4) to (a7), Formula (a15), Formula (a16), Formula (a19), Formula (a20), and Formula (b2), $P^{191}$, $P^{192}$, $P^{201}$, $P^{202}$, $P^{211}$, $P^{212}$, $P^{221}$, $P^{222}$, $P^{301}$, $P^{302}$, $P^{311}$, $P^{312}$, $P^{341}$, $P^{342}$, $P^{351}$ to $P^{354}$, and $P^{601}$ to $P^{604}$ each independently represent an oxygen atom, a sulfur atom, $=C(CN)_2$, $=C[S(=O)_2R^{3S}]_2$, $=C[S(=O)R^{3S}]_2$, $=C[C(=O)R^{3S}]_2$, $=C[CN][S(=O)_2R^{3S}]$, $=C[CN][S(=O)R^{3S}]$, $=C[CN][C(=O)R^{3S}]$, $=C[C(=O)R^{3S}][S(=O)_2R^{3S}]$, or $=C[C(=O)R^{3S}][S(=O)R^{3S}]$.

$R^{3S}$ represents a monovalent substituent.

The kind of the monovalent substituent represented by $R^{3S}$ is not particularly limited, and examples thereof include groups exemplified by the substituent W described later.

Examples of $P^{191}$, $P^{192}$, $P^{201}$, $P^{202}$, $P^{211}$, $P^{212}$, $P^{221}$, $P^{222}$, $P^{301}$, $P^{302}$, $P^{311}$, $P^{312}$, $P^{341}$, $P^{342}$, $P^{351}$ to $P^{354}$, and $P^{601}$ to $P^{604}$ preferably include an oxygen atom, a sulfur atom, or $=C(CN)_2$, more preferably include an oxygen atom or $=C(CN)_2$, and particularly preferably include an oxygen atom.

In Formula (b3), $R^{q1}$ to $R^{q3}$ each independently represent a hydrogen atom or a monovalent substituent.

The kind of the monovalent substituent represented by $R^{q1}$ to $R^{q3}$ is not particularly limited, and examples thereof include groups exemplified by the substituent W described later. $R^{q2}$ and $R^{q3}$ may be bonded to each other to form a bidentate coordination. Among these, $R^{q1}$ is preferably an alkyl group, an aryl group, or a heteroaryl group, which may have a halogen atom or a substituent. $R^{q2}$ and $R^{q3}$ are each independently preferably an acyloxy group or an alkoxycarbonylamino group, which may have a halogen atom or a substituent.

In Formulae (a4) to (a7), Formulae (a9) to (a20), and Formulae (b1) to (b3), * represents a bonding position.

Examples of a conjugate fused ring group derived from a fused ring formed by combining two or more monocyclic rings selected from the group consisting of Formulae (a1) to (a3) and a divalent conjugate fused ring group derived from a fused ring formed by combining a monocyclic ring selected from the group consisting of Formulae (a1) to (a3) and a fused ring represented by Formula (a8) preferably include a group represented by any of Formulae (AX) to (AZ).

(AX)

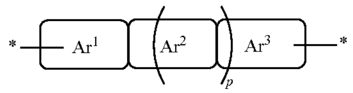

In Formula (AX), $Ar^1$, $Ar^2$, and $Ar^3$ each independently represent a conjugated ring. p represents an integer of 0 to 8. * represents a bonding site.

In Formula (AX), a conjugated ring is intended to be a monocyclic aromatic ring, a monocyclic anti-aromatic ring, or a monocyclic non-aromatic ring. Among the above-described conjugated rings, a monocyclic aromatic ring is preferable.

The monocyclic aromatic ring, the monocyclic anti-aromatic ring, or the monocyclic non-aromatic ring represented by $Ar^1$, $Ar^2$, and $Ar^3$ may further have a substituent. The kind of the substituent is not particularly limited, and examples thereof include groups exemplified by the substituent W described below. Among these, an alkyl group, an alkoxy group, an acyl group, an alkoxycarbonyl group, an aryl group, or a heteroaryl group, which may have a halogen atom or a substituent, is preferable, an alkyl group, an aryl group, or a heteroaryl group, which may have a substituent, is more preferable, and an aryl group or a heteroaryl group, which may have a substituent, is still more preferable.

Examples of the aromatic ring include benzene, pyrrole, thiophene, thiazole, isothiazole, selenophene, oxazole, isoxazole, thiadiazole, oxadiazole, imidazole, pyrazole, triazole, pyridine, pyridazine, pyrimidine, triazine, furan, and other aromatic rings. Among these, benzene, selenophene, thiazole, furan, or thiophene is preferable, and benzene, thiazole, or thiophene is more preferable. In addition, examples of the above-described anti-aromatic ring include cyclobutadiene, pentalene, cyclooctatetraene, and other anti-aromatic rings. Furthermore, examples of the above-described non-aromatic ring include cyclopentadiene, cyclohexadiene, 1,3-cycloheptadiene, and 1,3-cyclooctadien, 1-silacyclopenta-2,4-diene, 1-germacyclopenta-2,4-diene, and other non-aromatic rings.

p is preferably 2 or more, and more preferably 3 or more, from the viewpoint that the effect of the present invention is more excellent.

From the viewpoint that the effect of the present invention is more excellent, in Formula (AX), p is 1 or more, and any one or more of $Ar^1$, $Ar^2$, or $Ar^3$ preferably has, as a substituent, an alkyl group, an aryl group, or a heteroaryl group, which may have a substituent, more preferably has an aryl group, or a heteroaryl group, which may have a substituent, and still more preferably has an aryl group, which may have a substituent.

(AY)

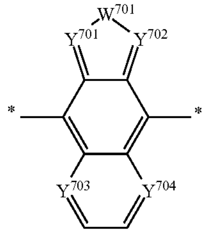

(AZ)

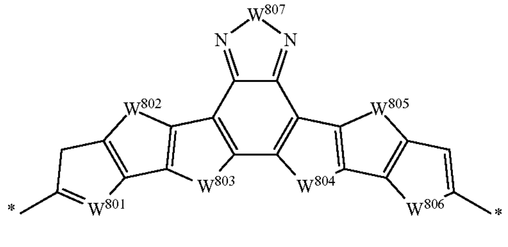

In Formula (AY), $Y^{701}$ to $Y^{704}$ each independently represent $=CR^V-$ or a nitrogen atom.

$R^V$ represents a hydrogen atom or a monovalent substituent. The kind of the monovalent substituent represented by $R^V$ is not particularly limited, and examples thereof include a group exemplified for a substituent W described later. Among these, an alkyl group, an aryl group, or a heteroaryl group, which may have a halogen atom or a substituent, is preferable.

In Formula (AY) and Formula (AZ), $W^{701}$ and $W^{801}$ to $W^{807}$ each independently represent a sulfur atom, an oxygen atom, a selenium atom, or $>NR^W$.

$R^W$ represents a hydrogen atom or a monovalent substituent. The kind of a monovalent substituent represented by $R^W$ is not particularly limited, and examples thereof include a group exemplified for a substituent W described later. Among these, an alkyl group, an aryl group, or a heteroaryl group, which may have a substituent, is preferable.

In Formula (AY) and Formula (AZ), * represents a bonding position.

As described above, the divalent conjugate group represented by $A^{11}$ is not particularly limited as long as it is a divalent linking group that has a cyclic structure and has a conjugated system formed between one bonding position and the other bonding position.

Examples of the divalent conjugate group represented by $A^{11}$ include the above-described divalent monocyclic aromatic group, the above-described divalent conjugate fused ring group, and a group formed by two or more selected from the above-described divalent monocyclic aromatic group and the above-described divalent conjugate fused ring group being bonded through a single bond or a divalent conjugate linking group.

The divalent conjugate linking group is intended to be a divalent linking group that does not have a cyclic structure in which a conjugated system is formed between one bonding position and the other bonding position, and examples thereof include $—CR^T═CR^T—$, $—CR^T═N—$, $—N═N—$, $—CR^T═N—$, and $—C≡C—$.

$R^T$ represents a hydrogen atom or a monovalent substituent. The kind of the monovalent substituent represented by $R^T$ is not particularly limited, and examples thereof include groups exemplified by the substituent W described later.

The divalent conjugate group represented by $A^{11}$ is preferably a group represented by either Formulae (A1) or (A2) among them, from the viewpoint that the effect of the present invention is more excellent.

$$*—Ar^{11}—* \quad (A1)$$

In Formula (A1), $Ar^{11}$ represents a divalent monocyclic aromatic ring group, which may have a substituent, a divalent conjugate fused ring group, which may have a substituent, or a divalent conjugate group represented by any of Formulae (a21) to (a24). * represents a bonding position.

Examples of the divalent monocyclic aromatic ring group, which may have a substituent represented by $Ar^{11}$, include the above-described divalent monocyclic aromatic ring group.

Examples of the divalent conjugate fused ring group, which may have a substituent represented by $Ar^{11}$, include the above-described divalent conjugate fused ring group derived from a fused ring formed by combining two or more monocyclic rings selected from the group consisting of Formulae (a1) to (a3), and a divalent conjugate fused ring group derived from a fused ring formed by combining a monocyclic ring selected from the group consisting of Formulae (a1) to (a3) and a fused ring represented by Formula (a8) (preferably divalent conjugate fused ring groups represented by Formulae (AX) to (AZ), and more preferably a divalent conjugate fused ring group represented by Formula (AX), a divalent conjugate fused ring group represented by Formula (AY), or a divalent conjugate fused ring group represented by Formula (AZ), in which p is 1 or more, and any one or more of $Ar^1$, $Ar^2$, or $Ar^3$ preferably has, as a substituent, an alkyl group, an aryl group, or a heteroaryl group, which may have a substituent (still more preferably, p is 1 or more, and any one or more of $Ar^1$, $Ar^2$, or $Ar^3$ preferably has, as a substituent, an aryl group or a heteroaryl group, which may have a substituent); a divalent conjugate fused ring group selected from the group consisting of Formulae (a4) to (a7) and Formulae (a9) to (a20); a divalent conjugate fused ring group selected from the group consisting of Formulae (b1) to (b3) (preferably a divalent conjugate fused ring group represented by formula (b3)).

Among these, $Ar^{11}$ is more preferably a divalent conjugate fused ring group, which may have a substituent, or a divalent conjugate group represented by any of Formulae (a21) to (a24) described below, from the viewpoint that the effect of the present invention is more excellent.

In addition, from the viewpoint that it is more excellent in photosensitivity in the near infrared range, $Ar^{11}$ is more preferably a divalent conjugate fused ring group selected from the group consisting of Formulae (a4) to (a7) and Formulae (a9) to (a12), a divalent conjugate fused ring group represented by Formula (AY) or (AZ), a divalent conjugate fused ring group represented by Formula (b3), or a divalent conjugate group represented by any of Formulae (a21) to (a24) described below.

(a21)

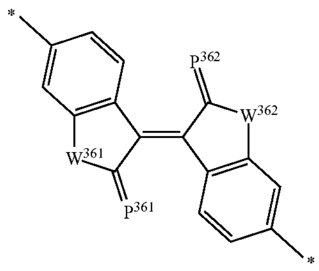

(a22)

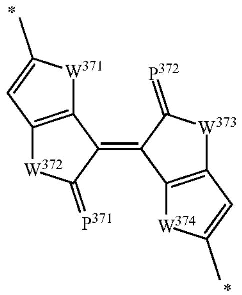

(a23)

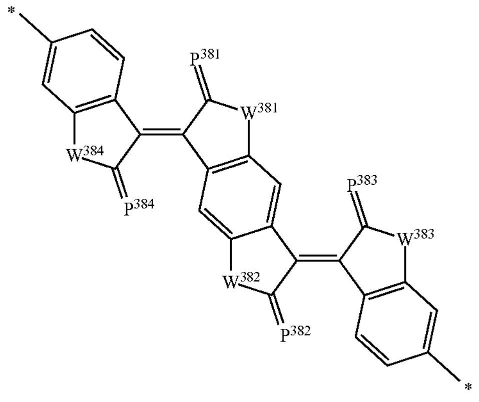

-continued (a24)

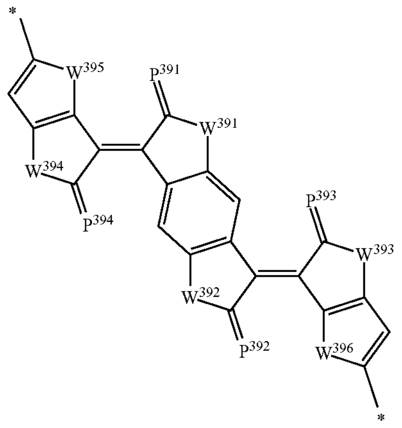

In Formulae (a21) to (a24), $W^{361}$, $W^{362}$, $W^{371}$ to $W^{374}$, $W^{381}$ to $W^{384}$, and $W^{391}$ to $W^{396}$ each independently represent a sulfur atom, an oxygen atom, a selenium atom, or $>NR^{U}$.

$R^{U}$ represents a hydrogen atom or a monovalent substituent. The kind of a monovalent substituent represented by $R^{U}$ is not particularly limited, and examples thereof include a group exemplified for a substituent W described later. Among these, an alkyl group, an aryl group, or a heteroaryl group, which may have a substituent, is preferable.

$P^{361}$, $P^{362}$, $P^{371}$, $P^{372}$, $P^{381}$ to $P^{384}$, and $P^{391}$ to $P^{394}$ each independently represent an oxygen atom, a sulfur atom, $=C(CN)_2$, $=C[S(=O)_2R^{2U}]_2$, $=C[S(=O)R^{2U}]_2$, $=C[C(=O)R^{2U}]_2$ $=C[CN][S(=O)_2R^{2'}]$, $=C[CN][S(=O)R^{2U}]$, $=C[CN][C(=O)R^{2U}]$, $=C[C(=O)R^{2U}][S(=O)_2R^{2'}]$, or $=C[C(=O)R^{21}][S(=O)R^{21}]$, and among these, an oxygen atom, a sulfur atom, or $=C(CN)_2$ is preferable, and an oxygen atom or $=C(CN)_2$ is more preferable.

$R^{2U}$ represents a monovalent substituent.

The kind of the monovalent substituent represented by $R^{21}$ is not particularly limited, and examples thereof include groups exemplified by the substituent W described later.

* represents a bonding position.

$$*—(Ar^{12}\text{-}L^{11})_{m11}\text{-}Ar^{13}—* \quad (A2)$$

In Formula (A2), $Ar^{12}$ and $Ar^{13}$ each independently represent a divalent monocyclic aromatic ring group, which may have a substituent, a divalent conjugate fused ring group, which may have a substituent, or a divalent conjugate group represented by Formulae (a21) to (a24) described above. $L^{11}$ represents a single bond or a divalent conjugate linking group. m11 represents an integer of 1 or more. In a case where m11 is an integer of 2 or more, a plurality of $Ar^{12}$'s in Formula (A2) may be the same or different from each other, and a plurality of $L^{11}$'s in Formula (A2) may be the same or different from each other. * represents a bonding position.

Examples of the divalent monocyclic aromatic ring group, which may have a substituent represented by $Ar^{12}$ and $Ar^{13}$, include the above-described divalent monocyclic aromatic ring group.

Examples of the divalent conjugate fused ring group, which may have a substituent represented by $Ar^{12}$ and $Ar^{13}$, include the above-described divalent conjugate fused ring group derived from a fused ring formed by combining two or more monocyclic rings selected from the group consisting of Formulae (a1) to (a3), and a divalent conjugate fused ring group derived from a fused ring formed by combining a monocyclic ring selected from the group consisting of Formulae (a1) to (a3) and a fused ring represented by Formula (a8) (preferably divalent conjugate fused ring groups represented by Formulae (AX) to (AZ), and more preferably a divalent conjugate fused ring group represented by Formula (AX), a divalent conjugate fused ring group represented by Formula (AY), or a divalent conjugate fused ring group represented by Formula (AZ), in which p is 1 or more, and any one or more of $Ar^1$, $Ar^2$, or $Ar^3$ preferably has, as a substituent, an alkyl group, an aryl group, or a heteroaryl group, which may have a substituent (still more preferably, p is 1 or more, and any one or more of $Ar^1$, $Ar^2$, or $Ar^3$ preferably has, as a substituent, an aryl group or a heteroaryl group, which may have a substituent); a divalent conjugate fused ring group selected from the group consisting of Formulae (a4) to (a7) and Formulae (a9) to (a20); a divalent conjugate fused ring group selected from the group consisting of Formulae (b1) to (b3) (preferably a divalent conjugate fused ring group represented by formula (b3)).

Among these, at least one of $Ar^{12}$ or $Ar^{13}$ is more preferably a divalent conjugate fused ring group, which may have a substituent, or a divalent conjugate group represented by any of Formulae (a21) to (a24) described below, from the viewpoint that the effect of the present invention is more excellent.

In addition, from the viewpoint that it is more excellent in photosensitivity in the near infrared range, at least one of $Ar^{12}$ or $Ar^{13}$ is more preferably a divalent conjugate fused ring group selected from the group consisting of Formulae (a4) to (a7) and Formulae (a9) to (a12), a divalent conjugate fused ring group represented by Formula (AY) or (AZ), a divalent conjugate fused ring group represented by Formula (b3), or a divalent conjugate group represented by any of Formulae (a21) to (a24).

Examples of the divalent conjugate linking group represented by $L^{11}$ include the above-described divalent conjugate linking groups.

m11 represents an integer of 1 or more, and is 1 to 10, for example, preferably 1 to 6, and more preferably 1 to 3.

It is also preferable that Formula (A2) is a group represented by Formula (A2-1) described below or Formula (A2-2) described below.

$$*—Ar^{12A}—Ar^{12B}—Ar^{13A}—* \quad \text{Formula (A2-1)}$$

$$*—Ar^{12C}—Ar^{12D}—Ar^{12E}—Ar^{12F}—Ar^{13B}—* \quad \text{Formula (A2-2)}$$

In Formula (A2-1), $Ar^{12A}$ and $Ar^{13A}$ each independently represent a divalent monocyclic aromatic ring group, which may have a substituent, or a divalent conjugate fused ring group, which may have a substituent. $Ar^{12B}$ represents a divalent conjugate fused ring group, which may have a substituent.

In Formula (A2-2), $Ar^{12C}$, $Ar^{12D}$, $Ar^{12F}$, and $Ar^{13B}$ each independently represent a divalent monocyclic aromatic ring group, which may have a substituent, or a divalent conjugate fused ring group, which may have a substituent. $Ar^{12E}$ represents a divalent conjugate fused ring group, which may have a substituent.

$Ar^{12A}$ and $Ar^{13A}$ in Formula (A2-1) and $Ar^{12C}$, $Ar^{12D}$, $Ar^{12F}$ and $Ar^{13B}$ in Formula (A2-2) are preferably divalent monocyclic aromatic ring groups.

Hereinafter, specific examples of the divalent conjugate group represented by $A^{11}$ will be described, but the present invention is not limited thereto.

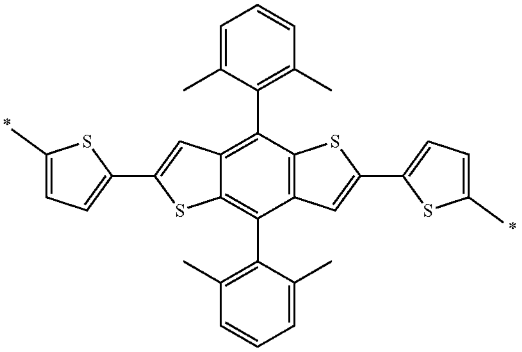
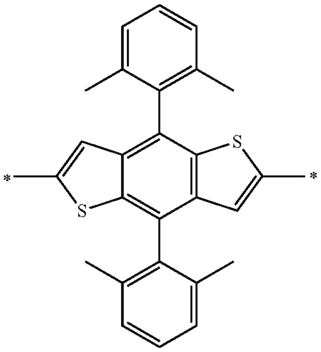
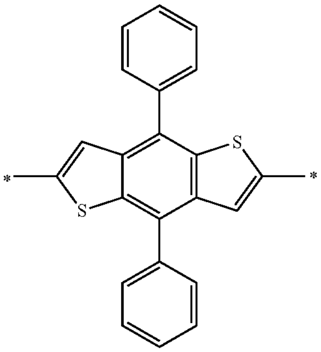
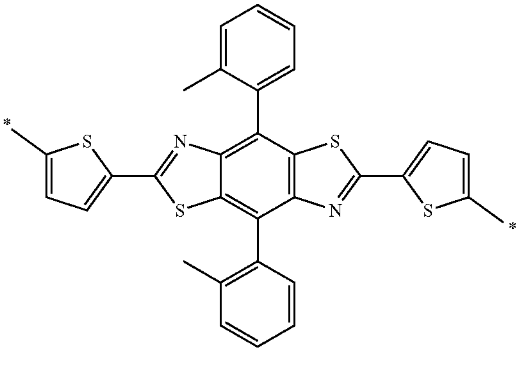
-continued
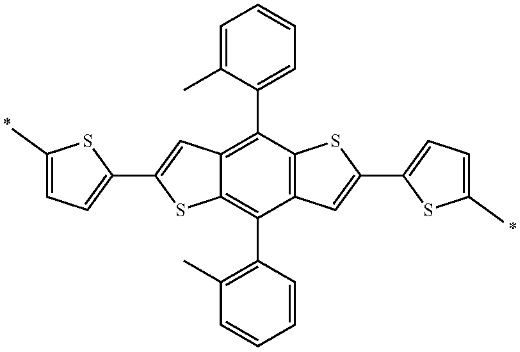
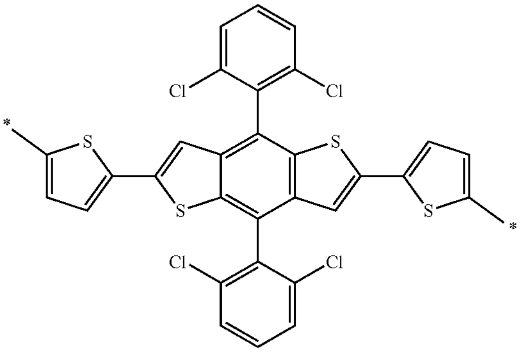
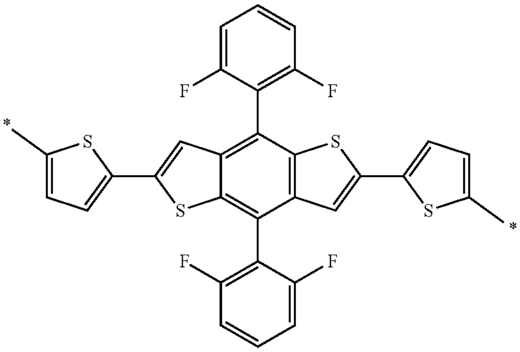
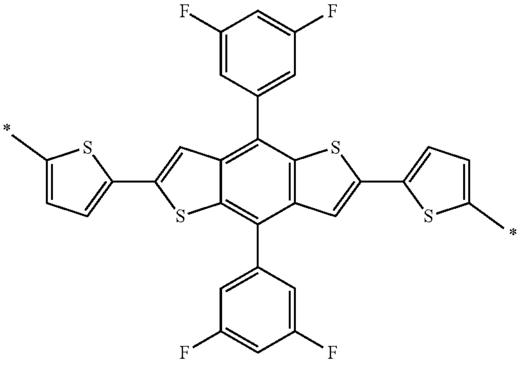

-continued
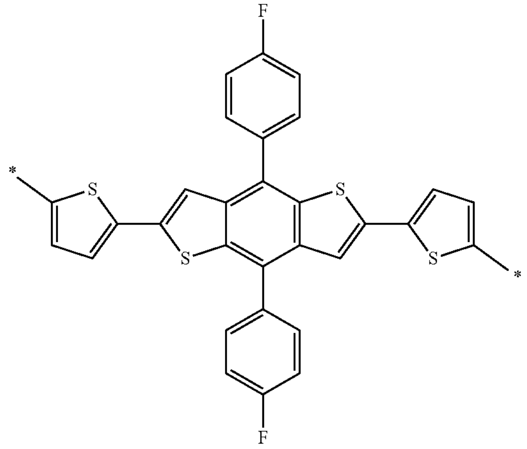
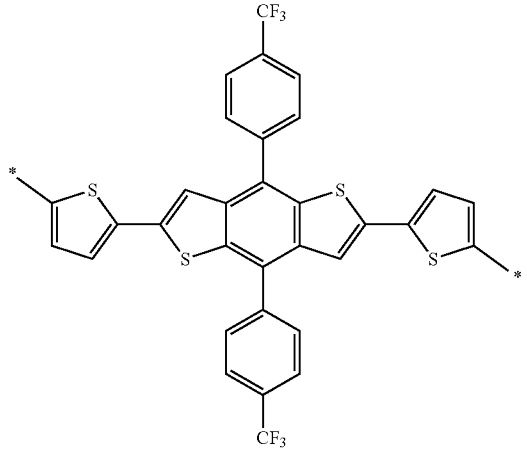
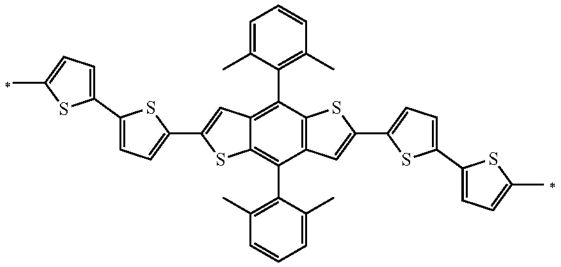
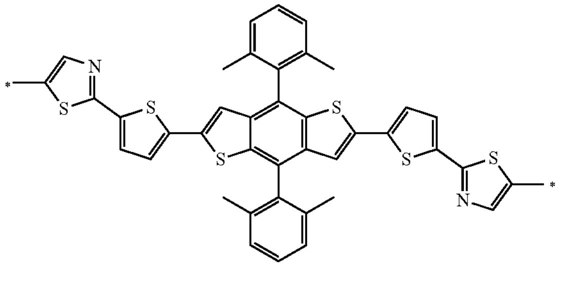
-continued
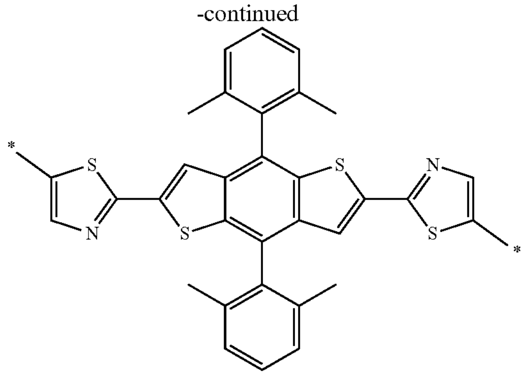
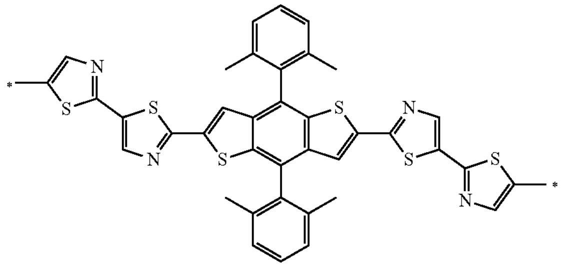
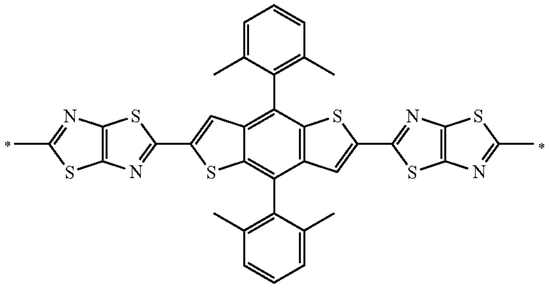
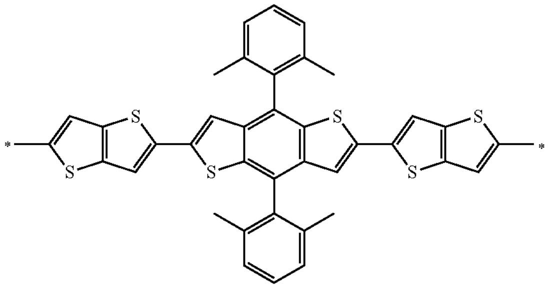
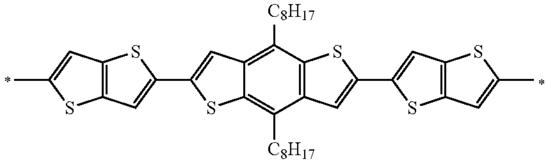
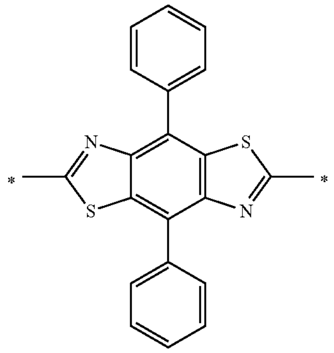

-continued
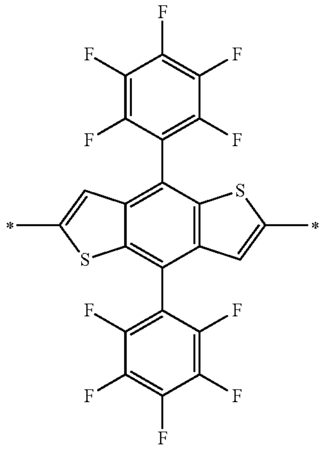
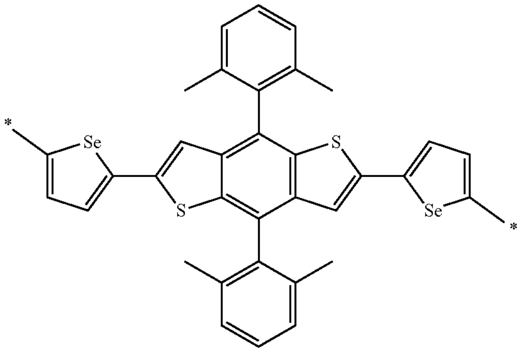
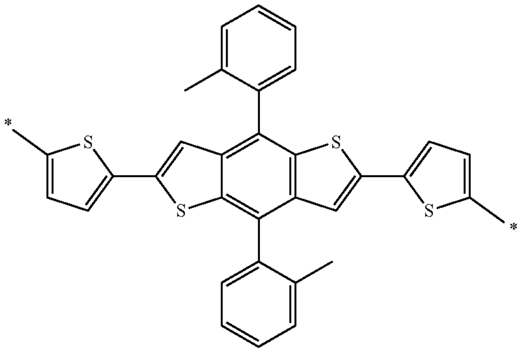
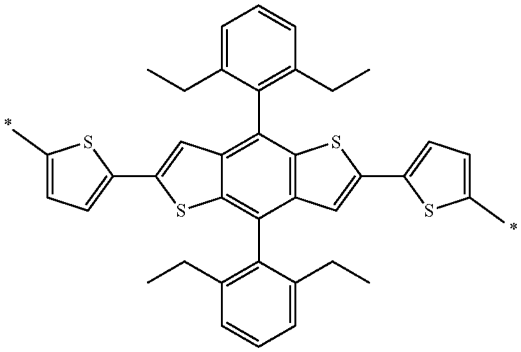
-continued
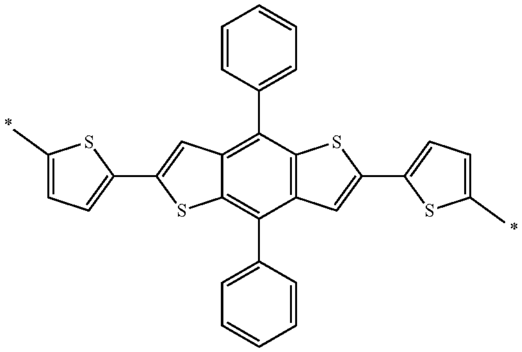
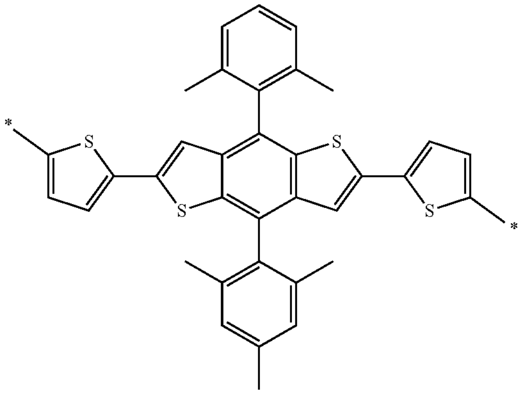
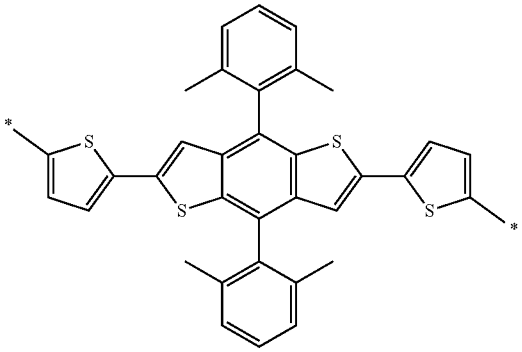
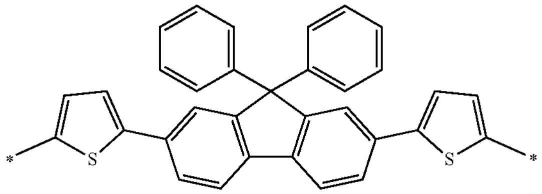
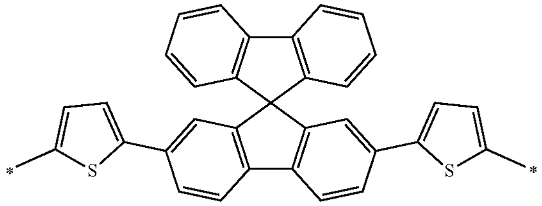
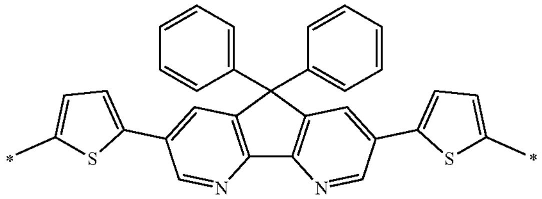

-continued
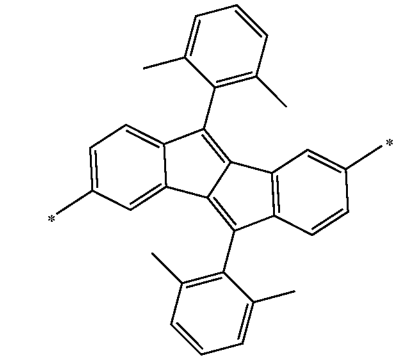
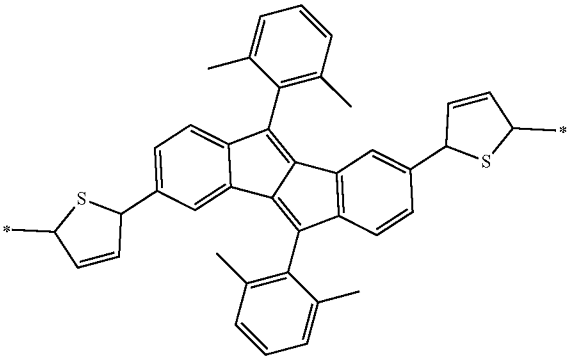
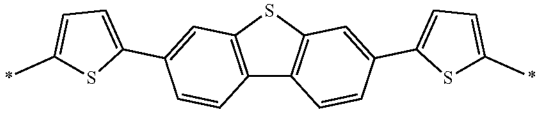
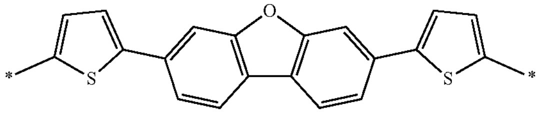
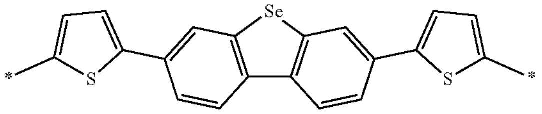
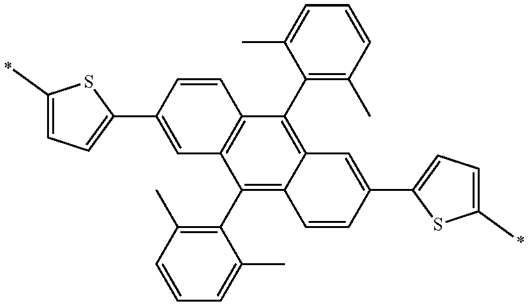
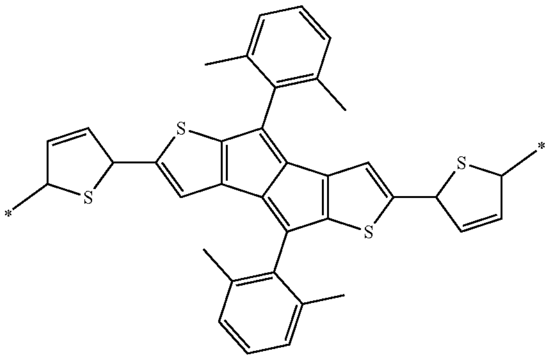
-continued
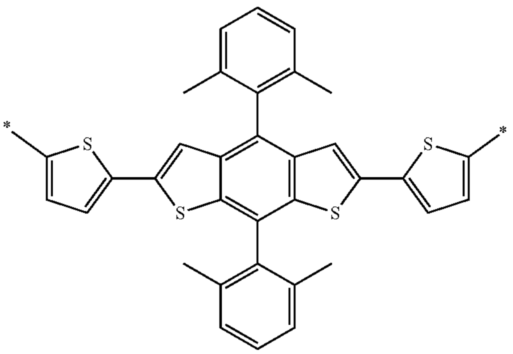
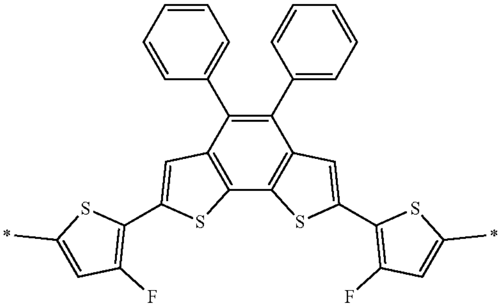
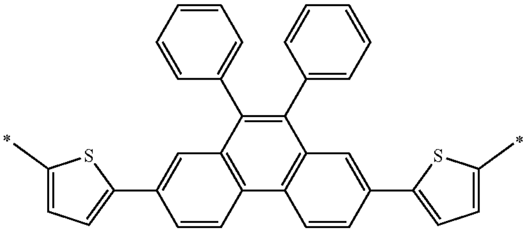
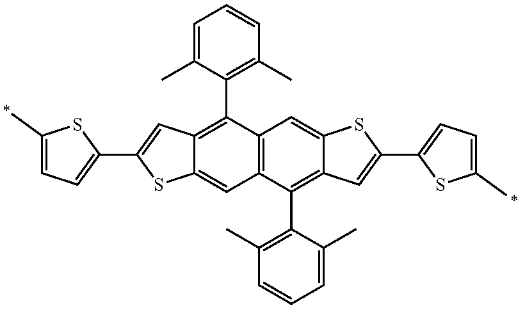
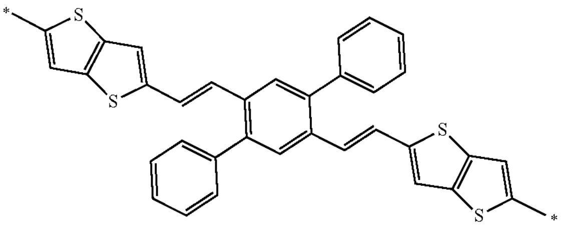
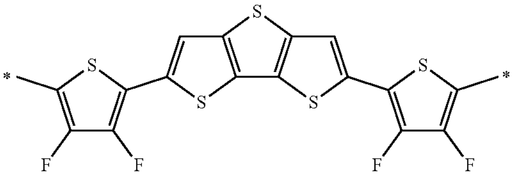

-continued
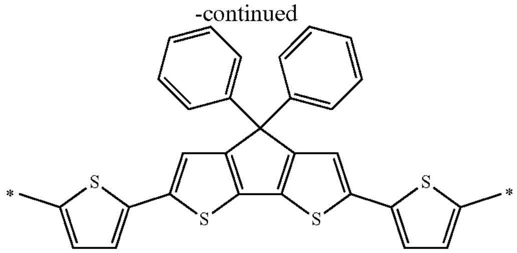
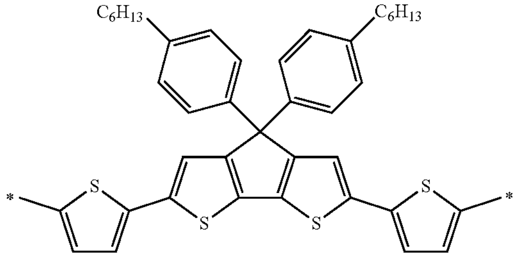
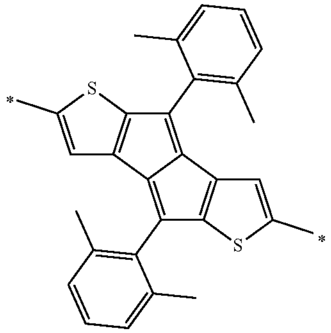
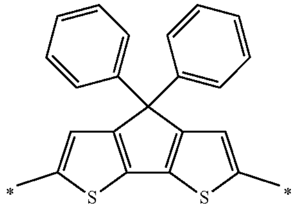
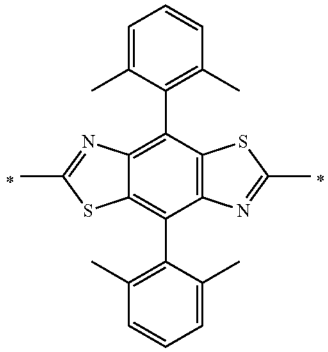
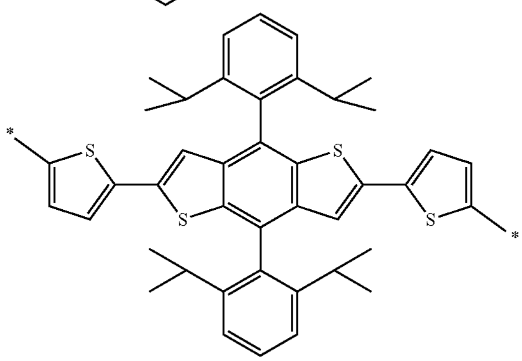
-continued
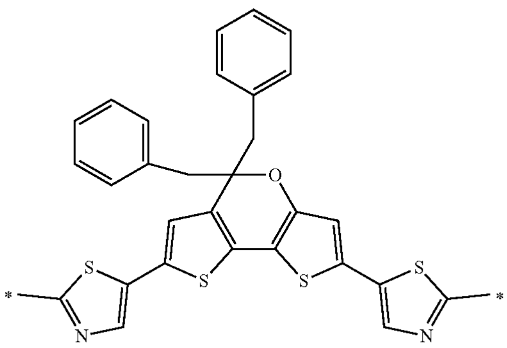
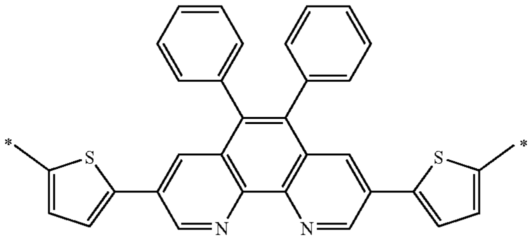
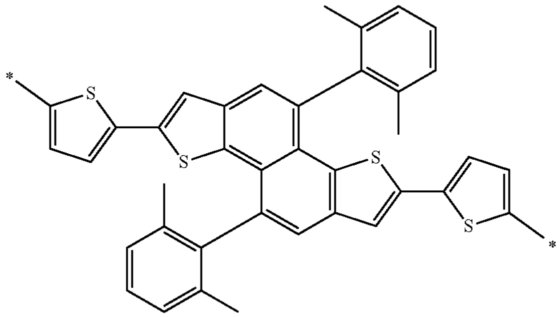
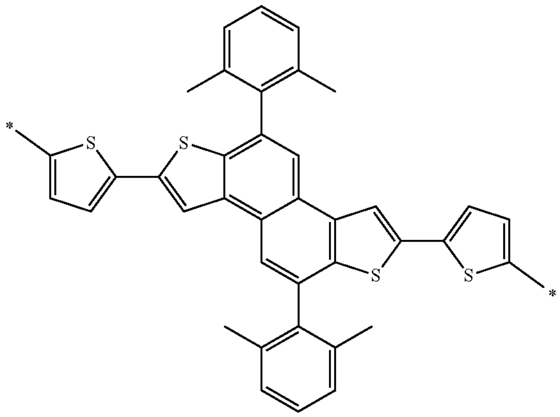
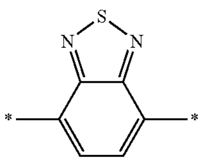
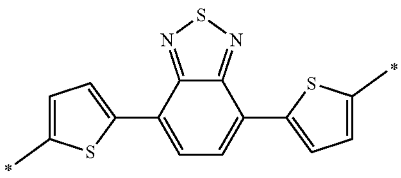

-continued
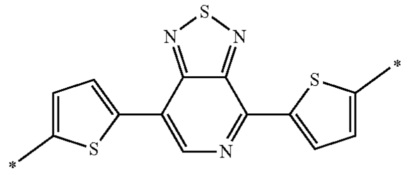
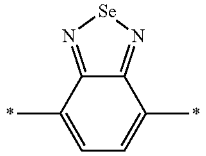
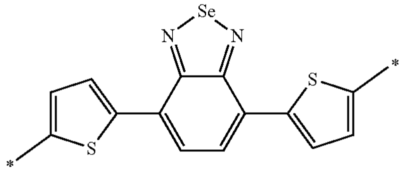
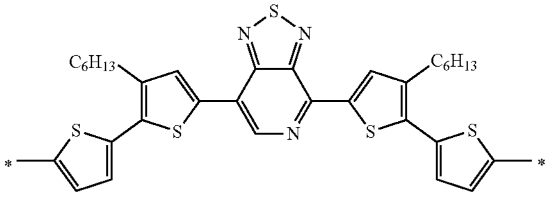
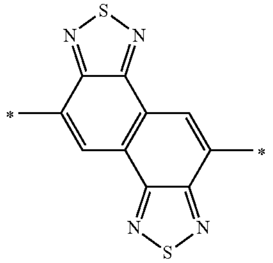
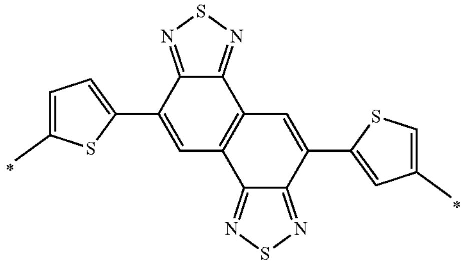
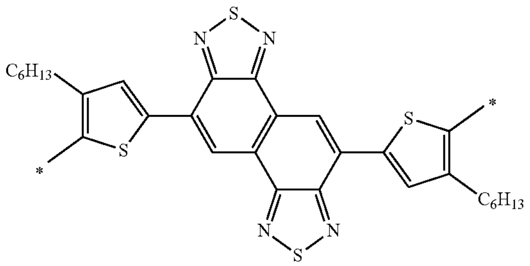
-continued
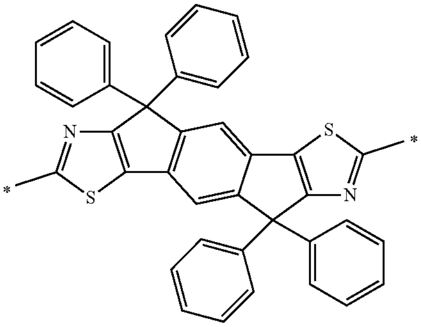
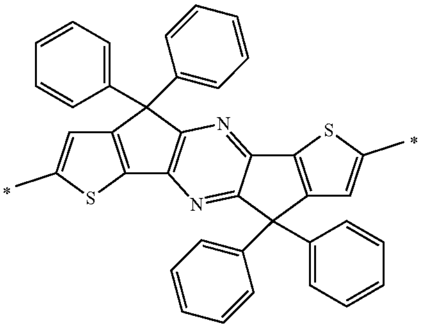
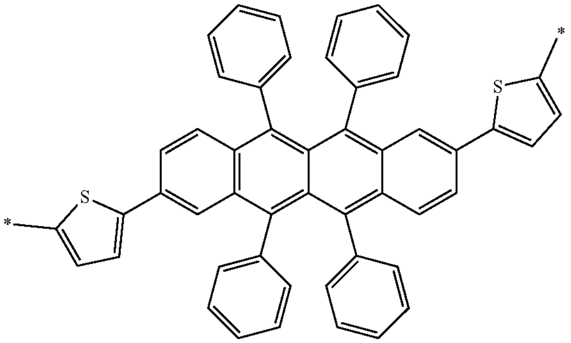
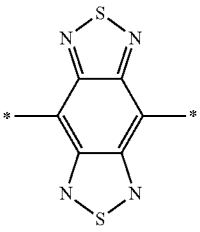
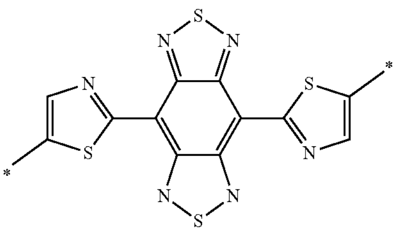

-continued
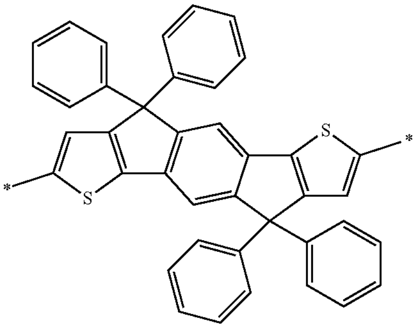
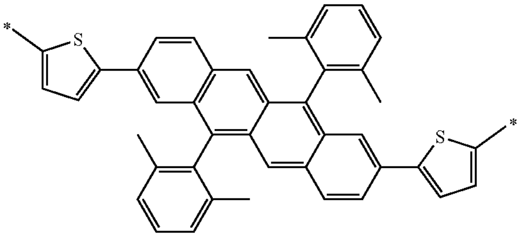
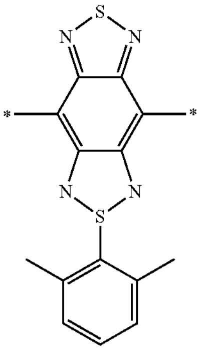
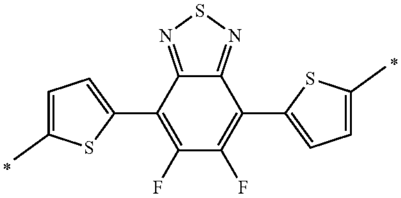
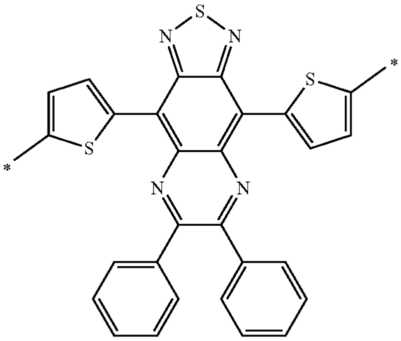
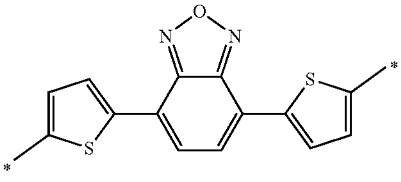
-continued
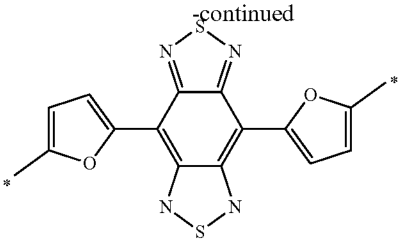
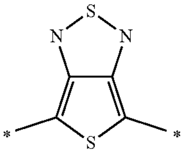
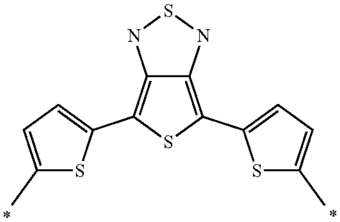
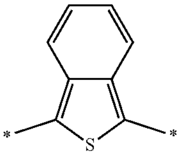
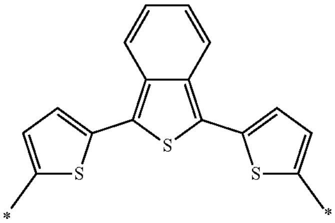
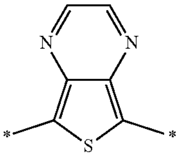
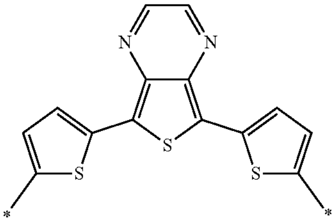
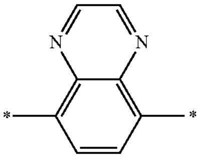
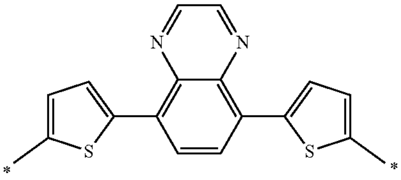

-continued
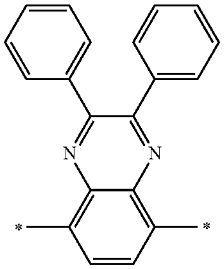
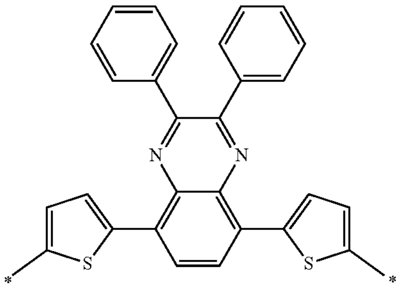
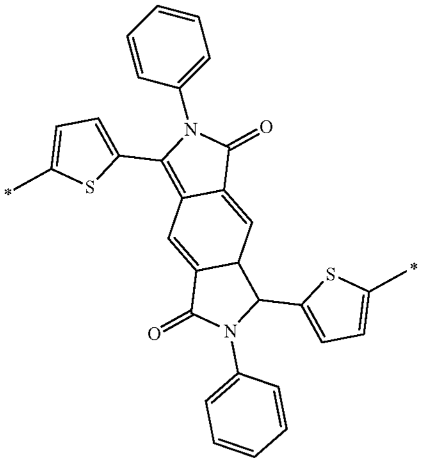
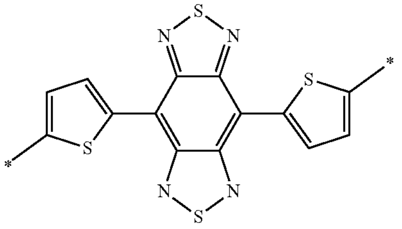
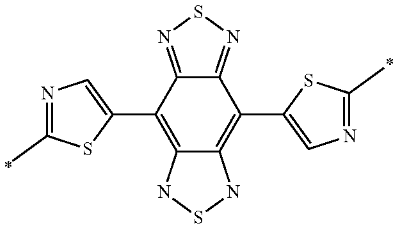
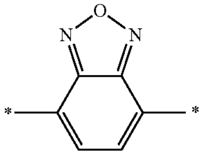
-continued
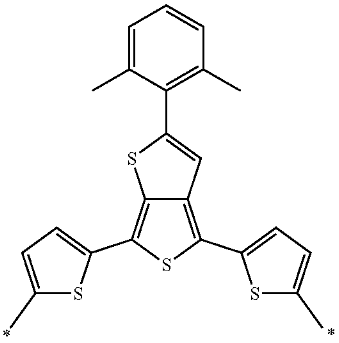
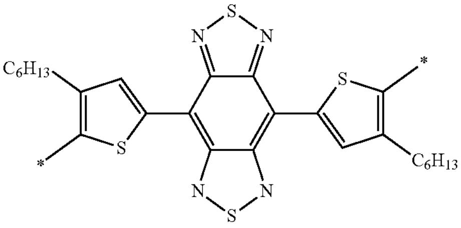
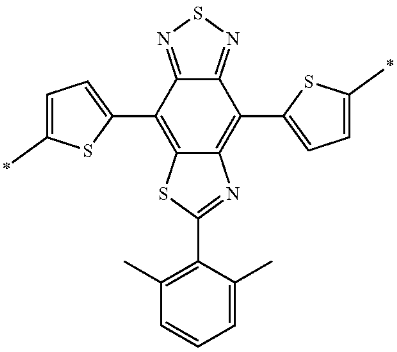
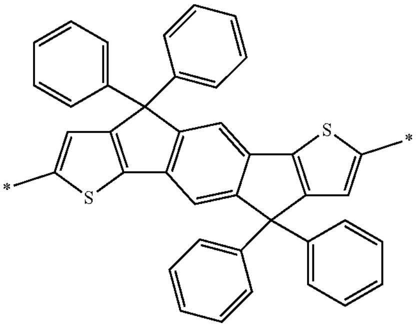
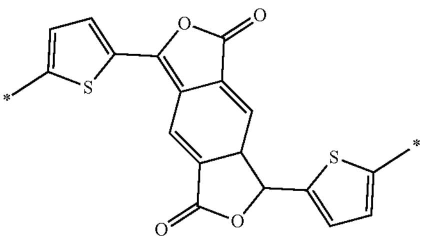

-continued
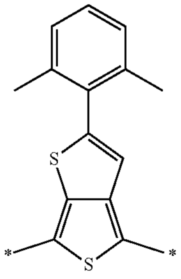
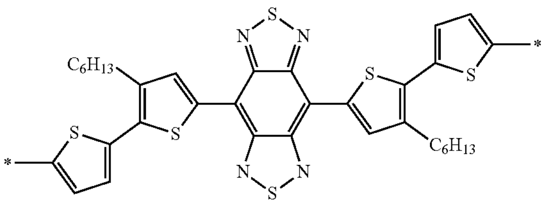
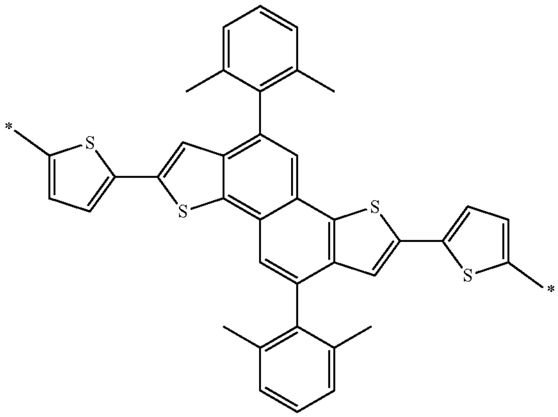
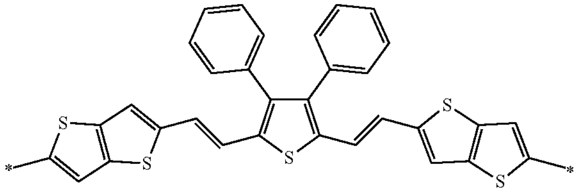
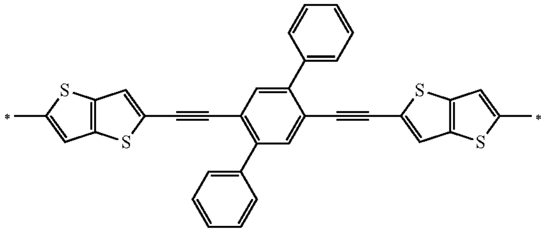
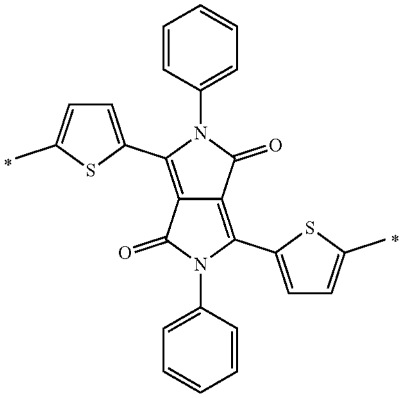
-continued
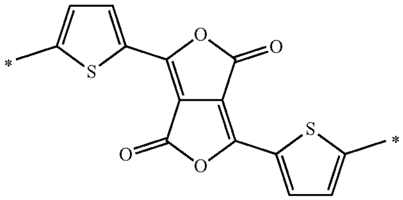
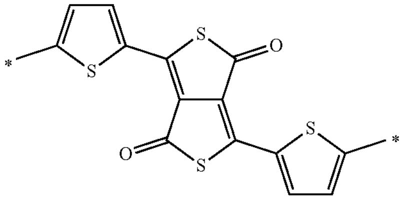
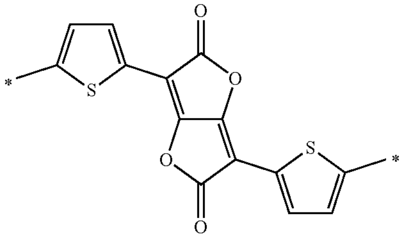
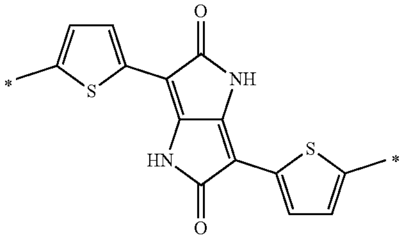
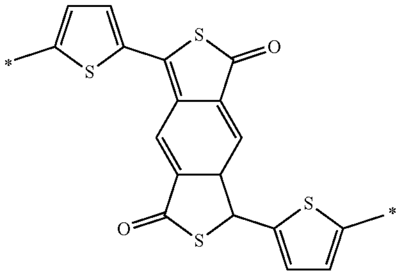
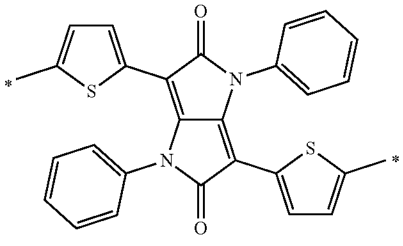
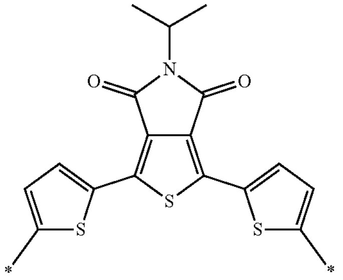

-continued
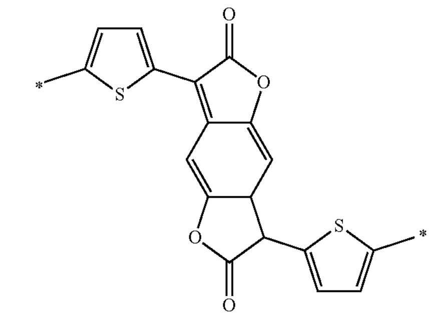
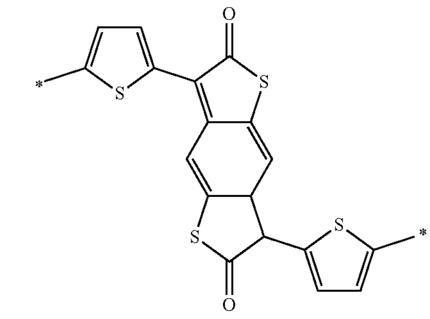
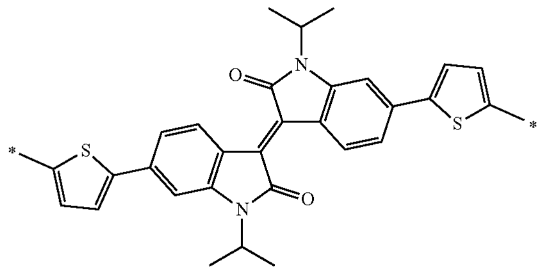
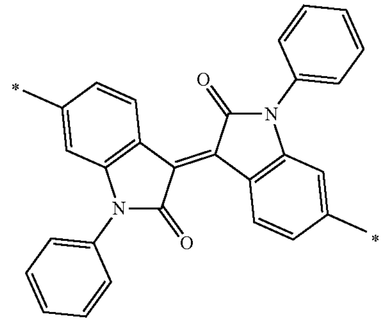
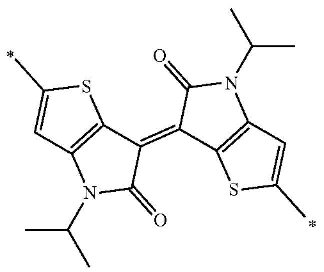
-continued
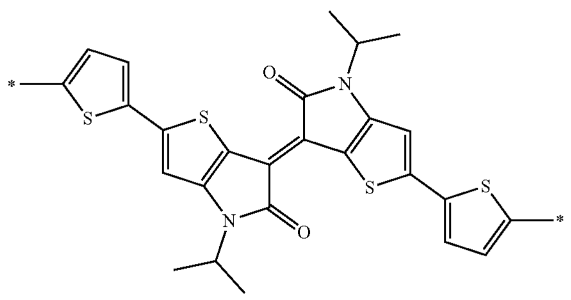
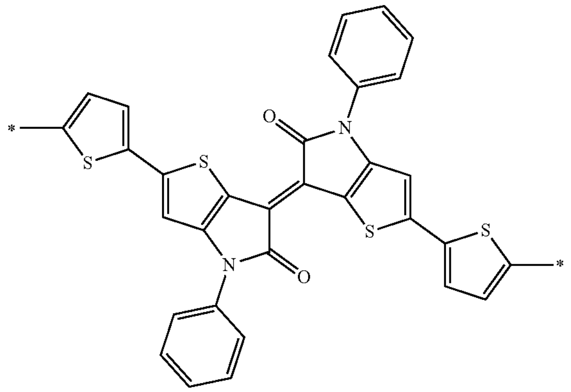
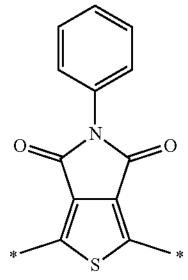
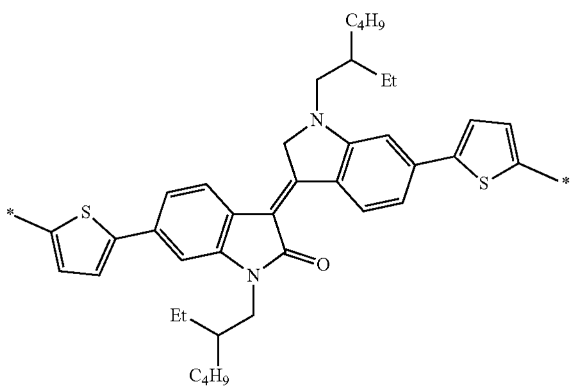

-continued
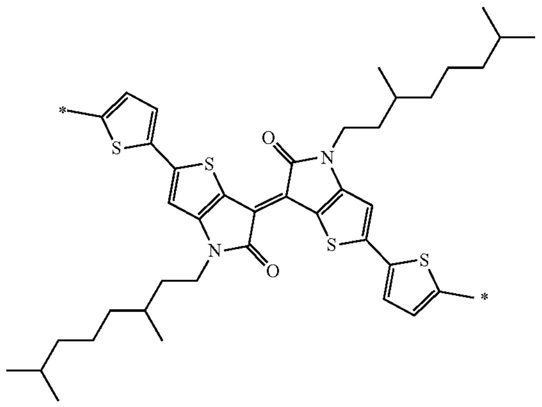
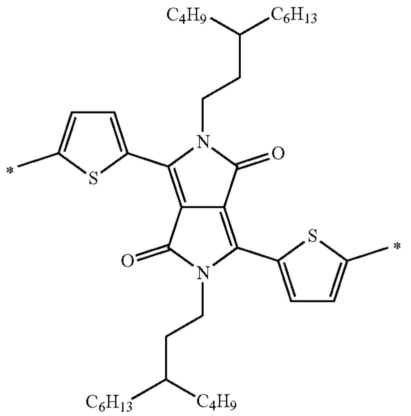
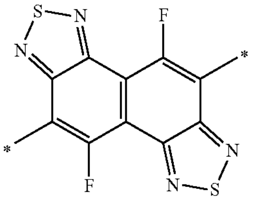
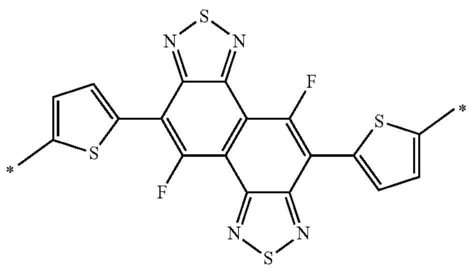
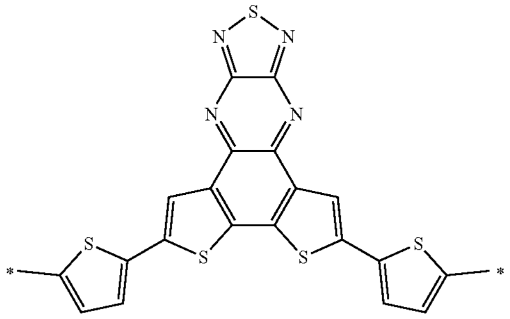
-continued
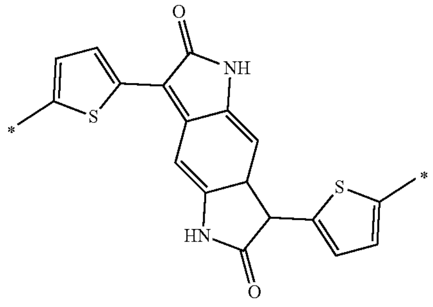
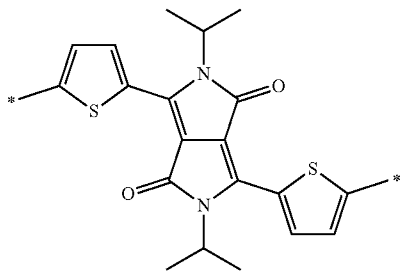
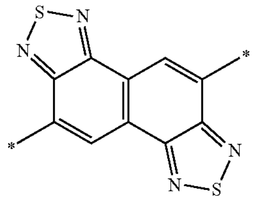
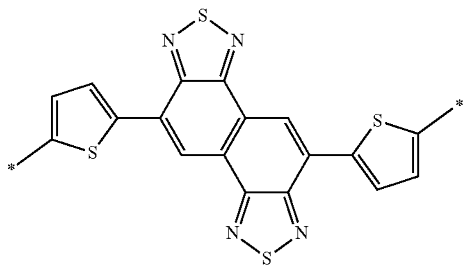
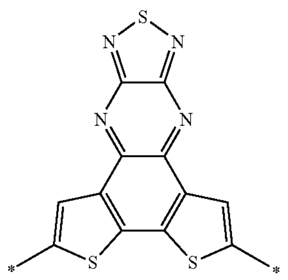
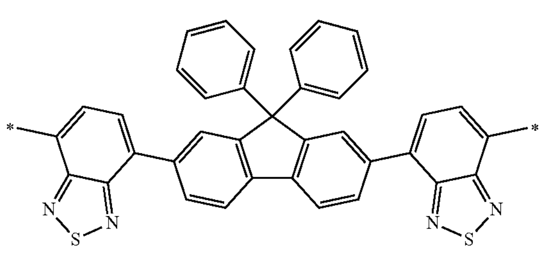

-continued
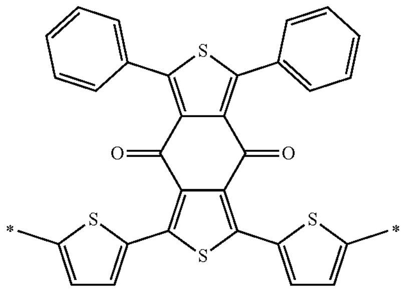
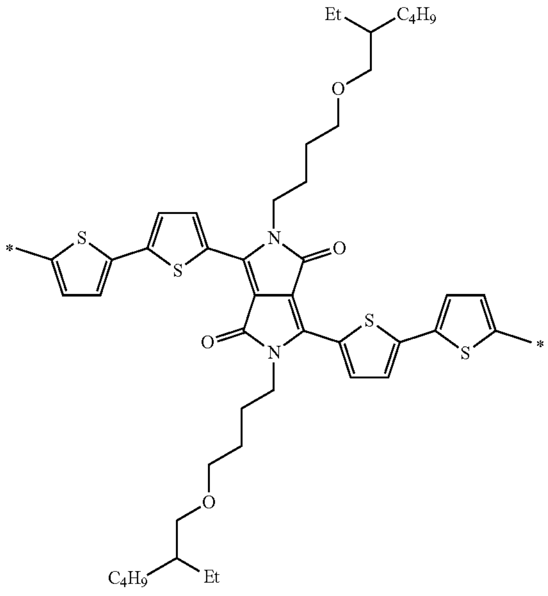
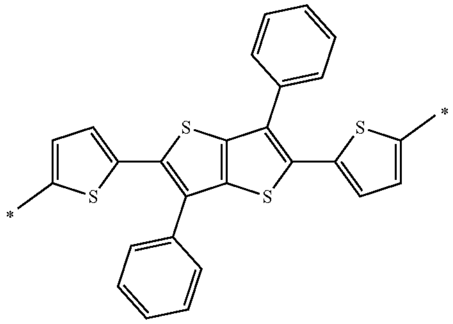
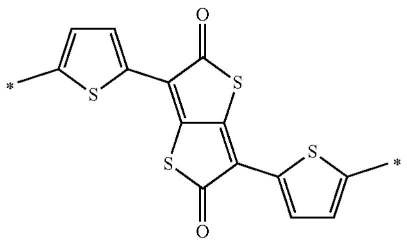
-continued
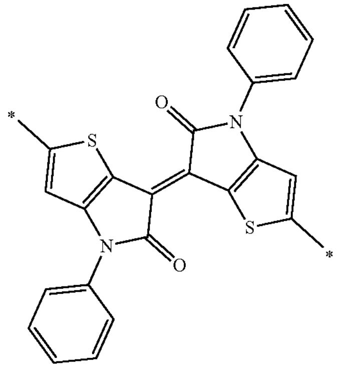
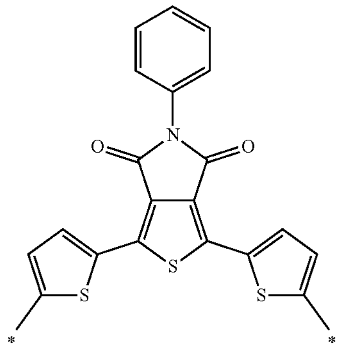
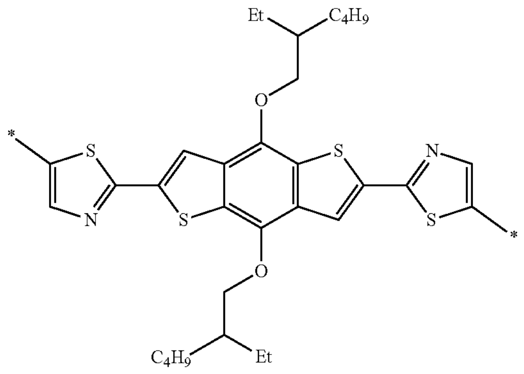

-continued
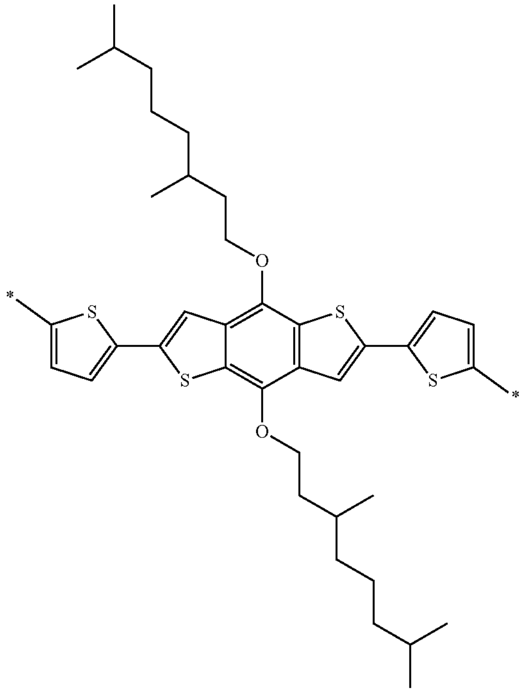
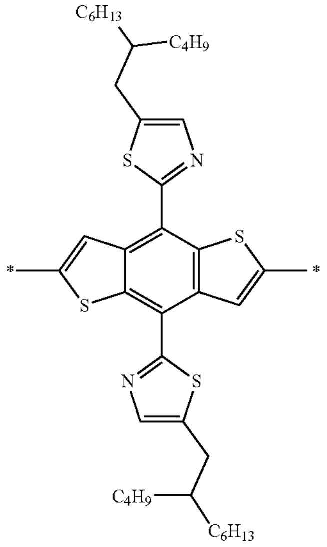
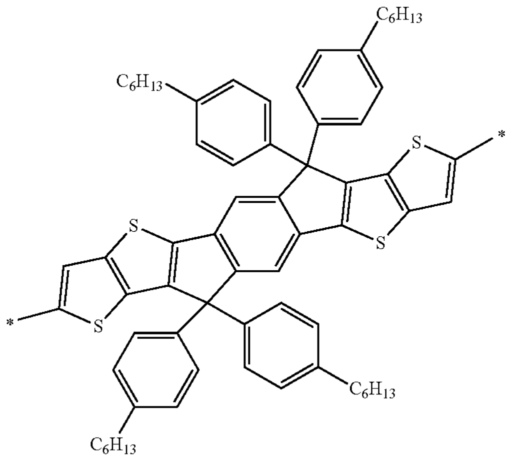
-continued
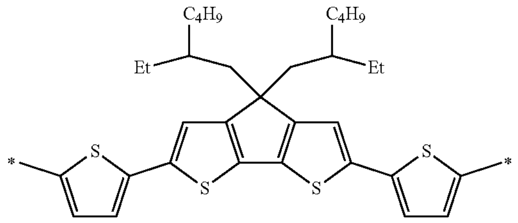
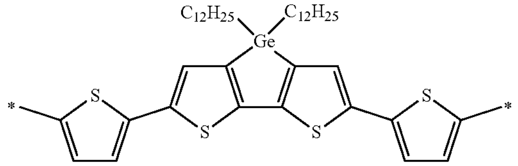
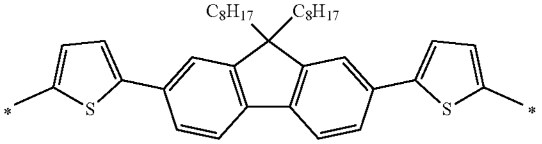
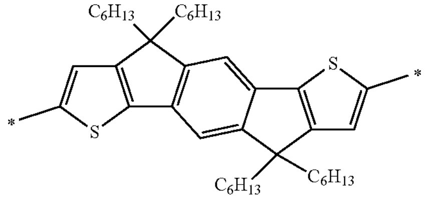
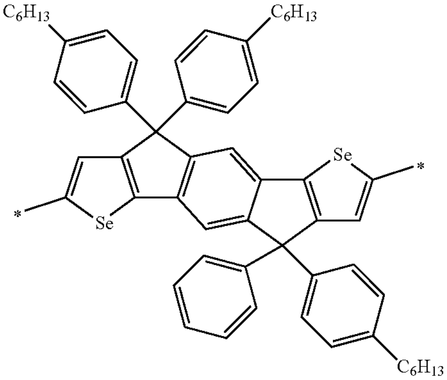
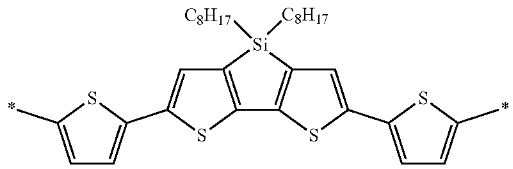
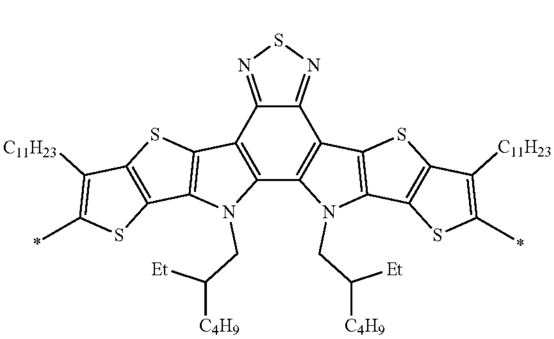

-continued
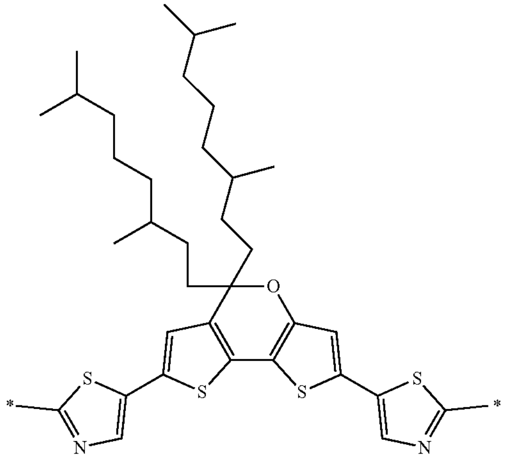
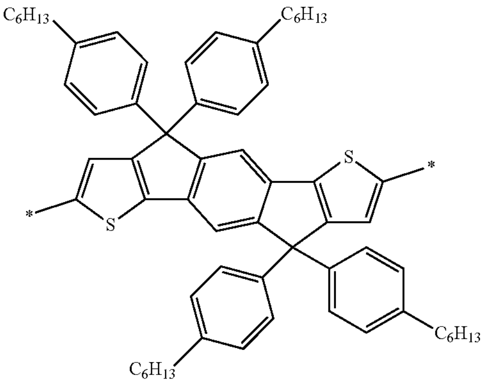
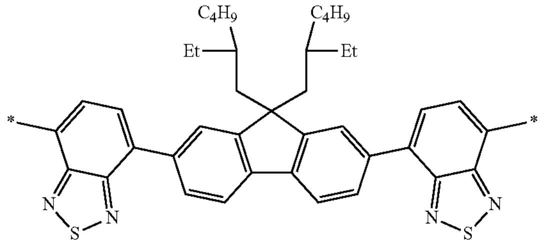
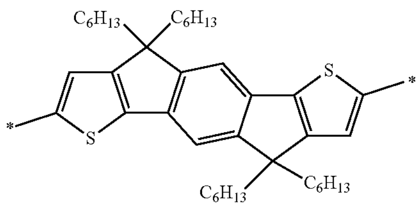
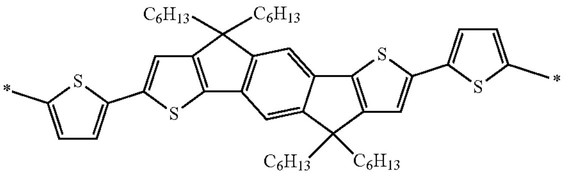
-continued
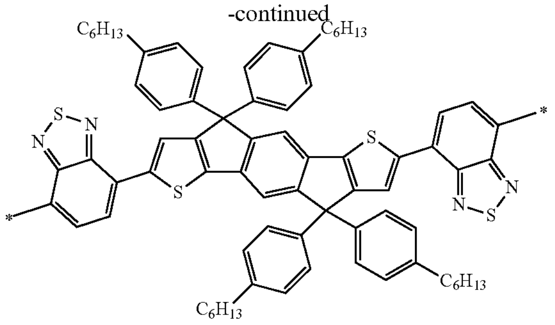
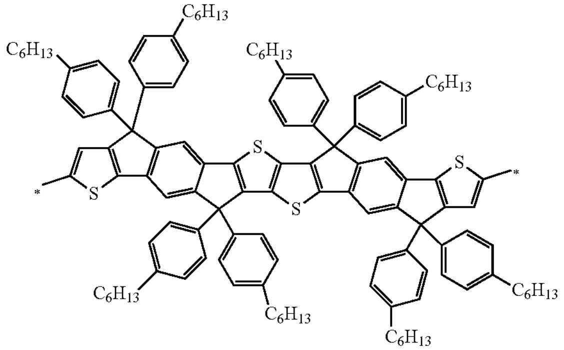
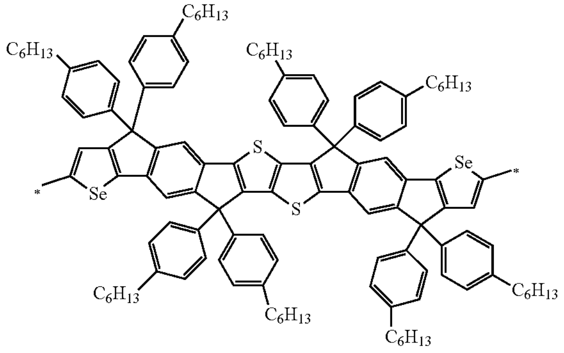
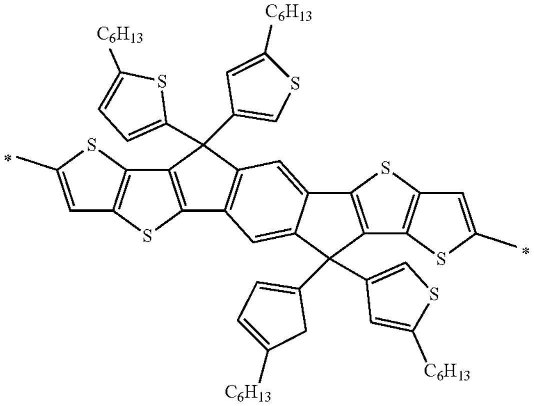
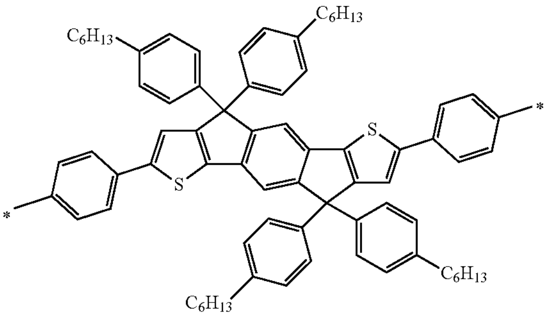

-continued
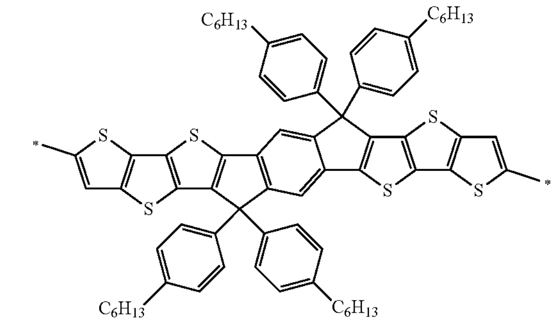
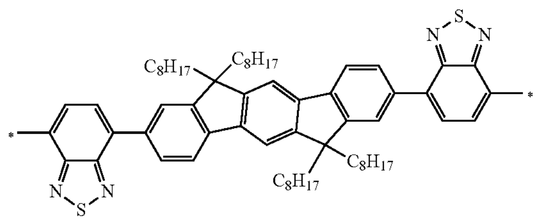
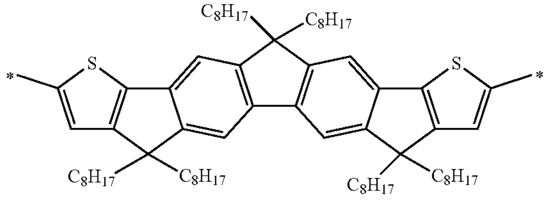
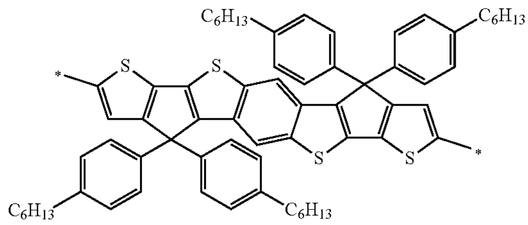
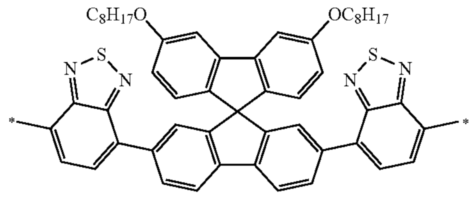
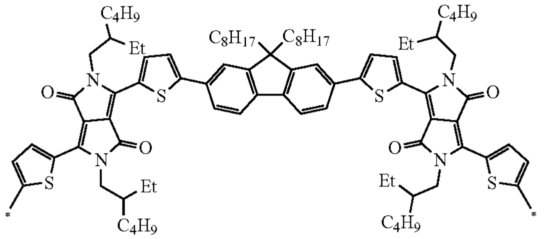
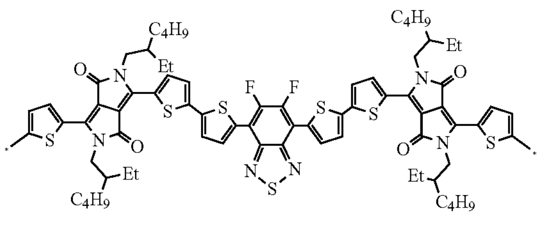
-continued
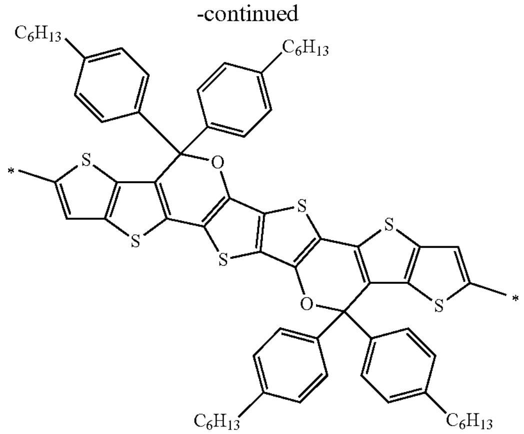
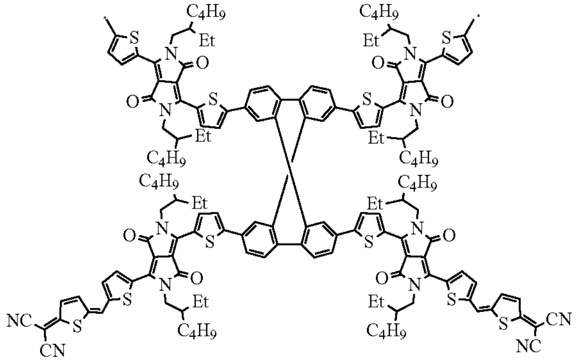
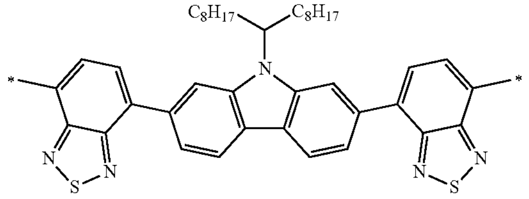
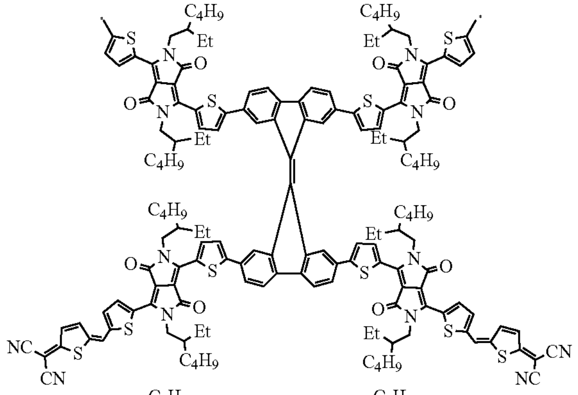
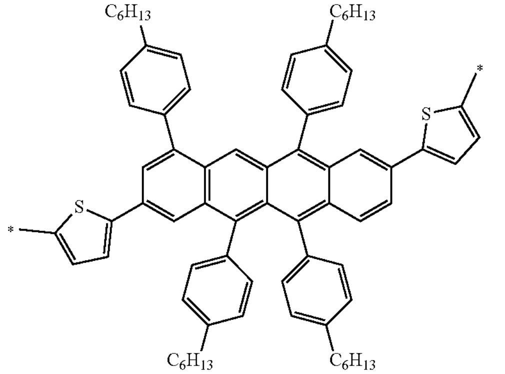

-continued
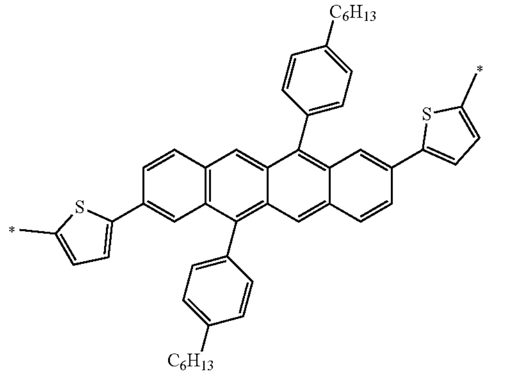
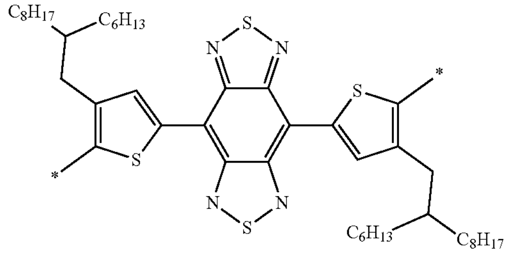
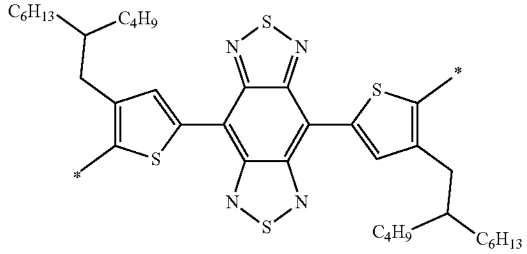
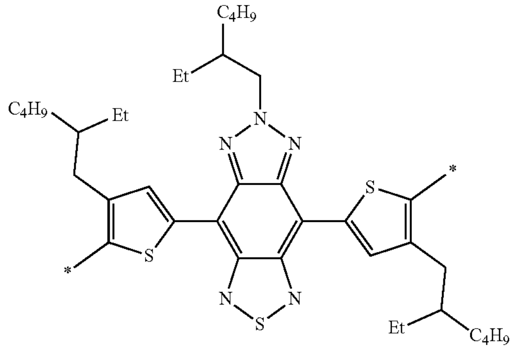
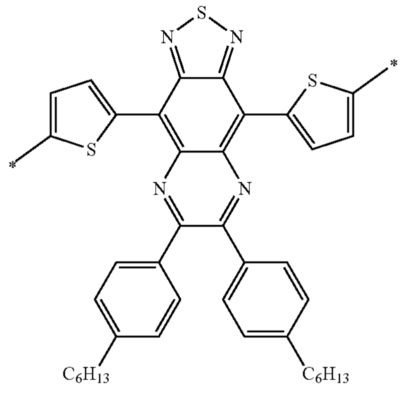
-continued
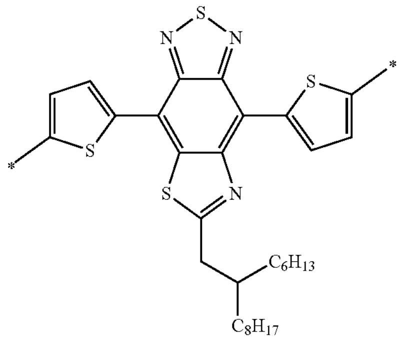
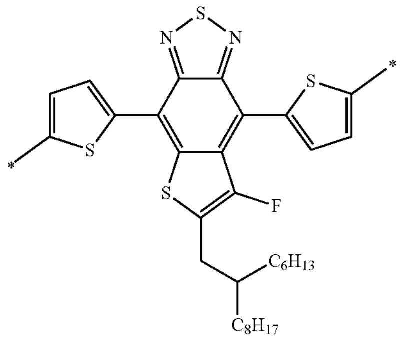
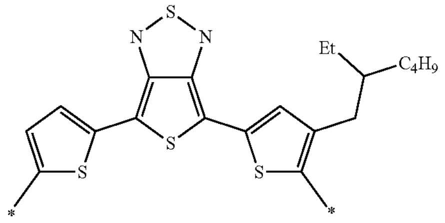
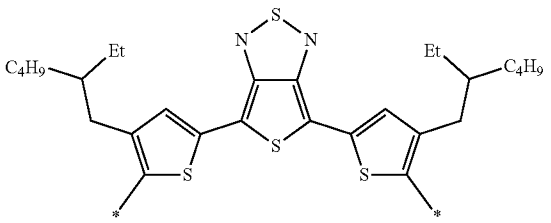
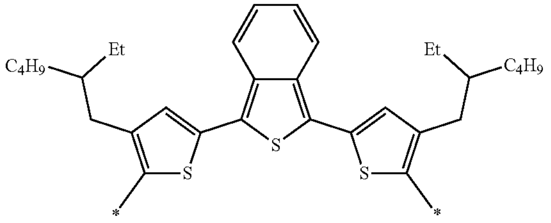
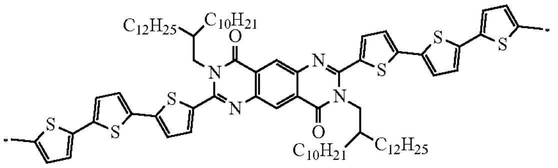

-continued
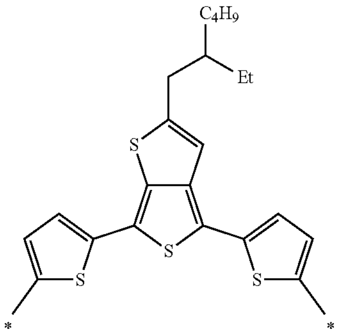
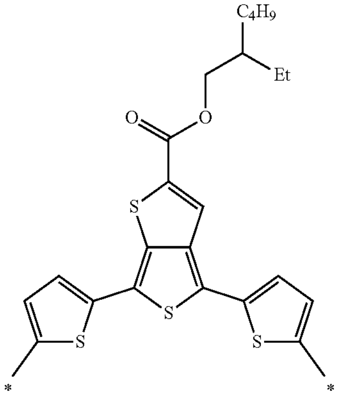
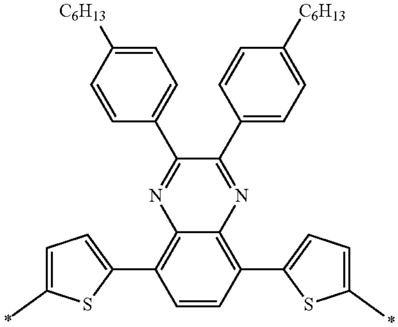
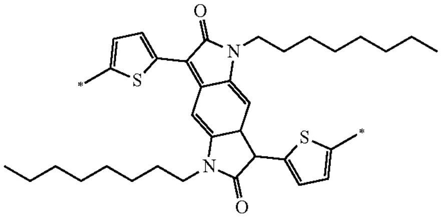
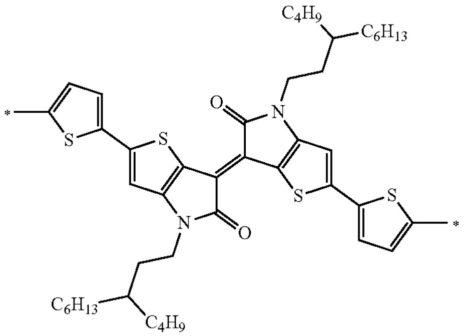
-continued
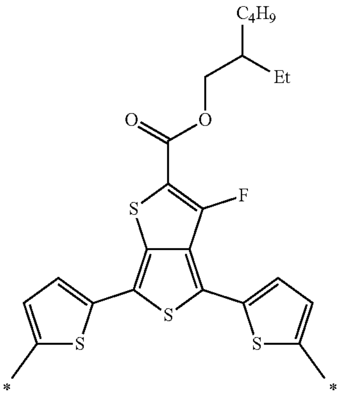
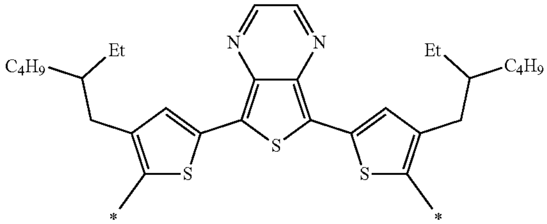
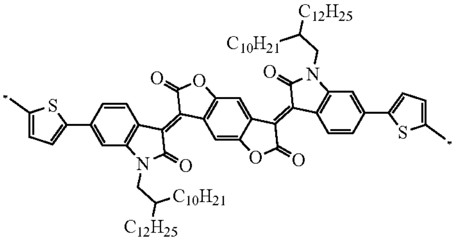
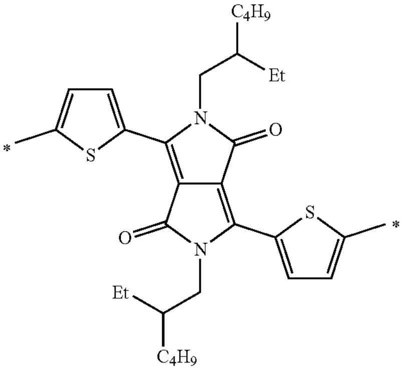
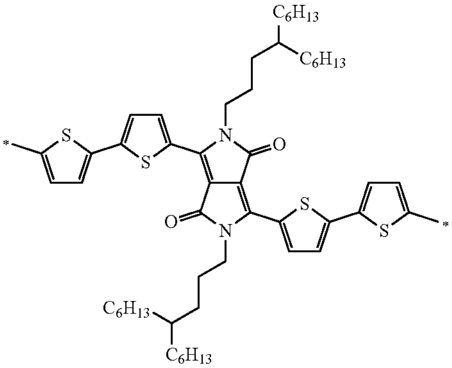

-continued
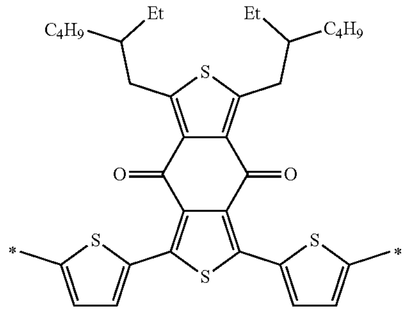
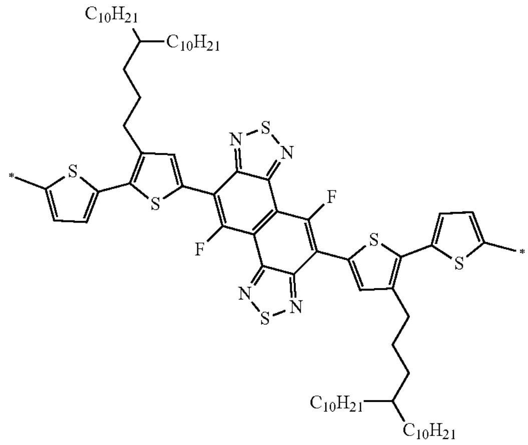
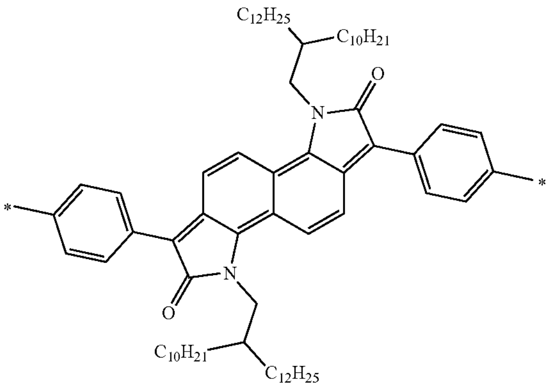
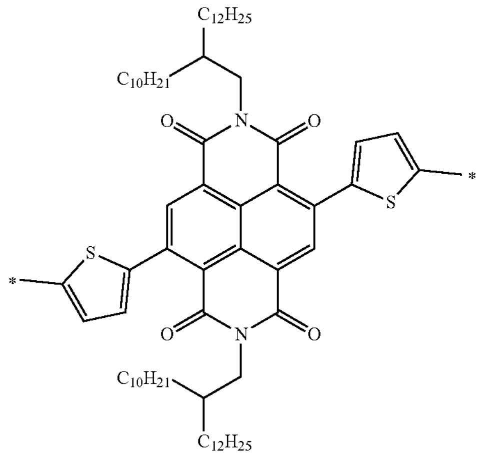
-continued
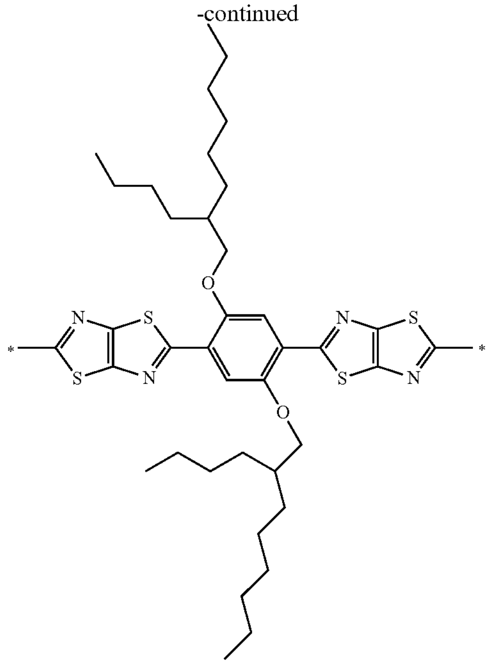
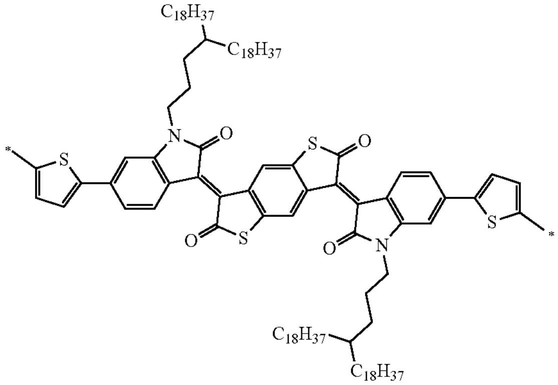
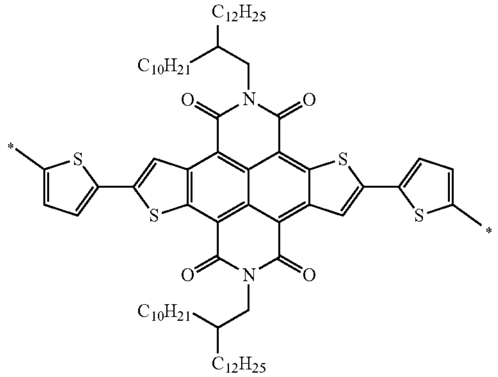
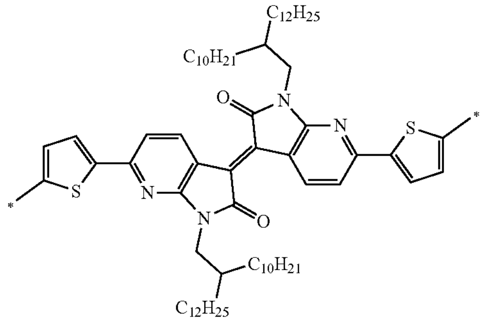

-continued
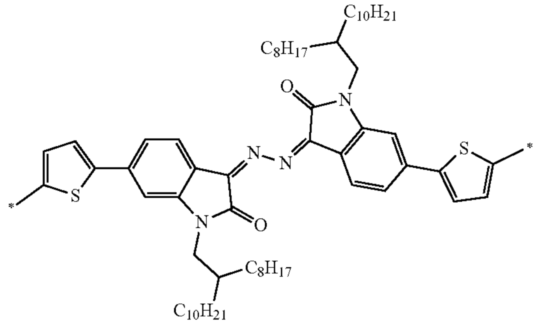
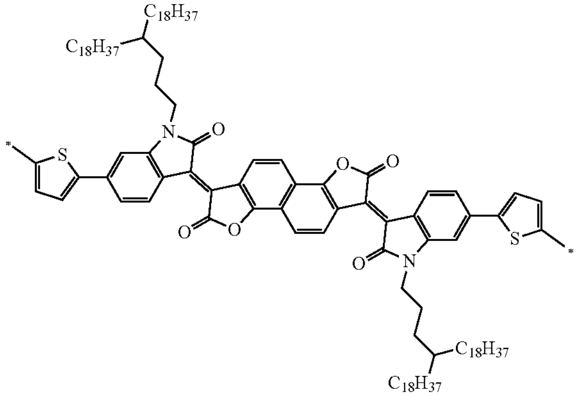
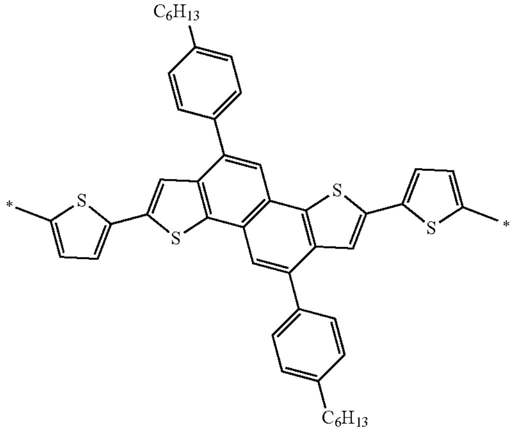
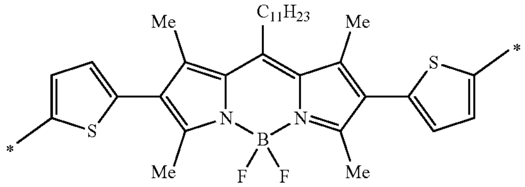
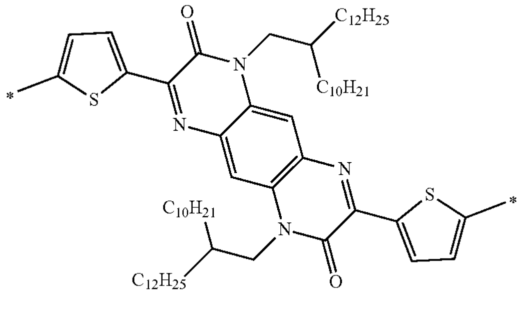
-continued
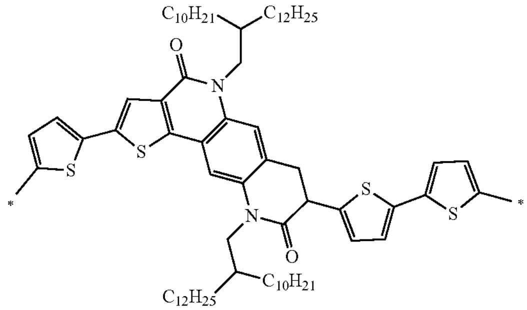
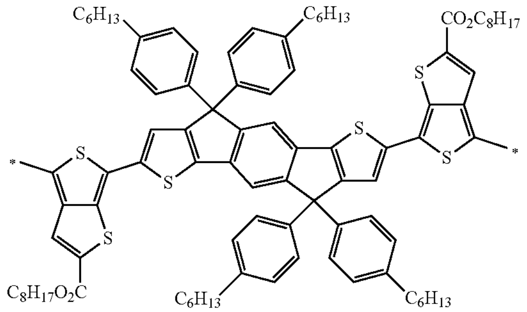
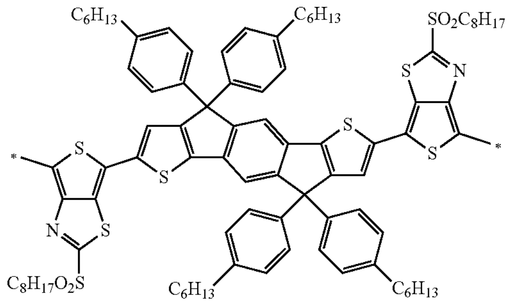
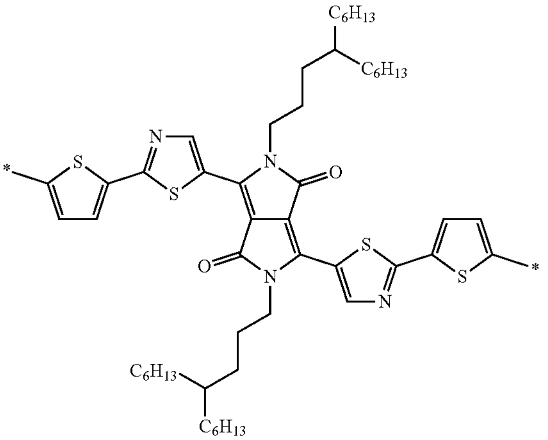

-continued

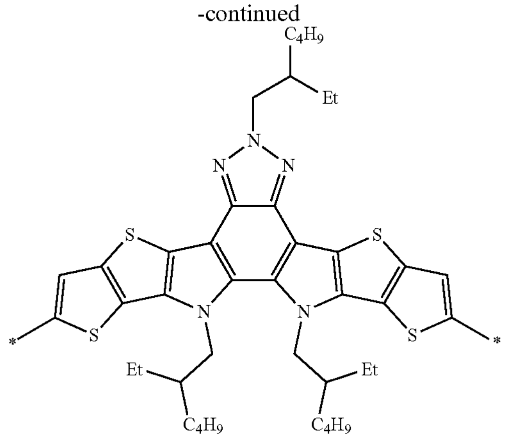

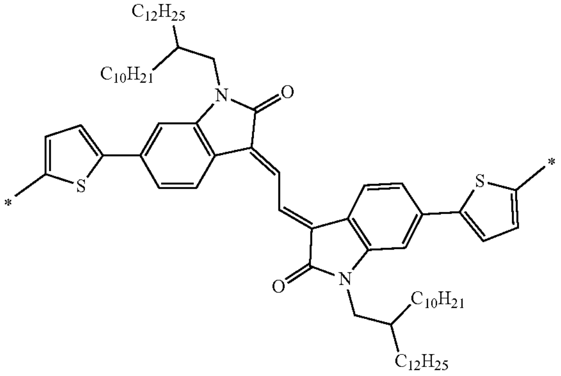

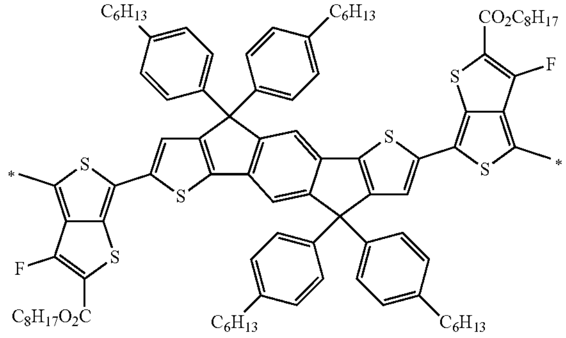

In Formula (1), $R^{11}$ and $R^{12}$ each independently represent a hydrogen atom or a monovalent substituent. The kinds of monovalent substituents represented by $R^{11}$ and $R^{12}$ are not particularly limited, and examples thereof include groups exemplified by the substituent W described later.

The monovalent substituents represented by $R^{11}$ and $R^{12}$ are each preferably an alkyl group, an aryl group, or a heteroaryl group, which may have a substituent, from the viewpoint that the effect of the present invention is more excellent.

Among these, from the viewpoint that the effect of the present invention is more excellent, $R^{11}$ and $R^{12}$ are each preferably a hydrogen atom, or an alkyl group, aryl group, or heteroaryl group, which may have a substituent, more preferably a hydrogen atom, or an alkyl group, and particularly preferably a hydrogen atom.

In Formula (1), $T^{11}$ and $T^{12}$ each independently represent a group represented by Formulae (T1) to (T3).

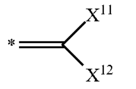

(T1)

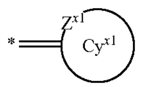

(T2)

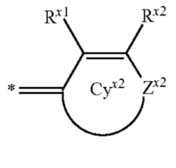

(T3)

In Formula (T1), $X^{11}$ and $X^{12}$ each independently represent —CN, —S(═O)$_2$R$^{13}$, —S(═O)R$^{13}$, —C(═O)R$^{14}$, —C(═O)OR$^{14}$, —C(═S)R$^{14}$, —C(═S)OR$^{14}$, —C(═O)SR$^{14}$, —C(═O)N(R$^{15}$)$_2$, —C(═S)N(R$^{15}$)$_2$, or —S(═O)$_2$N(R$^{15}$)$_2$.

$R^{13}$ and $R^{14}$ each independently represent a monovalent substituent. $R^{15}$ represents a hydrogen atom or a monovalent substituent. The kinds of monovalent substituents represented by $R^{13}$, $R^{14}$, and $R^{15}$ are not particularly limited, and examples thereof include groups exemplified by the substituent W described later.

From the viewpoint that the effect of the present invention is more excellent, at least one of $X^{11}$ or $X^{12}$ preferably represents —CN, and both of $X^{11}$ and $X^{12}$ more preferably represent —CN.

In Formula (T1), * represents a bonding position.

In Formula (T2), $Z^{x1}$ each independently represents >C═O, >C═S, >C═C(CN)$_2$, >S(═O)$_2$, >S(═O), >C═C[S(═O)$_2$R$^{15}$]$_2$, >C═C[S(═O)R$^{15}$]$_2$, >C═C[C(═O)R$^{15}$]$_2$, >C═C[CN][S(═O)$_2$R$^{15}$], >C═C[CN][S(═O)R$^{15}$], >C═C[CN][C(═O)R$^{15}$], >C═C[C(═O)R$^{15}$][S(═O)$_2$R$^{15}$], or >C═C[C(═O)R$^{15}$][S(═O)R$^{15}$].

$R^{15}$ represents a monovalent substituent. The kind of the monovalent substituent represented by $R^{15}$ is not particularly limited, and examples thereof include groups exemplified by the substituent W described later.

In Formula (T2), $Cy^{x1}$ represents a ring containing at least one carbon atom and a ring-constituting atom in $Z^{x1}$ described above. The above-described ring may further have a substituent. In addition, one carbon atom is intended to be a carbon atom specified in Formula (specifically, a carbon atom to which * is bonded). Furthermore, in Formula (T2), the carbon atom specified in Formula (T2) and $Z^{x1}$ are adjacent to each other. That is, for example, in a case where $Z^{x1}$ is >C═O, the carbon atom specified in Formula and a carbon atom that is the ring-constituting atom in $Z^{x1}$ are bonded to each other. $Z^{x1}$ is a group corresponding to a so-called electron-withdrawing group.

The kind of the substituent which $Cy^{x1}$ may have is not particularly limited, and examples thereof include groups exemplified by the substituent W described later.

The ring-constituting atom in $Cy^{x1}$ preferably has 2 to 15 carbon atoms, more preferably has 2 to 11 carbon atoms, and still more preferably has 2 to 9 carbon atoms.

The number of carbon atoms is a number including one carbon atom specified in Formula (T2) and one or more carbon atoms optionally included in the ring-constituting atom in $Z^{x1}$. The number of carbon atoms does not include the number of carbon atoms in a substituent that $Cy^{x1}$ can optionally have.

A ring-constituting atom in $Cy^{x1}$ may have a heteroatom, and examples of the heteroatom include a nitrogen atom, a sulfur atom, an oxygen atom, a selenium atom, a tellurium atom, a phosphorus atom, a silicon atom, and a boron atom. Among these, the nitrogen atom, the sulfur atom, or the oxygen atom is preferable. The ring-constituting atom in $Cy^{x1}$ preferably has 0 to 8 heteroatoms, more preferably has 0 to 6 heteroatoms, and still more preferably has 0 to 4 heteroatoms. The number of heteroatoms described above does not include the number of heteroatoms of the substituent that $Cy^{x1}$ may optionally have.

$Cy^{x1}$ may have a monocyclic structure or a fused ring structure. $Cy^{x1}$ is preferably a 5-membered ring, a 6-membered ring, or a fused ring containing at least any one of a 5-membered ring or a 6-membered ring. The number of rings forming the above-described fused ring is preferably 2 or 3.

In Formula (T2), * represents a bonding position.

In Formula (T3), $Z^{x1}$ has the same definition as $Z^{x2}$ in Formula (T2), and the suitable embodiment thereof is also the same.

(T1)

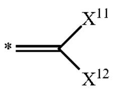

(T2)

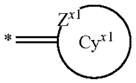

(T3)

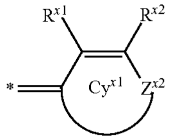

In Formula (T3), $Cy^{x2}$ represents a ring containing at least three carbon atoms and a ring-constituting atom in $Z^{x2}$ described above. The above-described ring may further have a substituent. The three carbon atoms are intended to be carbon atoms specified in Formula (specifically corresponding to a carbon atom to which * is bonded, a carbon atom to which $R^{x1}$ is bonded, and a carbon atom to which $R^{x2}$ is bonded). In addition, in Formula (T3), the carbon atom to which $R^{x2}$ is bonded and $Z^{x2}$ are adjacent to each other. That is, for example, in a case where $Z^{x2}$ is >C═O, the carbon atom to which $R^{x2}$ is bonded and a carbon atom that is the ring-constituting atom in $Z^{x2}$ are bonded to each other. $Z^{x2}$ is a group corresponding to a so-called electron-withdrawing group.

The kind of the substituent which $Cy^{x2}$ may have is not particularly limited, and examples thereof include groups exemplified by the substituent W described later.

The ring-constituting atom in $Cy^{x2}$ preferably has 4 to 11 carbon atoms, more preferably has 5 to 11 carbon atoms, and still more preferably has 5 to 7 carbon atoms. The number of carbon atoms is a number including three carbon atoms specified in Formula (T3) and one or more carbon atoms optionally included in the ring-constituting atom in $Z^{x2}$. The number of carbon atoms does not include the number of carbon atoms in a substituent that $Cy^{x1}$ can optionally have.

The ring-constituting atom in $Cy^{x2}$ may have a heteroatom, and examples of the heteroatom include a nitrogen atom, a sulfur atom, an oxygen atom, a selenium atom, a tellurium atom, a phosphorus atom, a silicon atom, and a boron atom. Among these, the nitrogen atom, the sulfur atom, or the oxygen atom is preferable, and the nitrogen atom or the oxygen atom is more preferable. The ring-constituting atom in $Cy^{x2}$ preferably has 1 to 8 heteroatoms, and more preferably has 1 to 3 heteroatoms. The number of heteroatoms described above does not include the number of heteroatoms of the substituent that $Cy^{x1}$ may optionally have.

$Cy^{x2}$ may have a monocyclic structure or a fused ring structure, but is preferably a monocyclic structure. $Cy^{x2}$ is preferably a 5-membered ring, a 6-membered ring, or a fused ring containing at least any one of a 5-membered ring or a 6-membered ring. The number of rings forming the above-described fused ring is preferably 2 or 3.

In Formula (T3), $R^{x1}$ and $R^{x2}$ each independently represent a hydrogen atom or a monovalent substituent. The kinds of monovalent substituents represented by $R^{x1}$ and $R^{x2}$ are not particularly limited, and examples thereof include groups exemplified by the substituent W described later.

In Formula (T3), * represents a bonding position.

The group represented by Formula (T2) is preferably a group represented by any of Formulae (T21) to (T26) described below, and among these, more preferably a group represented by any of Formula (T21), Formula (T22), or Formula (T25).

(T21)

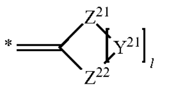

(T22)

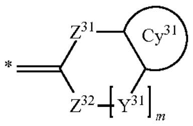

(T23)

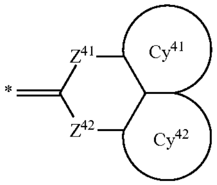

(T24)

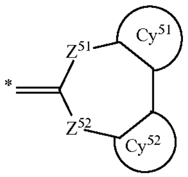

(T25)

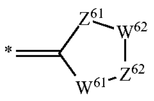

(T26)

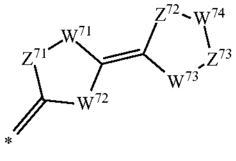

In Formulae (T21) to (T26), $Z^{21}$, $Z^{22}$, $Z^{31}$, $Z^{32}$, $Z^{41}$, $Z^{42}$, $Z^{51}$, $Z^{52}$, $Z^{61}$, $Z^{62}$, $Z^{71}$, $Z^{72}$, and $Z^{73}$ each have the same definitions as $Z^{x1}$ in Formula (T2), and the suitable embodiments thereof are also the same.

In Formula (T21), l represents an integer of 0 to 4. In a case where l represents an integer of 2 to 4, a plurality of $Y^{21}$'s in Formula (T21) may be the same or different from each other.

In Formula (T21), in a case where l represents 1, $Y^{21}$ represents $>C(R^{16})_2$, >C═O, >C═S, an oxygen atom, a sulfur atom, or $>NR^{17}$. In Formula (T21), in a case where l represents an integer of 2 to 4, $Y^{21}$ represents $>C(R^{16})_2$, $═C(R^{16})—$, ═N—, >C═O, >C═S, an oxygen atom, a sulfur atom, or $>NR^{17}$.

$R^{16}$ and $R^{17}$ each independently represent a hydrogen atom or a monovalent substituent. The kinds of monovalent substituents represented by $R^{16}$ and $R^{17}$ are not particularly limited, and examples thereof include groups exemplified by the substituent W described later.

In Formula (T22), m represents an integer of 0 to 2. In a case where m represents 2, a plurality of $Y^{31}$'s in Formula (T22) may be the same or different from each other.

In Formula (T22), in a case where m represents 1, $Y^3$ represents $>C(R^{16})_2$, >C═O, >C═S, an oxygen atom, a sulfur atom, or $>NR^{17}$. In Formula (T22), in a case where m represents 2, $Y^{31}$ represents $>C(R^{16})_2$, $═C(R^{16})—$, ═N—, >C═O, >C═S, an oxygen atom, a sulfur atom, or $>NR^{17}$.

$R^{16}$ and $R^{17}$ each independently represent a hydrogen atom or a monovalent substituent. The kinds of monovalent substituents represented by $R^{16}$ and $R^{17}$ are not particularly limited, and examples thereof include groups exemplified by the substituent W described later.

In Formula (T22), $Cy^{31}$ represents an aromatic ring containing at least two or more carbon atoms, which may have a substituent. The two carbon atoms are intended to be carbon atoms specified in Formula (specifically corresponding to a carbon atom to which $Z^{31}$ is bonded, and a carbon atom to which $Y^{31}$ is bonded).

The above-described aromatic ring may be a monocyclic ring or a polycyclic ring, and examples thereof include an aromatic hydrocarbon ring and an aromatic heterocyclic ring.

The aromatic hydrocarbon ring preferably has 6 to 15 carbon atoms, and more preferably has 6 to 10. Examples of the aromatic hydrocarbon ring include a benzene ring, a naphthalene ring, an anthracene ring, and a phenanthrene ring.

Examples of the heteroatoms contained in the aromatic heterocyclic ring (atoms other than carbon atoms and hydrogen atoms) include a sulfur atom, an oxygen atom, a nitrogen atom, and a selenium atom, and a sulfur atom, an oxygen atom, or a nitrogen atom is preferable. The number of heteroatoms contained in the aromatic heterocyclic ring is not particularly limited, but is preferably 1 to 4 and more preferably 1 or 2.

The aromatic heterocyclic ring preferably has a 5- to 15-membered ring, more preferably has a 5- to 10-membered ring, and still more preferably has a 5- or 6-membered ring. Examples of the aromatic heterocyclic ring preferably include furan, thiophene, selenophene, pyrrole, thiazole, isothiazole, oxazole, isoxazole, thiadiazole, oxadiazole, imidazole, pyrazole, triazole, pyridine, pyrimidine, pyridazine, pyrazine, triazine, tetrazine, quinoline, isoquinoline, quinoxaline, quinazoline, cinnoline, phthalazine, acridine, thienothiophene, thienothiazole, thienooxazole, thienoimidazole, thienopyrazole, benzothiophene, benzothiazole, benzoxazole, benzoimidazole, benzopyrazole, benzotriazole, benzothiazol, benzoxadiazole, or benzoselenodiazole.

The kind of the substituent which $Cy^{31}$ may have is not particularly limited, and examples thereof include groups exemplified by the substituent W described later.

In Formula (T23), $Cy^{41}$ represents an aromatic ring containing at least three or more carbon atoms, which may have a substituent. The three carbon atoms are intended to be carbon atoms specified in Formula (specifically, corresponding to a carbon atom to which $Z^{41}$ is bonded, and two carbon atoms shared by $Cy^{41}$ and $Cy^{42}$). In addition, $Cy^{42}$ represents an aromatic ring containing at least three or more carbon atoms, which may have a substituent. The three carbon atoms are intended to be carbon atoms specified in Formula (specifically, corresponding to a carbon atom to which $Z^{42}$ is bonded, and two carbon atoms shared by $Cy^{41}$ and $Cy^{42}$).

The aromatic rings represented by $Cy^{41}$ and $Cy^{42}$ have the same definition as the aromatic ring represented by $Cy^{31}$ described above. In a case where the aromatic rings represented by $Cy^{41}$ and $Cy^{42}$ are each aromatic hydrocarbon, the suitable embodiments thereof are the same as the suitable embodiments of $Cy^{31}$ described above.

In a case where the aromatic rings represented by $Cy^{41}$ and $Cy^{42}$ are each an aromatic heterocyclic ring, examples of the aromatic heterocyclic ring preferably include furan, thiophene, selenophene, pyrrole, isothiazole, isoxazole, pyrazole, pyridine, pyrimidine, pyridazine, triazine, quinoline, isoquinoline, quinoxaline, quinazoline, cinnoline, phthalazine, acridine, benzothiophene, benzothiazole, benzoxazole, benzoimidazole, benzopyrazole, benzotriazole, benzothiadiazole, benzoxadiazole, or benzoselenodiazole.

The kinds of the substituents which $Cy^{41}$ and $Cy^{42}$ may have are not particularly limited, and examples thereof include groups exemplified by the substituent W described later.

In Formula (T24), $Cy^{51}$ each independently represents an aromatic ring containing at least two or more carbon atoms, which may have a substituent. The two carbon atoms are intended to be carbon atoms specified in Formula (specifically corresponding to a carbon atom to which $Z^{51}$ is bonded, and a carbon atom adjacent to the carbon atom). In addition, $Cy^{52}$ each independently represents an aromatic ring containing at least two or more carbon atoms, which may have a substituent. The two carbon atoms are intended to be carbon atoms specified in Formula (specifically corresponding to a carbon atom to which $Z^{52}$ is bonded, and a carbon atom adjacent to the carbon atom).

The aromatic rings represented by $Cy^{51}$ and $Cy^{52}$ have the same definition as the aromatic ring represented by $Cy^{31}$ described above, and the suitable embodiments thereof are also the same.

The kinds of the substituents which $Cy^{51}$ and $Cy^{52}$ may have are not particularly limited, and examples thereof include groups exemplified by the substituent W described later.

In Formula (T25) and Formula (T26), $W^{61}$, $W^{62}$, and $W^{71}$ to $W^{74}$ each independently represent $>C(R^{18})_2$, an oxygen atom, a sulfur atom, or $>NR^{19}$.

$R^{18}$ and $R^{19}$ each independently represent a hydrogen atom or a monovalent substituent. The kinds of monovalent substituents represented by $R^{18}$ and $R^{19}$ are not particularly limited, and examples thereof include groups exemplified by the substituent W described later.

Among these, the group represented by Formula (T3) is preferably a group represented by Formula (T31).

(T31)

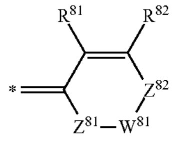

In Formula (T31), $Z^{81}$ and $Z^{82}$ each independently have the same definition as $Z^{x2}$ in Formula (T3), and the suitable embodiments thereof are also the same.

In Formula (T31), $W^{81}$ represents >$C(R^{20})_2$, an oxygen atom, a sulfur atom, or >$NR^{21}$.

$R^{20}$ and $R^{21}$ each independently represent a hydrogen atom or a monovalent substituent. The kinds of monovalent substituents represented by $R^{20}$ and $R^{21}$ are not particularly limited, and examples thereof include groups exemplified by the substituent W described later.

In Formula (T31), $R^{81}$ and $R^{82}$ each independently represent a hydrogen atom or a monovalent substituent. The kinds of monovalent substituents represented by $R^{81}$ and $R^{82}$ are not particularly limited, and examples thereof include groups exemplified by the substituent W described later.

As Formula (T2) and Formula (T3), derivatives of coloring agents that are usually used as acidic nuclei in merocyanine coloring agents can also be used. Examples of the coloring agents include as follows:

(a) 1,3-dicarbonyl nuclei: for example, a 1,3-indandione nucleus, 1,3-cyclohexanedione, 5,5-dimethyl-1,3-cyclohexanedione, 1,3-dioxane-4,6-dione, and the like;

(b) pyrazolinone nuclei: for example, 1-phenyl-2-pyrazolin-5-one, 3-methyl-1-phenyl-2-pyrazolin-5-one, 1-(2-benzothiazolyl)-3-methyl-2-pyrazolin-5-one, and the like;

(c) isoxazolinone nuclei: for example, 3-phenyl-2-isoxazolin-5-one, 3-methyl-2-isoxazolin-5-one, and the like;

(d) oxindole nuclei: for example, 1-alkyl-2,3-hydro-2-oxindole, and the like;

(e) 2,4,6-trioxohexahydropyrimidine nuclei: for example, barbituric acid or 2-thibarbituric acid and derivatives thereof, and the like. Examples of the derivatives include 1-alkyl compounds such as 1-methyl and 1-ethyl, 1,3-dialkyl compounds such as 1,3-dimethyl, 1,3-diethyl, 1,3-dibutyl, 1,3-diaryl compounds such as 1,3-diphenyl, 1,3-di(p-chlorophenyl), 1,3-di(p-ethoxycarbonylphenyl), 1-alkyl-1-aryl compounds such as 1-ethyl-3-phenyl, 1,3-diheteroaryl compounds such as 1,3-di(2-pyridyl), and the like;

(f) 2-thio-2,4-thiazolidinedione nuclei: for example, rhodanine and derivatives thereof, and the like. Examples of the derivatives include 3-aklylrhodanine such as 3-methylrhodanine, 3-ethylrhodanine, 3-allylrhodanine, 3-arylrhodanine such as 3-phenylrhodanine, 3-heteroarylrhodanine such as 3-(2-pyridyl)rhodanine, and the like;

(g) 2-thio-2,4-oxazolidinedione (2-thio-2,4-(3H,5H)-oxazoledione nuclei: for example, 3-ethyl-2-thio-2,4-oxazolidinedione, and the like;

(h) thianaphthenone nuclei: for example, 3(2H)-thianaphthenone-1,1-dioxide, and the like;

(i) 2-thio-2,5-thiazolidinedione nuclei: for example, 3-ethyl-2-thio-2,5-thiazolidinedione, and the like;

(j) 2,4-thiazolidinedione nuclei: for example, 2,4-thiazolidinedione, 3-ethyl-2,4-thiazolidinedione, 3-phenyl-2,4-thiazolidinedione, and the like;

(k) thiazoliin-4-one nuclei: for example, 4-thiazolinone, 2-ethyl-4-thiazolinone, and the like;

(l) 2,4-imidazolidinedione (hydantoin) nuclei: for example, 2,4-imidazolidinedione, 3-ethyl-2,4-imidazolidinedione, and the like;

(m) 2-thio-2,4-imidazolidinedione (2-thiohydantoin) nuclei: for example, 2-thio-2,4-imidazolidinedione, 3-ethyl-2-thio-2,4-imidazolidinedione, and the like;

(n) imidazolin-5-one nuclei: for example, 2-propylmercapto-2-imidazolin-5-one, and the like;

(o) 3,5-pyrazolidinedione nuclei: for example, 1,2-diphenyl-3,5-pyrazolidinedione, 1,2-dimethyl-3,5-pyrazolidinedione, and the like;

(p) benzothiophen-3(2H)-one nuclei: for example, benzothiophen-3(2H)-one, oxobenzothiophen-3(2H)-one, dioxobenzothiophen-3(2H)-one, and the like;

(q) indanone nuclei: for example, 1-indanone, 3-phenyl-1-indanone, 3-methyl-1-indanone, 3,3-diphenyl-1-indanone, 3,3-dimethyl-1-indanone, and the like;

(r) benzofuran-3-(2H)-one nucleus: for example, benzofuran-3-(2H)-one, and the like;

(s) 2,2-dihydrophenalene-1,3-dione nucleus, and the like.

In Formula (1), from the viewpoint that the effect of the present invention is more excellent, it is preferable that both $T^{11}$ and $T^{12}$ represent a group represented by Formula (T1), and it is more preferable that both $T^{11}$ and $T^{12}$ represent a group represented by Formula (T1), and at least one of $X^{11}$ and $X^{12}$ in Formula (T1) represents —CN, and it is still more preferable that both $T^{11}$ and $T^{12}$ represent a group represented by Formula (T1), and $X^{11}$ and $X^{12}$ in Formula (T1) represent —CN.

In Formula (1), $Q^{11}$ and $Q^{12}$ each independently represent a quinoid-type conjugate linking group represented by Formula (Q).

(Q)

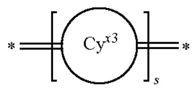

In Formula (Q), $Cy^{x3}$ represents a 5- to 10-membered ring containing at least one or more double bonds. * represents a bonding position. s represents an integer of 1 to 10.

The quinoid-type conjugate linking group represented by Formula (Q) is intended to be a divalent linking group having a conjugated system formed between one bonding position and the other bonding position and a quinoid structure contributing to the above-described conjugated system.

Here, the quinoid structure is a structure that is in a resonance state with a radical singlet, and for example, the following structure is intended.

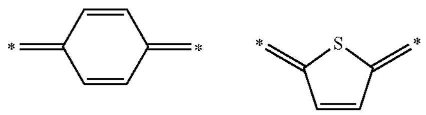

A ring represented by $Cy^{x3}$ may have a monocyclic structure or a fused ring structure. The ring represented by $Cy^{x3}$ is preferably a 5-membered ring, a 6-membered ring, or a fused ring containing at least any one of a 5-membered ring or a 6-membered ring. The number of rings forming the above-described fused ring is preferably 2.

In addition, in a case where the ring represented by $Cy^{x3}$ has a fused ring structure, the ring represented by $Cy^{x3}$ preferably has a structure formed by a 5- or 6-membered monocyclic ring that forms a quinoid structure and another ring being fused, as in Formulae (Q4) and (Q8) described later, for example.

The ring represented by $Cy^{x3}$ is preferably a hydrocarbon ring or a heterocyclic ring containing at least one or more double bonds.

In a case where the ring represented by $Cy^{x3}$ is a 5-membered ring, it is preferable that the ring represented by $Cy^{x3}$ contains one double bond. In addition, in a case where the ring represented by $Cy^{x3}$ is a 6-membered ring, it is preferable that the ring represented by $Cy^{x3}$ contains two double bonds.

In a case where the ring represented by $Cy^{x3}$ is a heterocyclic ring, for example, the ring preferably contains a heteroatom such as a sulfur atom, an oxygen atom, a selenium atom, or a nitrogen atom, and a sulfur atom is more preferable.

In addition, the ring represented by $Cy^{x3}$ may further have a substituent. The kind of the substituent is not particularly limited, and examples thereof include groups exemplified by the substituent W described later.

s is preferably 1 to 6 and more preferably 1 to 3.

In Formula (Q), in a case where s is an integer of 2 or more, and a plurality of $Cy^{x3}$'s are present, s $Cy^{x3}$'s are fused with each other to form a fused product. The form of the fused ring is not particularly limited.

Here, in a case where s $Cy^{x3}$'s in Formula (Q) are represented as N1 to Ns numbers from one double bond toward the other double bond, Formula (Q) satisfies conditions (A) to (D) as follows:

(A) in a case where s represents 1, $Cy^{x3}$ of $N_1$ forms a quinoid structure together with two double bonds (corresponding to the double bonds specified in Formula (Q)) bonded to $Cy^{x3}$ of $N_1$;

(B) in a case where s represents 2, $Cy^{x3}$ of $N_1$ and $Cy^{x3}$ of $N_2$ are fused with each other, $Cy^{x3}$ of $N_1$ forms a quinoid structure together with a double bond (corresponding to one double bond specified in Formula (Q)) bonded to $Cy^{x3}$ of $N_1$ and a double bond contained in $Cy^{x3}$ of $N_2$, and $Cy^{x3}$ of $N_2$ forms a quinoid structure together with a double bond contained in $Cy^{x3}$ of $N_1$ and contributing to the formation of the quinoid structure by $Cy^{x3}$ of $N_1$, and a double bond (corresponding to the other double bond specified in Formula (Q)) bonded to $Cy^{x3}$ of $N_2$;

(C) in a case where s represents an integer of 3 or more, $Cy^{x3}$'s of $N_1$ to $N_s$ are fused with each other, $Cy^{x3}$ of $N_1$ forms a quinoid structure together with a double bond (corresponding to a double bond specified in Formula (Q)) bonded to $Cy^{x3}$ of $N_1$ and a double bond contained in $Cy^{x3}$ of $N_2$, and in a case where t is an integer of 2 to (s−1), $Cy^{x3}$'s of $N_t$ each form a quinoid structure together with a double bond contained in $Cy^{x3}$ of $N_{t-1}$ and contributing to a formation of a quinoid structure by $Cy^{x3}$ of $N_{t-1}$ and a double bond contained in $Cy^{x3}$ of $N_{t+1}$, and $Cy^{x3}$ of $N_s$ forms a quinoid structure together with a double bond contained in $Cy^{x3}$ of $N_{s-1}$ and contributing to a formation of a quinoid structure by $Cy^{x3}$ of $N_{s-1}$, and a double bond (corresponding to the other double bond specified in Formula (Q)) bonded to $Cy^{x3}$ of $N_s$; and (D) Formula (Q) does not contain the following structures.

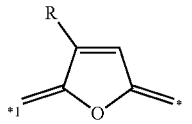

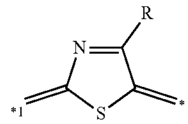

In Formulae, R represents an organic group. *1 represents a bonding position with $T^{11}$ or $T^{12}$. * represents the other bonding position.

The condition (C) will be described. For example, in a case where Formula (Q) represents a quinoid-type conjugate linking group represented by Formula (Q7) described later, and fused rings in Formula (Q7) are numbered $N_1$, $N_2$, and $N_3$ in order from a bonding position * on the left end, a ring of $N_1$ forms a quinoid structure together with a double bond on the left end and a double bond (a double bond formed between a carbon atom and $Y^{155}$ adjacent to the carbon atom) contained in a ring of $N_2$. The ring of $N_2$ is contained in the ring of $N_1$ and forms a quinoid structure together with a double bond (a double bond formed between a carbon atom and $Y^{151}$ adjacent to the carbon atom) contributing to the formation of the quinoid structure of the ring of $N_1$ and a double bond (a double bond formed between a carbon atom and $Y^{158}$ adjacent to the carbon atom) contained in the ring of $N_3$. The ring of $N_3$ is contained in the ring of $N_2$ and forms a quinoid structure together with a double bond (a double bond formed between a carbon atom and $Y^{154}$ adjacent to the carbon atom) contributing to the formation of the quinoid structure of the ring of $N_2$ and a double bond on the left end.

Among these, $Q^{11}$ and $Q^{12}$ are preferably quinoid-type conjugate linking groups selected from the group consisting of Formulae (Q1) to (Q11).

(Q1)

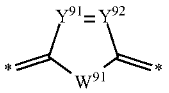

(Q2)

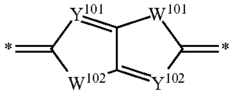

(Q3)

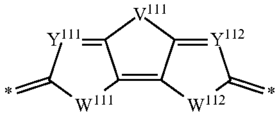

(Q4)

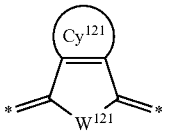

(Q5)

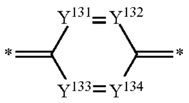

(Q6)

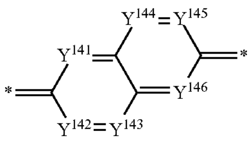

-continued (Q7)

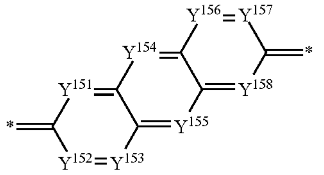

(Q8)

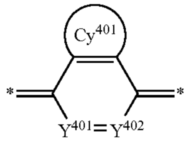

(Q9)

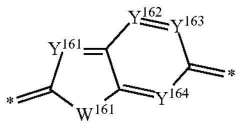

(Q10)

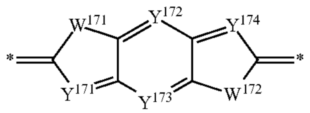

(Q11)

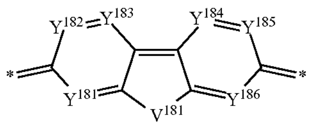

In Formula (Q1), $W^{91}$ represents a sulfur atom, a selenium atom, or >$NR^L$.

In Formulae (Q2) to (Q4), (Q9), and (Q10), $W^{101}$, $W^{102}$, $W^{111}$, $W^{112}$, $W^{121}$, $W^{161}$, $W^{171}$, and $W^{172}$ each independently represent a sulfur atom, an oxygen atom, a selenium atom, or >$NR^L$.

$R^L$ represents a hydrogen atom or a monovalent substituent. The kind of the monovalent substituent represented by $R^L$ is not particularly limited, and examples thereof include groups exemplified by the substituent W described later.

In Formulae (Q1) to (Q3) and Formulae (Q5) to (Q11), $Y^{91}$, $Y^{92}$, $Y^{101}$, $Y^{102}$, $Y^{111}$, $Y^{112}$, $Y^{131}$ to $Y^{134}$, $Y^{141}$ to $Y^{146}$, $Y^{151}$ to $Y^{158}$, $Y^{401}$, $Y^{402}$, $Y^{161}$ to $Y^{164}$, $Y^{171}$ to $Y^{174}$ and $Y^{181}$ to $Y^{186}$ each independently represent $=C(R^M)-$ or a nitrogen atom.

$R^M$ represents a hydrogen atom or a monovalent substituent. The kind of the monovalent substituent represented by $R^M$ is not particularly limited, and examples thereof include groups exemplified by the substituent W described later.

In Formula (Q4), $Cy^{121}$ represents an aromatic ring containing at least two carbon atoms, which may have a substituent. In addition, two carbon atoms are intended to be carbon atoms specified in Formula (specifically, two carbon atoms adjacent to a carbon atom to which * is bonded).

The above-described aromatic ring may be a monocyclic ring or a polycyclic ring, and examples thereof include an aromatic hydrocarbon ring and an aromatic heterocyclic ring.

The aromatic hydrocarbon ring preferably has 6 to 15 carbon atoms, and more preferably has 6 to 10. Examples of the aromatic hydrocarbon ring include a benzene ring and a naphthalene ring.

Examples of the heteroatoms contained in the aromatic heterocyclic ring (atoms other than carbon atoms and hydrogen atoms) include a sulfur atom, an oxygen atom, a nitrogen atom, and a selenium atom, and a sulfur atom, an oxygen atom, or a nitrogen atom is preferable. The number of heteroatoms contained in the aromatic heterocyclic ring is not particularly limited, but is preferably 1 to 4 and more preferably 1 or 2.

The aromatic heterocyclic ring preferably has a 5- to 10-membered ring, more preferably has a 5- or 6-membered ring. Examples of the aromatic heterocyclic ring preferably include furan, thiophene, selenophene, pyrrole, thiazole, isothiazole, oxazole, isoxazole, thiadiazole, oxadiazole, imidazole, pyrazole, triazole, pyridine, pyrimidine, pyridazine, pyrazine, triazine, or tetrazine.

The kind of the substituent which $Cy^{121}$ may have is not particularly limited, and examples thereof include groups exemplified by the substituent W described later.

In Formula (Q8), $Cy^{401}$ represents an aromatic ring containing at least two carbon atoms, which may have a substituent. In addition, two carbon atoms are intended to be carbon atoms specified in Formula (specifically, two carbon atoms adjacent to a carbon atom to which * is bonded). The aromatic ring has the same definition as the aromatic ring represented by $Cy^{121}$, and the suitable embodiments thereof are also the same.

In Formulae (Q3) and (Q11), $V^{111}$ and $V^{181}$ each independently represent a sulfur atom, an oxygen atom, a selenium atom, >$NR^{2L}$, >$C(R^{2L})_2$, >$Si(R^{2L})_2$, or >$Ge(R^{2L})_2$.

$R^{2L}$ represents a hydrogen atom or a monovalent substituent. The kind of a monovalent substituent represented by $R^{2L}$ is not particularly limited, examples thereof include a group exemplified for a substituent W described later, and an alkyl group, an aryl group, or a heteroaryl group, which may have a substituent, is preferable.

In Formulae (Q1) to (Q11), * represents a bonding position.

Here, in Formula (Q1), in order to further prevent the inhibition of the effect of the present invention due to steric hindrance, in a case where $W^{91}$ represents a sulfur atom, one of $Y^{91}$ and $Y^{92}$ represents $=CR^M$, and the other one represents a nitrogen atom, $R^M$ preferably represents a hydrogen atom.

In Formula (1), $Q^{11}$ and $Q^{12}$ each independently preferably represent a quinoid-type conjugate linking group represented by any of Formulae (Q1) to (Q5) from the viewpoint that the effect of the present invention is more excellent.

In Formula (1), n11 and n12 each independently represent an integer of 1 or more.

Among n11 and n12, either n11 or n12 representing an integer of 1 to 6 is preferable, either n11 or n12 representing an integer of 1 to 3 is more preferable, and either n11 or n12 representing an integer of 1 or 2 is still more preferable.

<<Substituent W>>

A substituent W in the present specification will be described below.

Examples of the substituent W include a halogen atom, an alkyl group (including a cycloalkyl group, a bicycloalkyl group, and a tricycloalkyl group), an alkenyl group (including a cycloalkenyl group and a bicycloalkenyl group), an alkynyl group, an aryl group, a heterocyclic group (may also be referred to as a heterocyclic group), a cyano group, a hydroxy group, a nitro group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or an arylsulfonylamino group, a mercapto group, an alkylthio group, an arylthio group, a heterocyclic thio group, a sulfamoyl group, an alkyl or an arylsulfinyl group, an alkyl or an arylsulfonyl group, an acyl group, an aryloxycarbonyl group, an alkoxycarbonyl group, a carbamoyl group, an aryl or a heterocyclic azo group, an imide group, a phosphino group, a phosphinyl group, a phosphinyloxy group, a phosphinylamino group, a phosphono group, a silyl group, a hydrazino group, a ureido group, a boronate group ($—B(OH)_2$), and other known substituents.

In addition, the substituent W may be further substituted with another substituent W. For example, an alkyl group may be substituted with a halogen atom.

The details of the substituent W are described in paragraph [0023] of JP2007-234651A.

However, as described above, the specific compound does not contain any of a carboxy group and a salt of the carboxy group, a phosphoric acid group and a salt of the phosphoric acid group, and a sulfonic acid group and a salt of the sulfonic acid group, from the viewpoint of avoiding deterioration of the vapor deposition suitability and charge transporting properties.

<<Alkyl Group, Aryl Group, or Heteroaryl Group which Specific Compound (Compound Represented by Formula (1)) May Have>>

Hereinafter, a suitable embodiment of an alkyl group, an aryl group, or a heteroaryl group which the specific compound (compound represented by Formula (1)) may have will be described. In other words, in a case where the specific compound (compound represented by Formula (1)) contains an alkyl group, an aryl group, or a heteroaryl group in its structure, the above-described alkyl group, aryl group, or heteroaryl group contained in the structure preferably has the following embodiments.

The number of carbon atoms of an alkyl group contained in the specific compound (compound represented by Formulae (1)) is not particularly limited, but the alkyl group preferably has 1 to 30 carbon atoms, and more preferably has 1 to 20 carbon atoms. The alkyl group may be any of linear, branched, or cyclic. In addition, the alkyl group may be substituted with a substituent (for example, a substituent W).

Examples of the alkyl group include a methyl group, an ethyl group, a n-propyl group, an i-propyl group, a n-butyl group, a t-butyl group, a n-hexyl group, a cyclohexyl group, a 2-ethylhexyl group, a 3, 7-dimethyloctyl group, a n-octyl group, a n-decyl group, a n-dodecyl group, a 2-butyloctyl group, a 2-hexyloctyl group, a 2-hexyldodecyl group, a 2-octyldodecyl group, a 2-decyltetradecyl group, a 4-hexyldecyl group, and other alkyl groups.

The number of carbon atoms of an aryl group contained in the specific compound (compound represented by Formulae (1)) is not particularly limited, but the aryl group preferably has 6 to 30 carbon atoms, more preferably has 6 to 18 carbon atoms, and still more preferably has 6 carbon atoms. The aryl group may have a monocyclic structure or a fused ring structure (condensed ring structure) in which two or more rings are fused to form a ring. In addition, the aryl group may be substituted with a substituent (for example, a substituent W).

Examples of the aryl group include a phenyl group, a naphthyl group, an anthryl group, a pyrenyl group, a phenanthrenyl group, a methylphenyl group, a dimethylphenyl group, a biphenyl group, a fluorenyl group, and the like, and a phenyl group, a naphthyl group, or an anthryl group is preferable.

The number of carbon atoms of a heteroaryl group contained in the specific compound (compound represented by Formulae (1)) is not particularly limited, but the heteroaryl group (monovalent aromatic heterocyclic group) preferably has 3 to 30 carbon atoms, and more preferably has 3 to 18 carbon atoms. The heteroaryl group may be substituted with a substituent (for example, a substituent W).

The heteroaryl group contains a heteroatom in addition to a carbon atom and a hydrogen atom. Examples of the heteroatom include a sulfur atom, an oxygen atom, a nitrogen atom, a selenium atom, a tellurium atom, a phosphorus atom, a silicon atom, and a boron atom, and a sulfur atom, an oxygen atom, or a nitrogen atom is preferable.

The number of heteroatoms of the heteroaryl group is not particularly limited, but is usually about 1 to 10, preferably 1 to 4, and more preferably 1 and 2.

The number of ring members of the heteroaryl group is not particularly limited, but is preferably 3 to 8, more preferably 5 to 7, and still more preferably 5 to 6. The heteroaryl group may have a monocyclic structure or a fused ring structure (fused ring structure) in which two or more rings are fused to form a ring. In a case of a fused ring structure, an aromatic hydrocarbon ring having no heteroatom (for example, a benzene ring) may be contained.

Examples of the heteroaryl group include a pyridyl group, a quinolyl group, an isoquinolyl group, an acridinyl group, a phenanthridinyl group, a pteridinyl group, a pyrazinyl group, a quinoxalinyl group, a pyrimidinyl group, a quinazolyl group, a pyridazinyl group, a cinnolinyl group, a phthalazinyl group, a triazinyl group, an oxazolyl group, a benzoxazolyl group, a thiazolyl group, a benzothiazolyl group, an imidazolyl group, a benzimidazolyl group, a pyrazolyl group, an indazolyl group, an isoxazolyl group, a benzisoxazolyl group, an isothiazolyl group, a benzisothiazolyl group, an oxadiazolyl group, a thiadiazolyl group, a triazolyl group, a tetrazolyl group, a furyl group, a benzofuryl group, a thienyl group, a benzothienyl group, a dibenzofuryl group, a dibenzothienyl group, a pyrrolyl group, an indolyl group, an imidazopyridinyl group, a carbazolyl group, and the like.

Hereinafter, specific examples of the specific compound will be described, but the specific compound is not limited thereto.

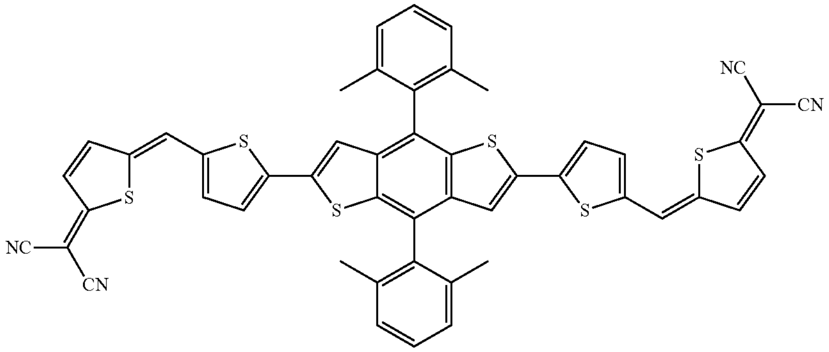
Molecular Weight: 879.18
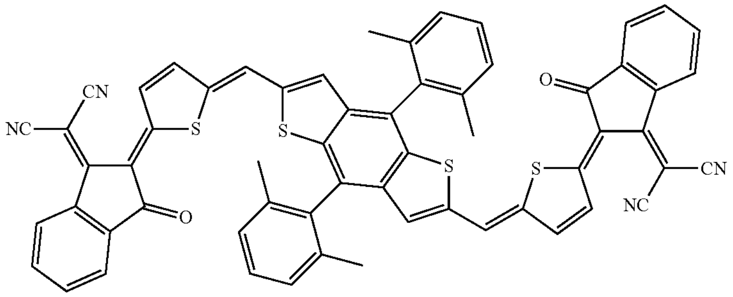
Molecular Weight: 971.20
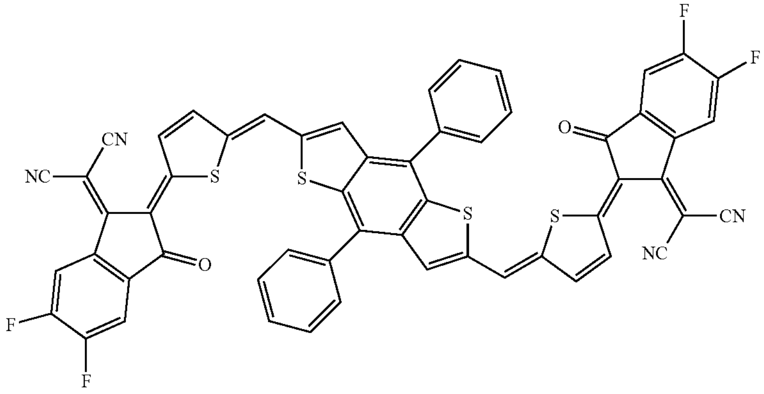
Molecular Weight: 987.05
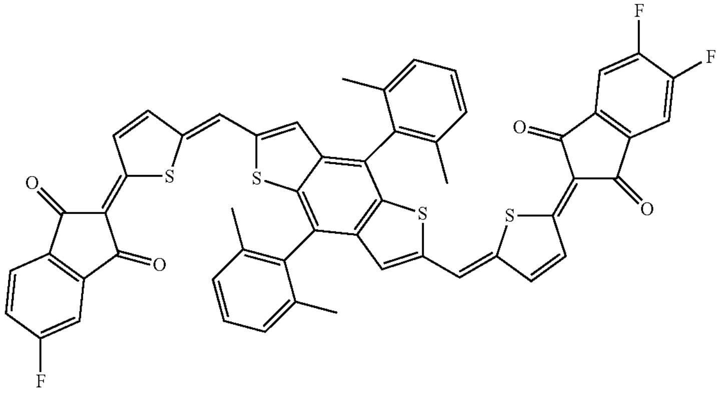
Molecular Weight: 929.07

-continued
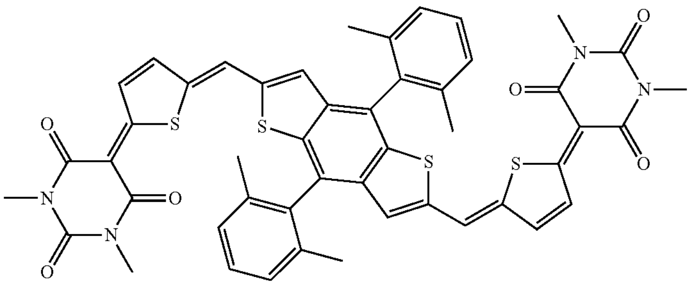
Molecular Weight: 895.09
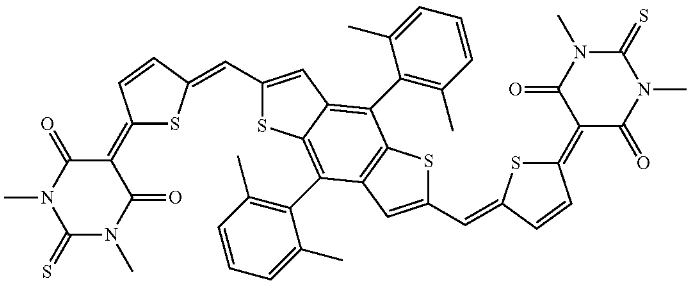
Molecular Weight: 927.22
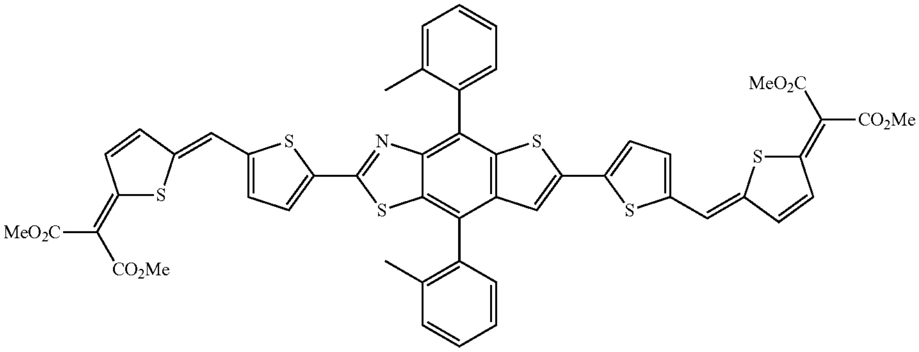
Molecular Weight: 984.22
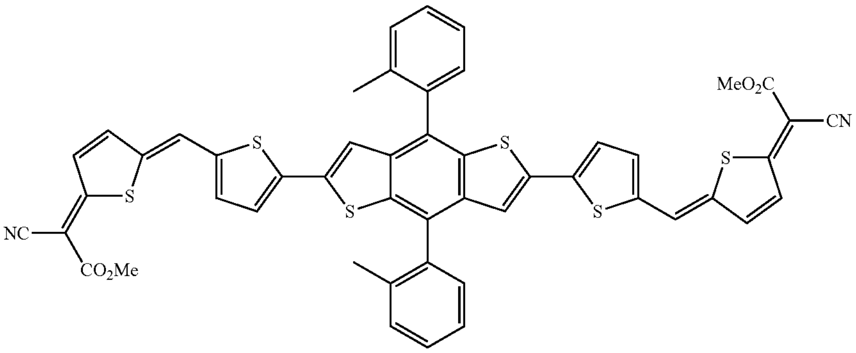
Molecular Weight: 917.18

-continued
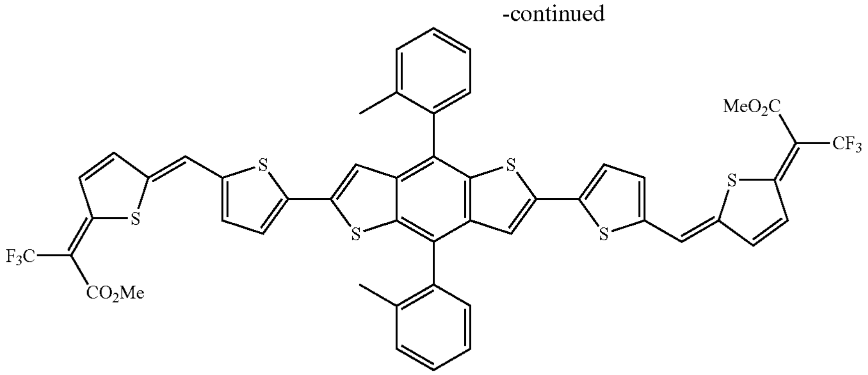
Molecular Weight: 1003.15
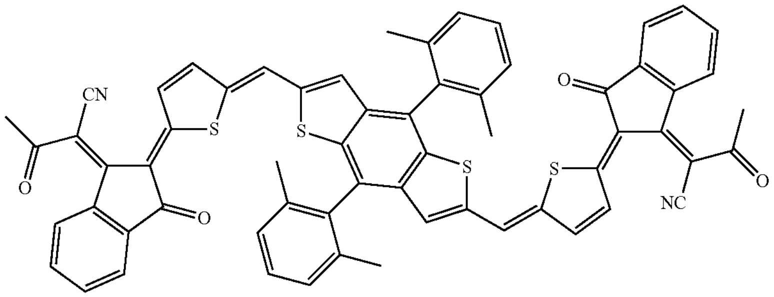
Molecular Weight: 1005.25
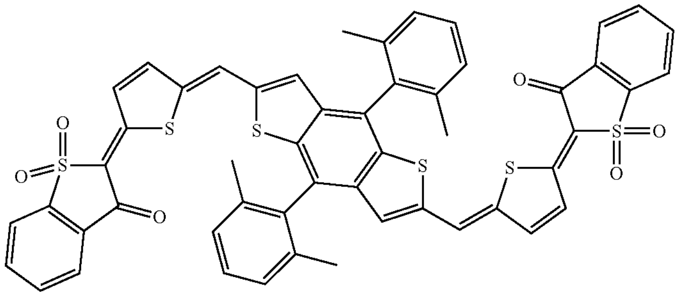
Molecular Weight: 947.20
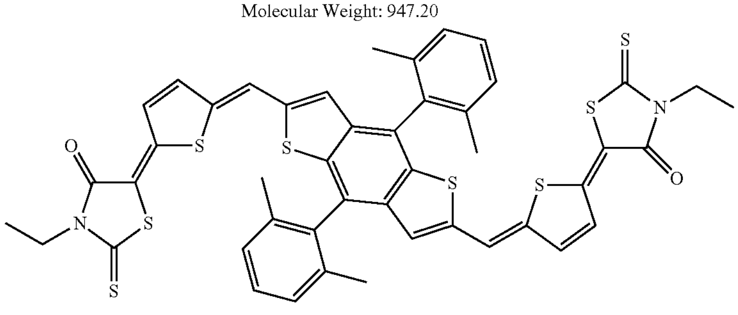
Molecular Weight: 905.29
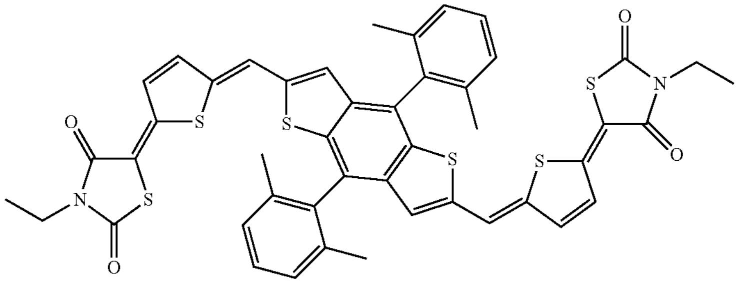
Molecular Weight: 873.16

-continued
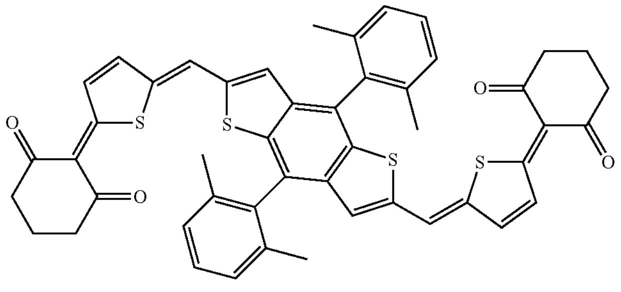
Molecular Weight: 807.07
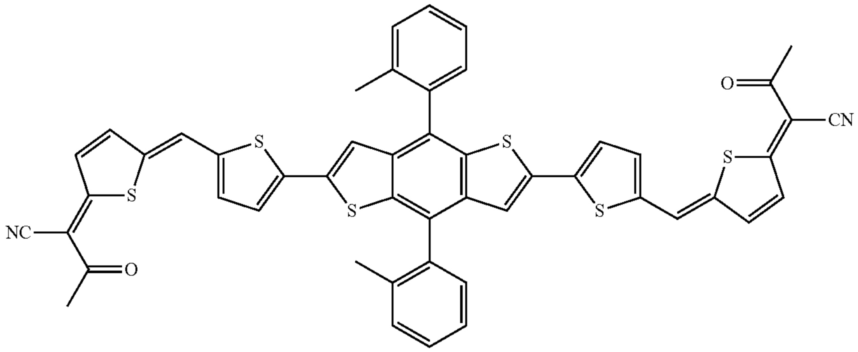
Molecular Weight: 885.18
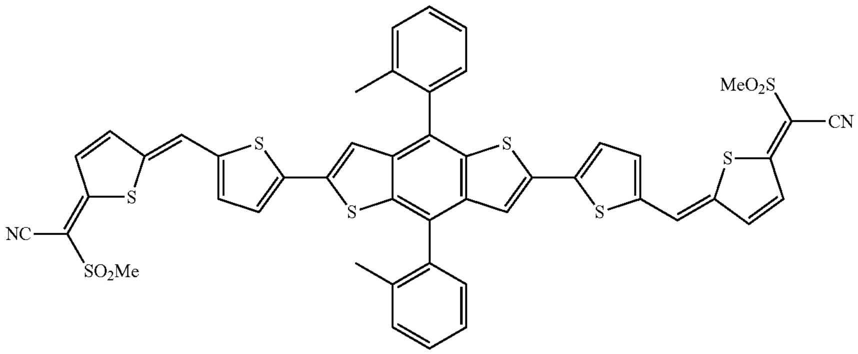
Molecular Weight: 957.27
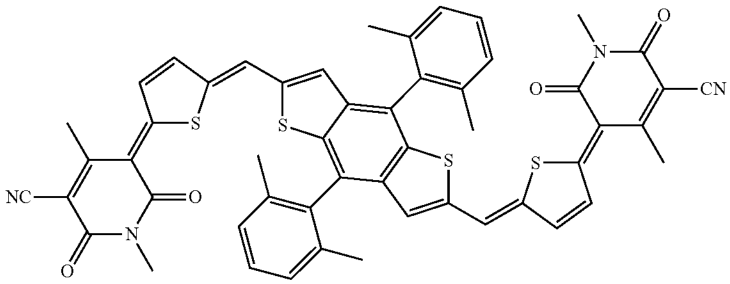
Molecular Weight: 911.14

-continued
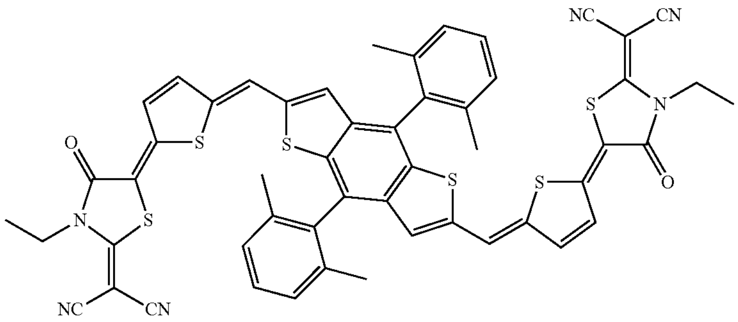
Molecular Weight: 969.26
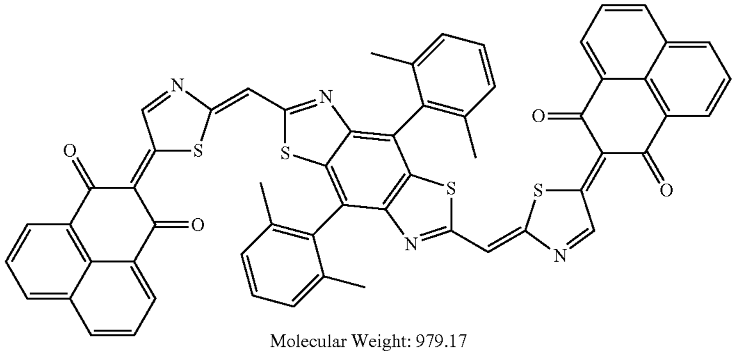
Molecular Weight: 979.17
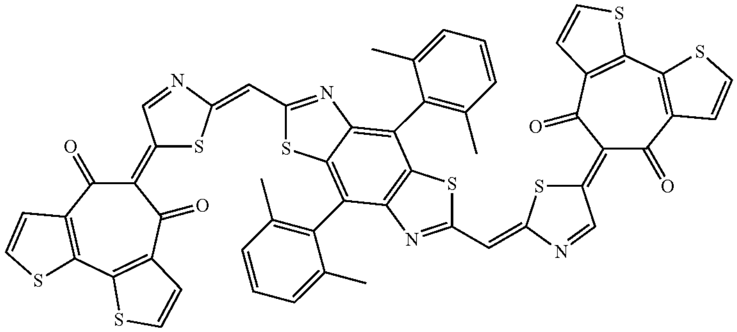
Molecular Weight: 1055.34
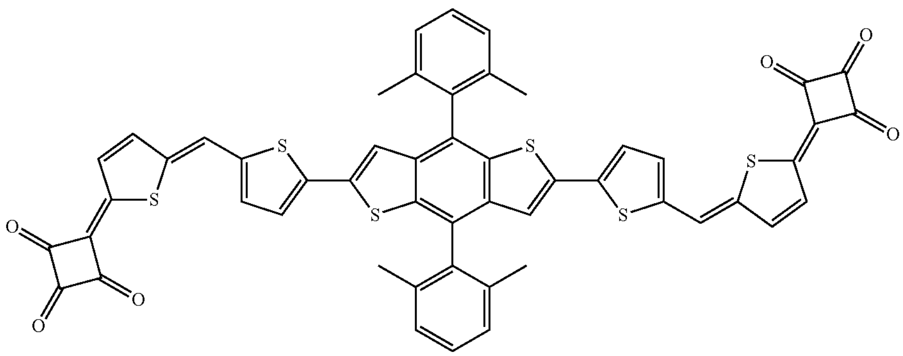
Molecular Weight: 943.17

-continued
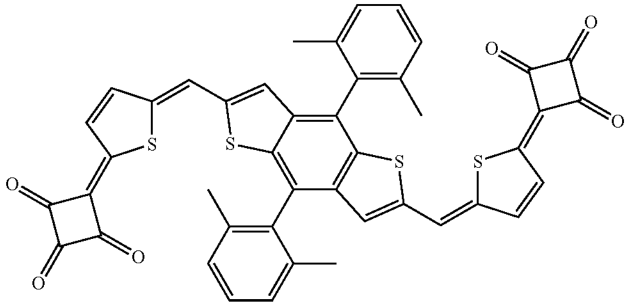
Molecular Weight: 778.93
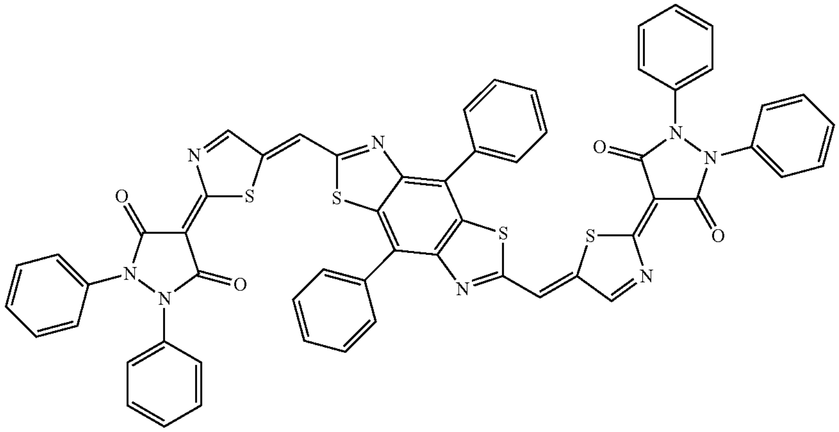
Molecular Weight: 1035.20
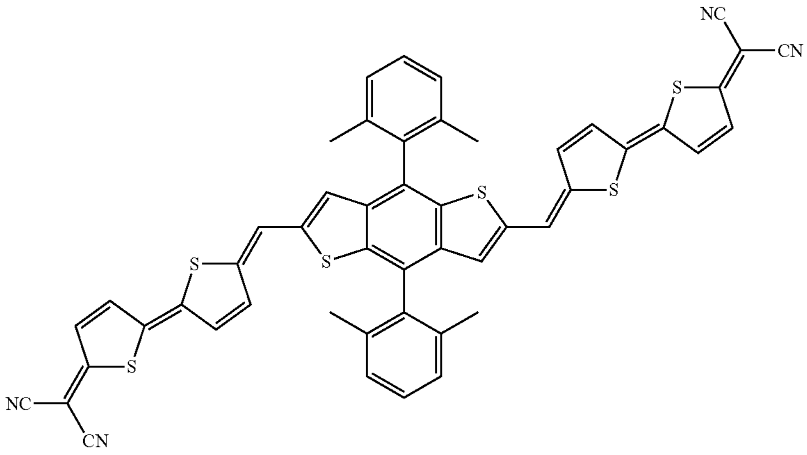
Molecular Weight: 879.18

-continued
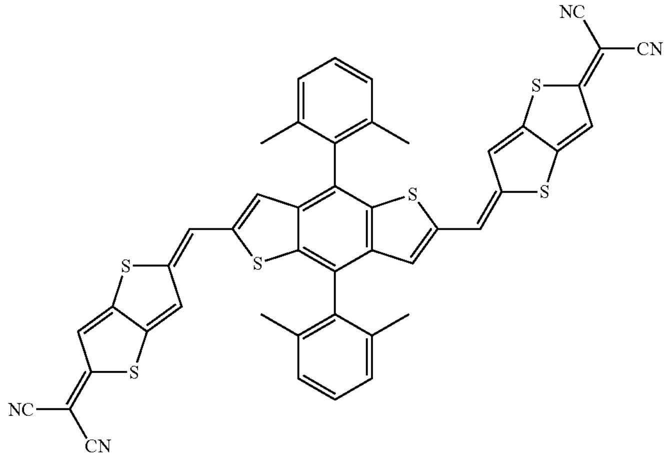
Molecular Weight: 827.10
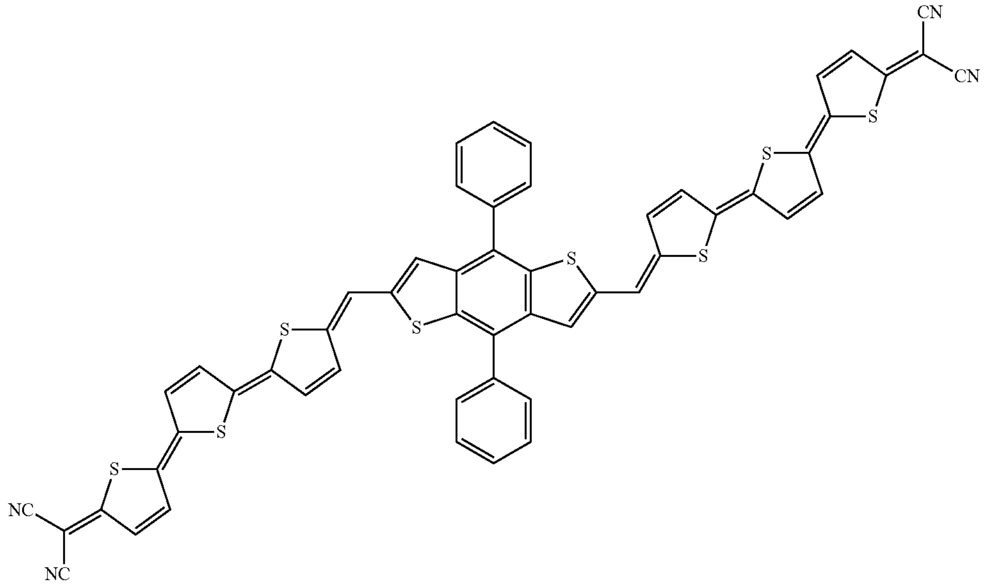
Molecular Weight: 987.31
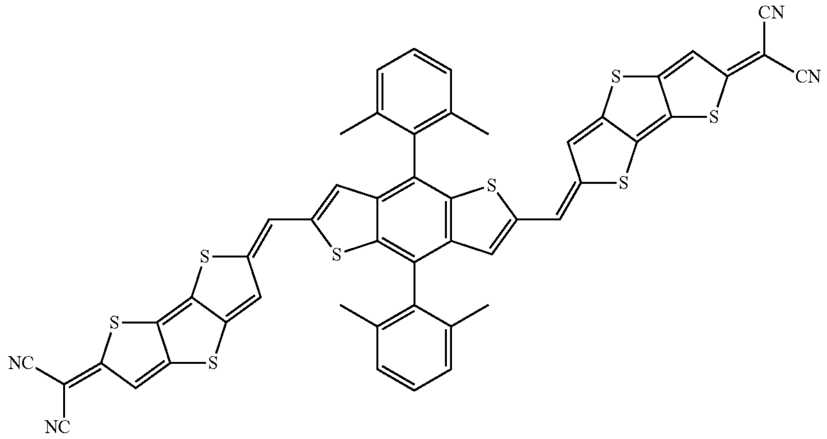
Molecular Weight: 939.27

-continued
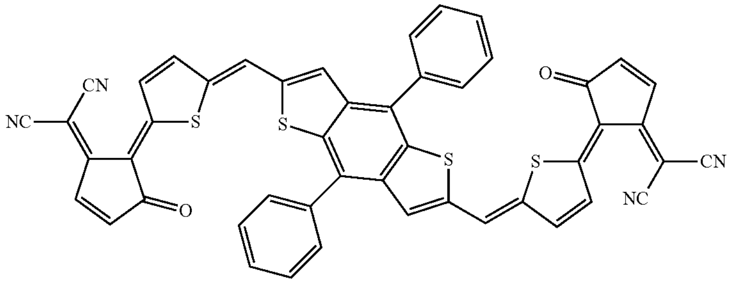
Molecular Weight: 814.97
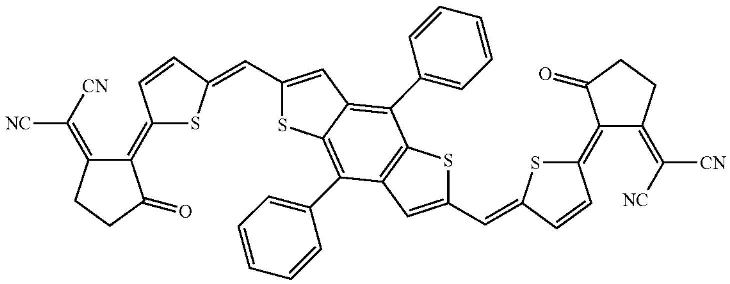
Molecular Weight: 819.00
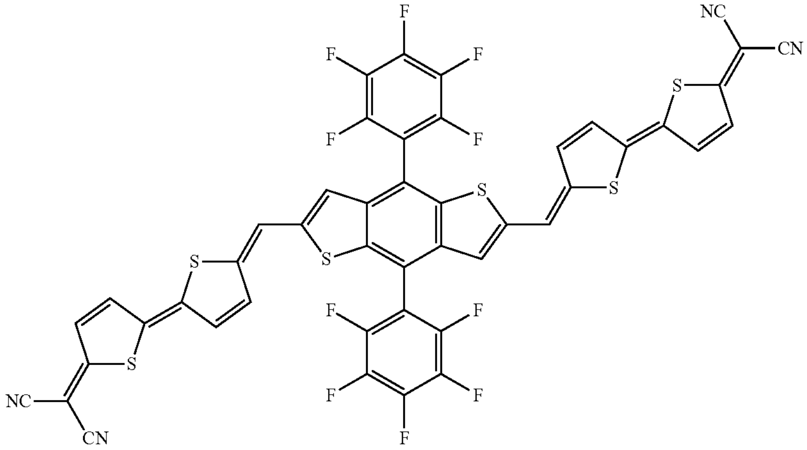
Molecular Weight: 1002.97
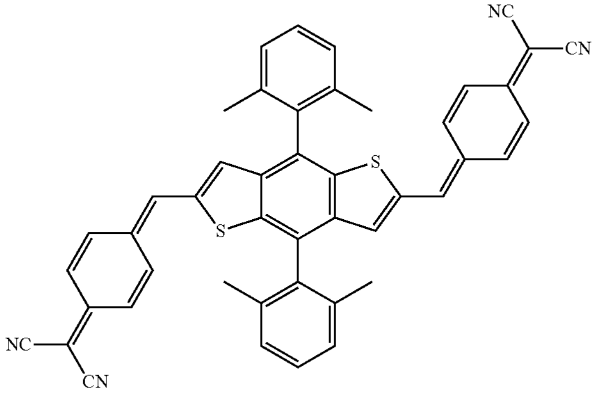
Molecular Weight: 702.89

-continued
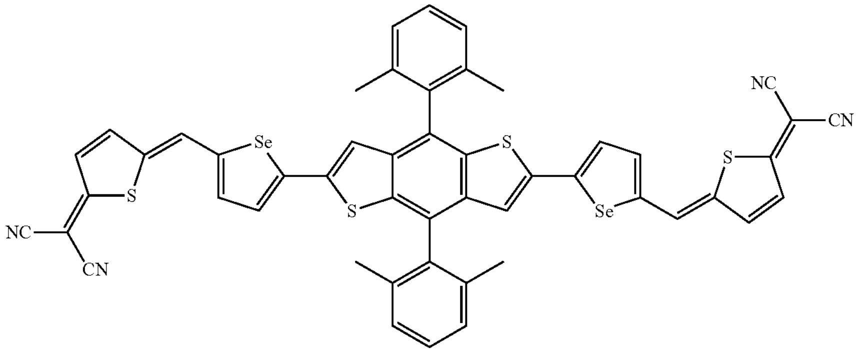
Molecular Weight: 973.00
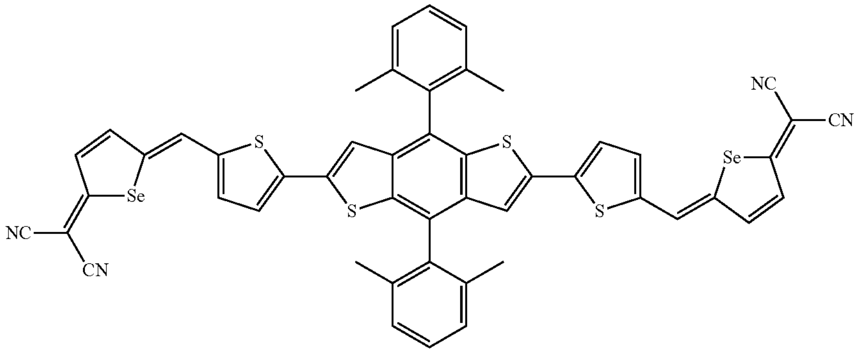
Molecular Weight: 973.00
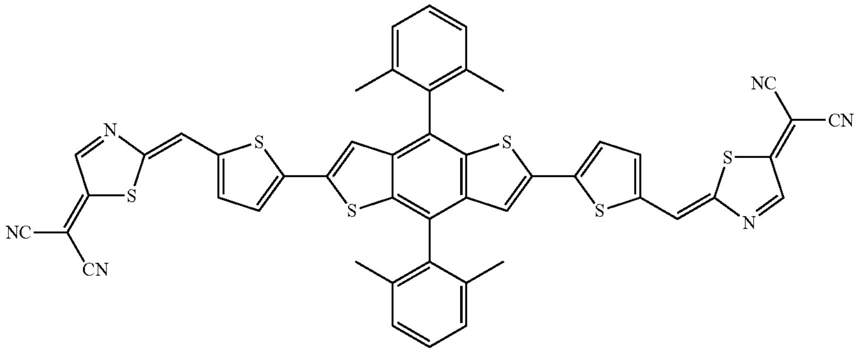
Molecular Weight: 881.15
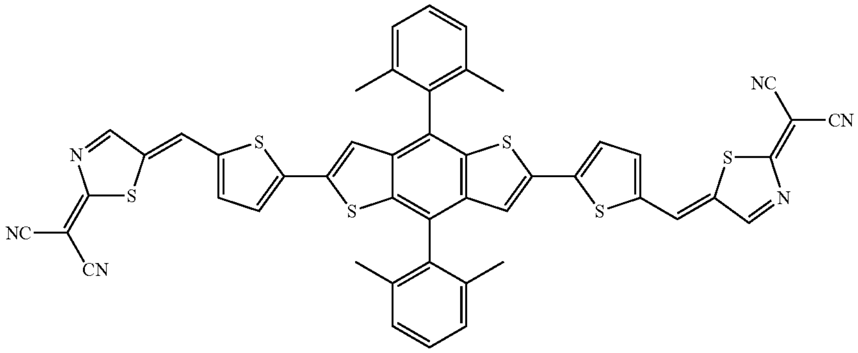
Molecular Weight: 881.15

-continued
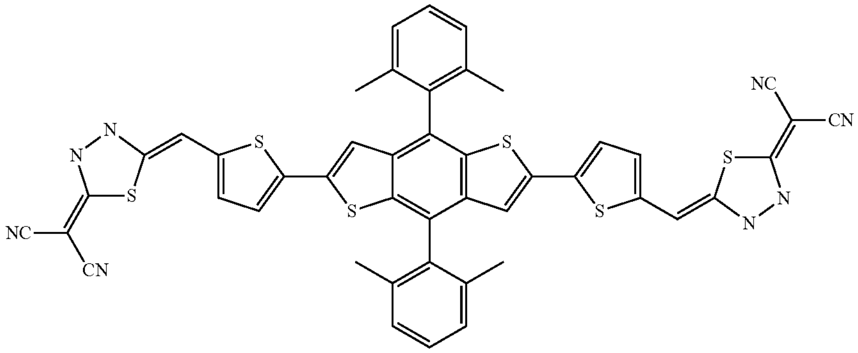
Molecular Weight: 883.13
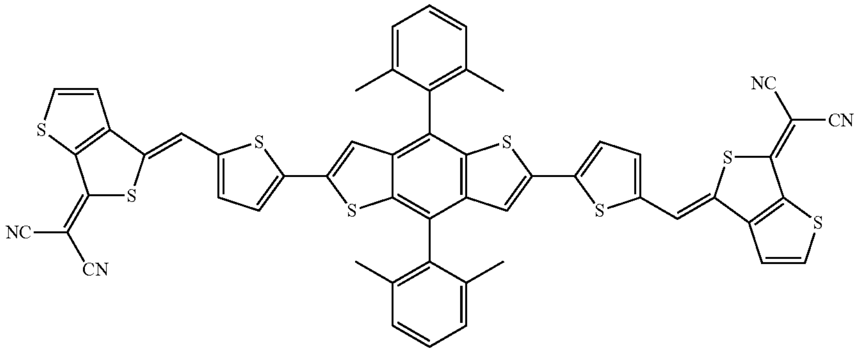
Molecular Weight: 991.34
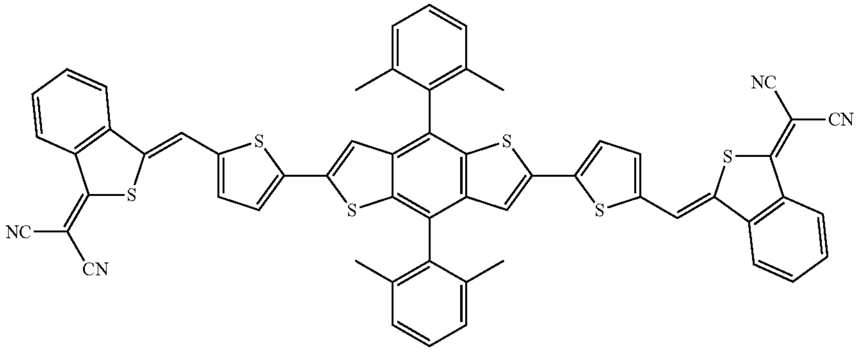
Molecular Weight: 979.30
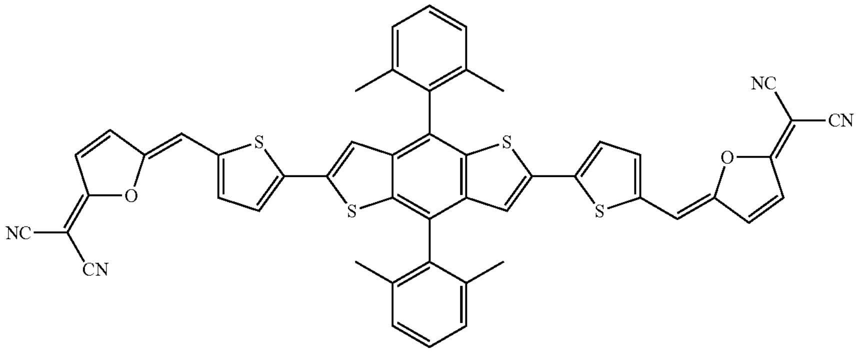
Molecular Weight: 847.06

-continued
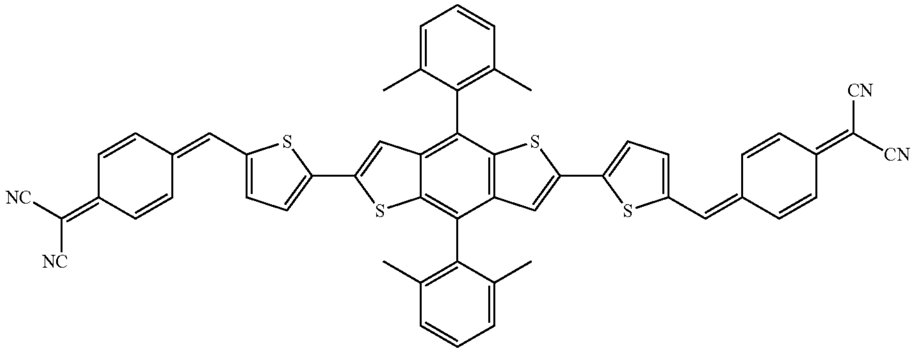
Molecular Weight: 867.13
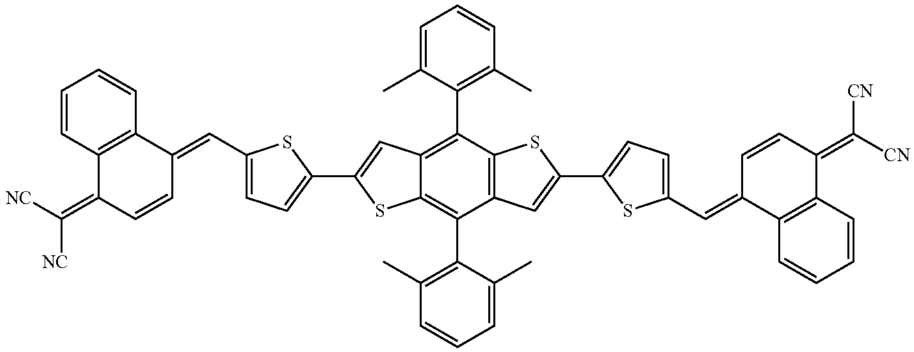
Molecular Weight: 967.25
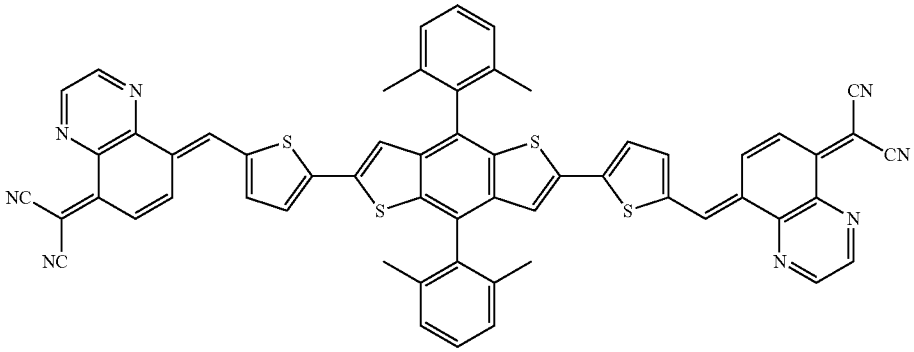
Molecular Weight: 971.21
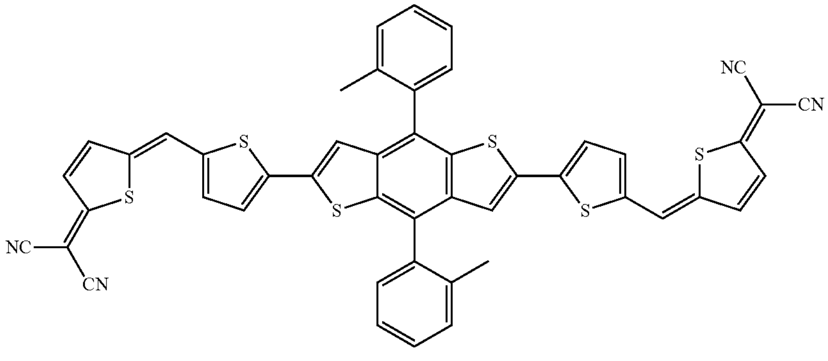
Molecular Weight: 851.12

-continued
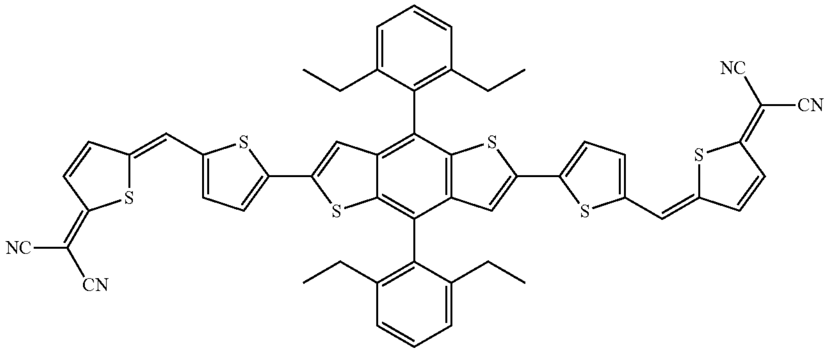
Molecular Weight: 935.29
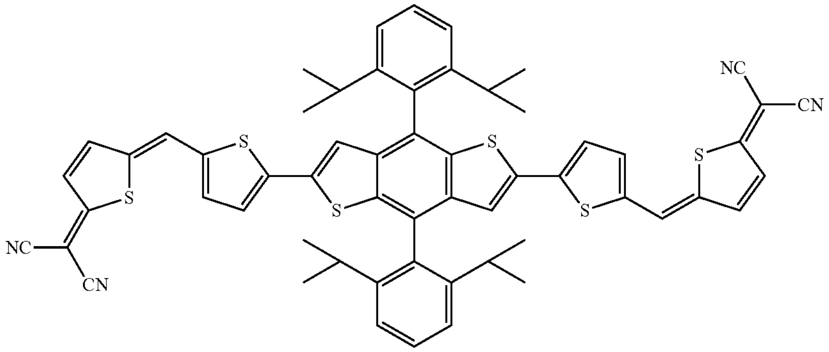
Molecular Weight: 991.39
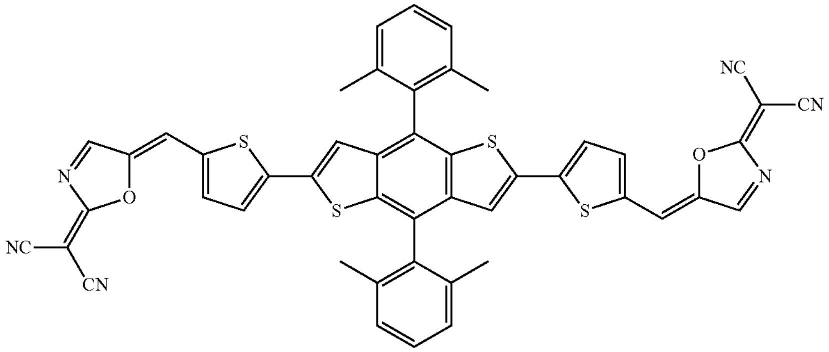
Molecular Weight: 849.03
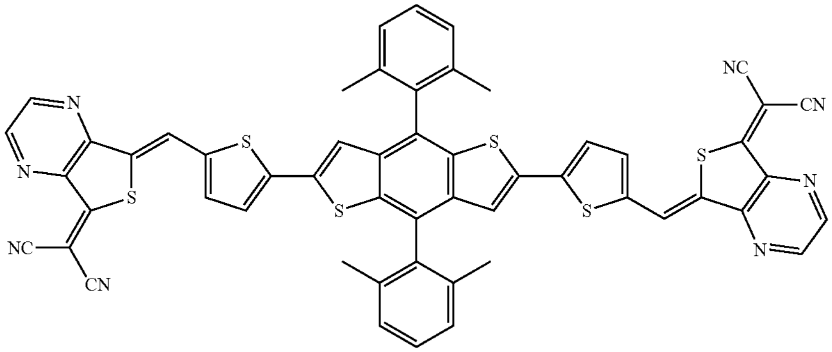
Molecular Weight: 983.25

-continued
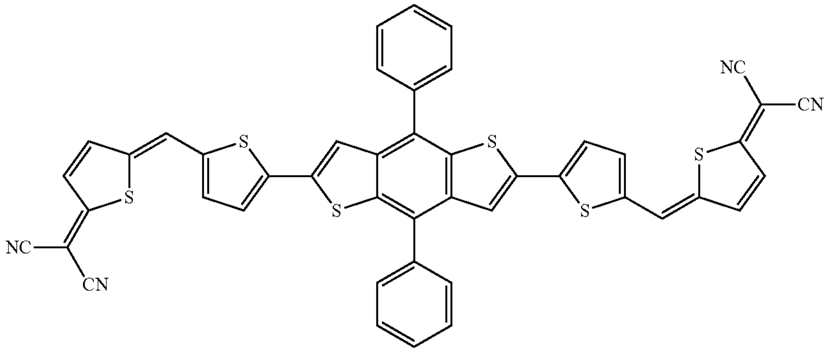
Molecular Weight: 823.07
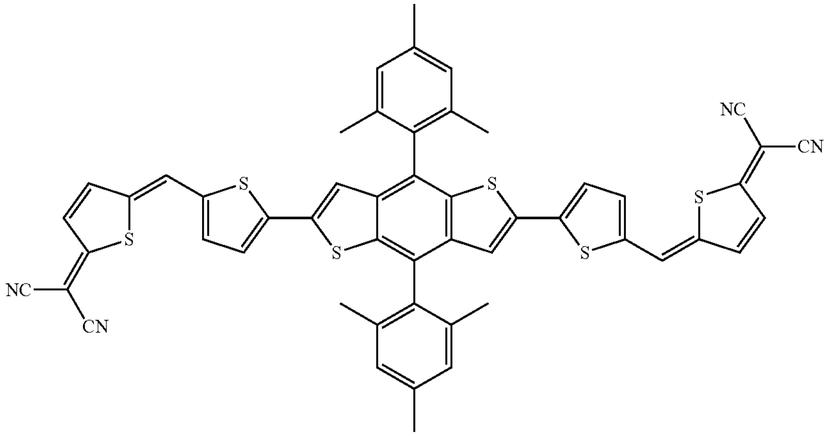
Molecular Weight: 907.23
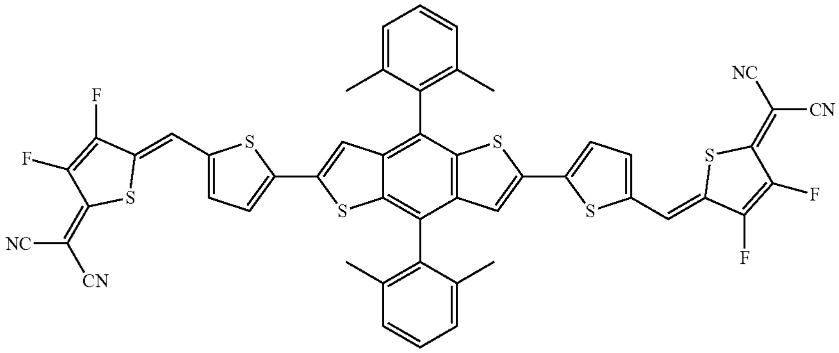
Molecular Weight: 951.14
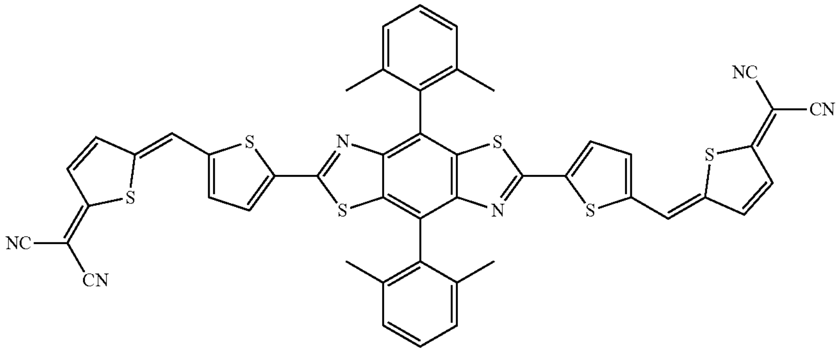
Molecular Weight: 881.15

-continued
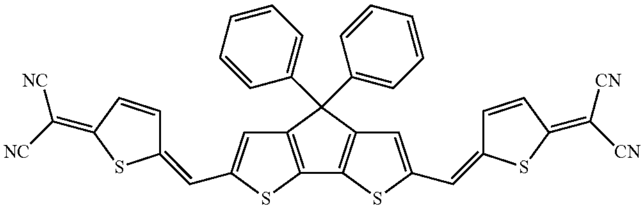
Molecular Weight: 646.82
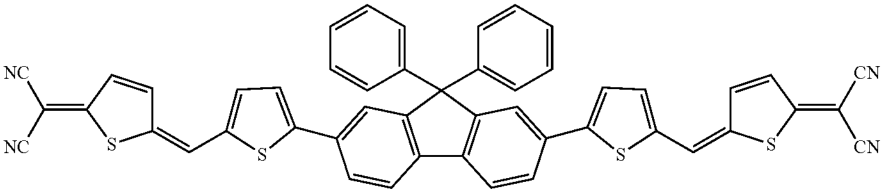
Molecular Weight: 799.02
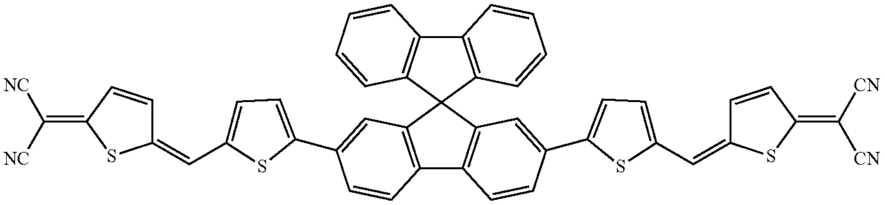
Molecular Weight: 797.00
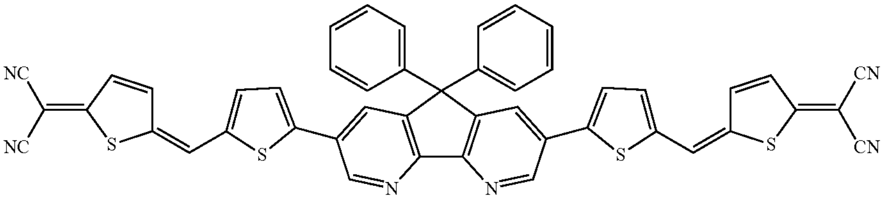
Molecular Weight: 800.99
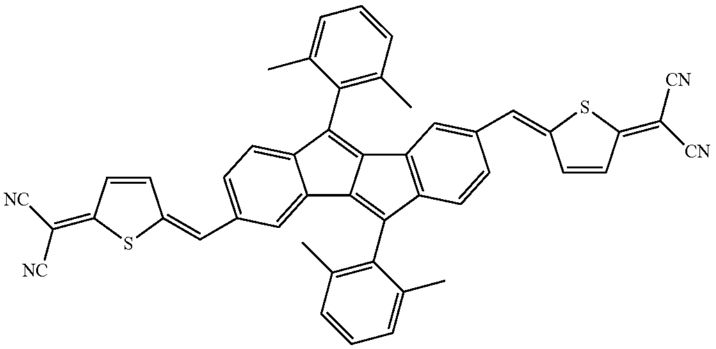
Molecular Weight: 726.92

-continued
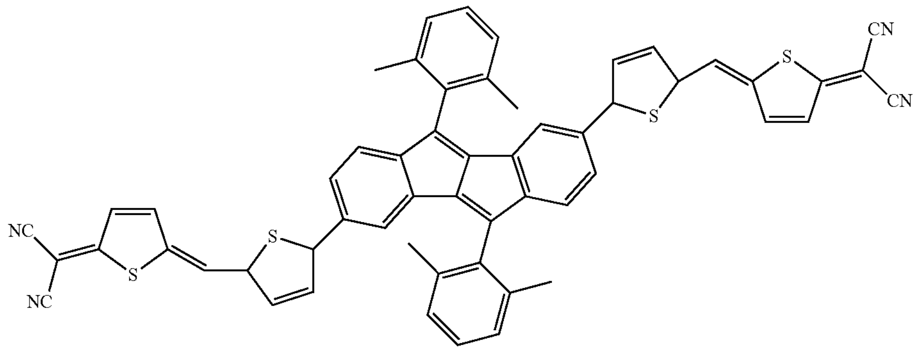
Molecular Weight: 895.19
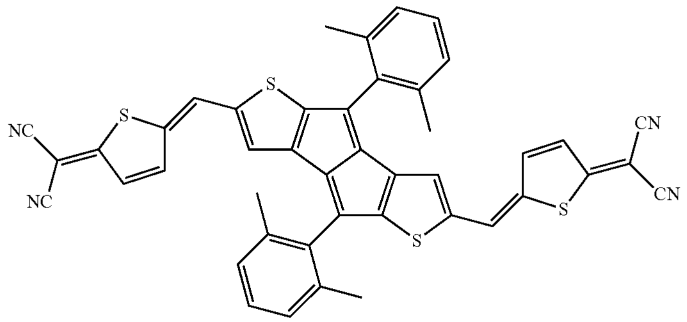
Molecular Weight: 738.96
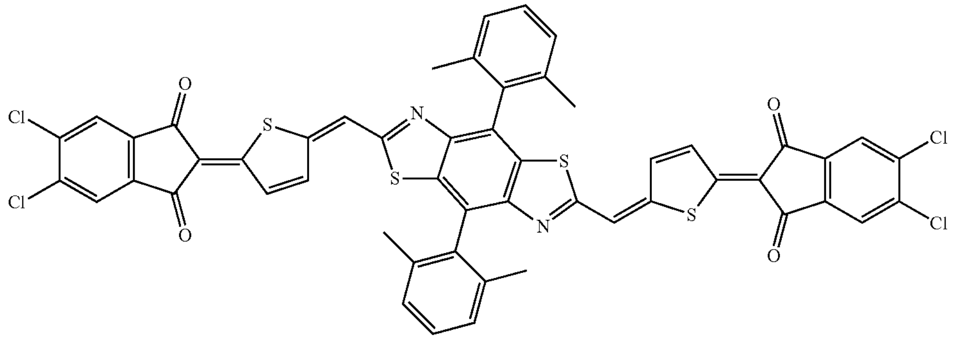
Molecular Weight: 1014.85
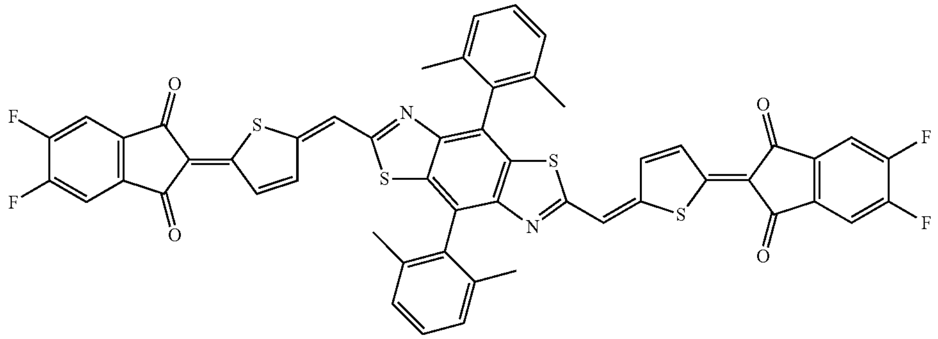
Molecular Weight: 949.04

-continued
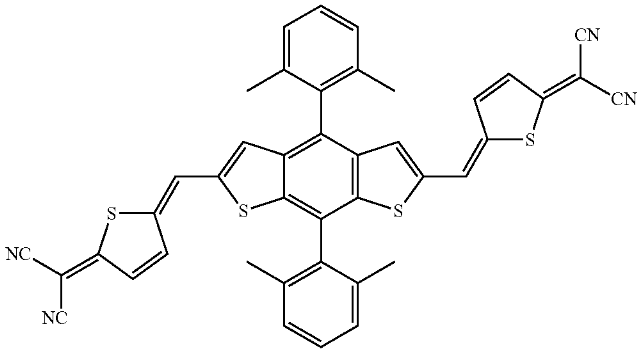
Molecular Weight: 714.94
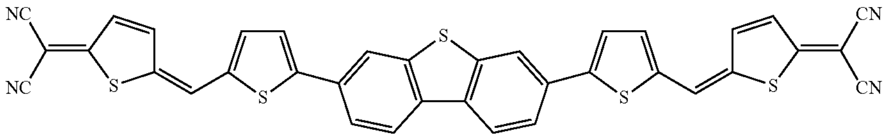
Molecular Weight: 664.85
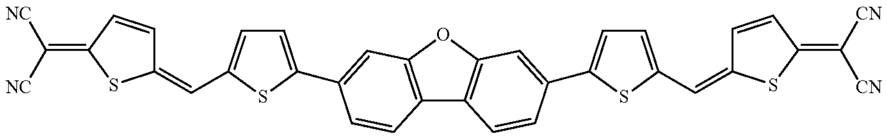
Molecular Weight: 648.79
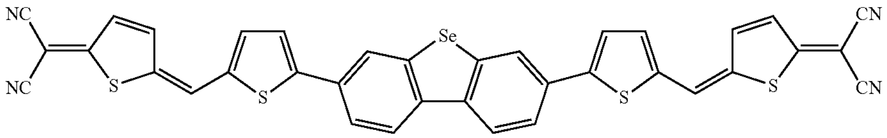
Molecular Weight: 711.76
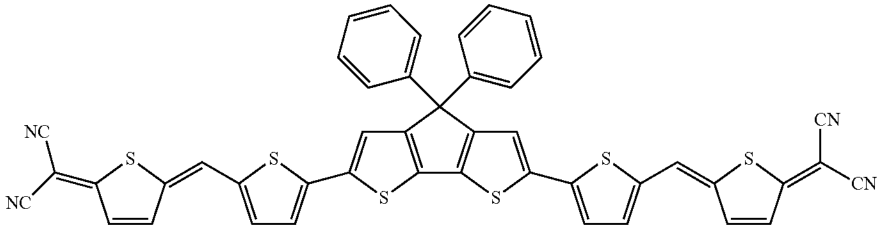
Molecular Weight: 811.06
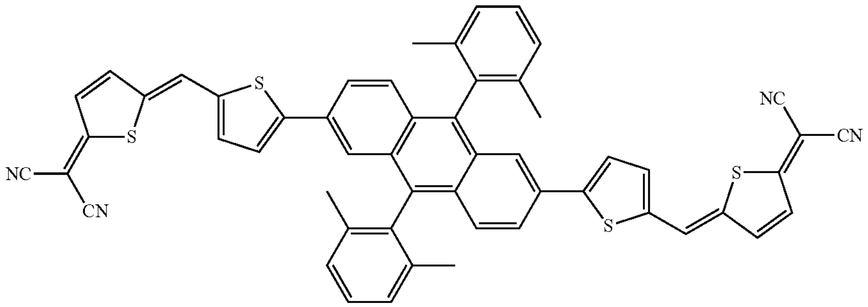
Molecular Weight: 867.13

-continued
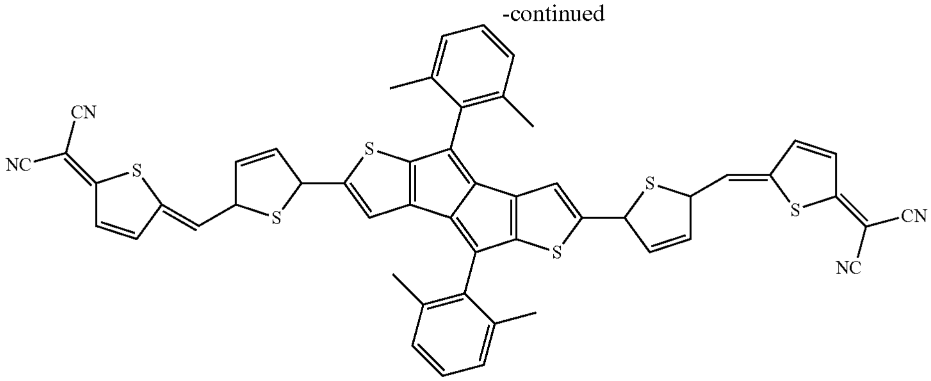
Molecular Weight: 907.23
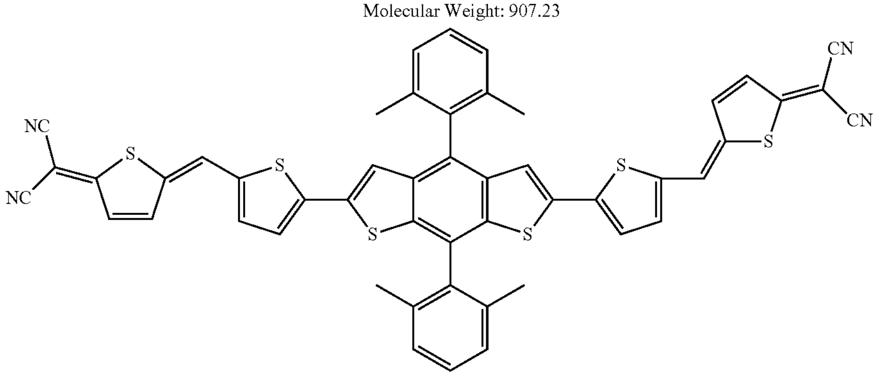
Molecular Weight: 879.18
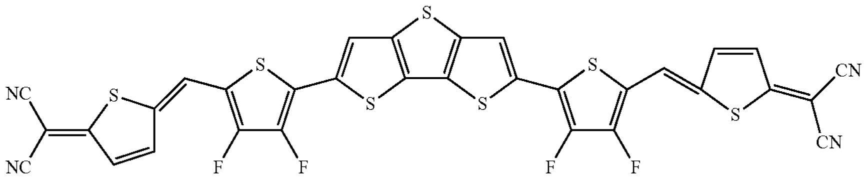
Molecular Weight: 748.86
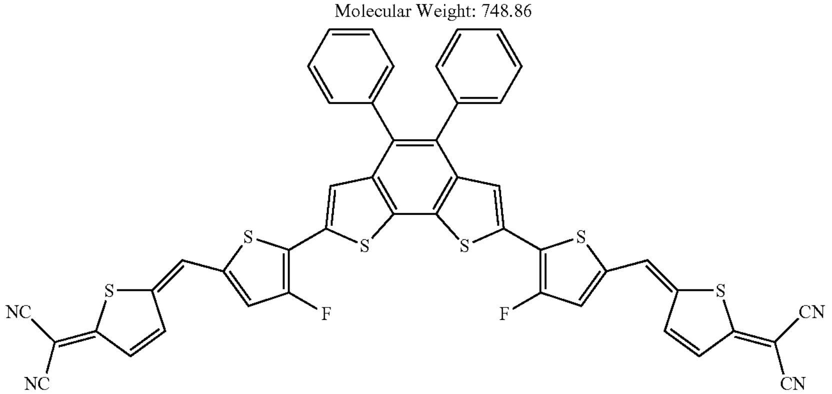
Molecular Weight: 859.05
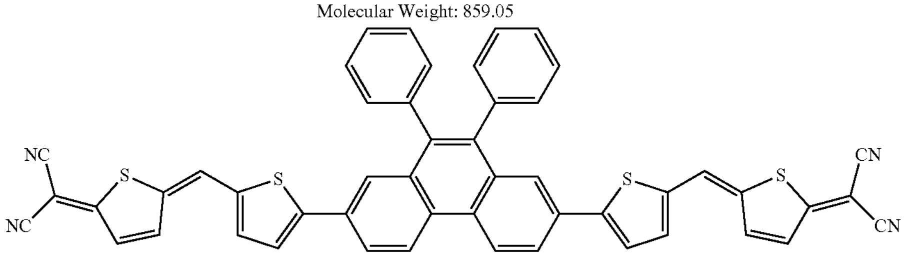
Molecular Weight: 811.03

-continued
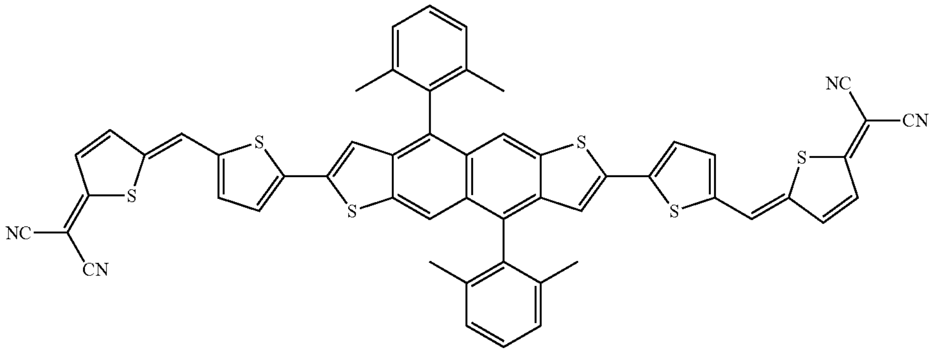
Molecular Weight: 929.24
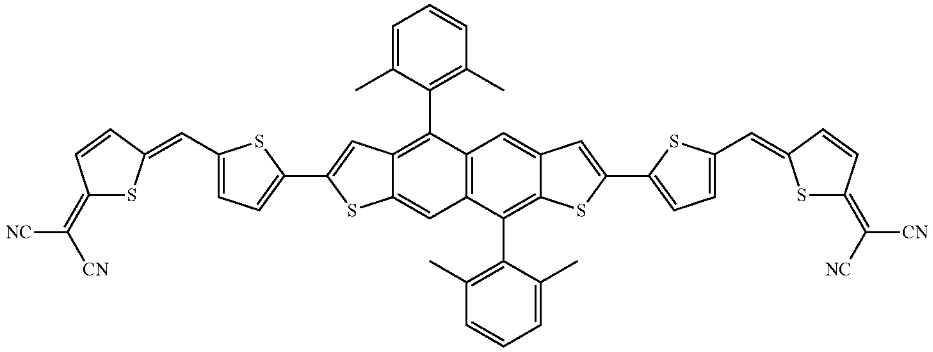
Molecular Weight: 929.24
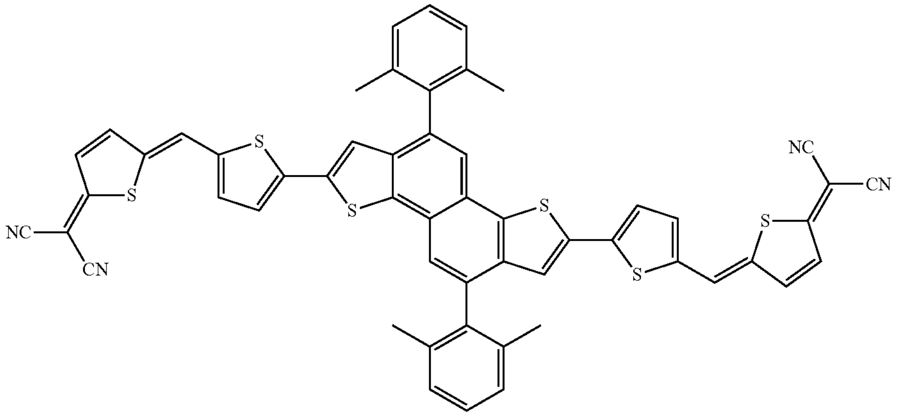
Molecular Weight: 929.24
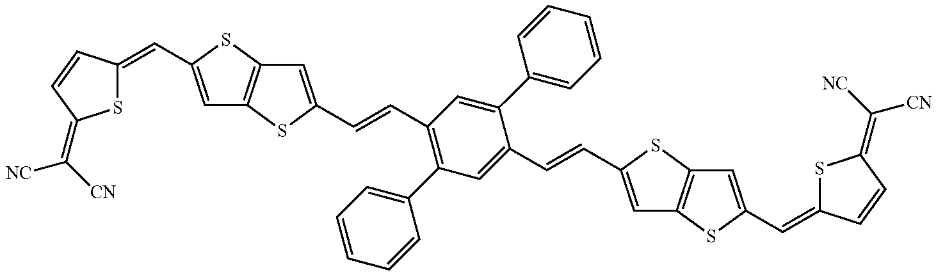
Molecular Weight: 875.15

-continued
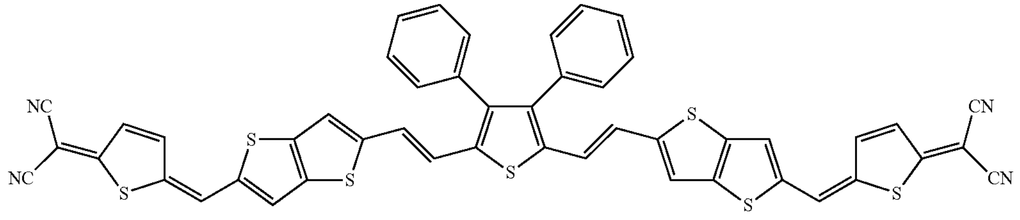
Molecular Weight: 851.17
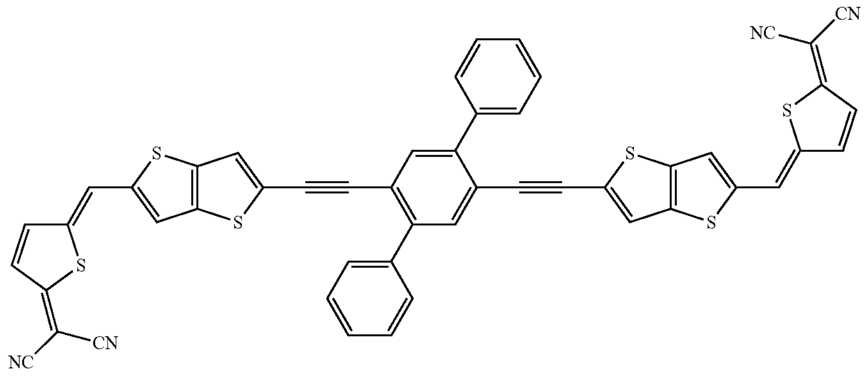
Molecular Weight: 871.11
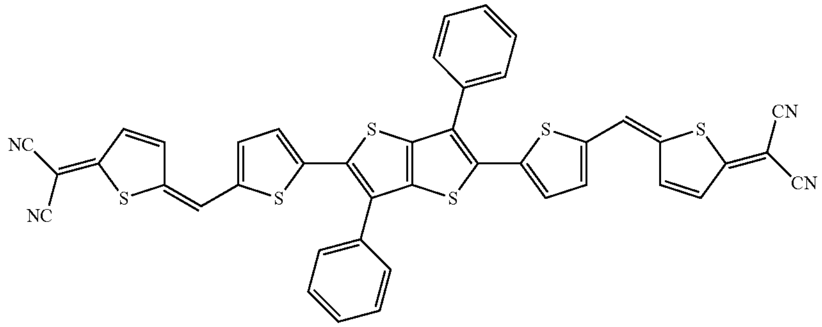
Molecular Weight: 773.01
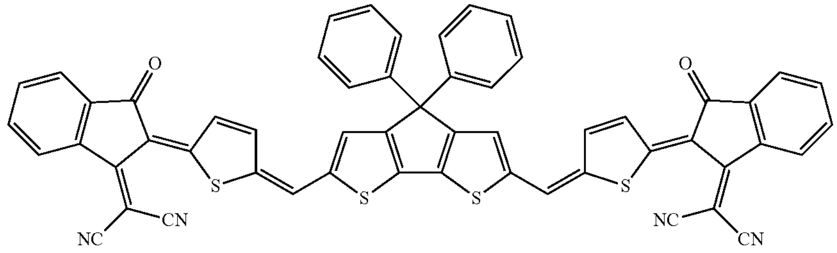
Molecular Weight: 903.08

-continued
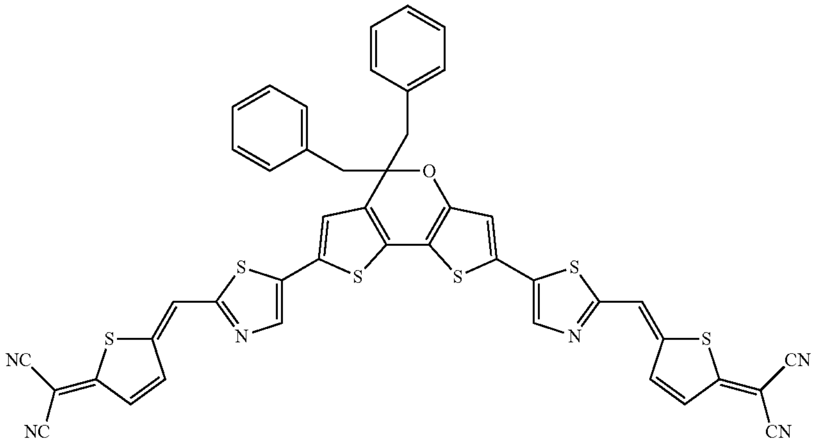
Molecular Weight: 857.09
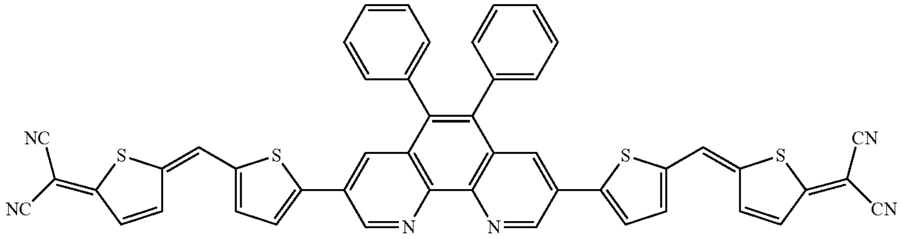
Molecular Weight: 813.00
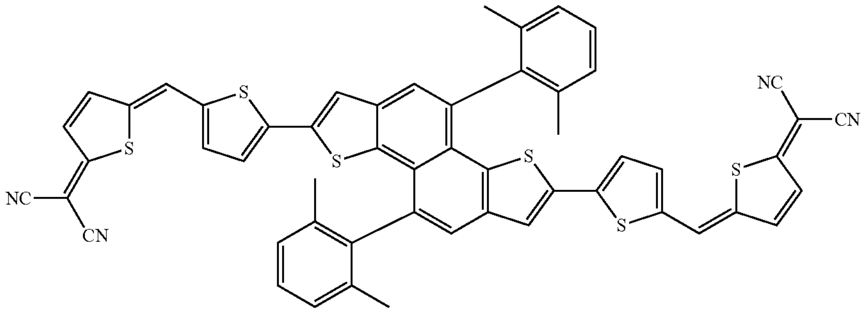
Molecular Weight: 929.24
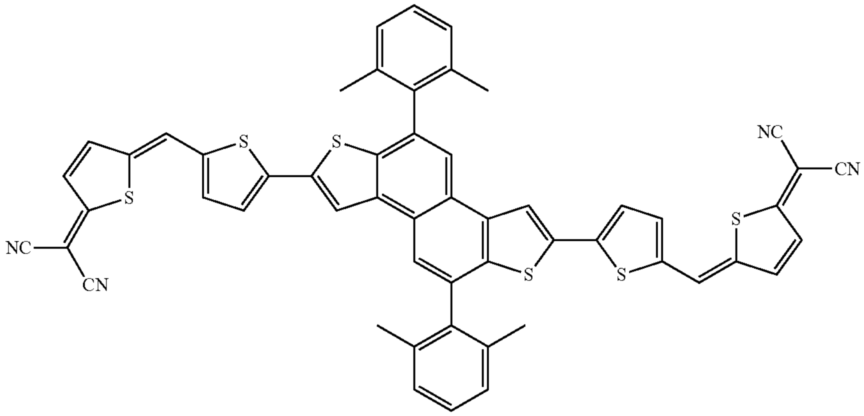
Molecular Weight: 929.24

-continued
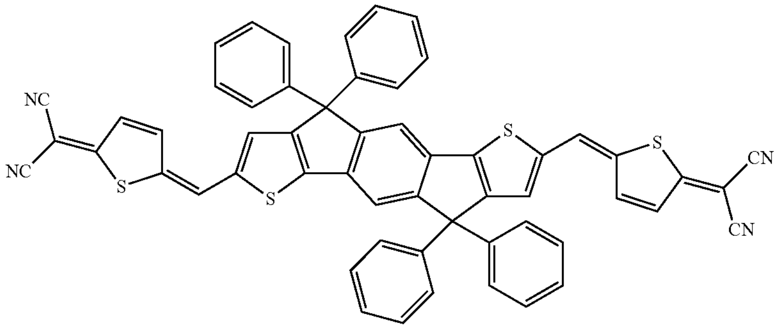
Molecular Weight: 887.12
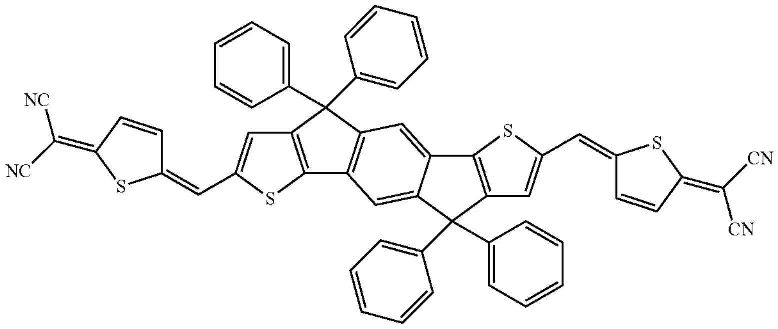
Molecular Weight: 887.12
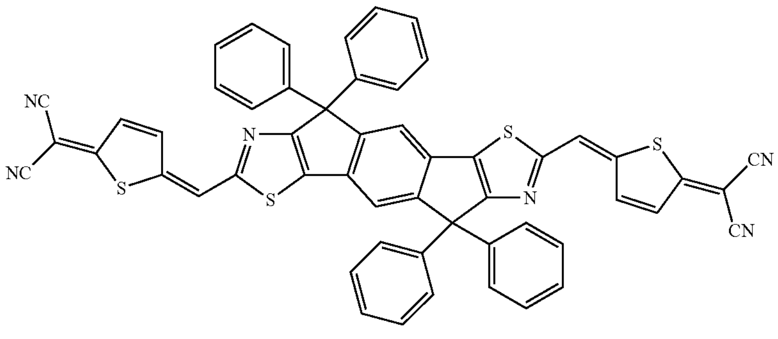
Molecular Weight: 889.10
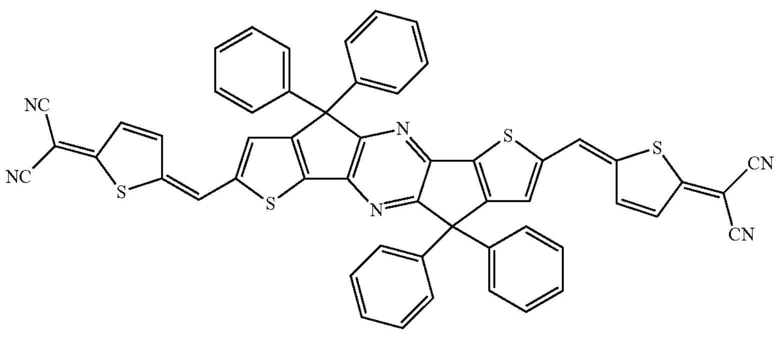
Molecular Weight: 889.10

-continued
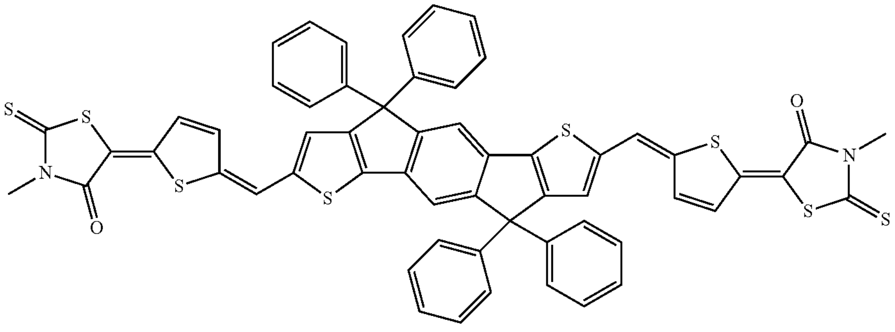
Molecular Weight: 1049.42
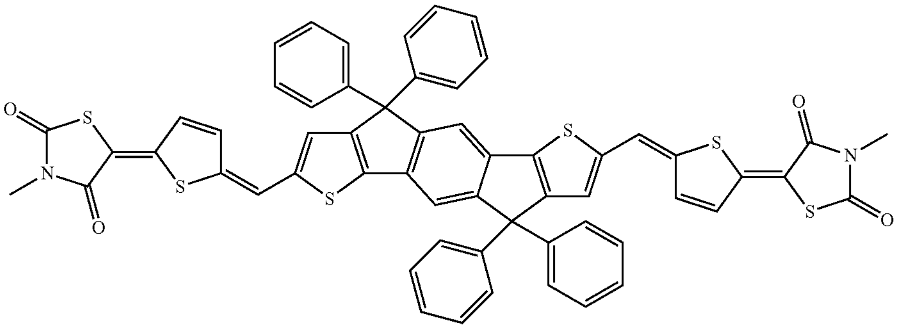
Molecular Weight: 1017.30
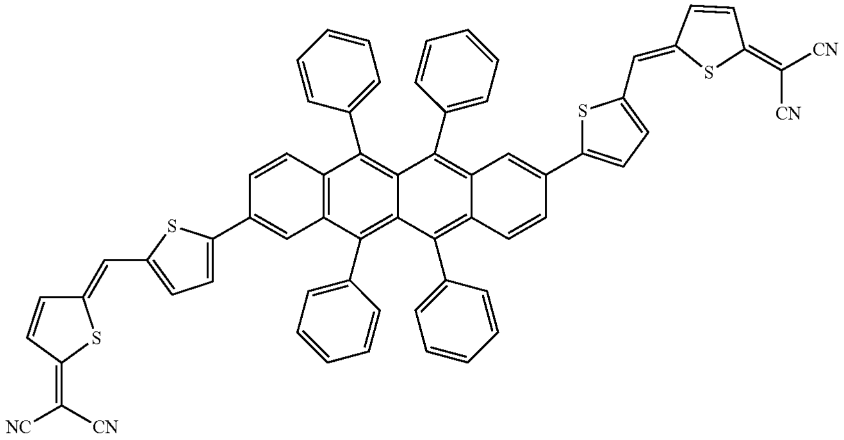
Molecular Weight: 1013.28
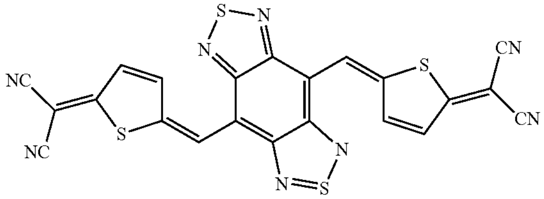
Molecular Weight: 510.59
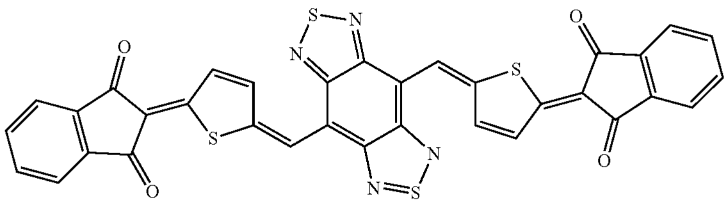
Molecular Weight: 670.75

-continued
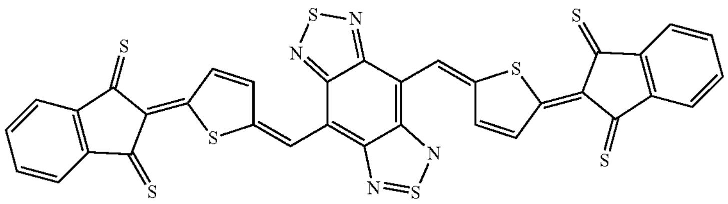
Molecular Weight: 734.99
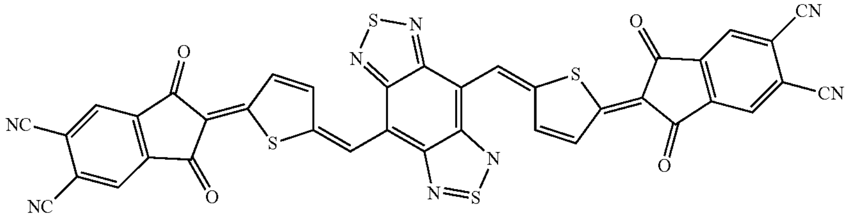
Molecular Weight: 770.79
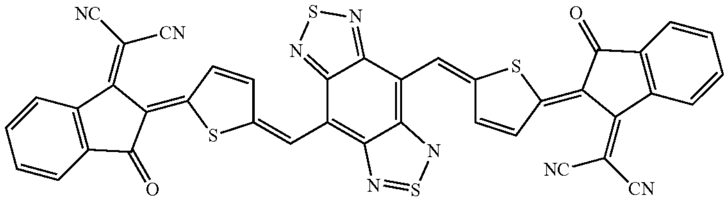
Molecular Weight: 766.85
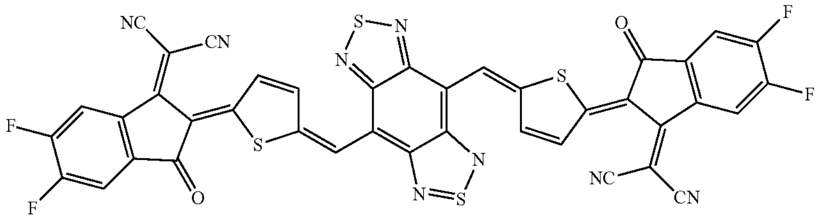
Molecular Weight: 836.81
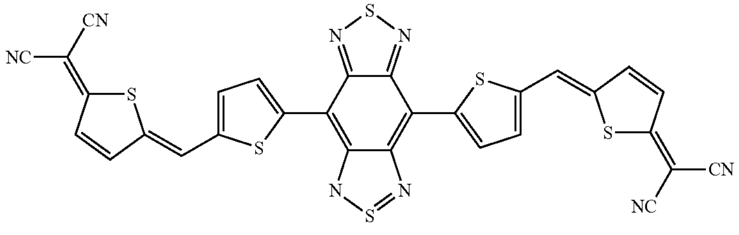
Molecular Weight: 674.83
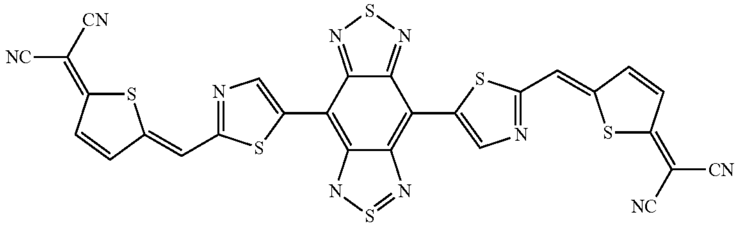
Molecular Weight: 676.80

-continued
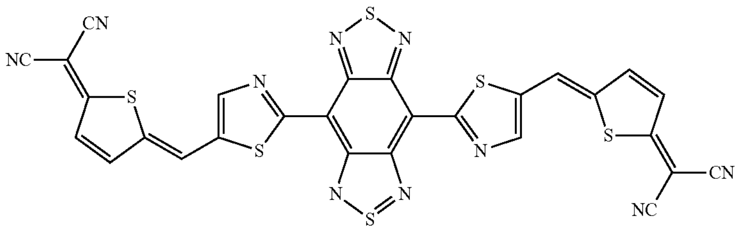
Molecular Weight: 676.80
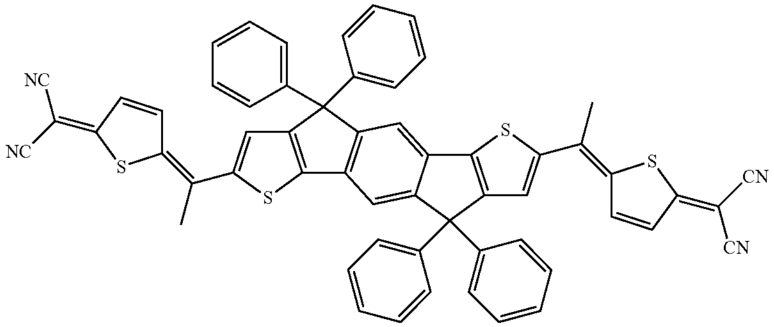
Molecular Weight: 915.18
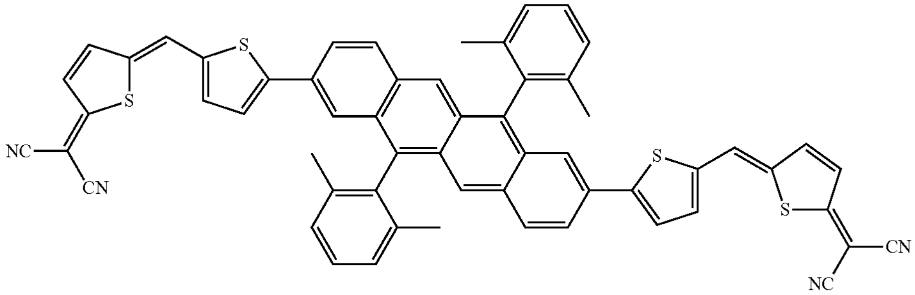
Molecular Weight: 917.19
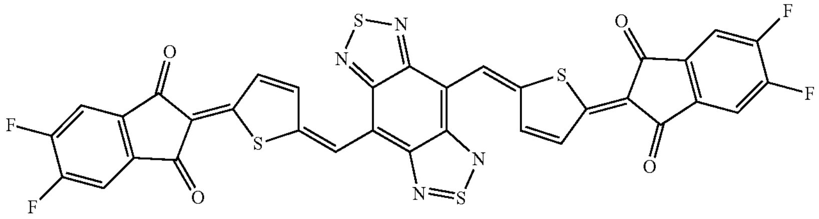
Molecular Weight: 742.71
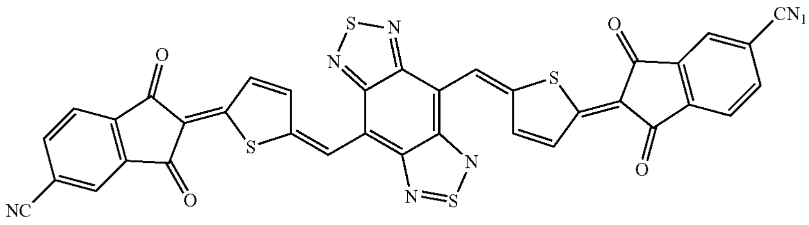
Molecular Weight: 720.77

-continued
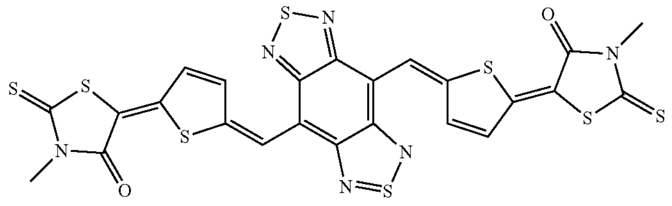
Molecular Weight: 672.88
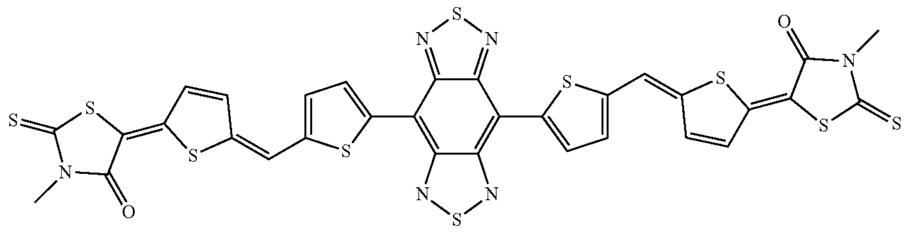
Molecular Weight: 837.12
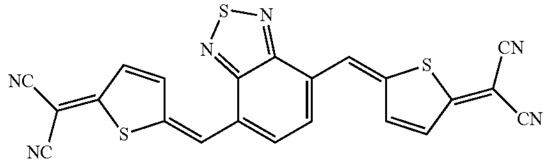
Molecular Weight: 452.53
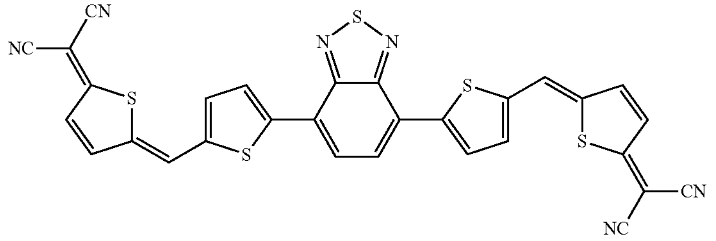
Molecular Weight: 616.77
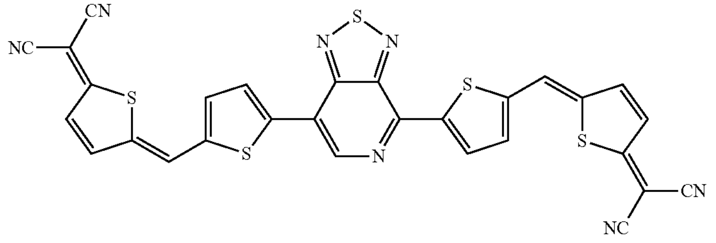
Molecular Weight: 617.76
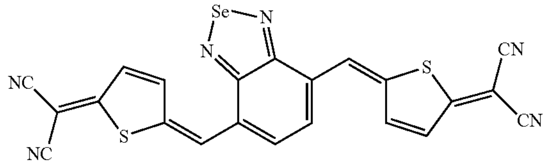
Molecular Weight: 499.43

-continued
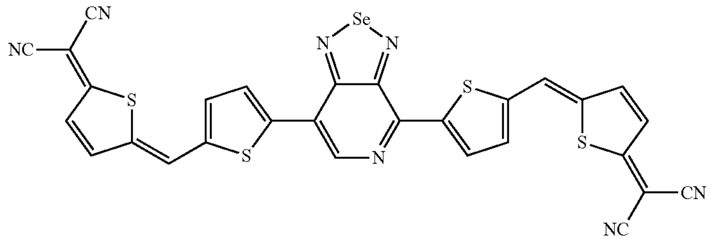
Molecular Weight: 663.67
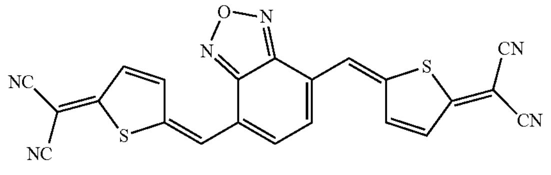
Molecular Weight: 436.47
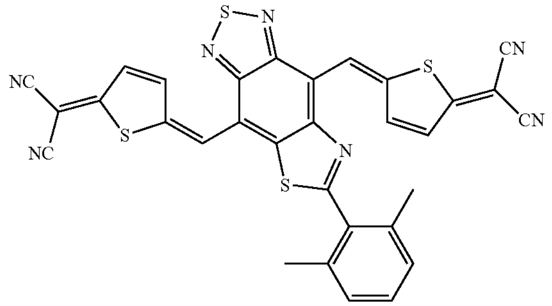
Molecular Weight: 613.75
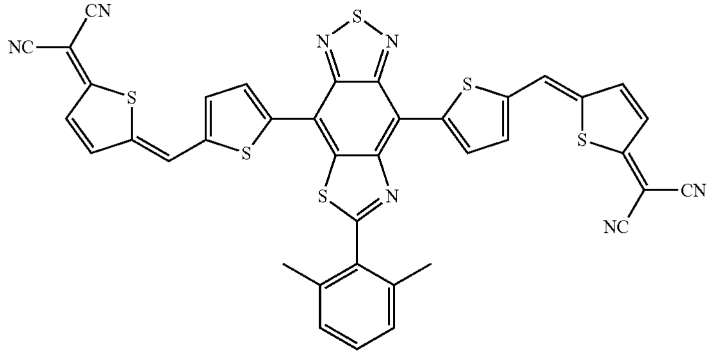
Molecular Weight: 777.99
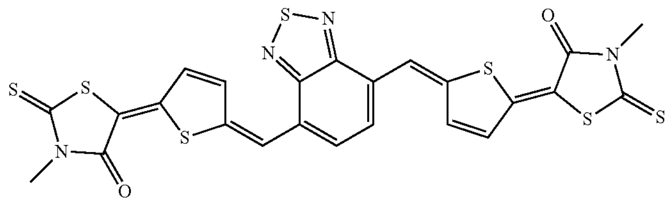
Molecular Weight: 614.82
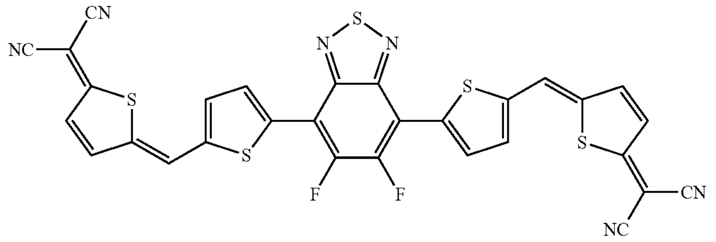
Molecular Weight: 652.75

-continued
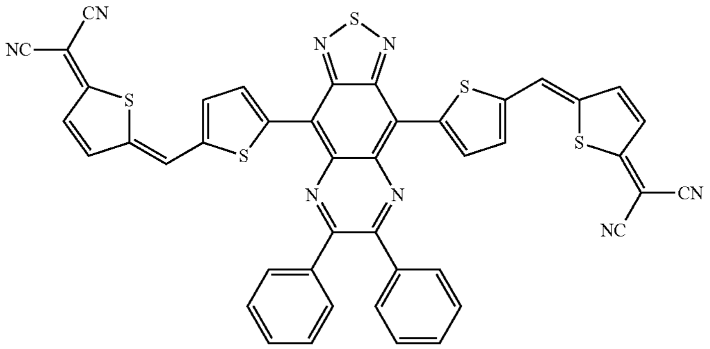
Molecular Weight: 821.00
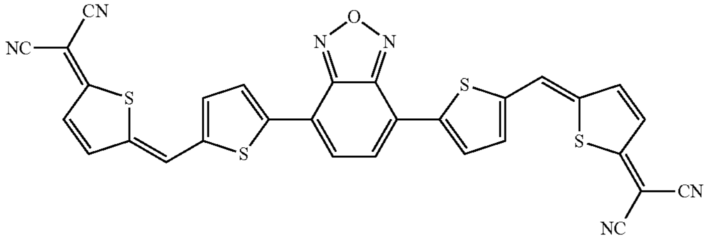
Molecular Weight: 600.71
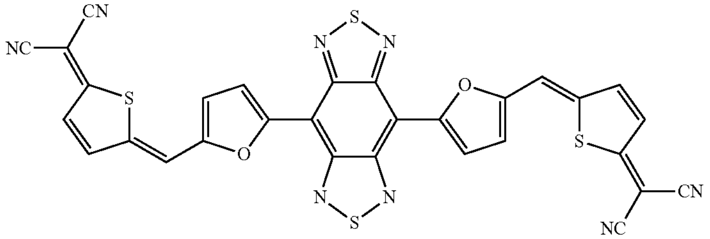
Molecular Weight: 642.70
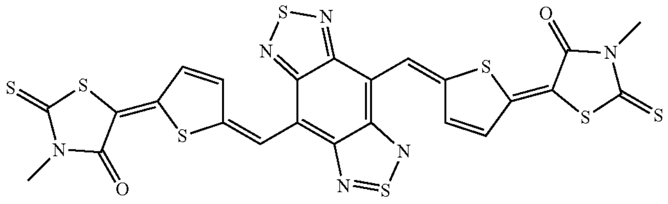
Molecular Weight: 672.88
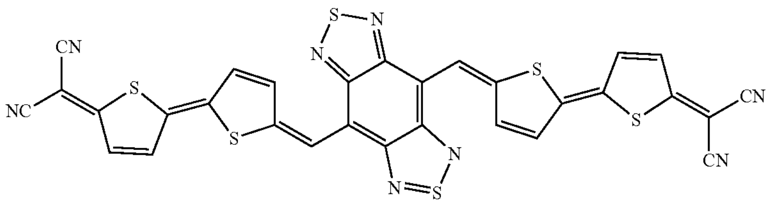
Molecular Weight: 674.83
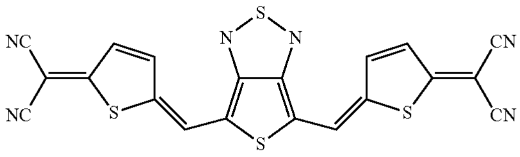
Molecular Weight: 458.55

-continued
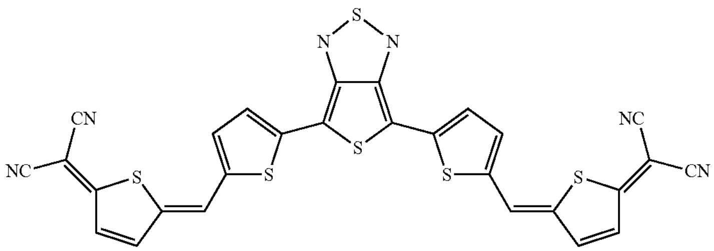
Molecular Weight: 622.79
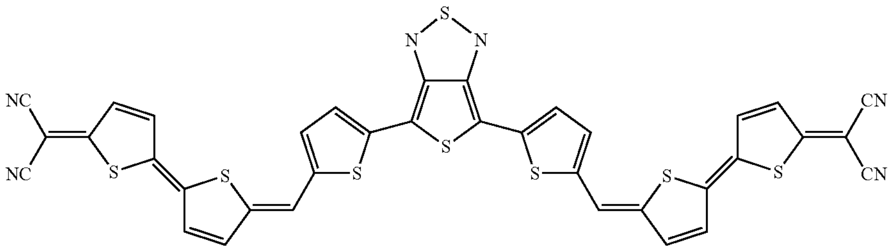
Molecular Weight: 787.03
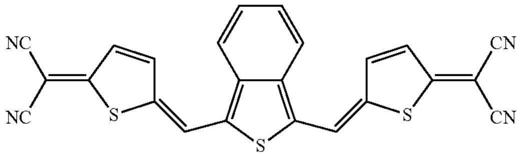
Molecular Weight: 450.55
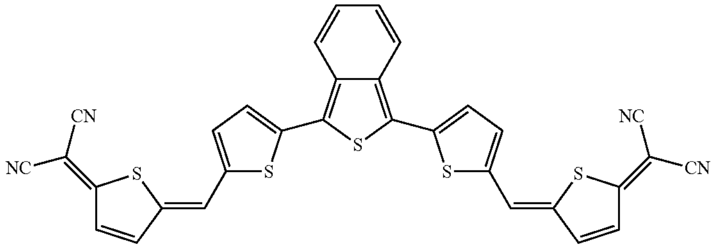
Molecular Weight: 614.79
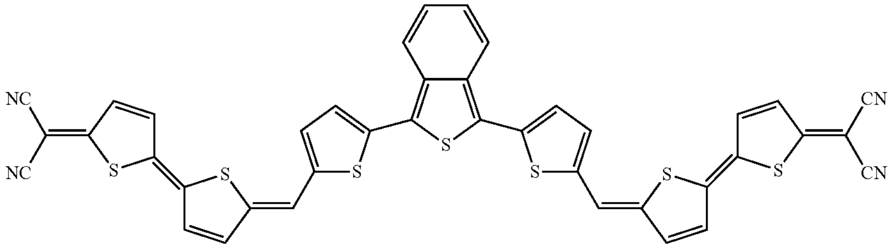
Molecular Weight: 779.03
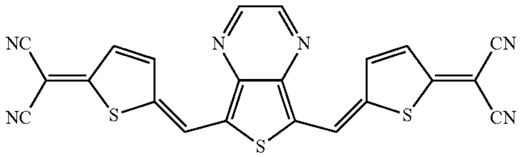
Molecular Weight: 452.53

-continued
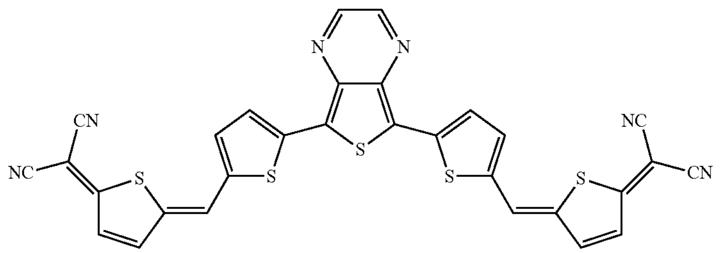
Molecular Weight: 616.77
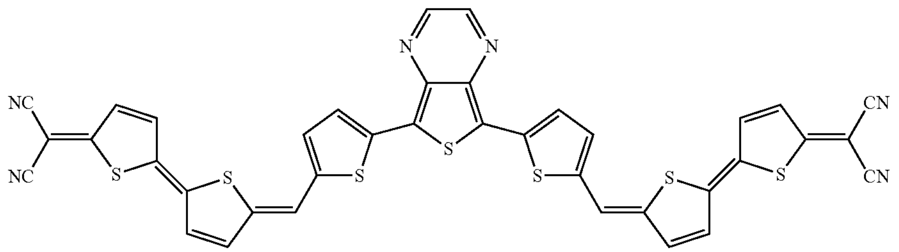
Molecular Weight: 781.01
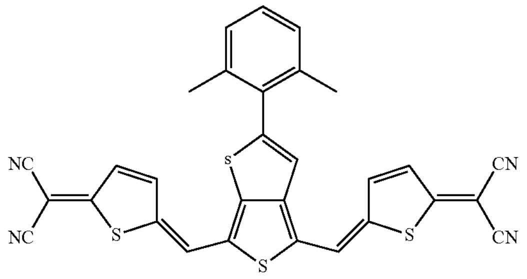
Molecular Weight: 560.73
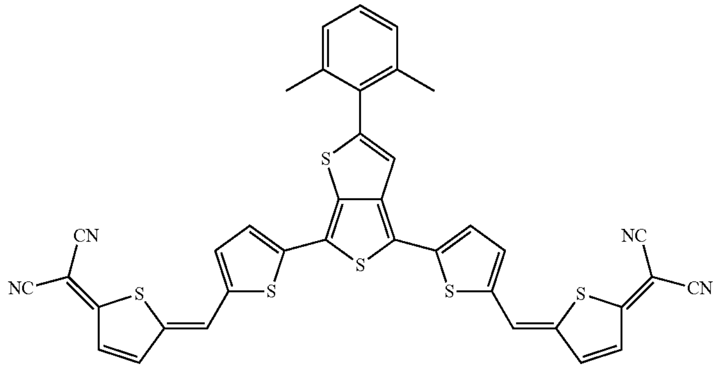
Molecular Weight: 724.97

-continued
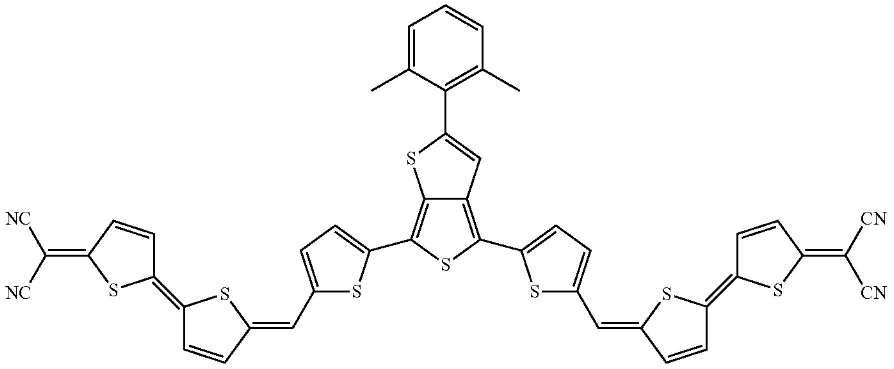
Molecular Weight: 889.21
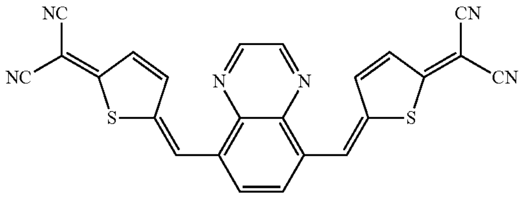
Molecular Weight: 446.51
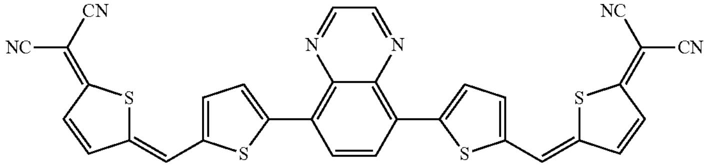
Molecular Weight: 610.75
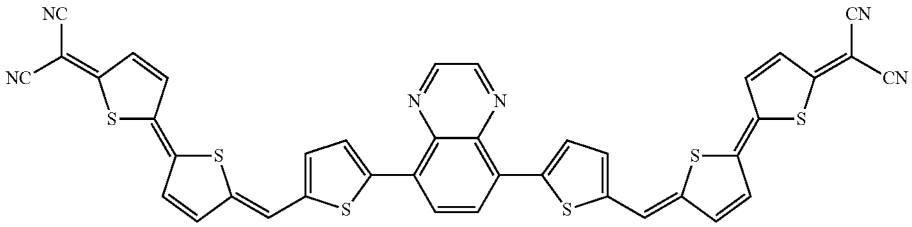
Molecular Weight: 774.99
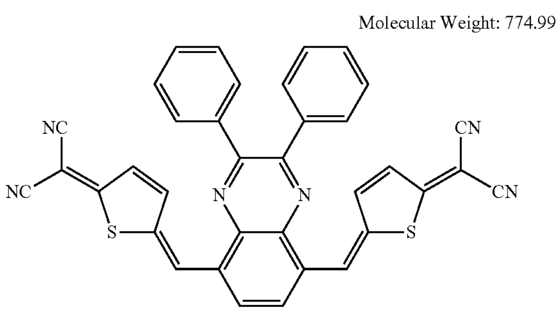
Molecular Weight: 598.70

-continued
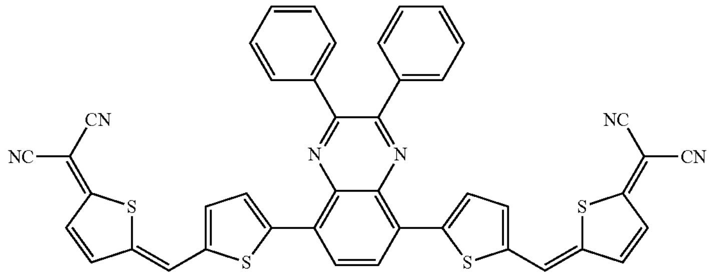
Molecular Weight: 762.94
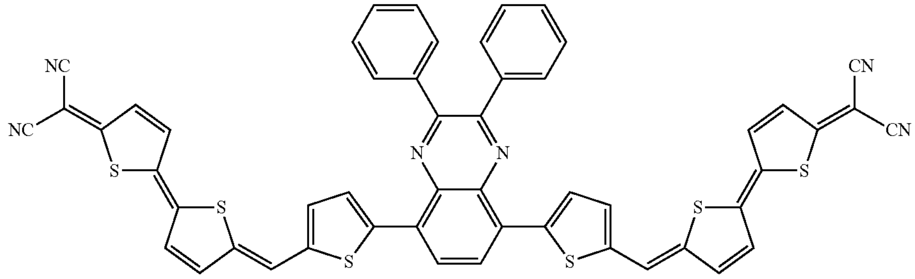
Molecular Weight: 927.18
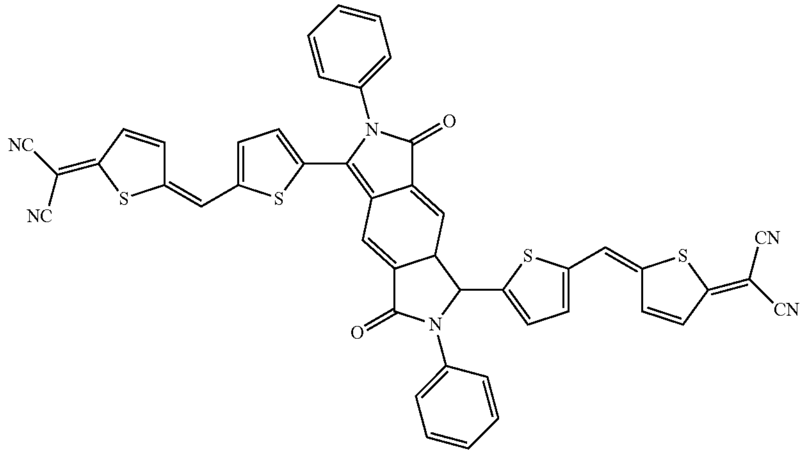
Molecular Weight: 820.98
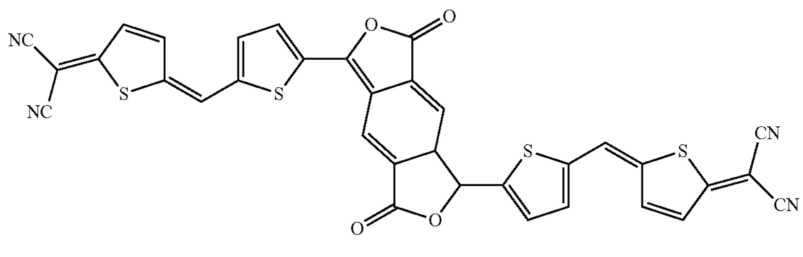
Molecular Weight: 670.75

-continued
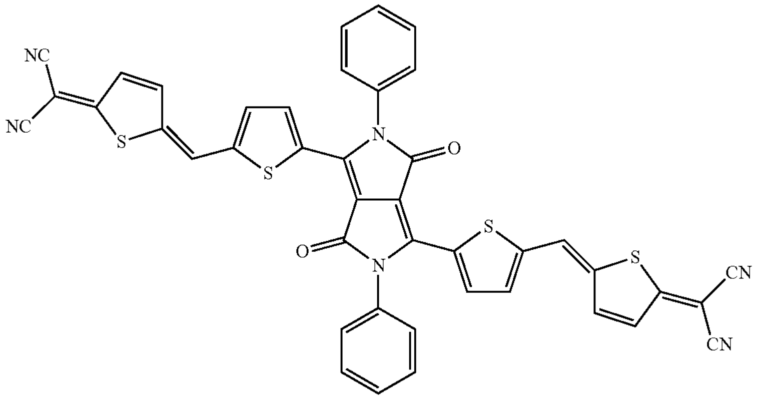
Molecular Weight: 768.90
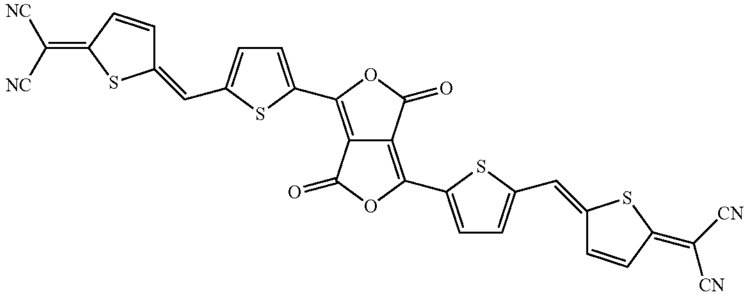
Molecular Weight: 618.67
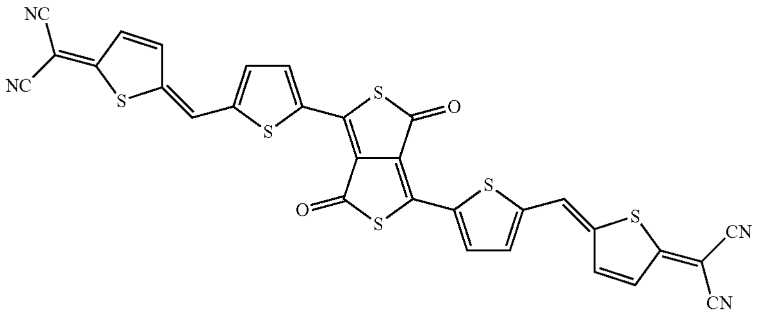
Molecular Weight: 650.80
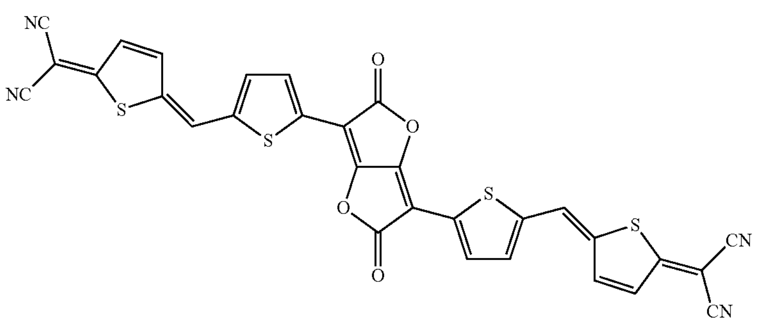
Molecular Weight: 618.67

-continued
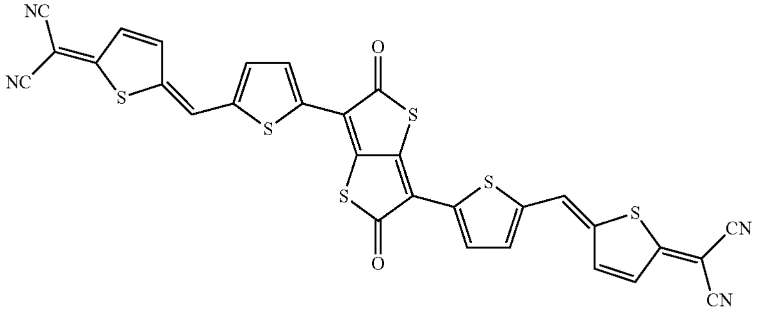
Molecular Weight: 650.80
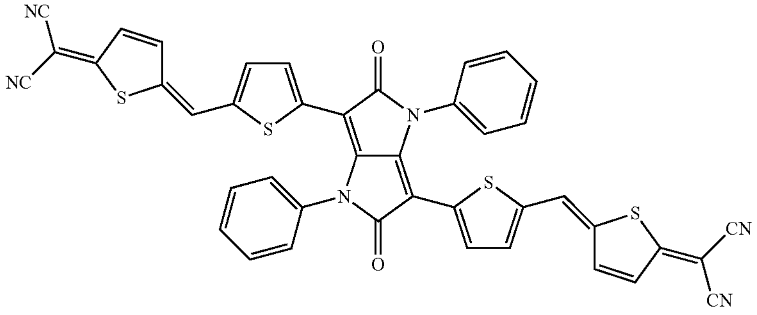
Molecular Weight: 768.90
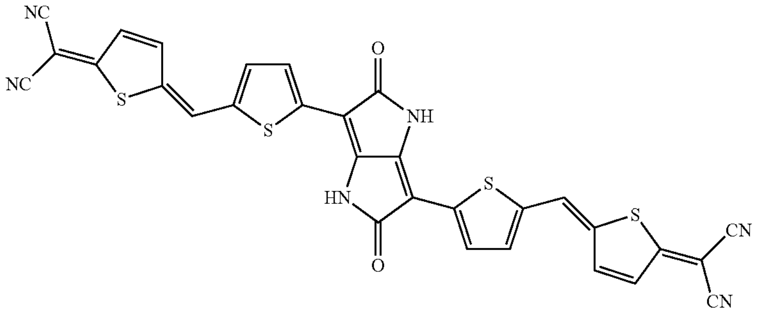
Molecular Weight: 616.71
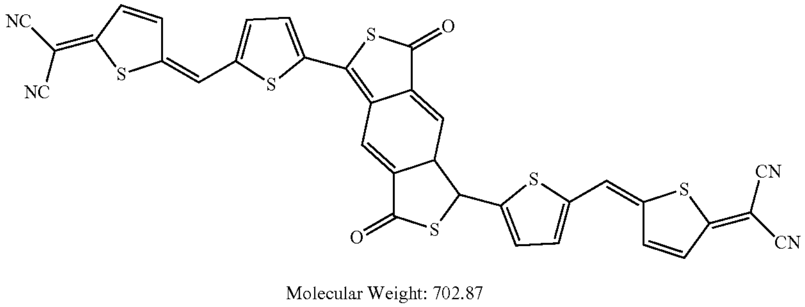
Molecular Weight: 702.87
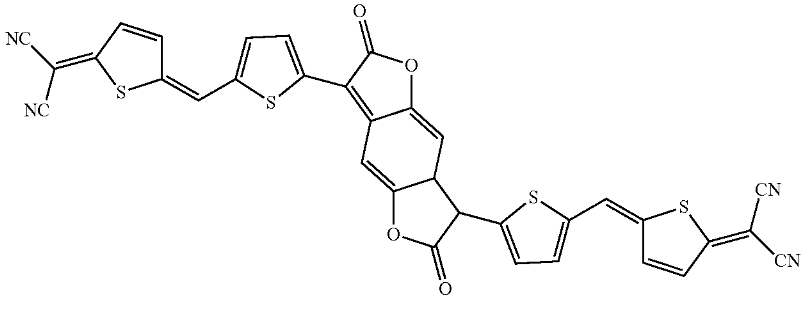
Molecular Weight: 670.75

-continued
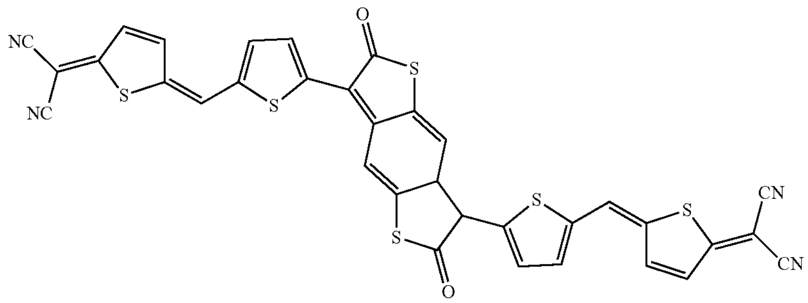
Molecular Weight: 702.87
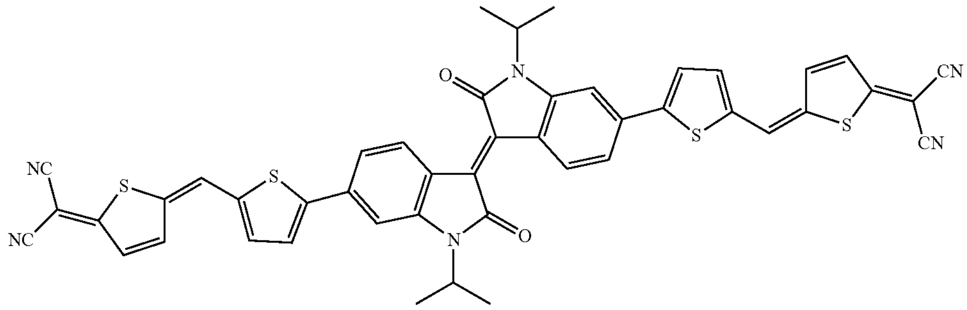
Molecular Weight: 827.03
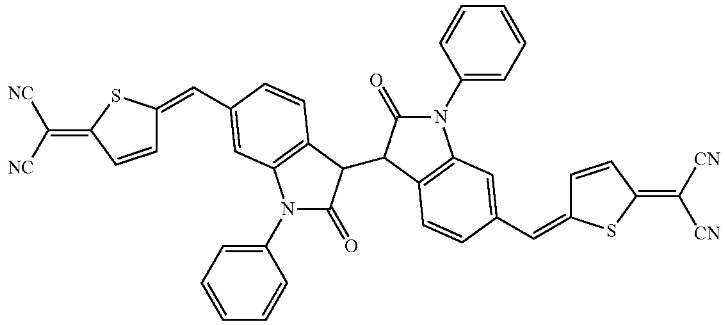
Molecular Weight: 730.82
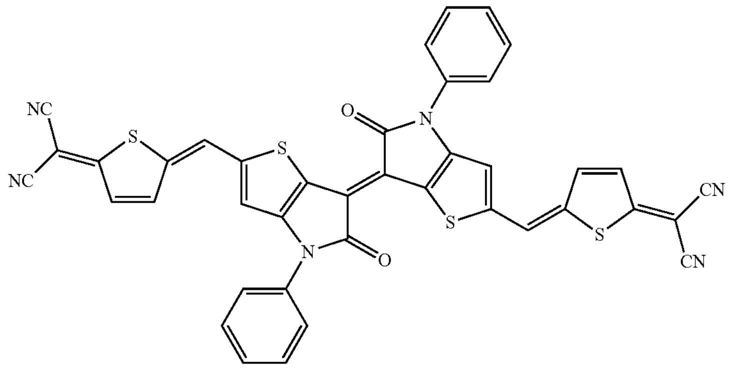
Molecular Weight: 742.86

-continued
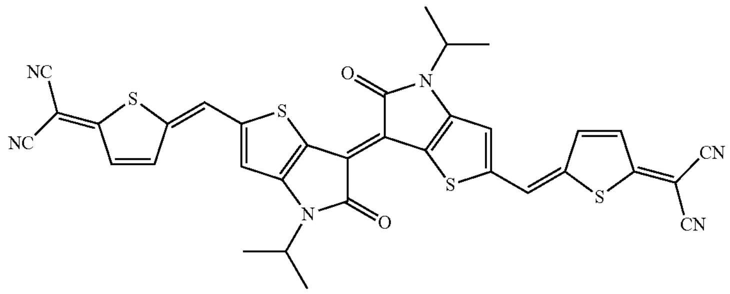
Molecular Weight: 674.83
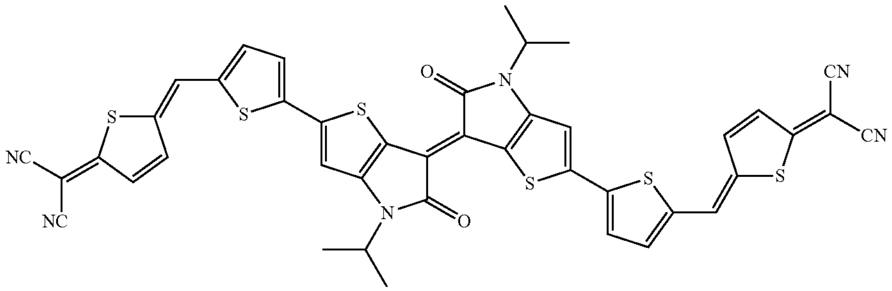
Molecular Weight: 839.07
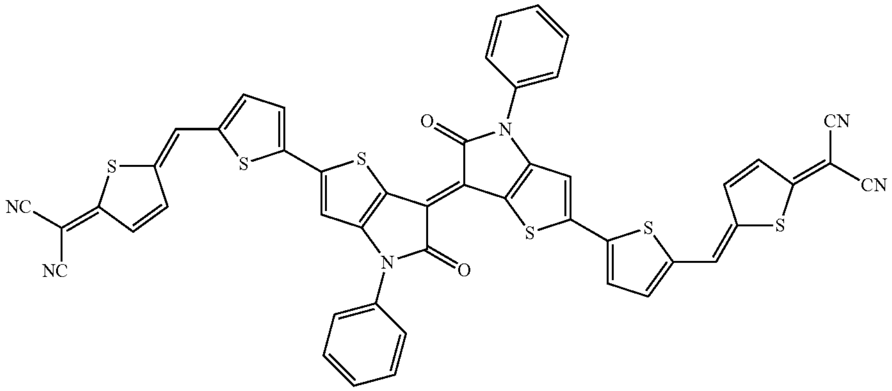
Molecular Weight: 907.10
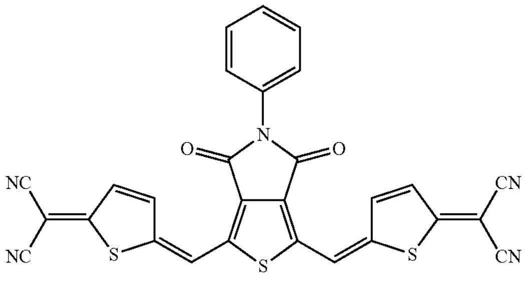
Molecular Weight: 545.61

-continued
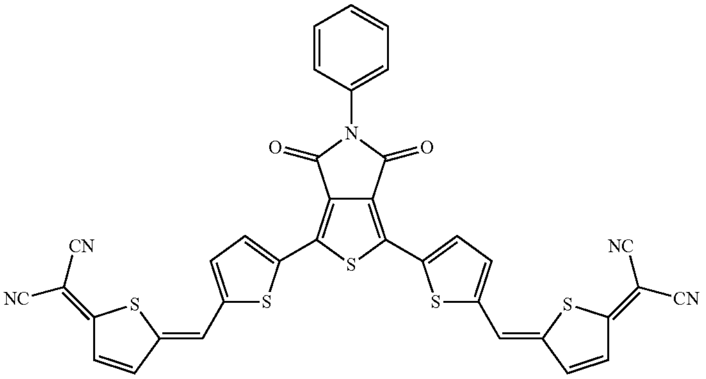
Molecular Weight: 709.85
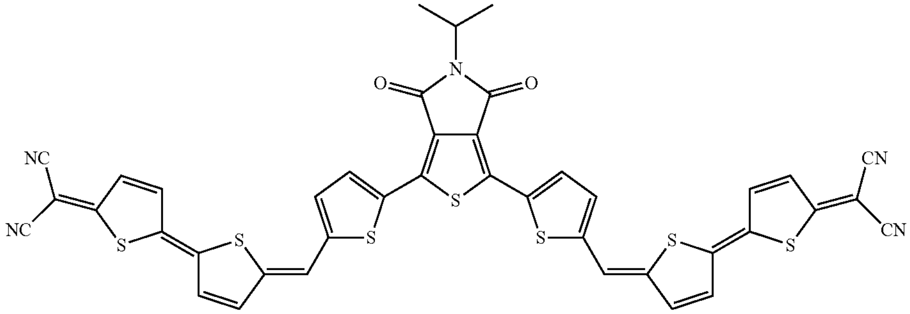
Molecular Weight: 840.07
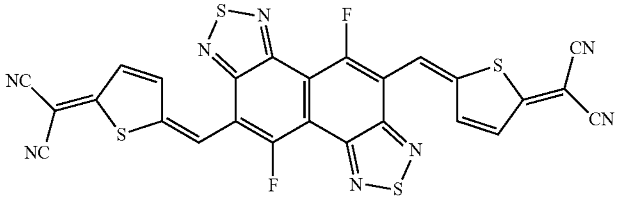
Molecular Weight: 596.63
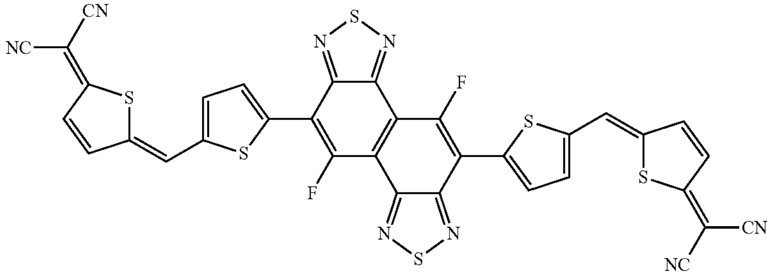
Molecular Weight: 760.87
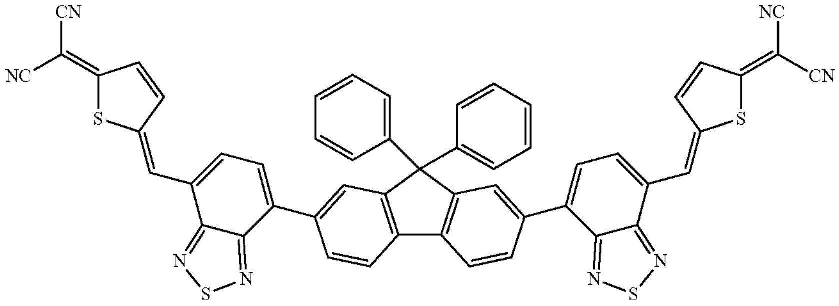
Molecular Weight: 903.09

-continued
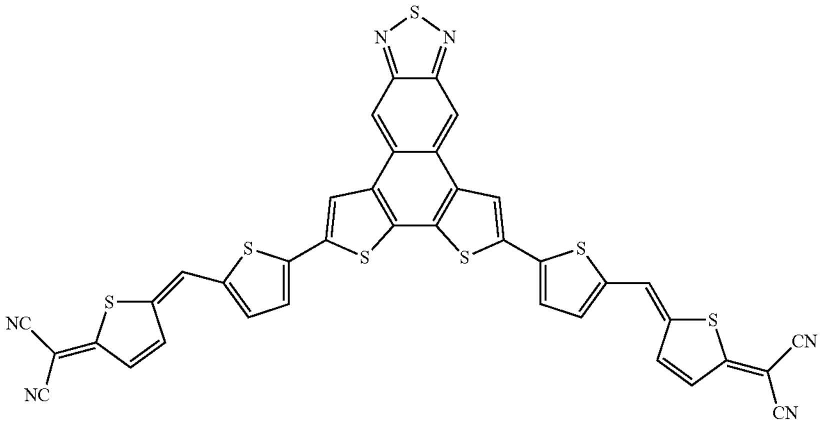
Molecular Weight: 780.97
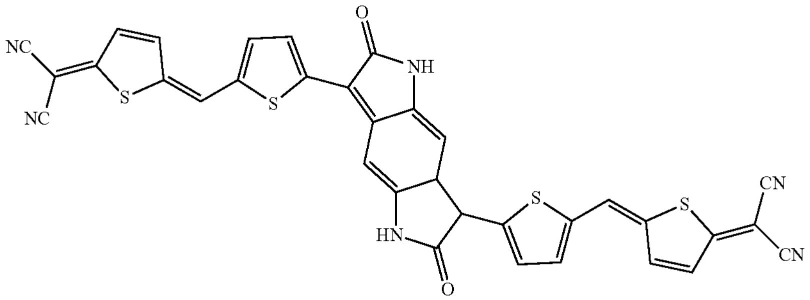
Molecular Weight: 668.78
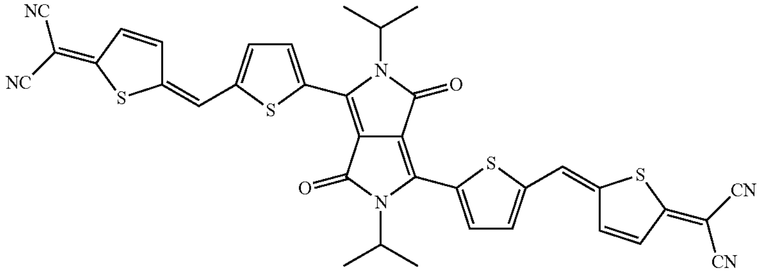
Molecular Weight: 700.87
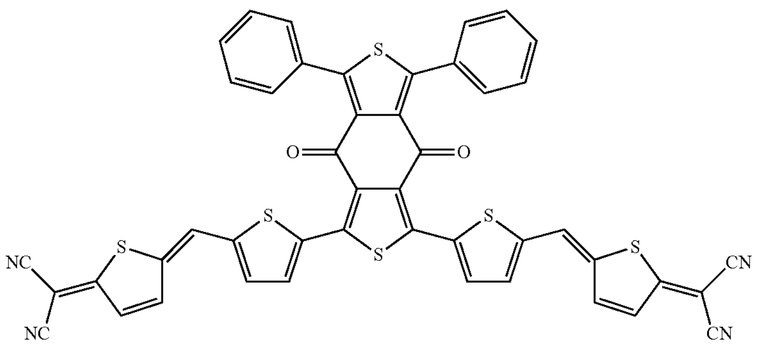
Molecular Weight: 853.05

-continued
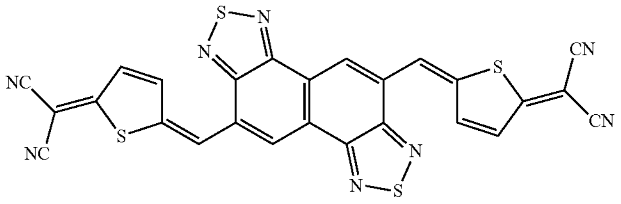
Molecular Weight: 560.65
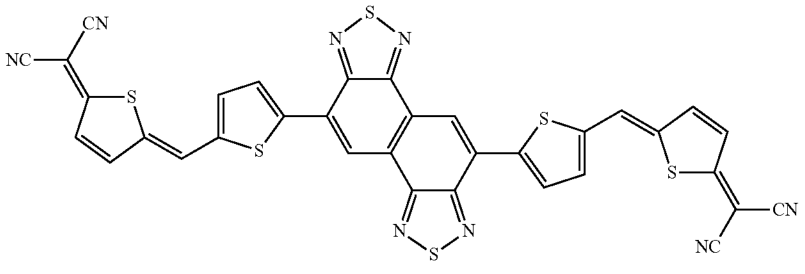
Molecular Weight: 724.89
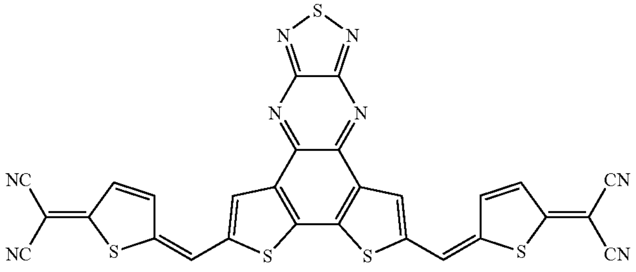
Molecular Weight: 616.73
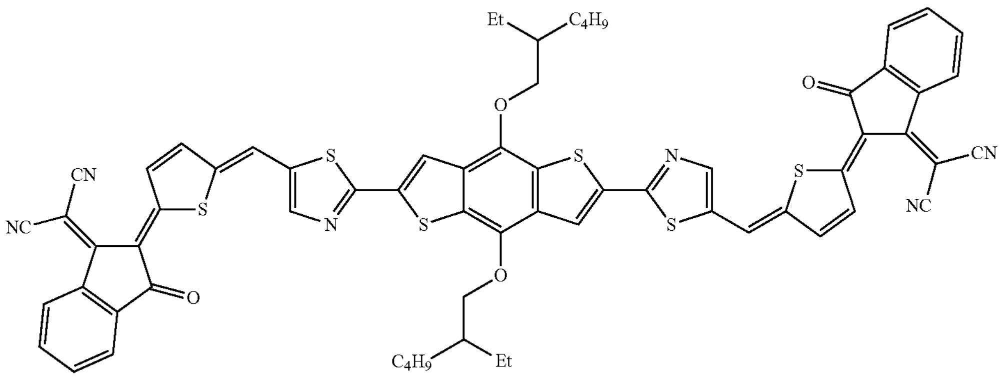
Molecular Weight: 1185.54

-continued
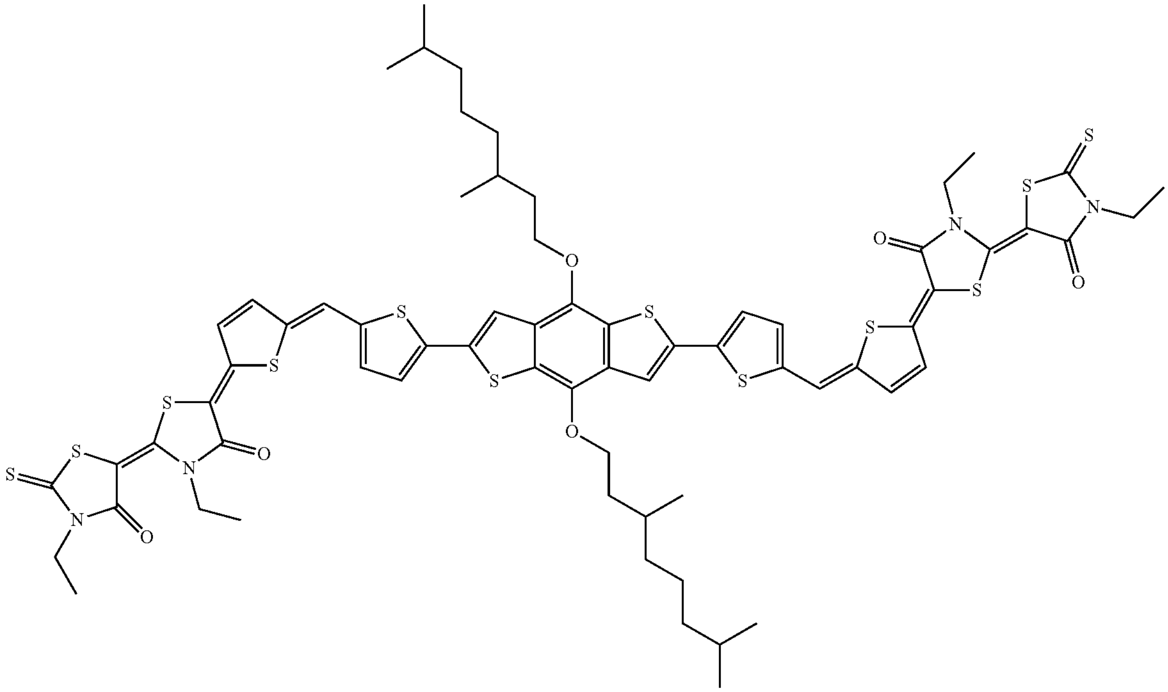
Molecular Weight: 1428.08
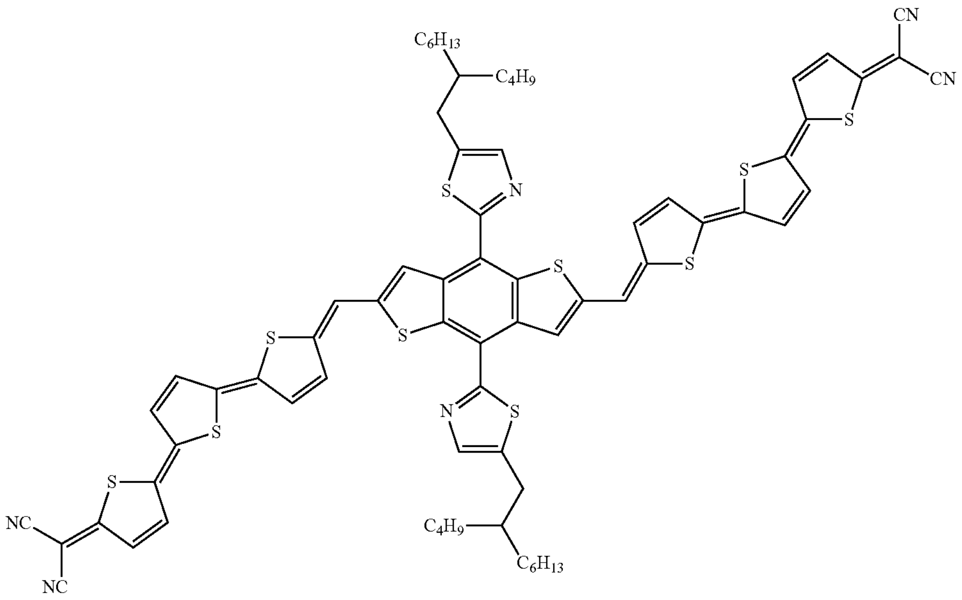
Molecular Weight: 1337.98

-continued
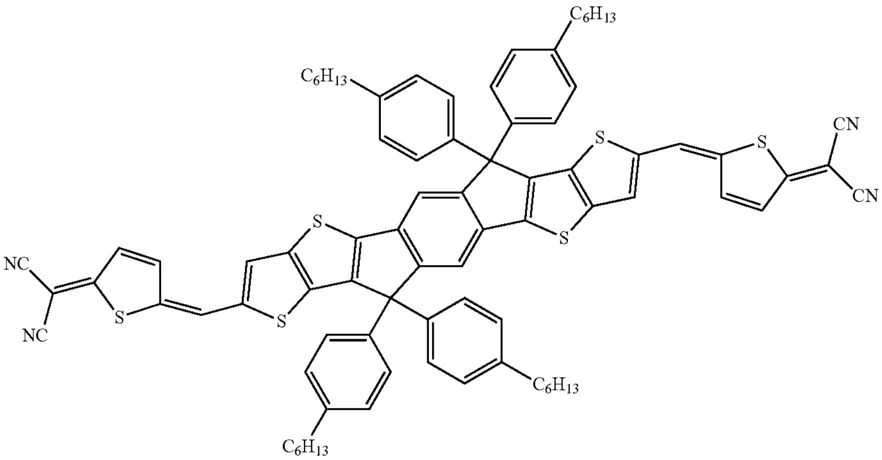
Molecular Weight: 1335.94
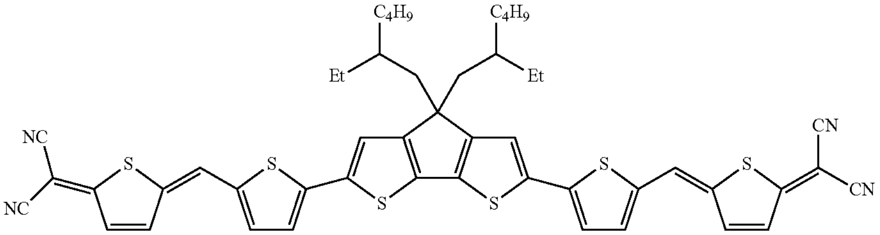
Molecular Weight: 883.30
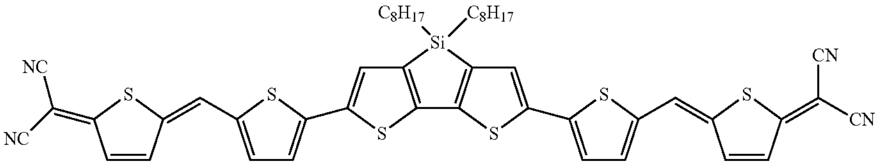
Molecular Weight: 899.37
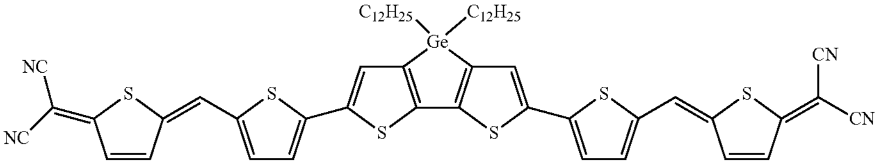
Molecular Weight: 1056.13
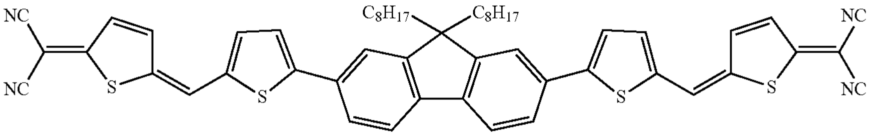
Molecular Weight: 871.25

-continued
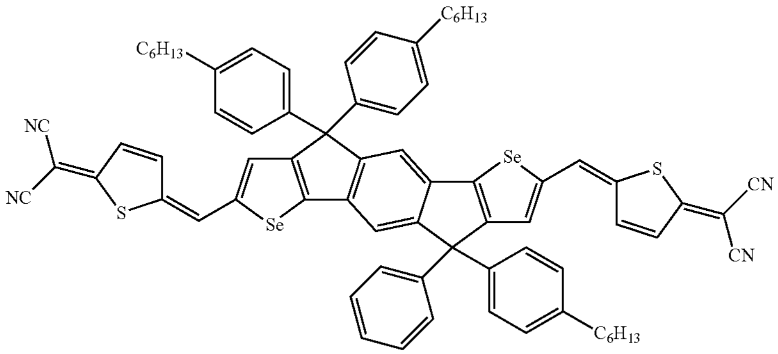
Molecular Weight: 1233.43
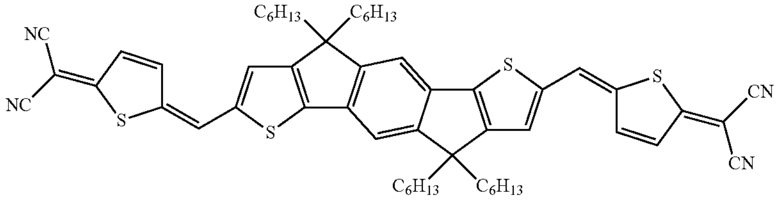
Molecular Weight: 919.38
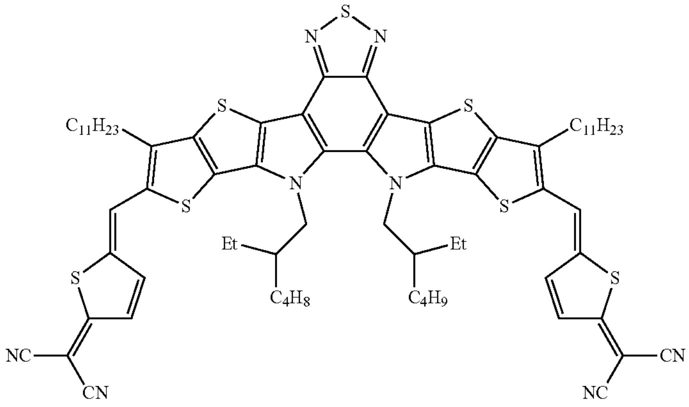
Molecular Weight: 1287.96
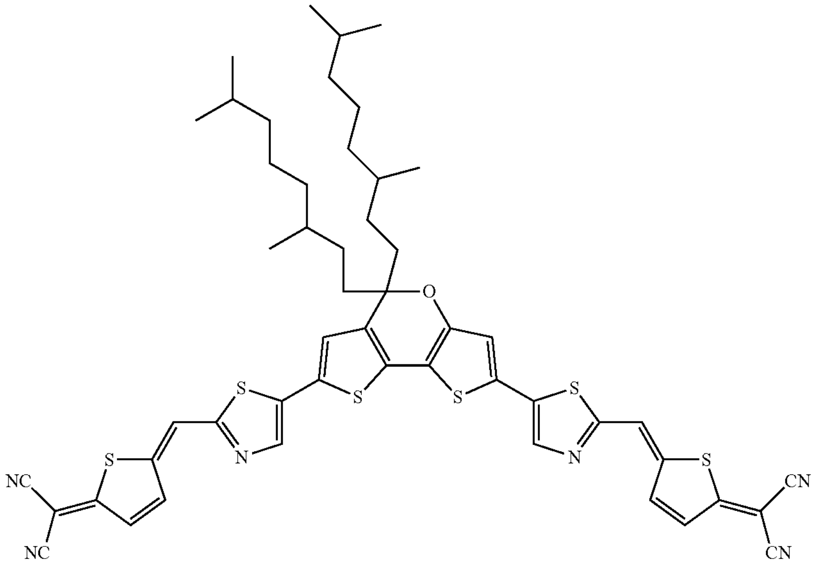
Molecular Weight: 957.38

-continued
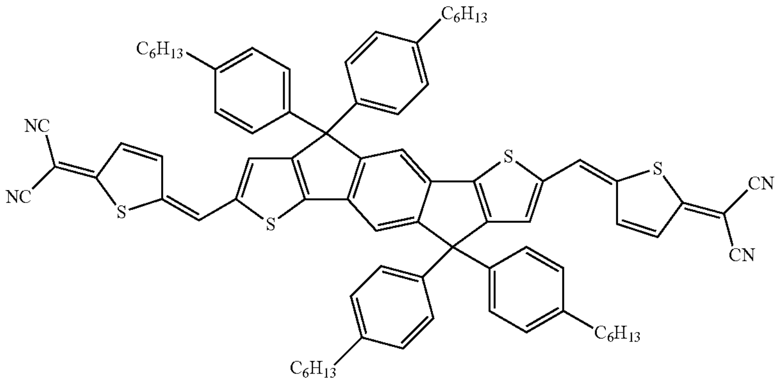
Molecular Weight: 1223.77
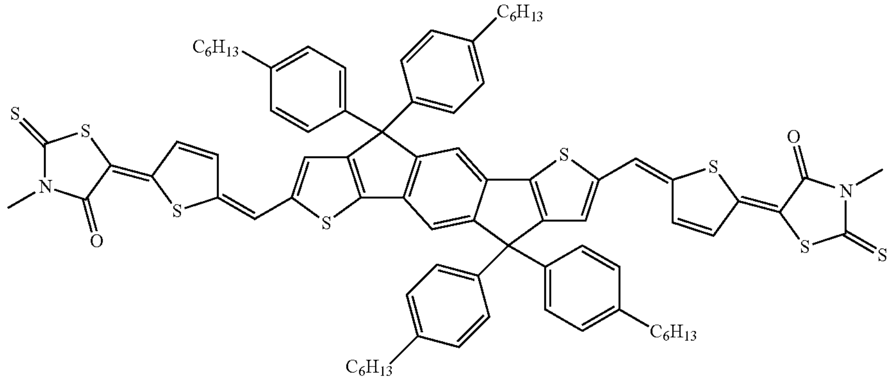
Molecular Weight: 1386.07
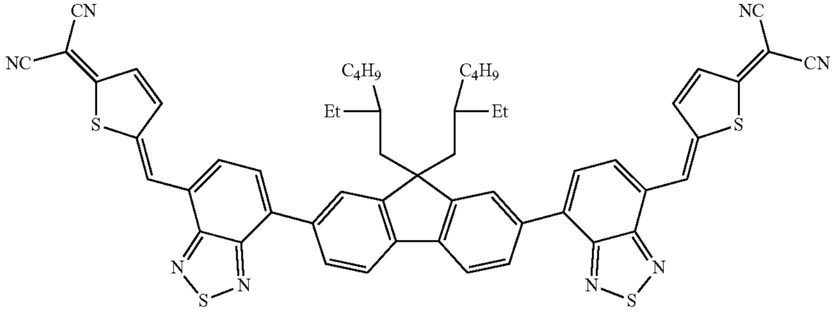
Molecular Weight: 975.32
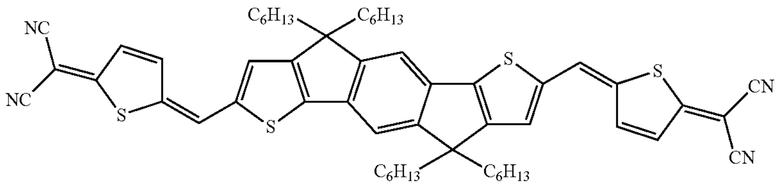
Molecular Weight: 919.38

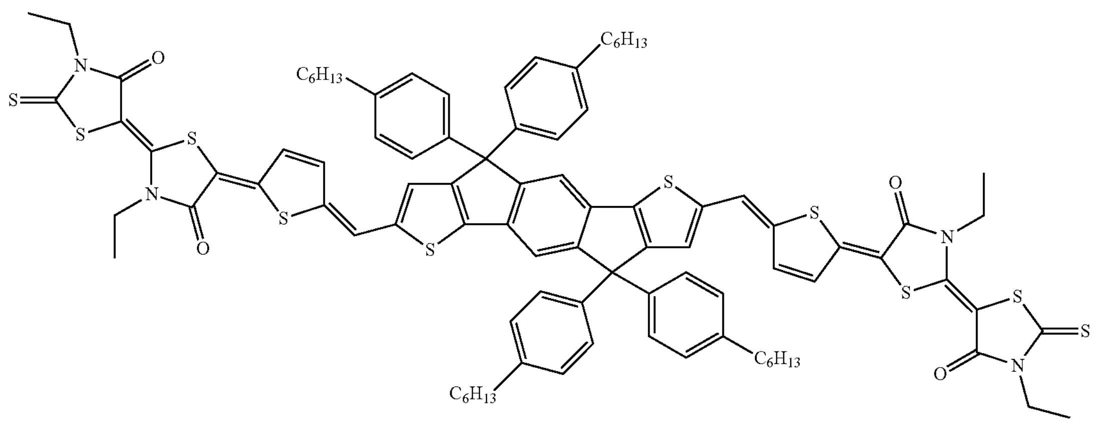
Molecular Weight: 1668.44
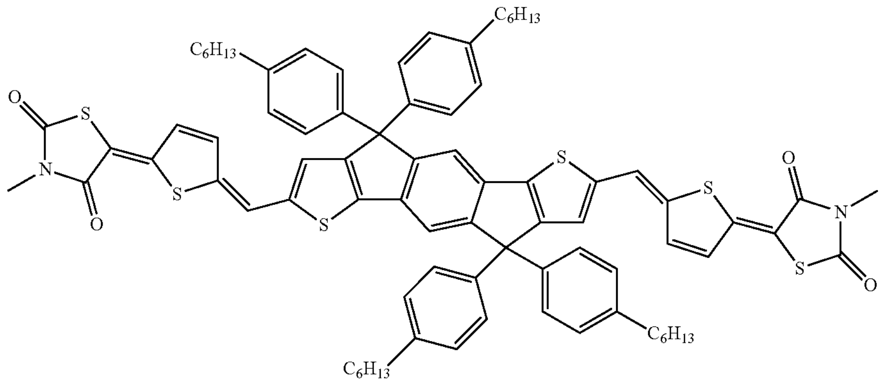
Molecular Weight: 1353.94
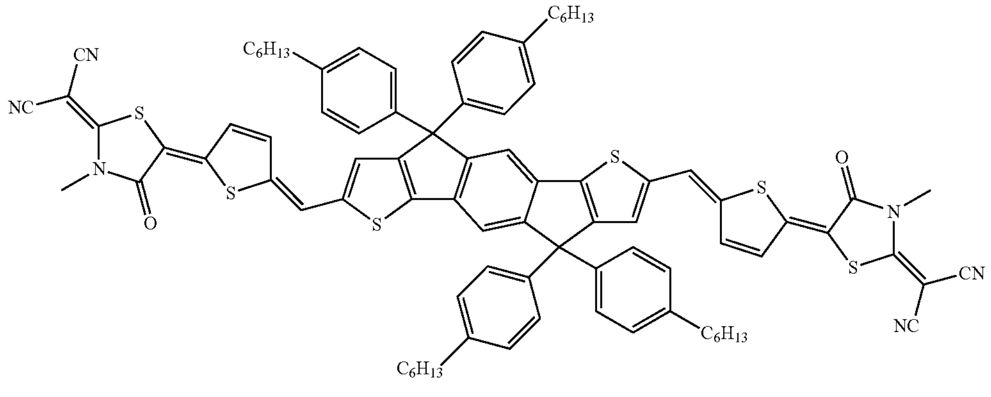
Molecular Weight: 1450.04

-continued
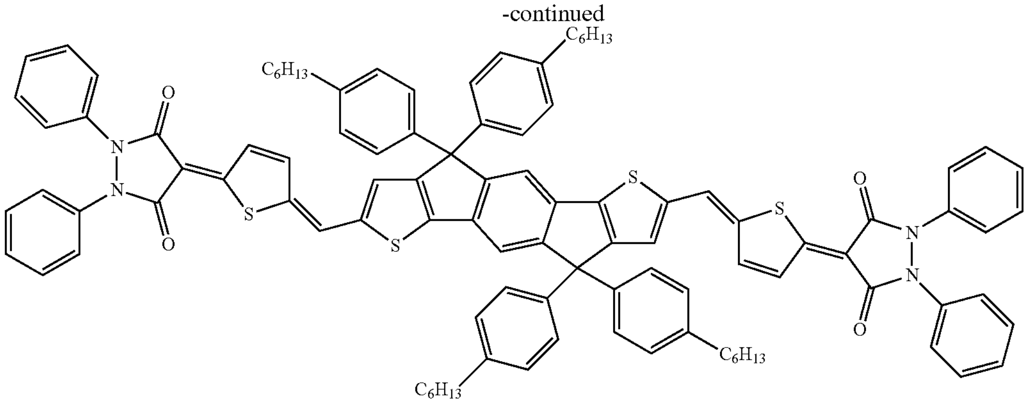
Molecular Weight: 1596.19
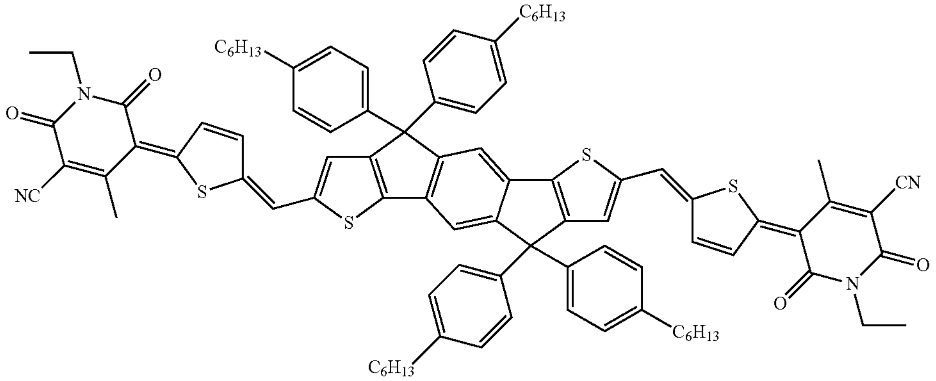
Molecular Weight: 1448.03
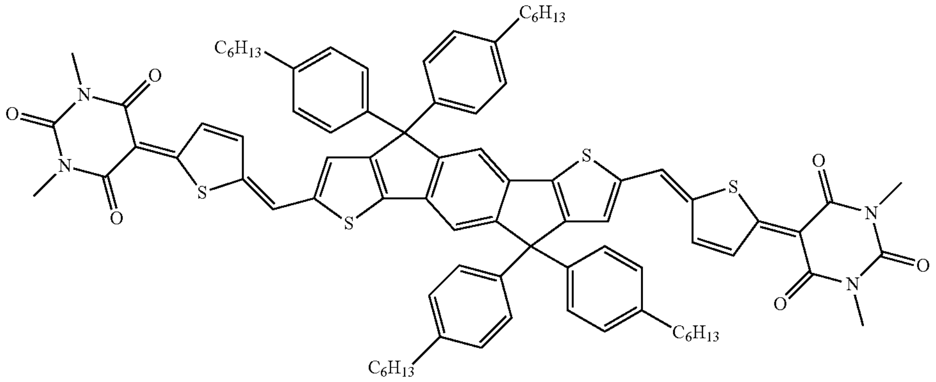
Molecular Weight: 1403.93
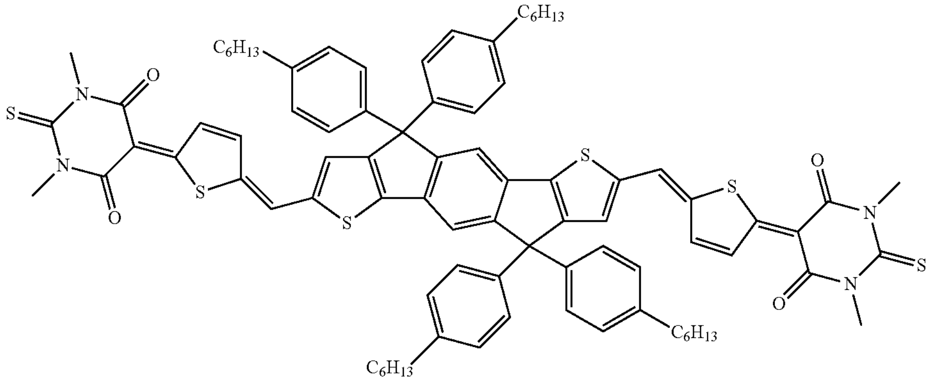
Molecular Weight: 1436.05

-continued
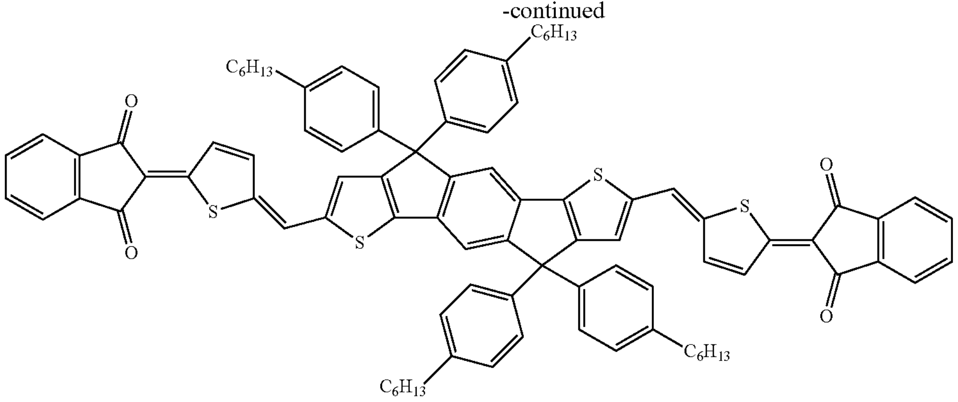
Molecular Weight: 1383.94
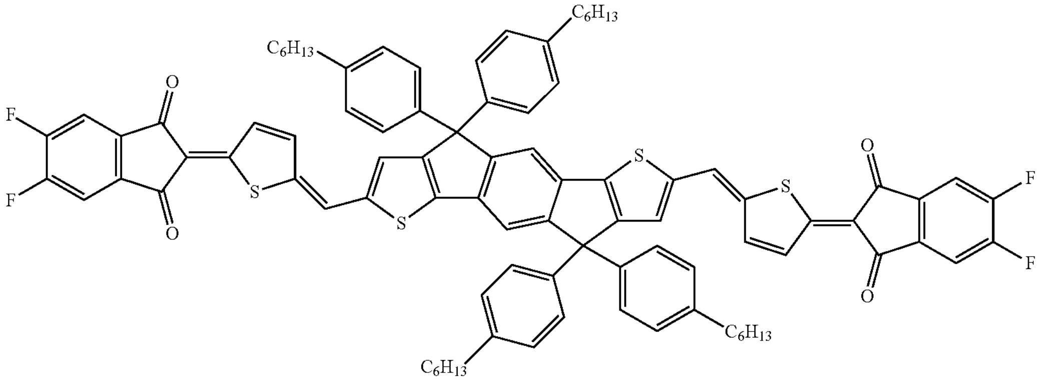
Molecular Weight: 1455.90
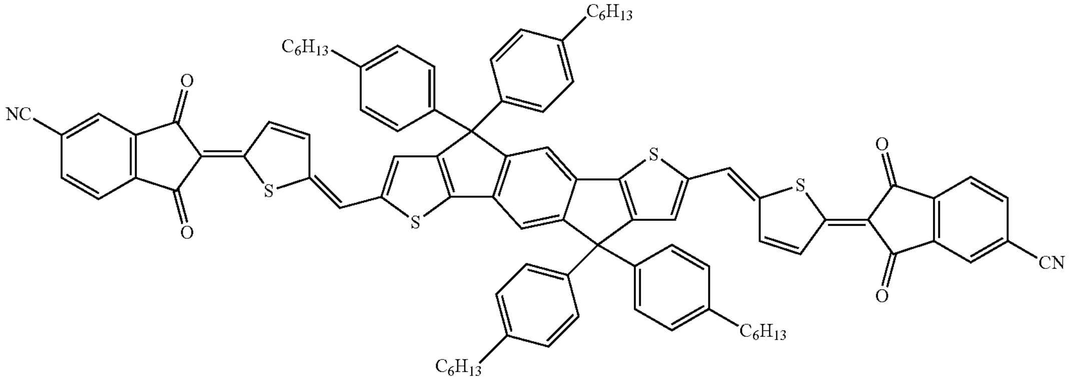
Molecular Weight: 1433.96
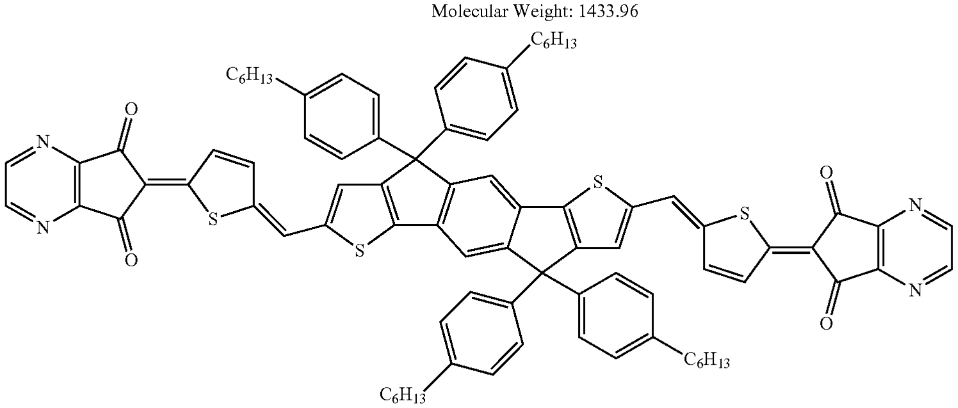
Molecular Weight: 1387.89

-continued
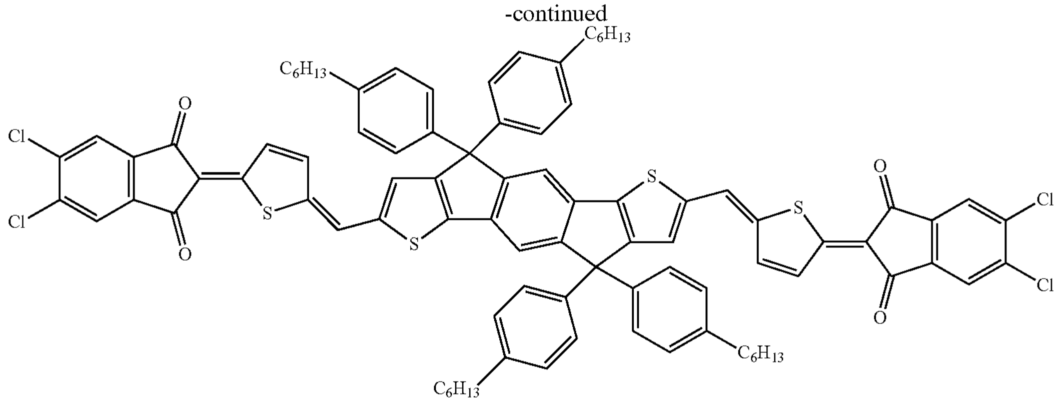
Molecular Weight: 1521.70
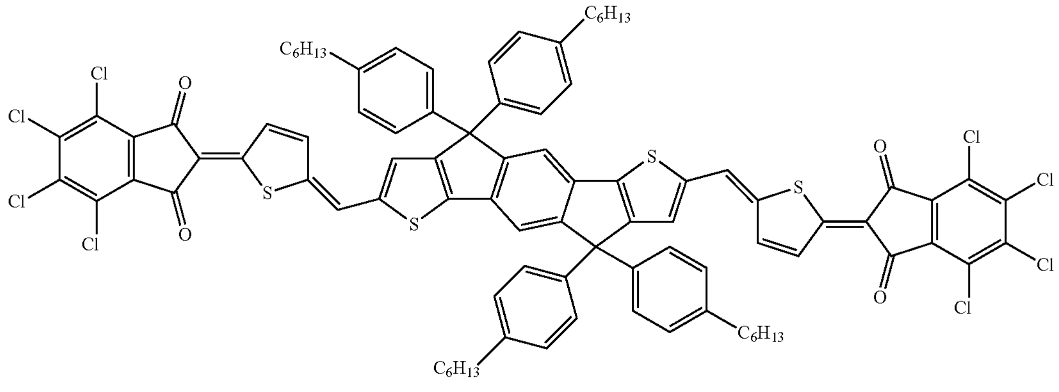
Molecular Weight: 1659.47
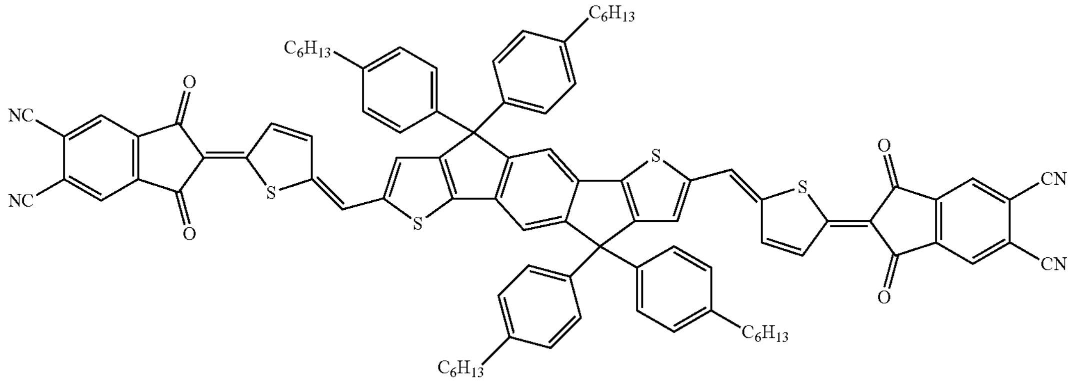
Molecular Weight: 1483.98
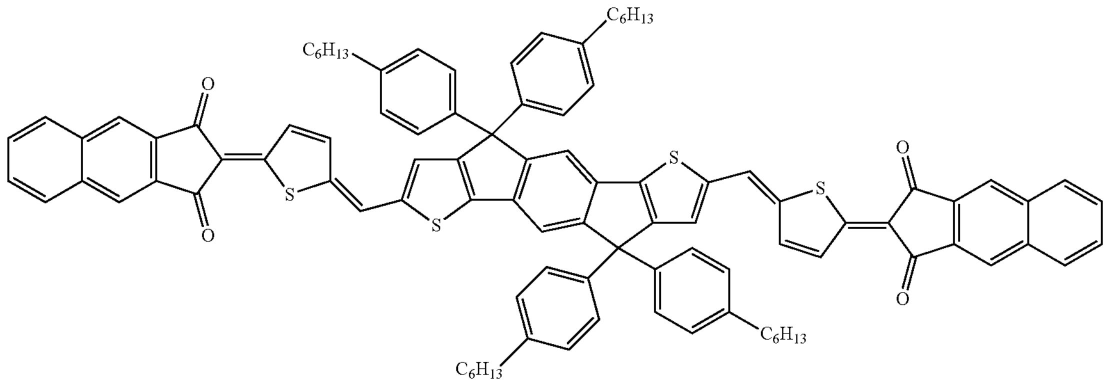
Molecular Weight: 1484.06

-continued
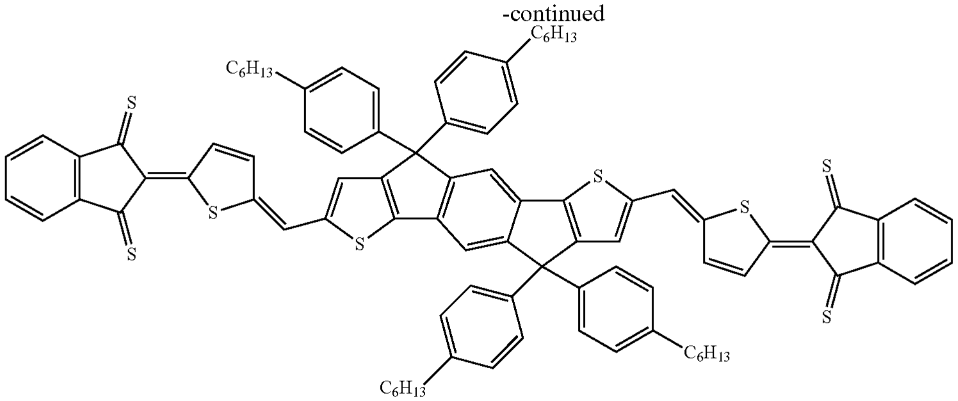
Molecular Weight: 1448.18
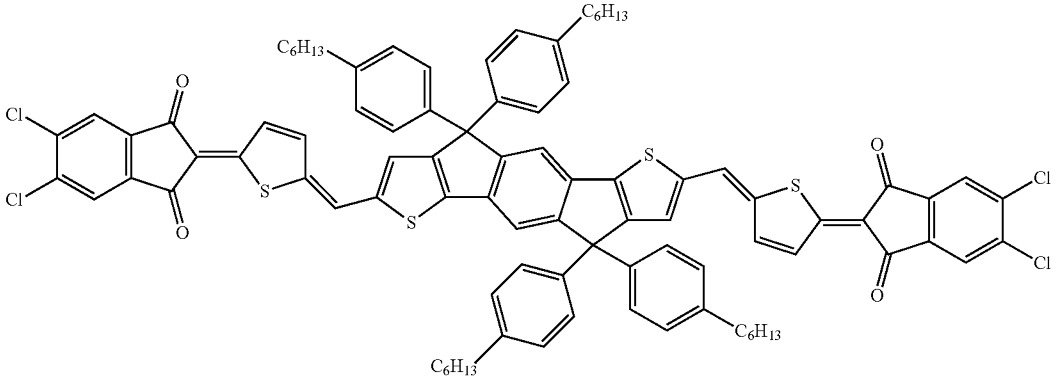
Molecular Weight: 1521.70
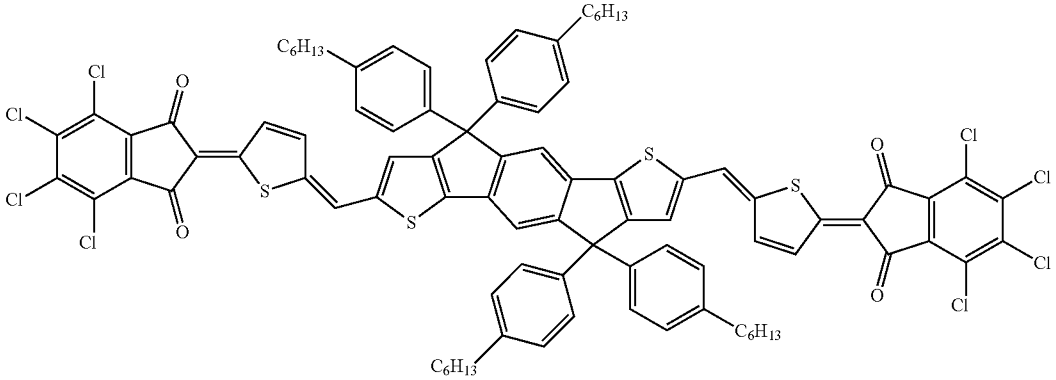
Molecular Weight: 1659.47
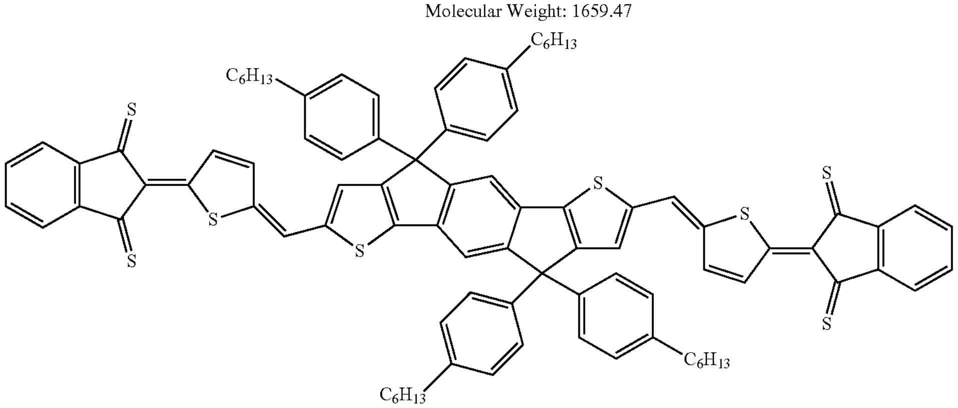
Molecular Weight: 1448.18

-continued
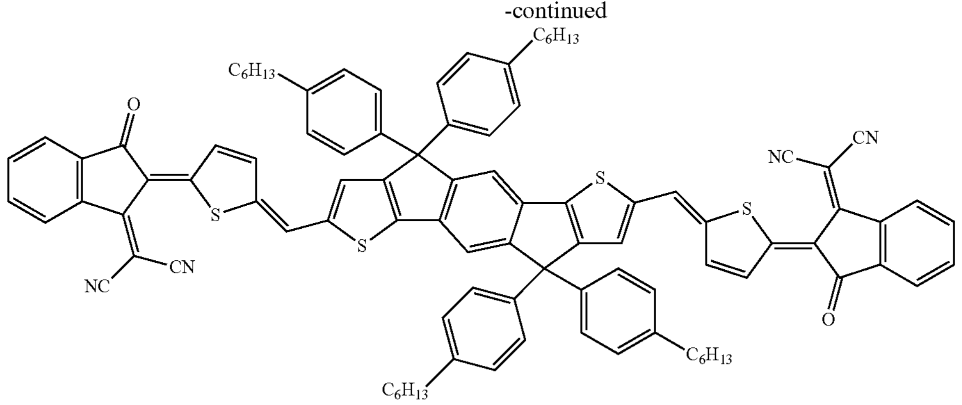
Molecular Weight: 1480.03
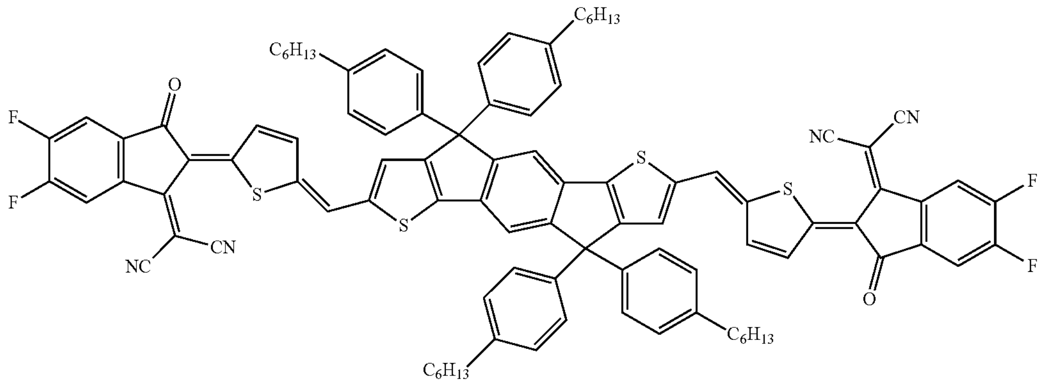
Molecular Weight: 1551.99
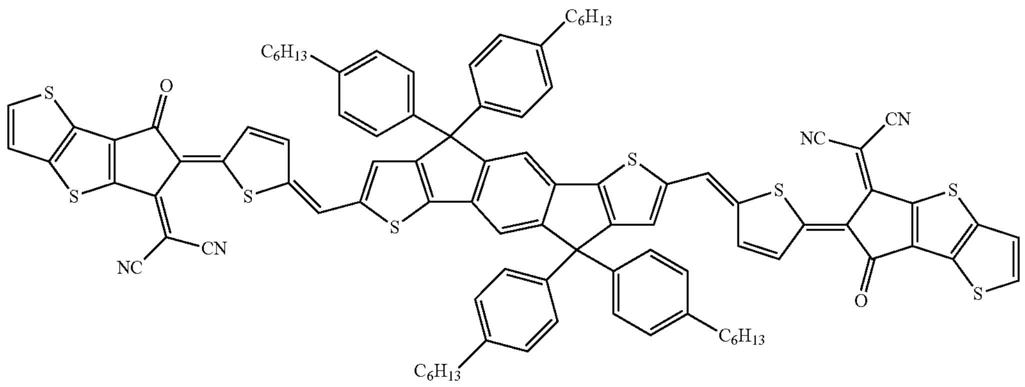
Molecular Weight: 1604.24
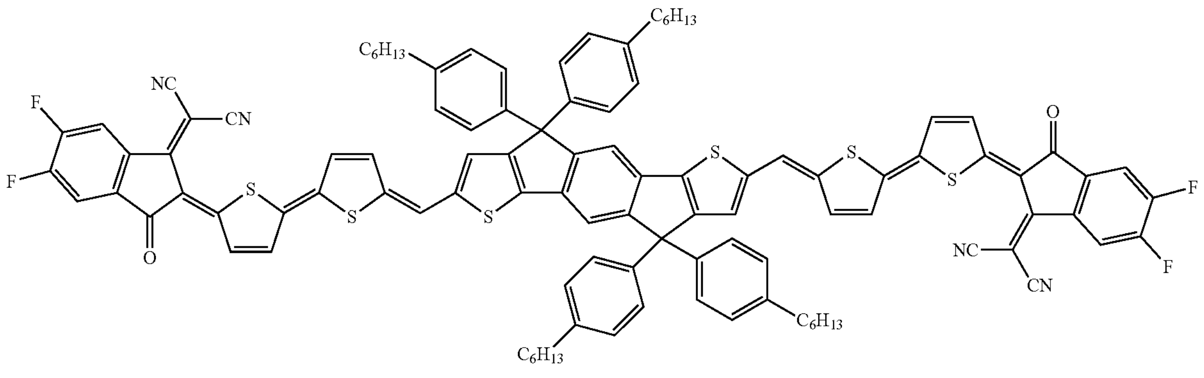
Molecular Weight: 1716.23

-continued
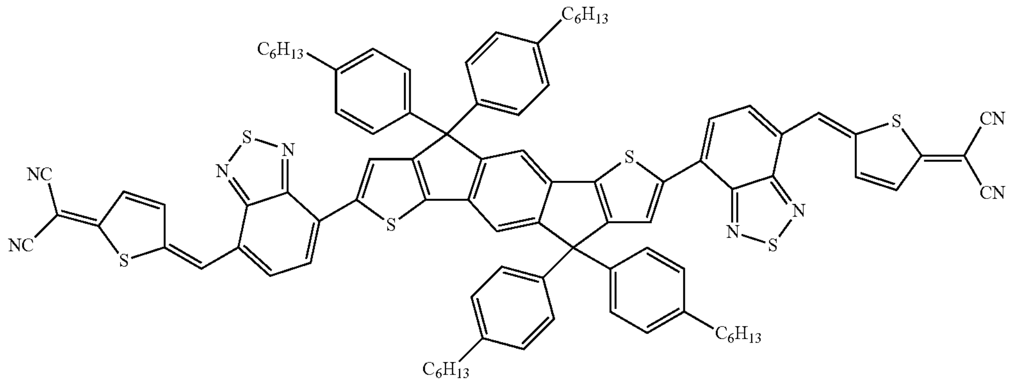
Molecular Weight: 1492.08
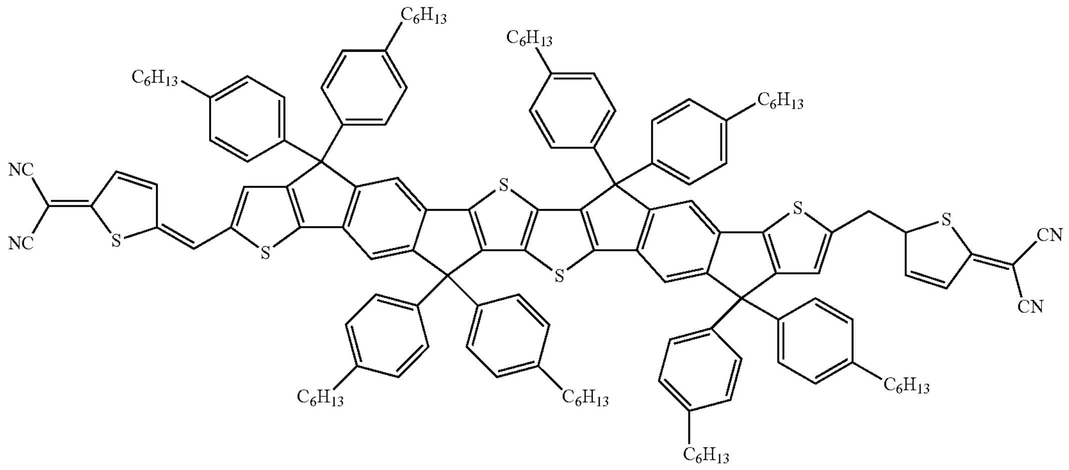
Molecular Weight: 2103.13
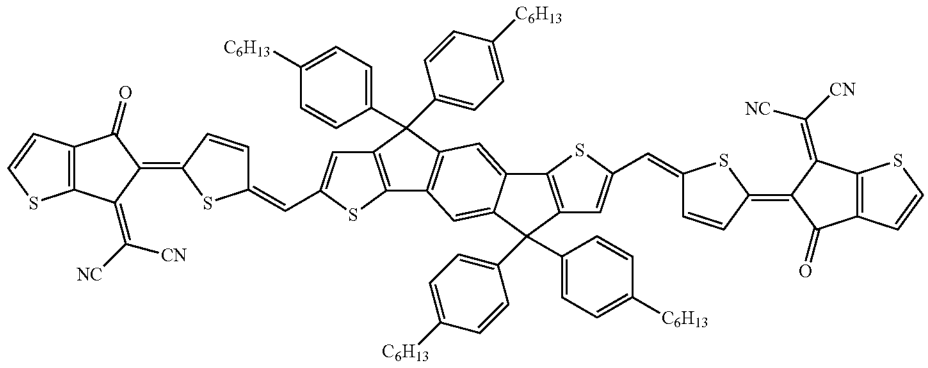
Molecular Weight: 1492.08

-continued
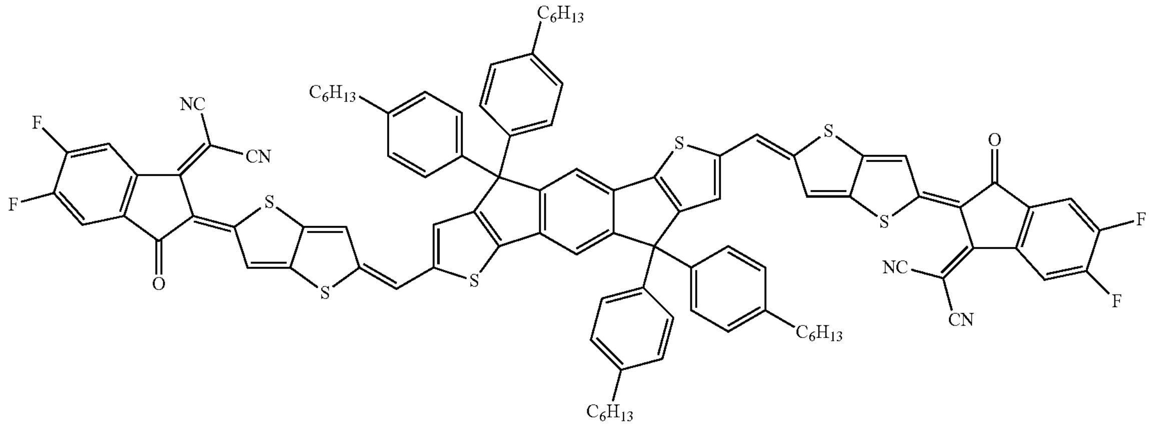
Molecular Weight: 1664.16
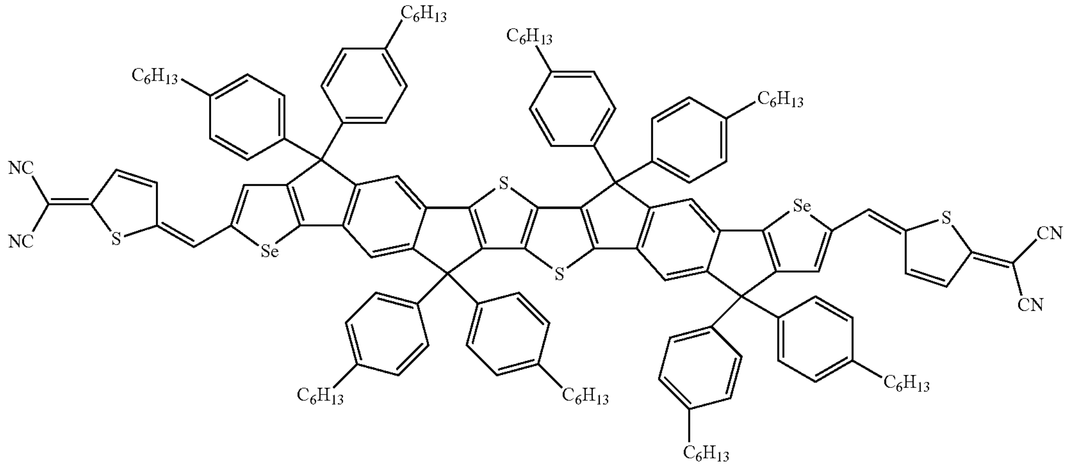
Molecular Weight: 2196.96
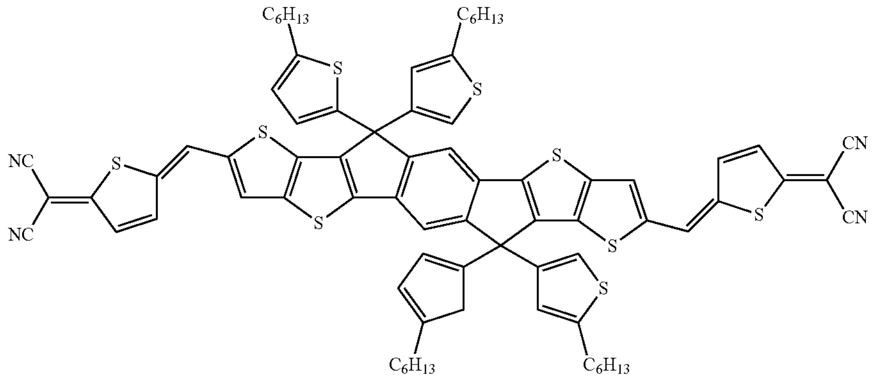
Molecular Weight: 1341.99

-continued
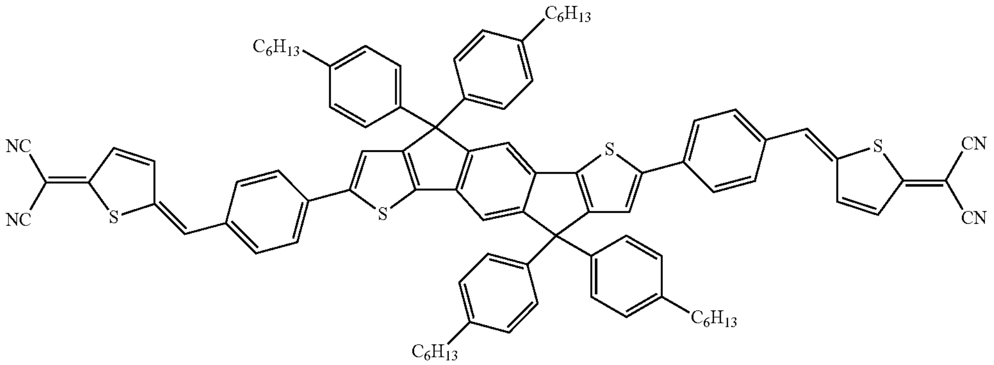
Molecular Weight: 1375.97
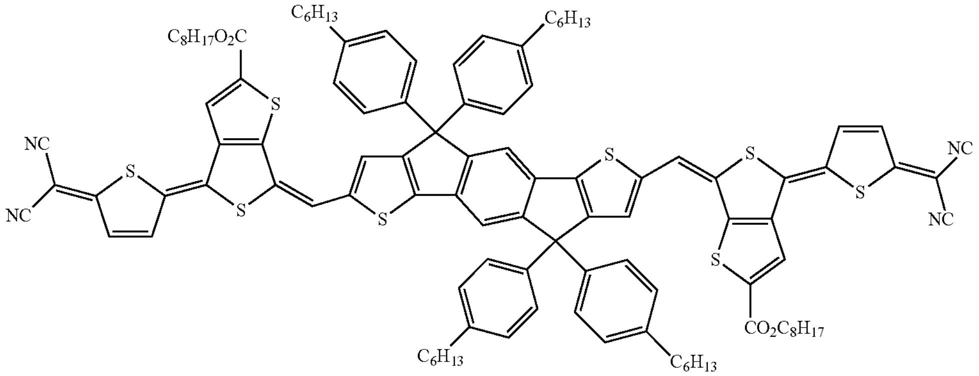
Molecular Weight: 1812.63
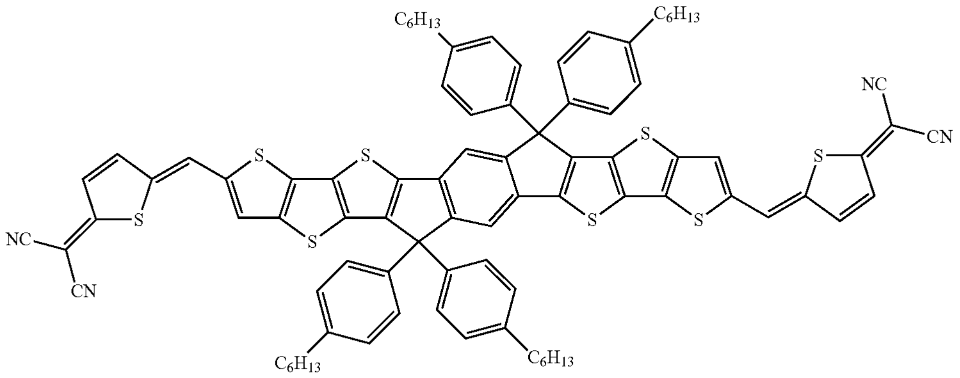
Molecular Weight: 1448.10
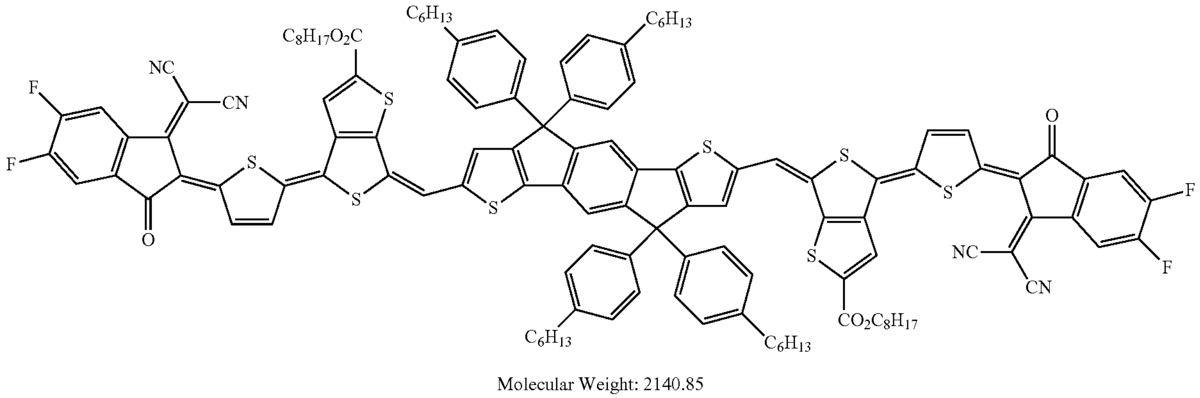
Molecular Weight: 2140.85

-continued
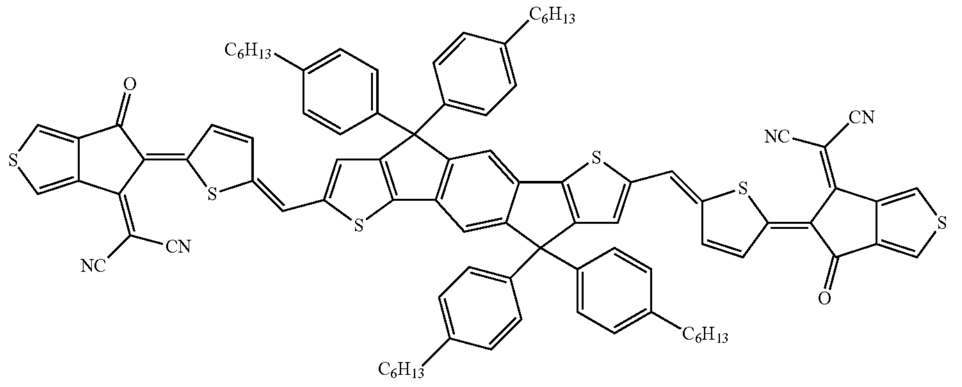
Molecular Weight: 1492.08
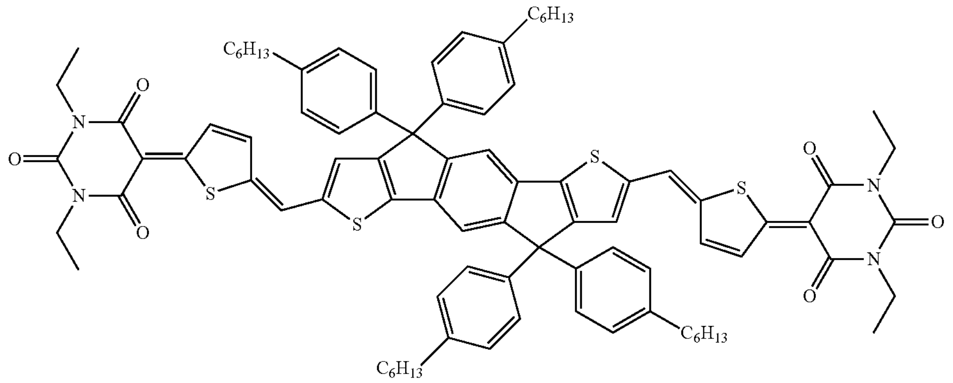
Molecular Weight: 1460.04
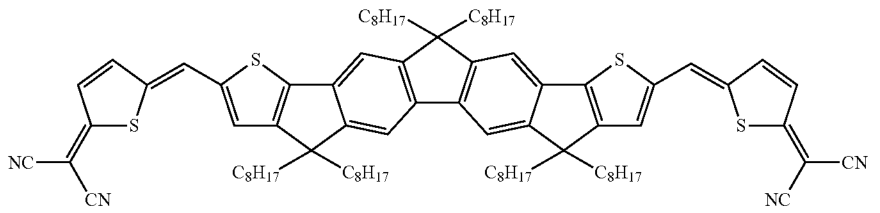
Molecular Weight: 1344.14
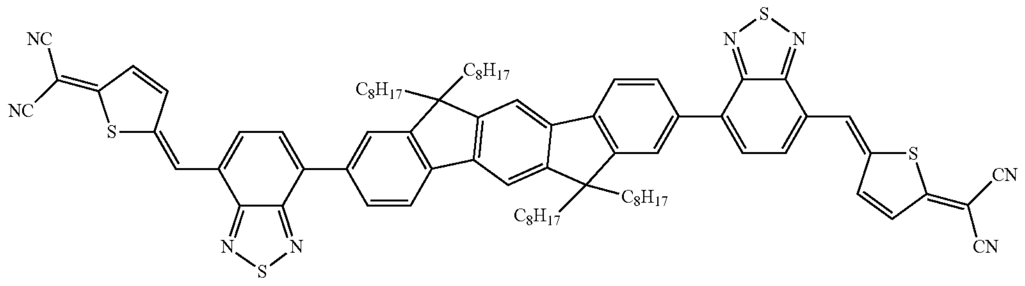
Molecular Weight: 1287.86

-continued
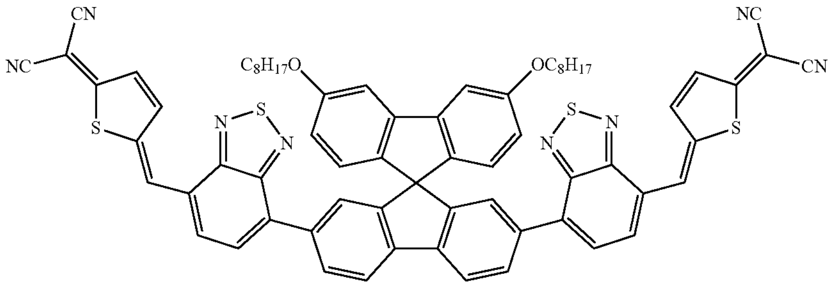
Molecular Weight: 1157.50
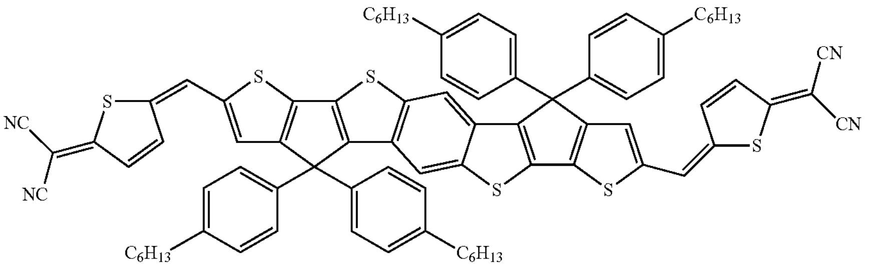
Molecular Weight: 1335.94
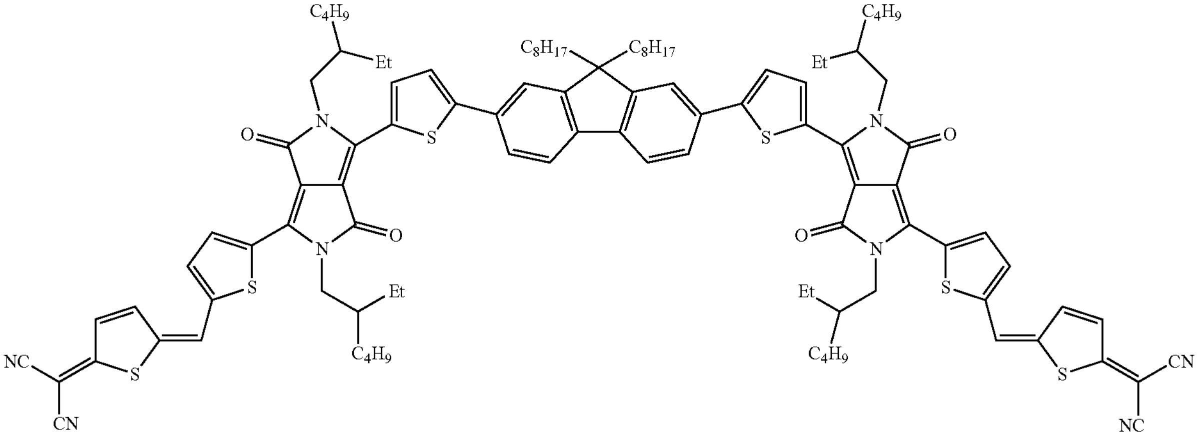
Molecular Weight: 1752.54
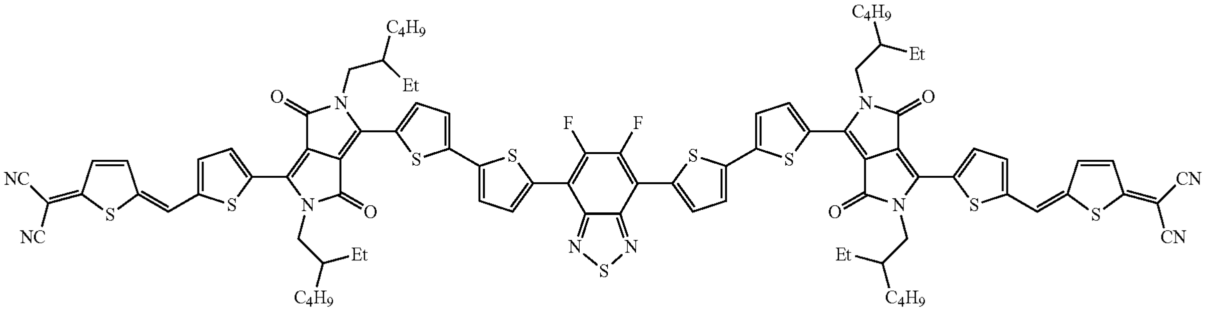
Molecular Weight: 1698.28

-continued
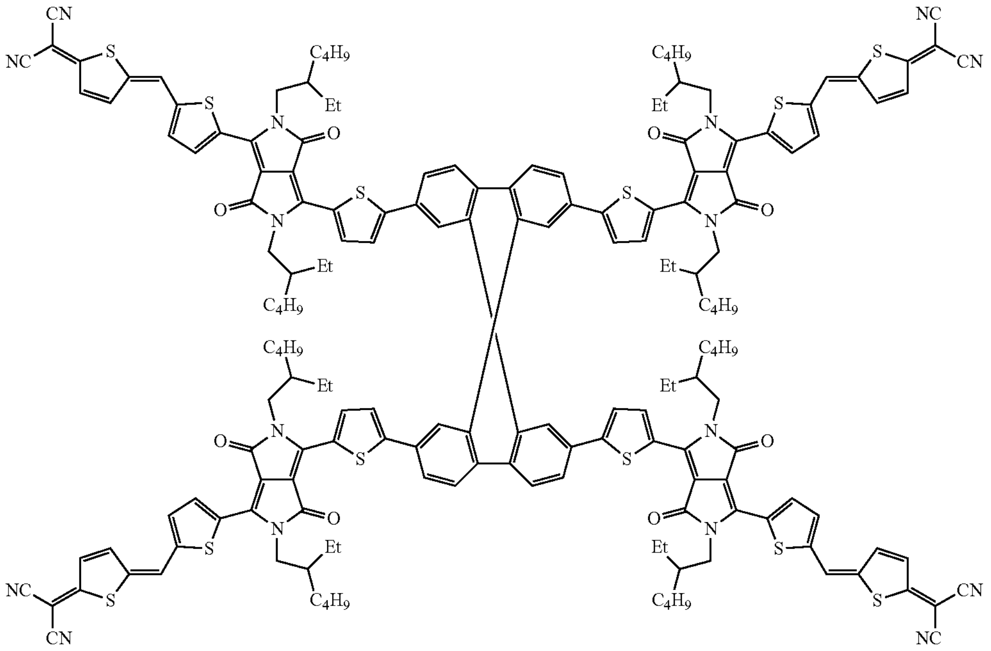
Molecular Weight: 3040.18
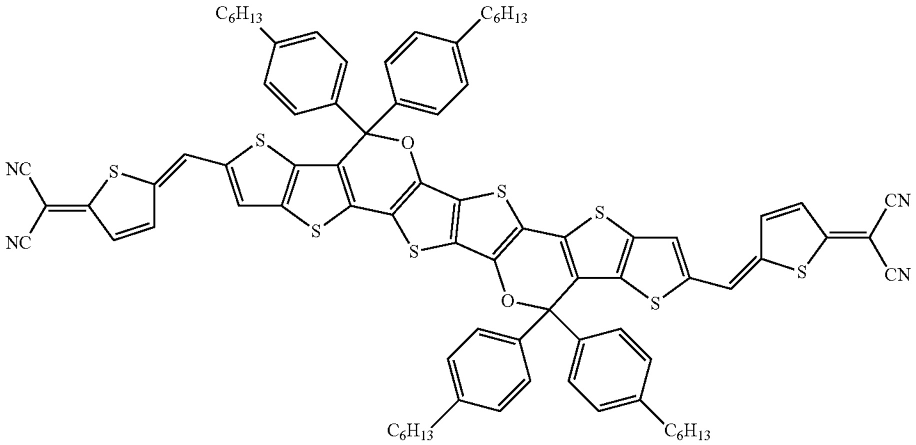
Molecular Weight: 1430.04
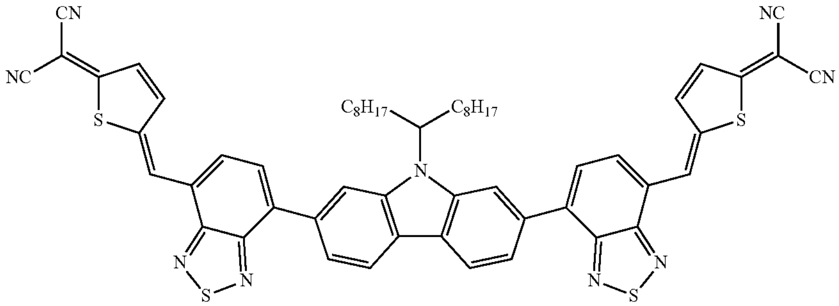
Molecular Weight: 990.34

-continued
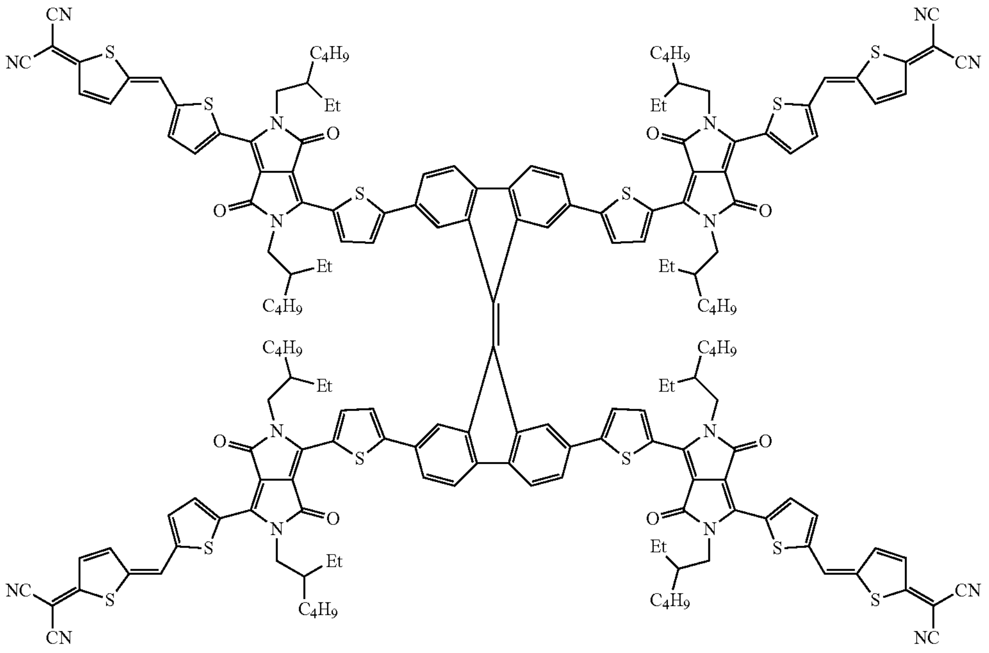
Molecular Weight: 3052.19
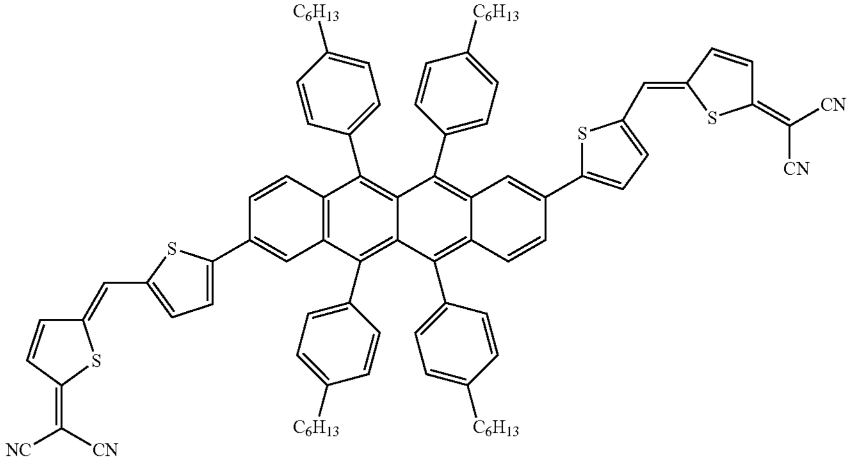
Molecular Weight: 1349.93
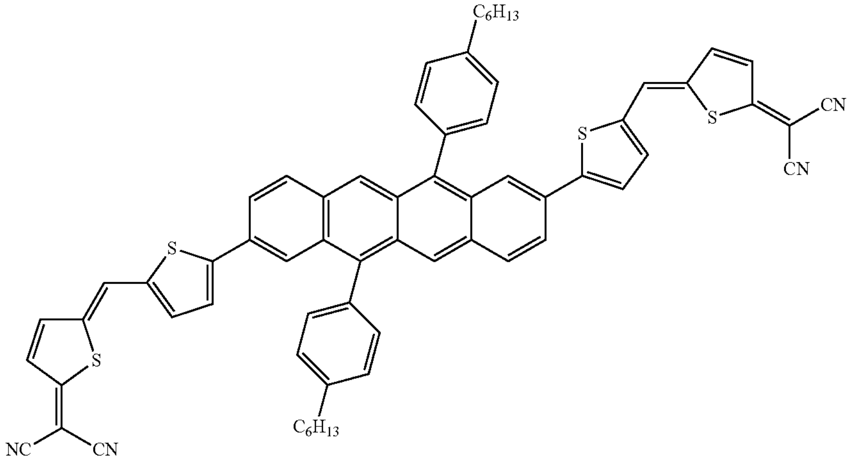
Molecular Weight: 1029.41

-continued
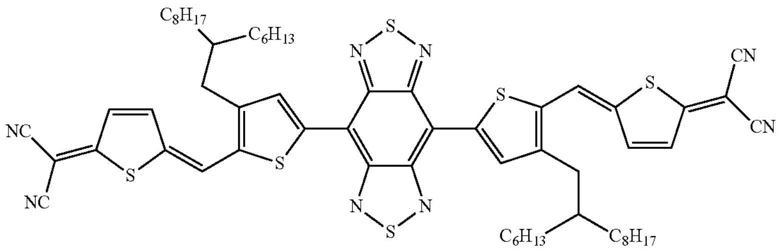
Molecular Weight: 1123.69
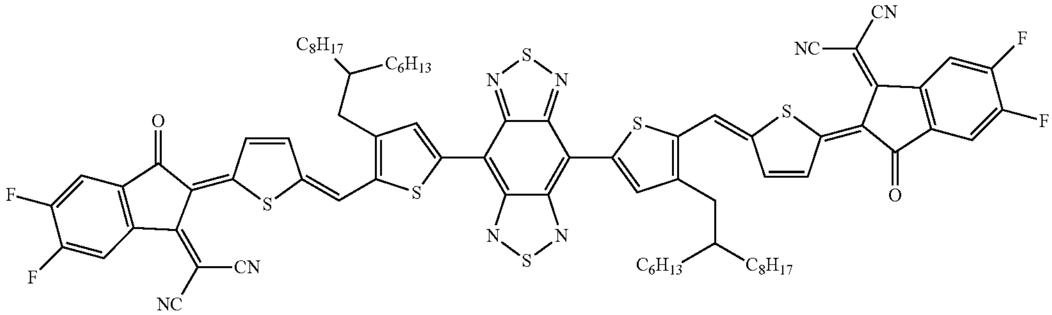
Molecular Weight: 1451.91
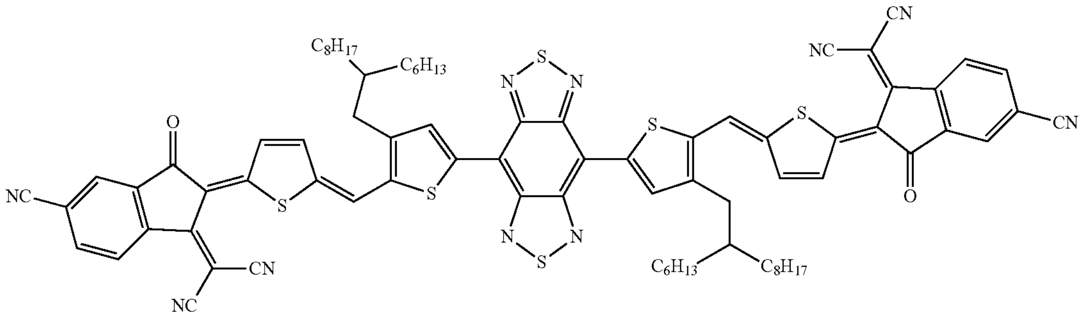
Molecular Weight: 1429.97
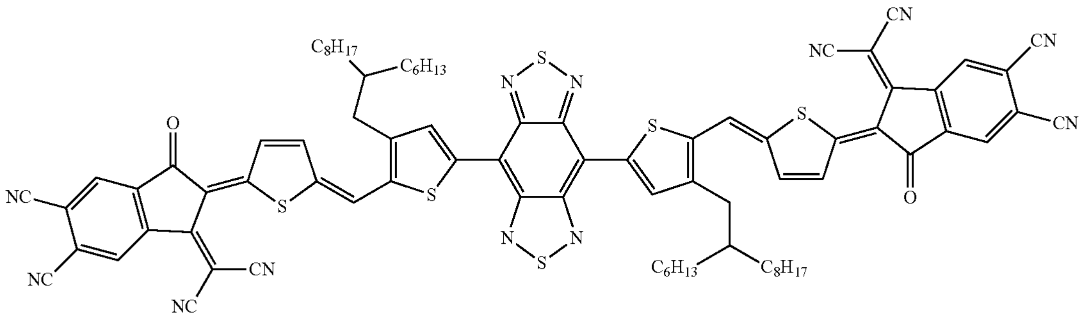
Molecular Weight: 1479.99
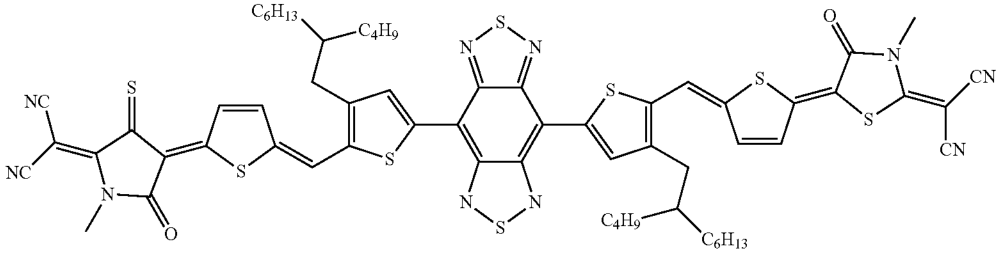
Molecular Weight: 1237.74

-continued
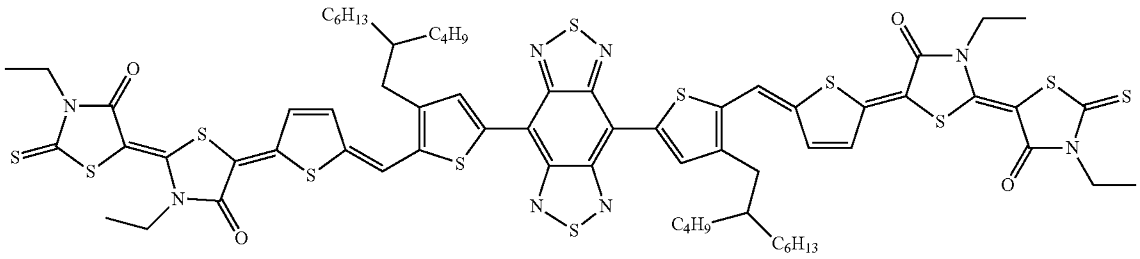
Molecular Weight: 1456.14
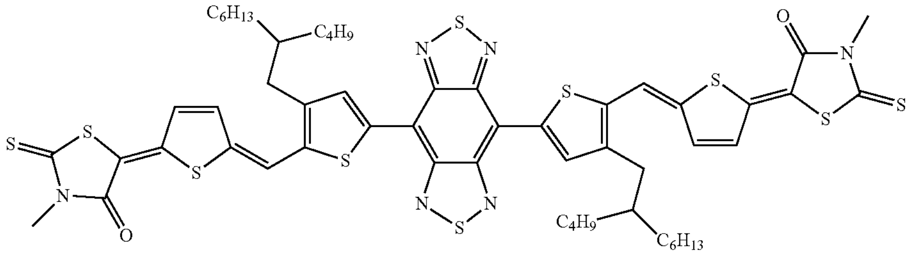
Molecular Weight: 1173.77
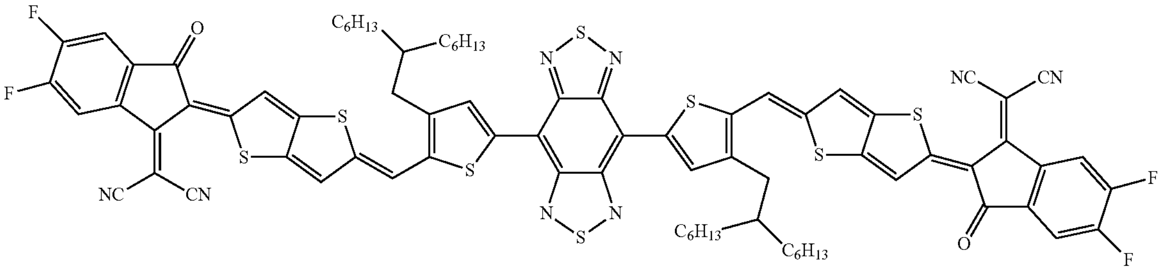
Molecular Weight: 1564.08
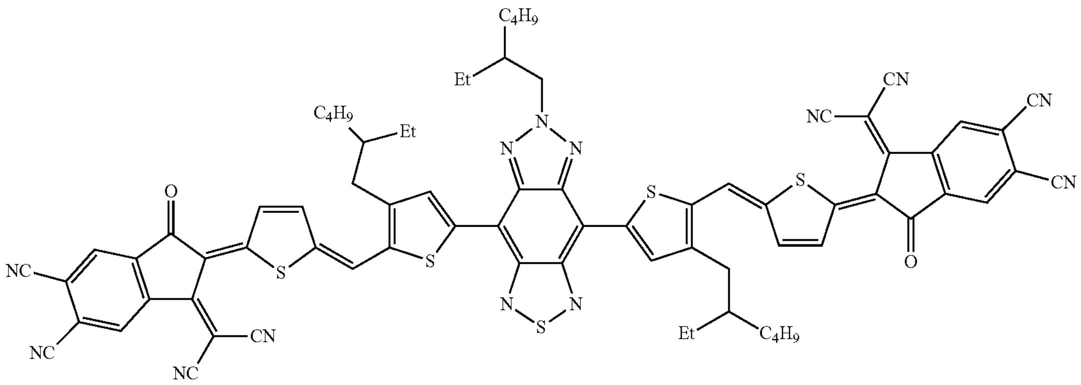
Molecular Weight: 1350.73

-continued
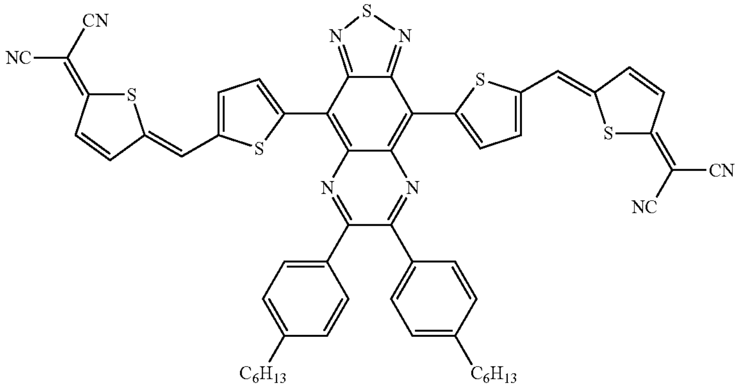
Molecular Weight: 989.32
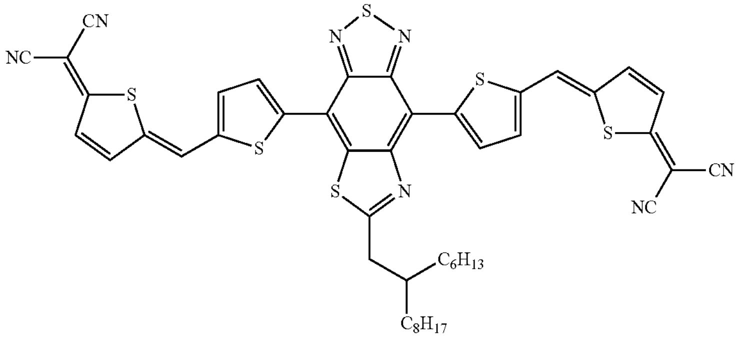
Molecular Weight: 898.27
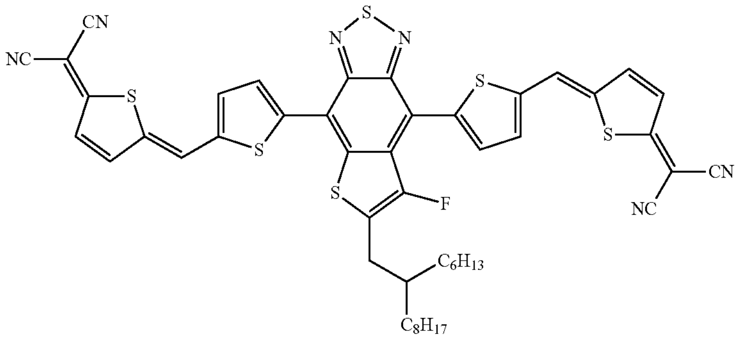
Molecular Weight: 915.27
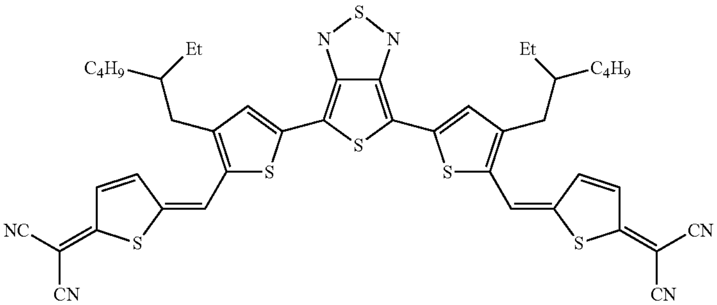
Molecular Weight: 847.22

-continued
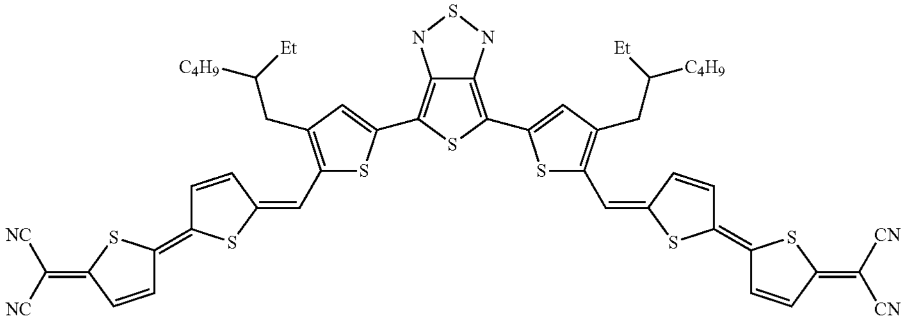
Molecular Weight: 1011.46
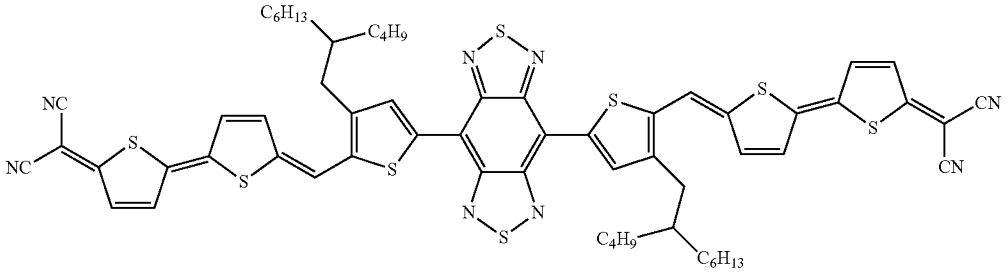
Molecular Weight: 1175.71
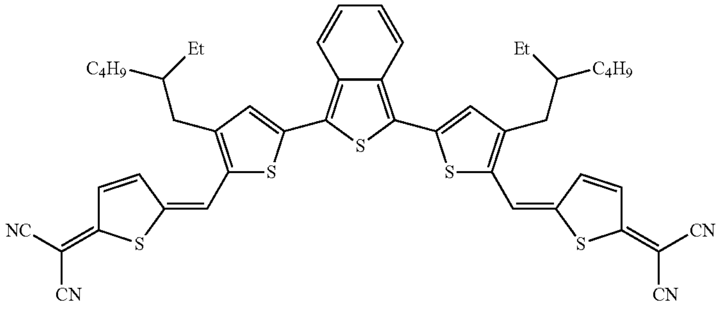
Molecular Weight: 839.22
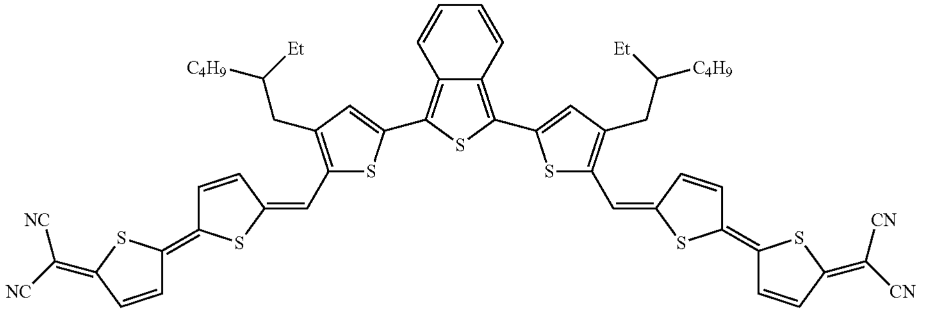
Molecular Weight: 1003.46
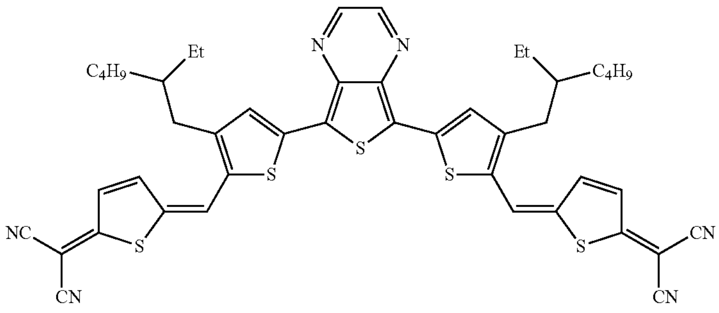
Molecular Weight: 841.20

-continued
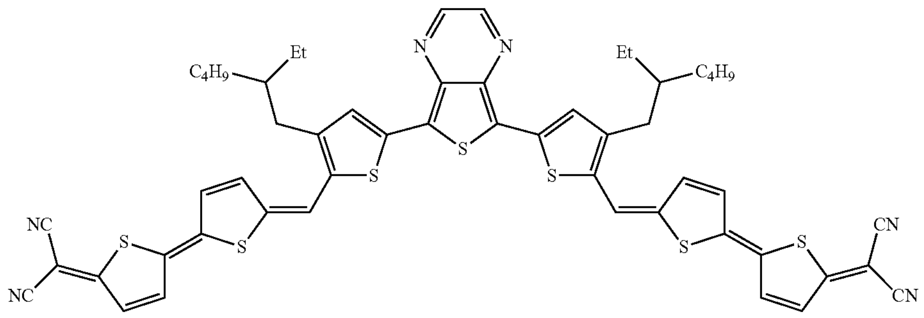
Molecular Weight: 1005.44
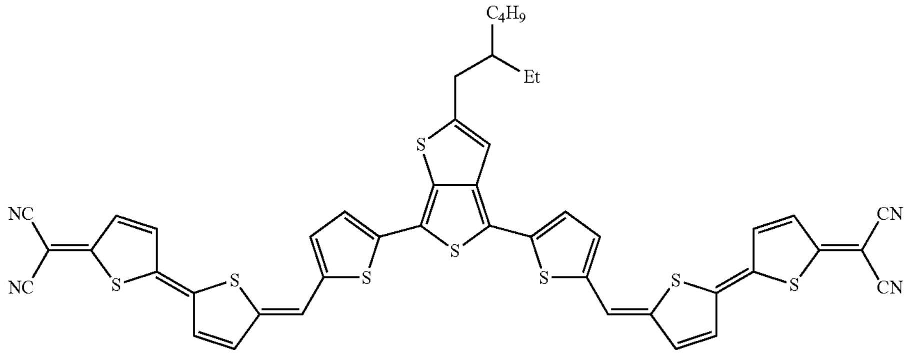
Molecular Weight: 897.27
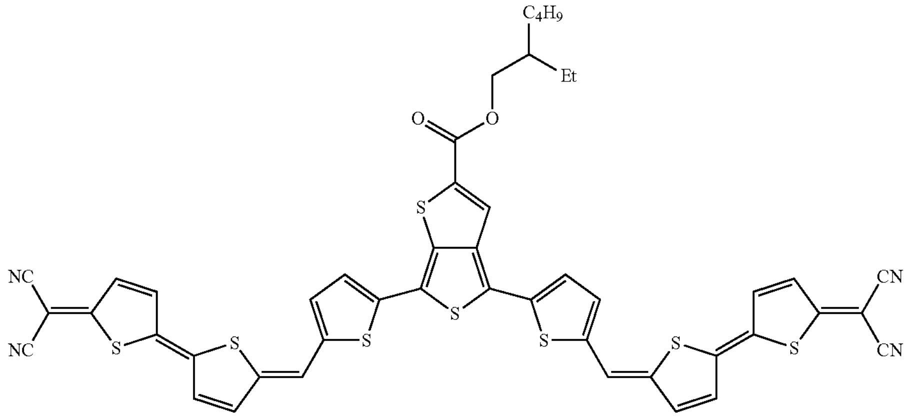
Molecular Weight: 941.28
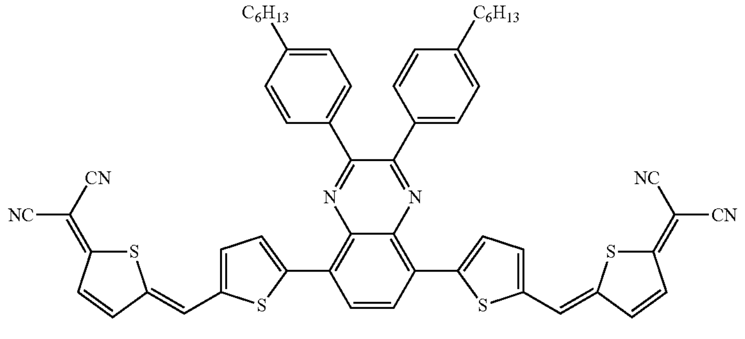
Molecular Weight: 931.27

-continued
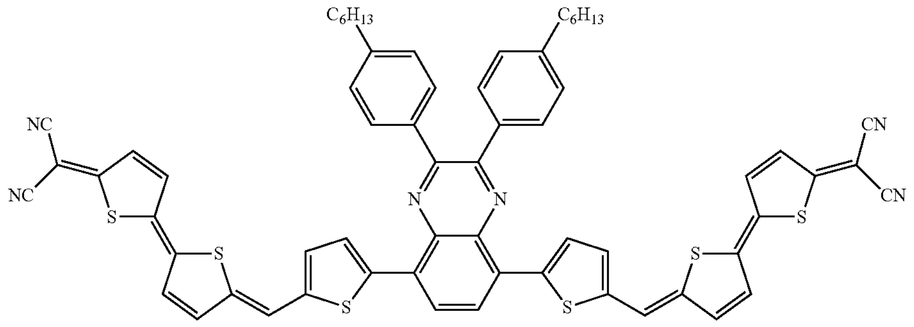
Molecular Weight: 1095.51
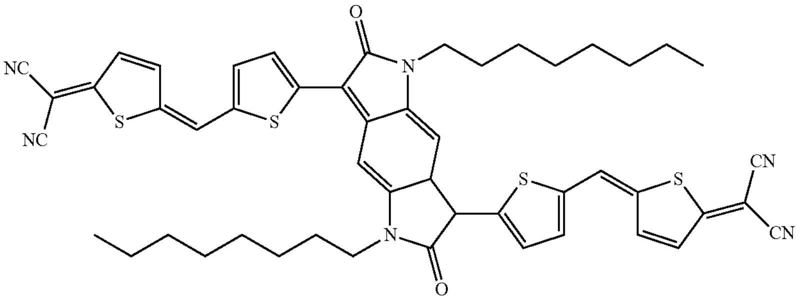
Molecular Weight: 893.21
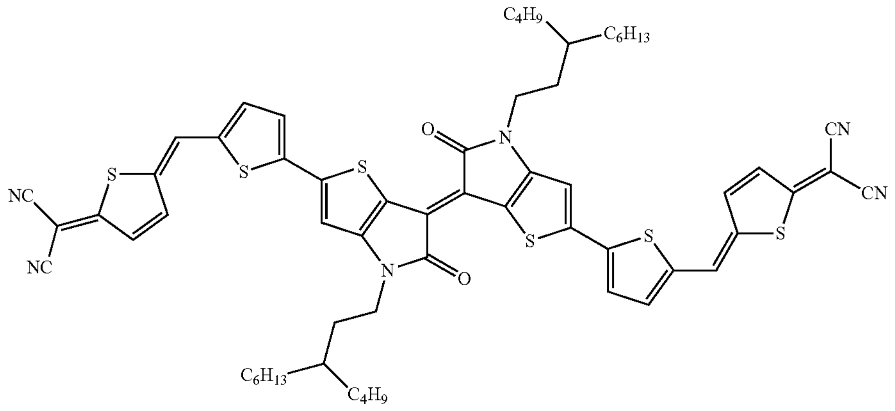
Molecular Weight: 1119.61
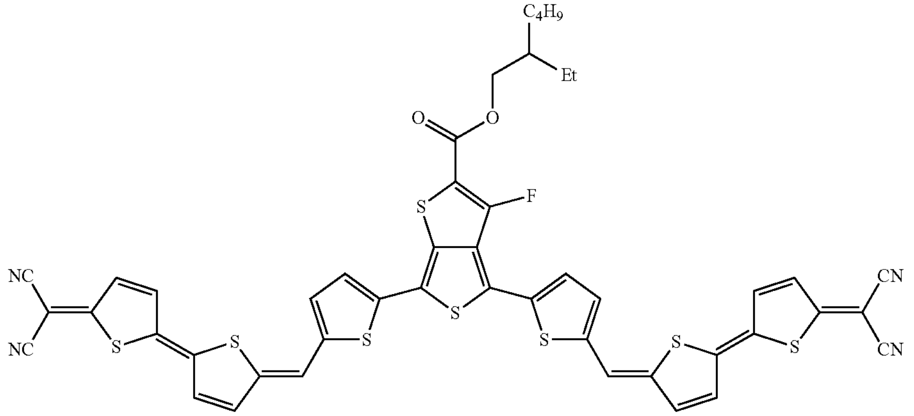
Molecular Weight: 959.27

-continued
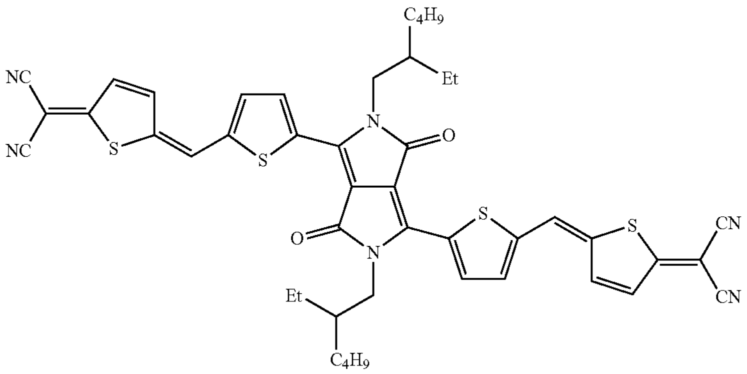
Molecular Weight: 841.14
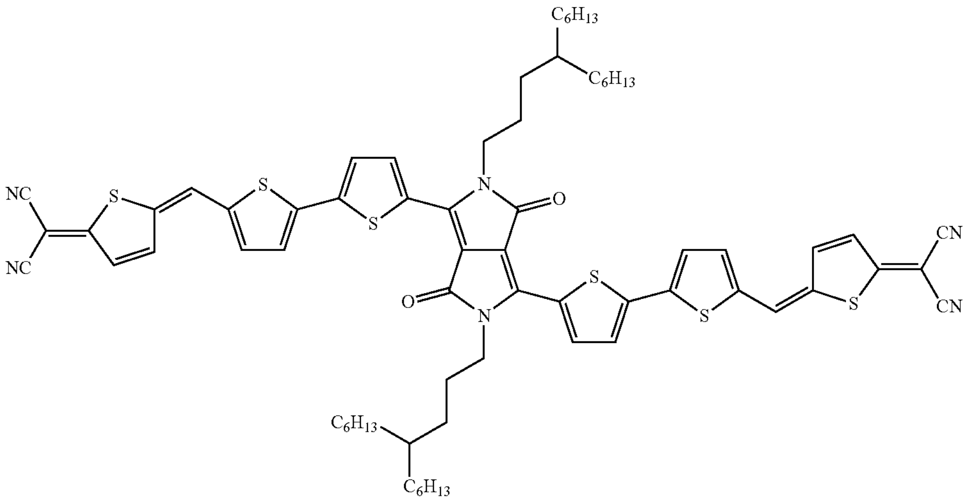
Molecular Weight: 1229.81
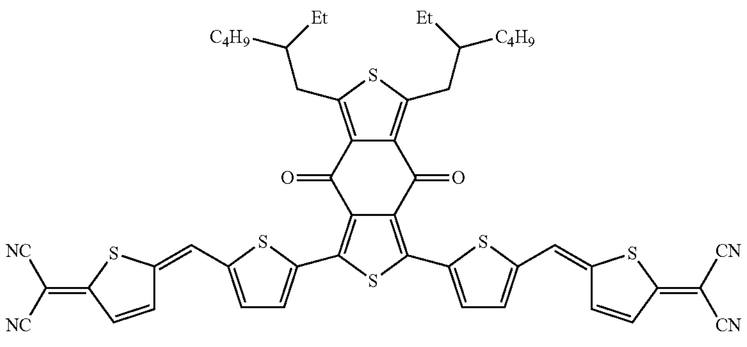
Molecular Weight: 925.29

-continued
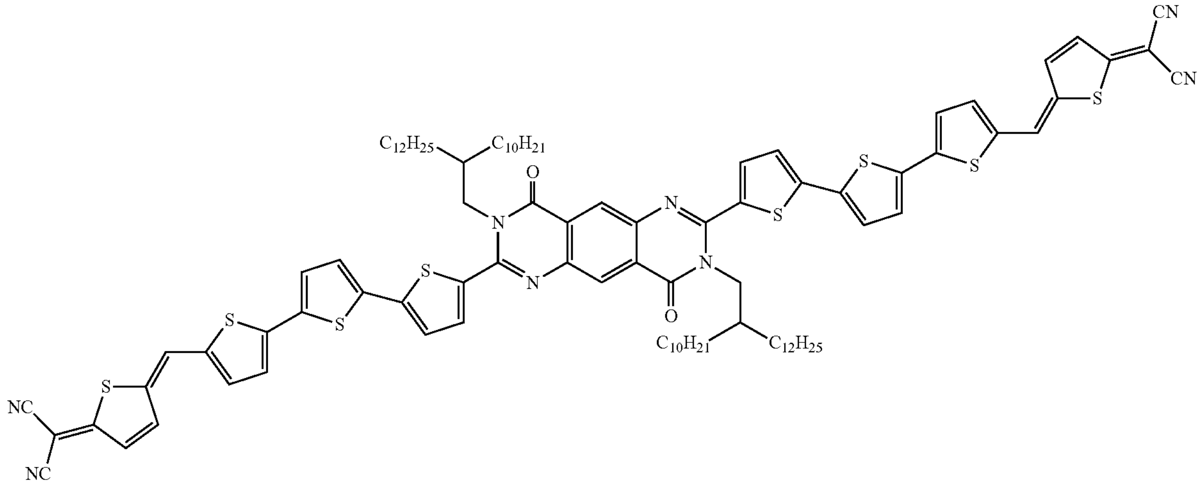
Molecular Weight: 1696.56
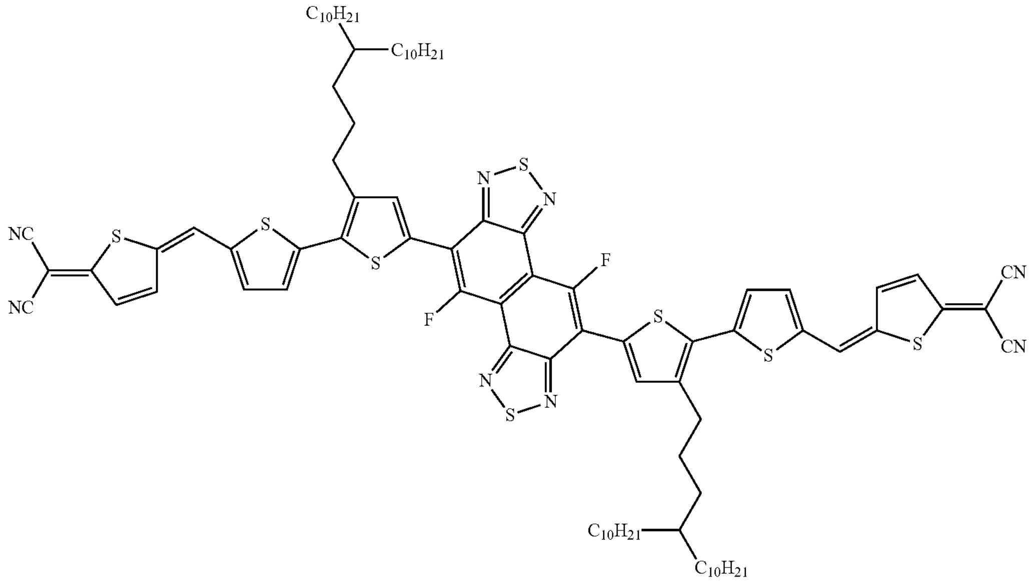
Molecular Weight: 1598.40
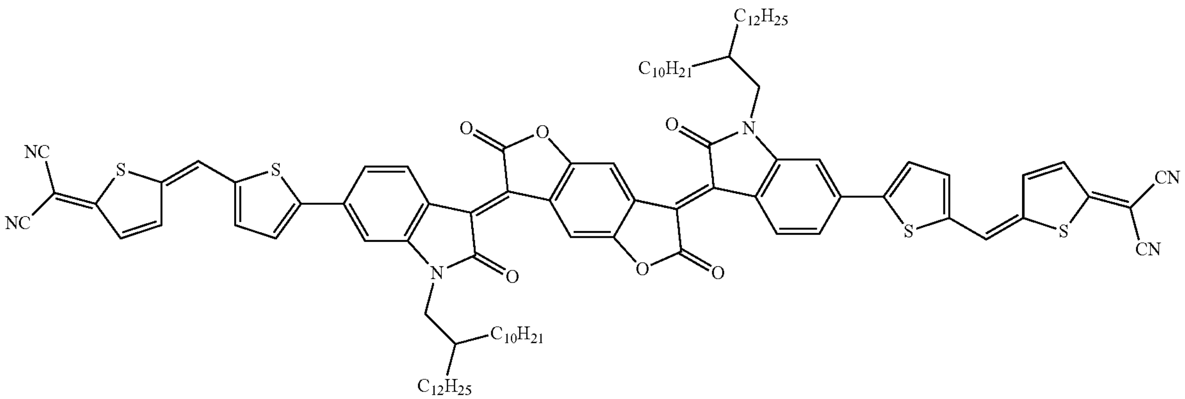
Molecular Weight: 1602.28

-continued
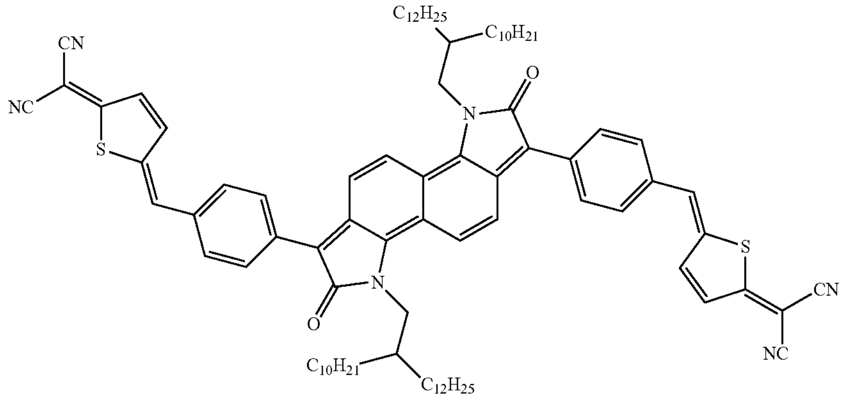
Molecular Weight: 1378.08
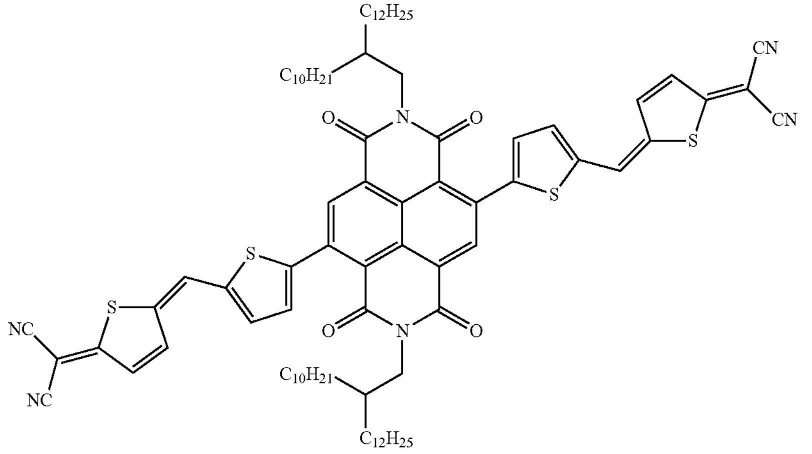
Molecular Weight: 1420.10
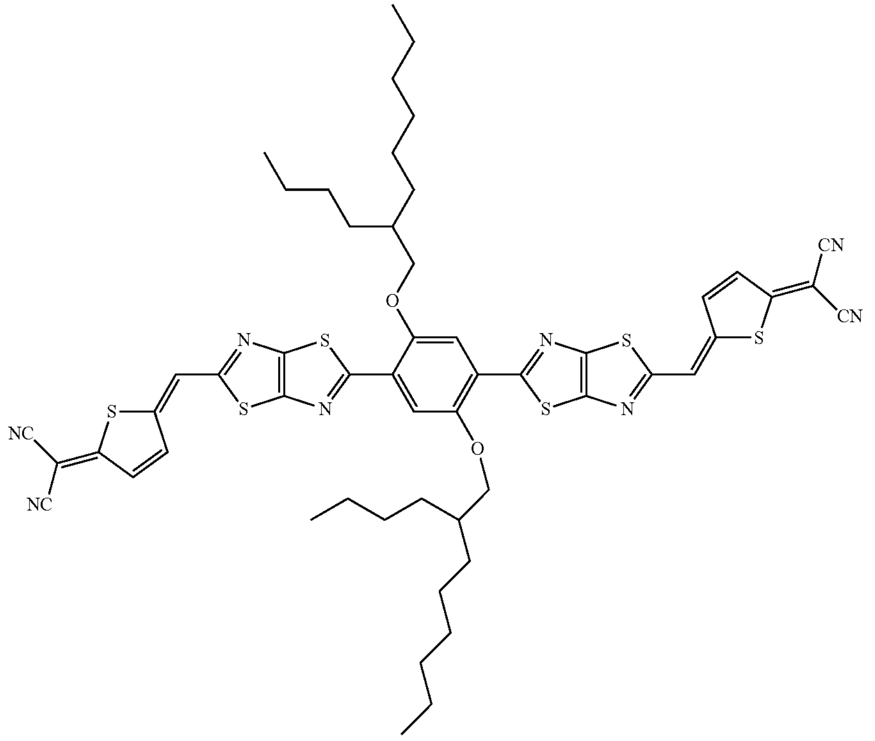
Molecular Weight: 1043.47

-continued
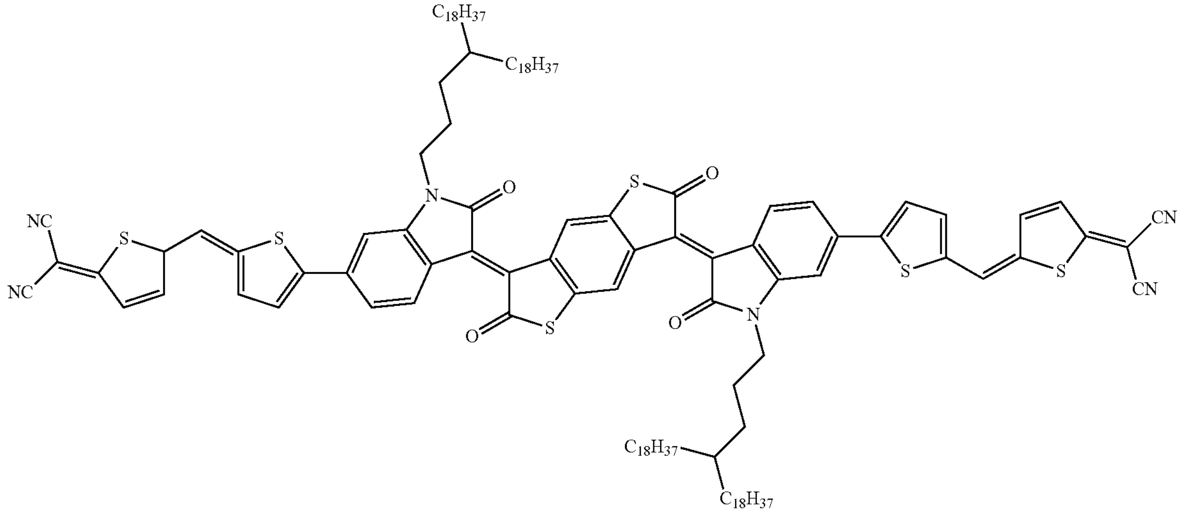
Molecular Weight: 2083.27
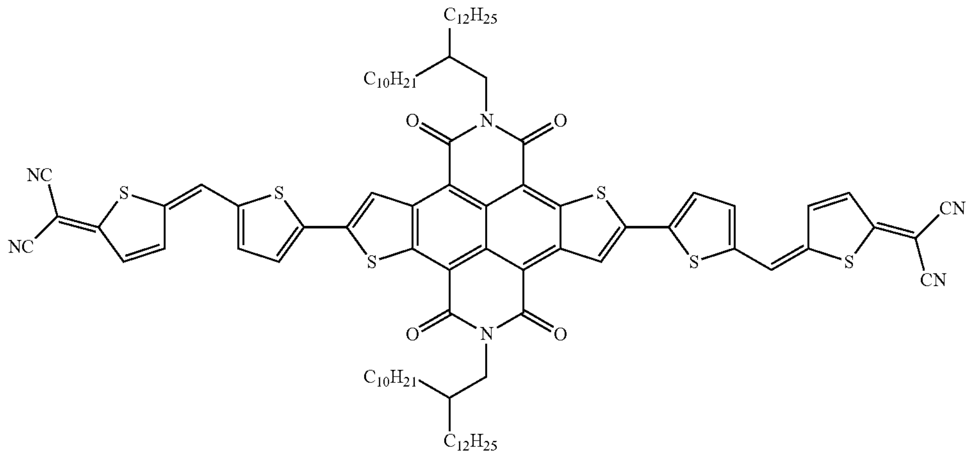
Molecular Weight: 1532.27
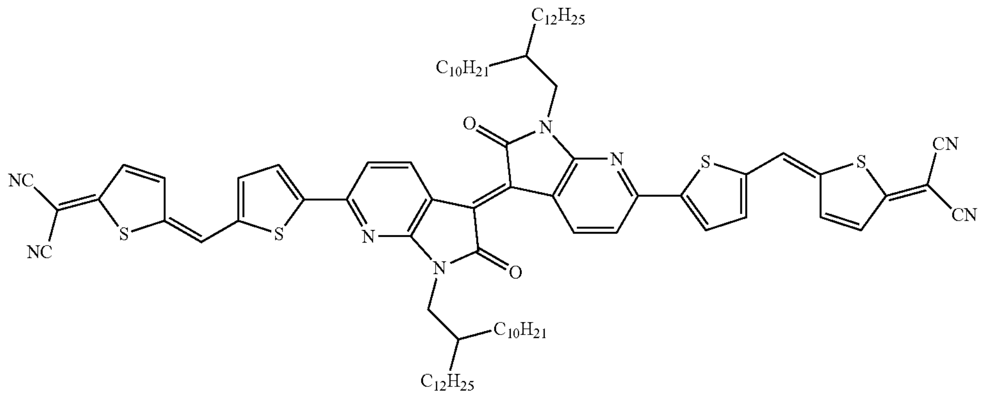
Molecular Weight: 1418.14

-continued
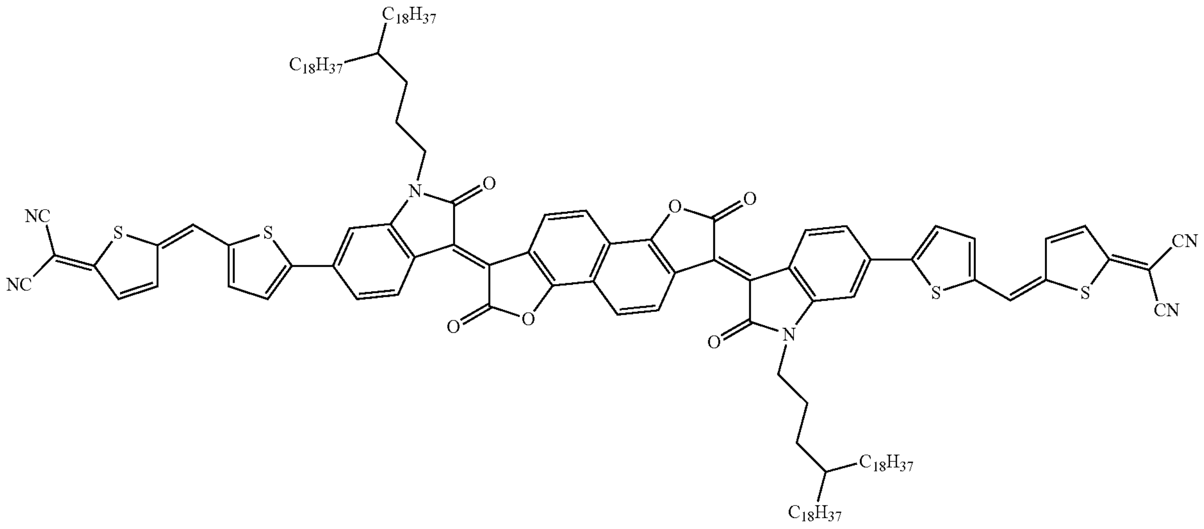
Molecular Weight: 2101.21
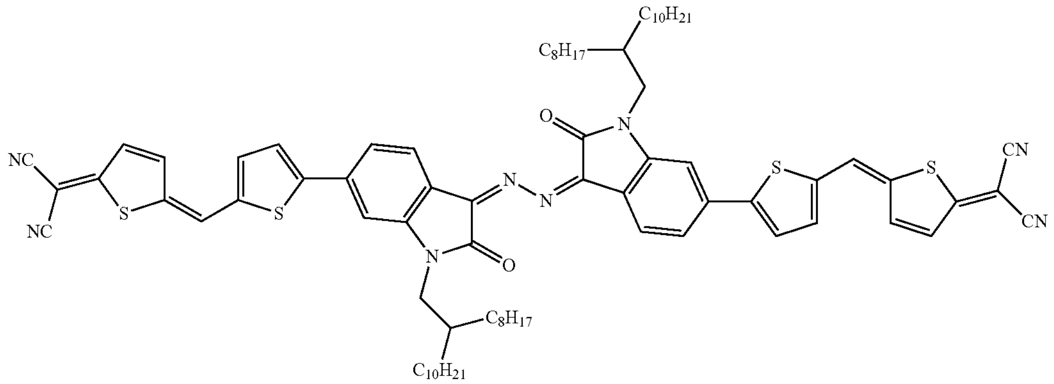
Molecular Weight: 1331.96
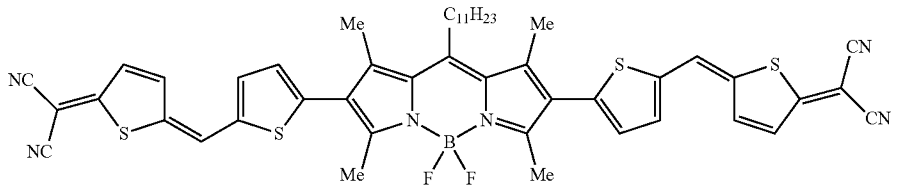
Molecular Weight: 882.98

-continued
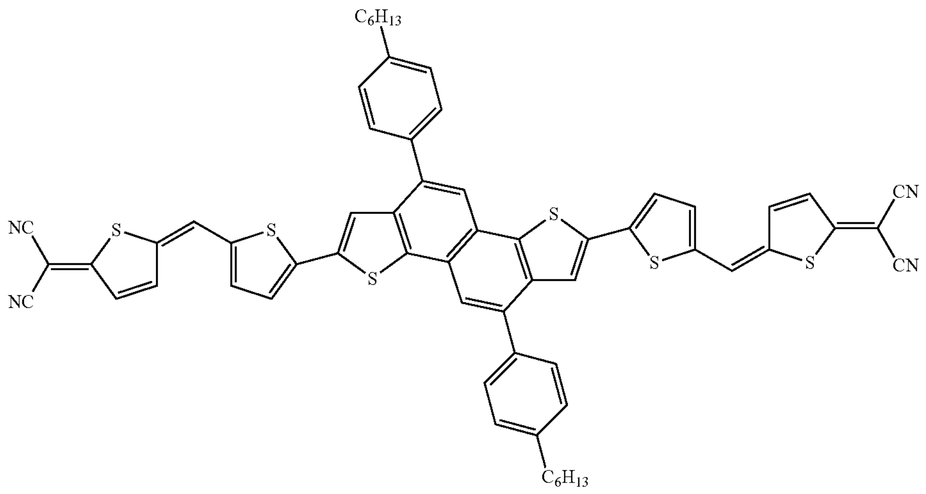
Molecular Weight: 1041.45
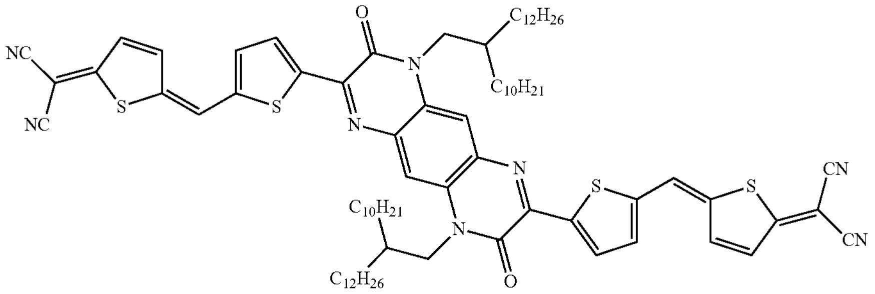
Molecular Weight: 1368.08
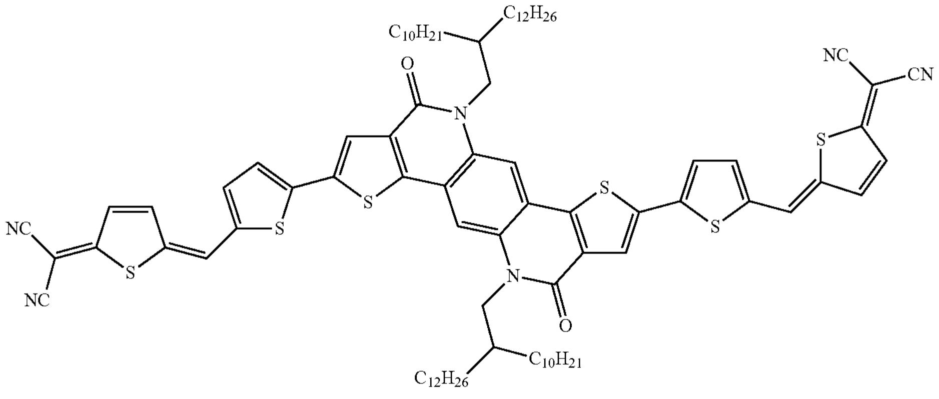
Molecular Weight: 1478.26
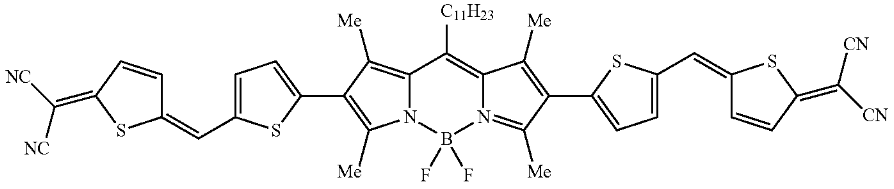
Molecular Weight: 882.98

-continued
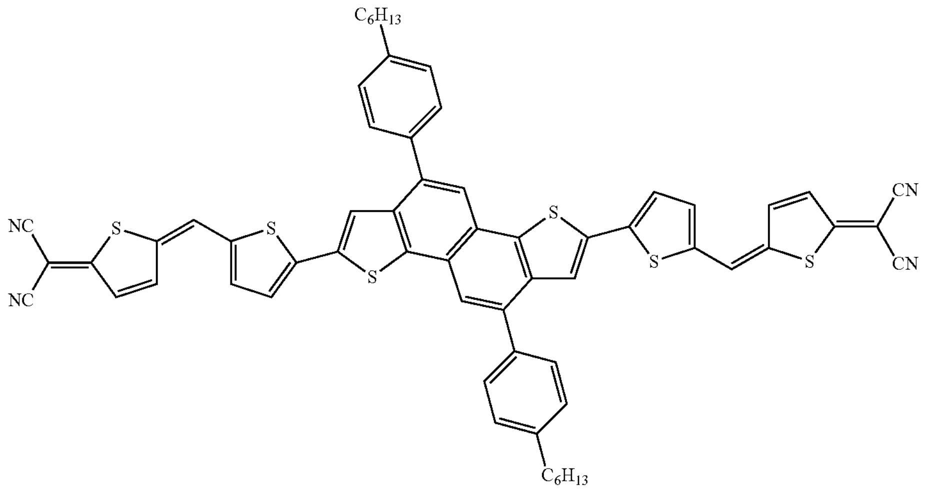
Molecular Weight: 1041.45
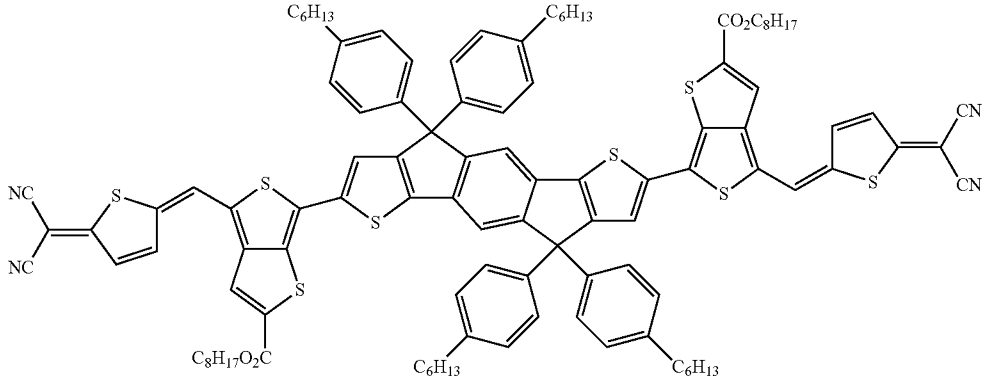
Molecular Weight: 1812.63
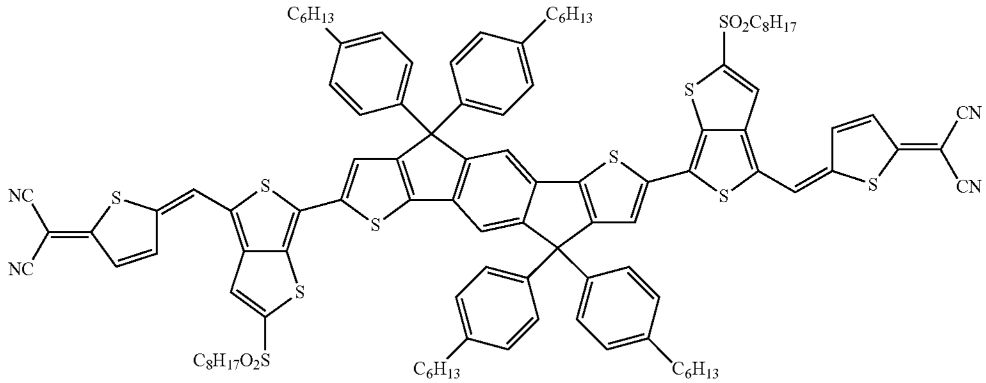
Molecular Weight: 1854.70

-continued
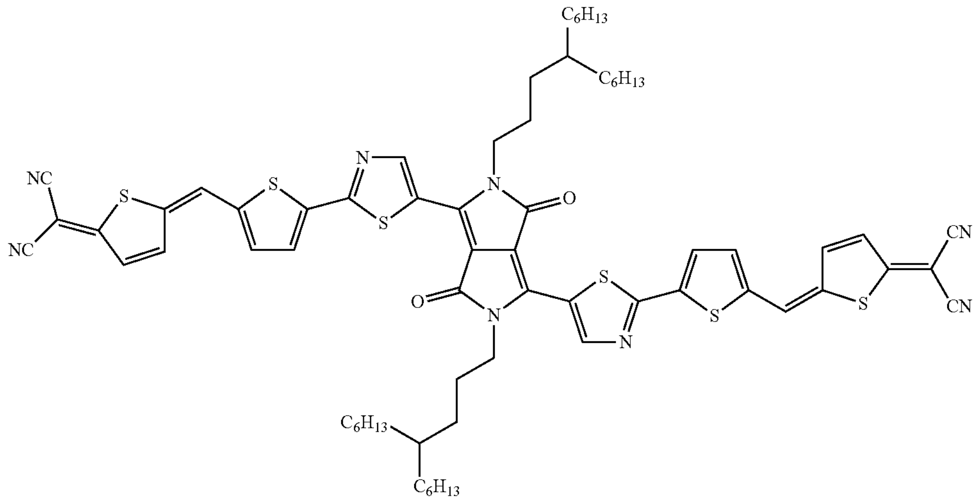
Molecular Weight: 1231.79
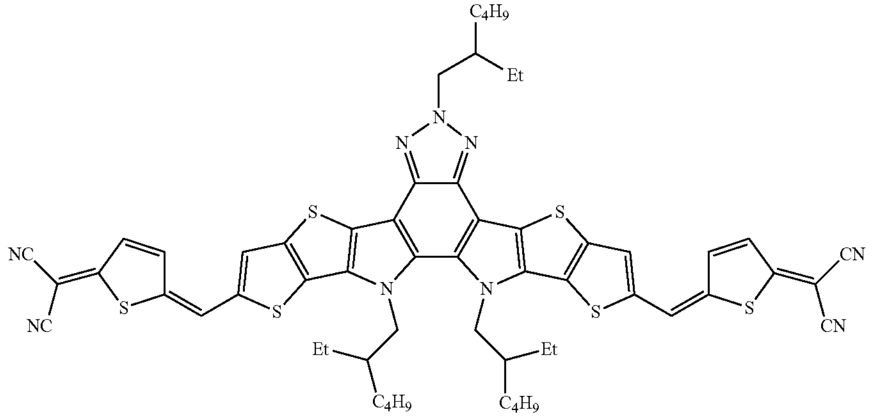
Molecular Weight: 1074.53
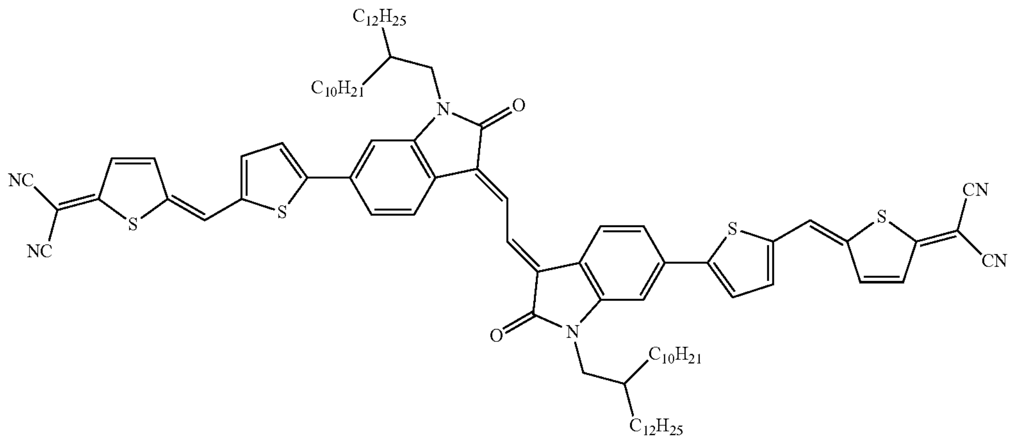
Molecular Weight: 1442.20

-continued

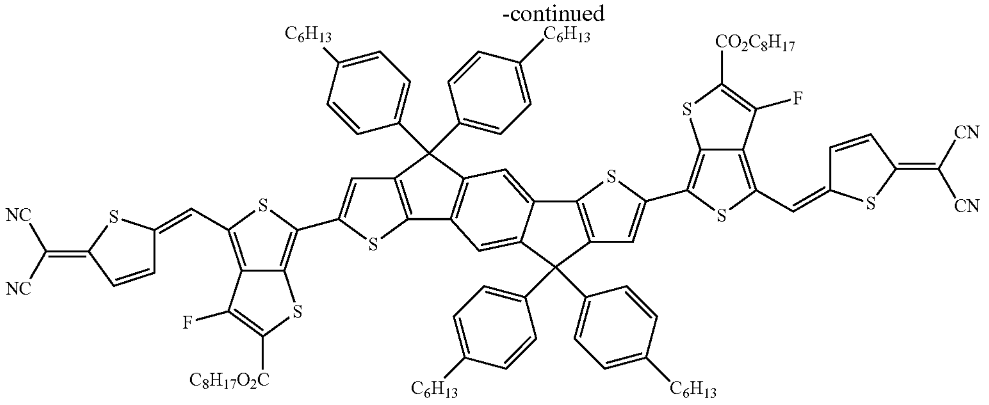

Moelcular Weight: 1848.61

The molecular weight of the specific compound is not particularly limited, but is preferably 400 to 3000.

Among these, in a case of forming a film by vapor deposition, a molecular weight of 400 to 1000 is preferable. In a case where the molecular weight is 1000 or less, a sublimation temperature is not increased, and a compound is not easily decomposed during the vapor deposition.

In a case where a film is formed by coating, the molecular weight is not particularly limited and is preferably 400 to 3000.

The maximum absorption wavelength of the specific compound is preferably within a range of 400 to 2000 nm, and more preferably within a range of 500 to 1500 nm.

The maximum absorption wavelength is a value measured by using vapor deposition or a coating film of the specific compound.

The specific compound is preferably a compound having an ionization potential of 5.0 to 7.0 eV in a single film, more preferably a compound having an ionization potential of 5.0 to 6.5 eV, and still more preferably a compound having an ionization potential of 5.0 to 6.0 eV from the viewpoint of matching the p-type semiconductor material or the n-type semiconductor material described later with the energy level.

The specific compound contained in the photoelectric conversion film may be used alone, or two or more thereof may be used in combination.

The photoelectric conversion film preferably further includes the p-type semiconductor material and/or the n-type semiconductor material, and more preferably includes the specific compound, the p-type semiconductor material, and the n-type semiconductor material. In a case where the photoelectric conversion film includes the specific compound and the p-type semiconductor material, the specific compound preferably functions as an n-type semiconductor, and in a case where the photoelectric conversion film includes the specific compound and the n-type semiconductor material, the specific compound preferably functions as a p-type semiconductor. In a case where the photoelectric conversion film includes the specific compound, the p-type semiconductor material, and the n-type semiconductor material, the specific compound may function as any of the p-type or n-type semiconductors. In addition, in a case where the photoelectric conversion film contains two or more kinds of specific compounds, it is preferable that at least one specific compound functions as a p-type semiconductor and at least the other specific compound functions as an n-type semiconductor. The photoelectric conversion film may further include a coloring agent.

The p-type semiconductor material and the n-type semiconductor material will be described later.

In a case where the photoelectric conversion film includes two or more kinds of the specific compounds, a content of one specific compound with respect to a total content of the specific compound in the entire photoelectric conversion film (=sum of film thicknesses of one kind of specific compound in terms of single layer/(sum of film thicknesses of two or more kinds of specific compounds in terms of single layer)×100) is preferably 20% to 80% by volume, and more preferably 40% to 80% by volume, from the viewpoint of responsiveness of the photoelectric conversion element.

In a case where the photoelectric conversion film includes the p-type semiconductor material, a content of the specific compound with respect to a total content of the specific compound and the p-type semiconductor material in the entire photoelectric conversion film (=sum of film thicknesses of specific compounds in terms of single layer/(sum of film thicknesses of specific compounds in terms of single layer+film thickness of p-type semiconductor material in terms of single layer)×100) is preferably 20% to 80% by volume, and more preferably 40% to 80% by volume, from the viewpoint of responsiveness of the photoelectric conversion element.

In a case where the photoelectric conversion film includes the n-type semiconductor material, a content of the specific compounds in the entire photoelectric conversion film (=sum of film thicknesses of specific compounds in terms of single layer/(sum of film thicknesses of specific compounds in terms of single layer+film thickness of n-type semiconductor material in terms of single layer+film thickness of n-type semiconductor material in terms of single layer)×100) is preferably 20% to 80% by volume, and more preferably 40% to 80% by volume, from the viewpoint of responsiveness of the photoelectric conversion element.

It is preferable that the photoelectric conversion film is substantially composed of two or more kinds of specific compounds, composed of two or more kinds of specific compounds and the coloring agent, composed of the specific compound and the p-type semiconductor material, composed of the specific compound, the p-type semiconductor material, and the coloring agent, composed of the specific compound and the n-type semiconductor material, or composed of the specific compound, the n-type semiconductor material, and the coloring agent. Furthermore, the photoelectric conversion film may further include an additive other than the coloring agent described below. In addition, the term "substantially" means the followings: in the case where the photoelectric conversion film is composed of two or more kinds of specific compounds, it is intended that the total content of the specific compound is 95% by mass or more with respect to the total mass of the photoelectric conversion film; in the case where the photoelectric conversion film is composed of two or more kinds of specific compounds and the coloring agent, it is intended that the total content of the specific compounds and the coloring agent is 95% by mass or more with respect to the total mass of the photoelectric conversion film; in the case where the photoelectric conversion film is composed of the specific compound and the p-type semiconductor material, it is intended that the total content of the specific compound and the p-type semiconductor material is 95% by mass or more with respect to the total mass of the photoelectric conversion film; in the case where the photoelectric conversion film is composed of the specific compound, the p-type semiconductor material, and the coloring agent, it is intended that the total content of the specific compound, the p-type semiconductor material, and the coloring agent is 95% by mass or more with respect to the total mass of the photoelectric conversion film; in the case where the photoelectric conversion film is composed of the specific compound and the n-type semiconductor material, it is intended that the total content of the specific compound and the n-type semiconductor material is 95% by mass or more with respect to the total mass of the photoelectric conversion film; in the case where the photoelectric conversion film is composed of the specific compound, the n-type semiconductor material, and the coloring agent, it is intended that the total content of the specific compound, the n-type semiconductor material, and the coloring agent is 95% by mass or more with respect to the total mass of the photoelectric conversion film.

<p-Type Semiconductor Material>

The photoelectric conversion film preferably includes the p-type semiconductor material as another component in addition to the specific compound. In this case, it is preferable that the specific compound functions as the n-type semiconductor.

The p-type semiconductor material is a donor organic semiconductor material (a compound), and refers to an organic compound having a property of easily donating an electron.

Further specifically, the p-type semiconductor material is an organic compound having more excellent hole transport properties than the specific compound.

In the present specification, the hole transport properties (hole carrier mobility) of a compound can be evaluated by, for example, a time-of-flight method (a TOF method) or by using a field effect transistor element.

The hole carrier mobility of the p-type semiconductor material is preferably $10^{-4}$ $cm^2/V\cdot s$ or more, more preferably $10^{-3}$ $cm^2/V\cdot s$ or more, and still more preferably $10^{-2}$ $cm^2/V\cdot s$ or more. The upper limit of the hole carrier mobility described above is not particularly limited, but is preferably 10 $cm^2/V\cdot s$ or less, for example, from the viewpoint of suppressing the flow of a small amount of current without light irradiation.

In addition, the p-type semiconductor material also preferably has a small ionization potential with respect to both the specific compound.

It is preferable that the photoelectric conversion film has a bulk heterostructure formed in a state where the specific compound and the p-type semiconductor material are mixed. The bulk heterostructure refers to a layer in which the specific compound and the p-type semiconductor material are mixed and dispersed in the photoelectric conversion film. The photoelectric conversion film having the bulk heterostructure can be formed by either a wet method or a dry method. The bulk heterostructure is described in detail in, for example, paragraphs [0013] and [0014] of JP2005-303266A and the like.

Examples of the p-type semiconductor material include triarylamine compounds (for example, N,N'-bis (3-methylphenyl)-(1,1'-biphenyl)-4,4'-diamine (TPD), 4,4'-bis [N-(naphthyl)-N-Phenyl-amino] biphenyl (α-NPD), compounds disclosed in paragraphs [0128] to [0148] of JP2011-228614A, compounds disclosed in paragraphs [0052] to [0063] of JP2011-176259A, compounds disclosed in paragraphs [0119] to [0158] of JP2011-225544A, compounds disclosed in paragraphs [0044] to [0051] of JP2015-153910A, and compounds disclosed in paragraphs [0086] to [0090] of JP2012-094660A, pyrazoline compounds, styrylamine compounds, hydrazone compounds, polysilane compounds, thiophene compounds (for example, a thienothiophene derivative, a dibenzothiophene derivative, a benzodithiophene derivative, a dithienothiophene derivative, a [1] benzothieno [3,2-b] thiophene (BTBT) derivative, a thieno [3,2-f: 4,5-f] bis [1] benzothiophene (TBBT) derivative, compounds disclosed in paragraphs [0031] to [0036] of JP2018-014474A, compounds disclosed in paragraphs [0043] to [0045] of WO2016-194630A, compounds disclosed in paragraphs [0025] to [0037], and [0099] to [0109] of WO2017-159684A, compounds disclosed in paragraphs [0029] to [0034] of JP2017-076766A, compounds disclosed in paragraphs [0015] to [0025] of WO2018-207722A, compounds disclosed in paragraphs [0045] to [0053] of JP2019-054228A, compounds disclosed in paragraphs [0045] to [0055] of WO2019-058995A, compounds disclosed in paragraphs [0063] to [0089] of WO2019-081416A, compounds disclosed in paragraphs [0033] to [0036] of JP2019-080052A, compounds disclosed in paragraphs [0044] to [0054] of WO2019-054125A, compounds disclosed in paragraphs [0041] to [0046] of WO2019-093188A, and the like), a cyanine compound, an oxonol compound, a polyamine compound, an indole compound, a pyrrole compound, a pyrazole compound, a polyarylene compound, a fused aromatic carbocyclic compound (for example, a naphthalene derivative, an anthracene derivative, a phenanthrene derivative, a tetracene derivative, a pentacene derivative, a pyrene derivative, a perylene derivative, and a fluoranthene derivative), a porphyrin compound, a phthalocyanine compound, a triazole compound, an oxadiazole compound, an imidazole compound, a polyarylalkane compound, a pyrazolone compound, an amino-substituted chalcone compound, an oxazole compound, a fluorenone compound, a silazane compound, a metal complex having nitrogen-containing heterocyclic compounds as ligands, and conjugated polymers such as polythiophene, polyparaphenylenevinylene, and polyfluorene.

The compounds that can be used as the p-type semiconductor materials are exemplified below.

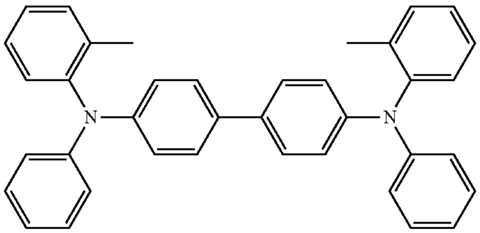
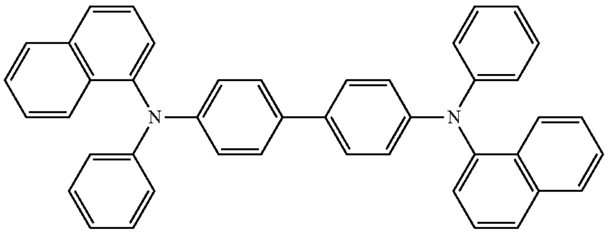
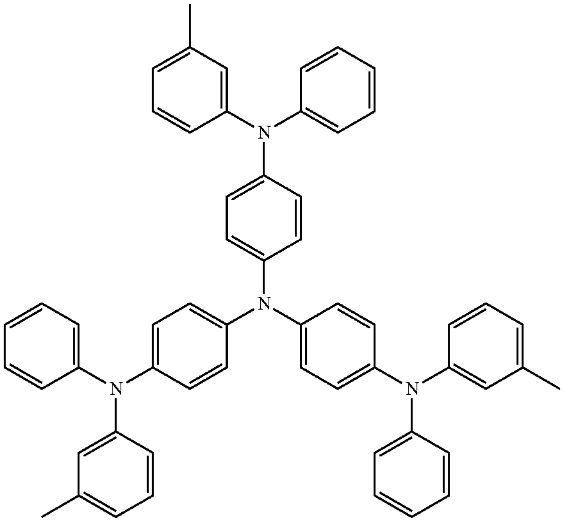
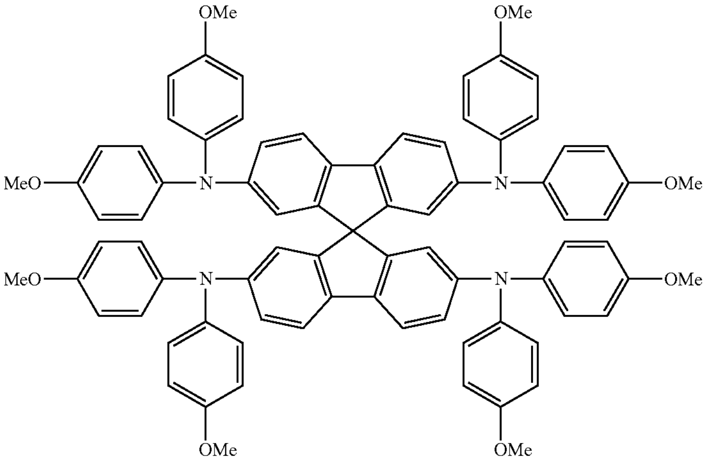
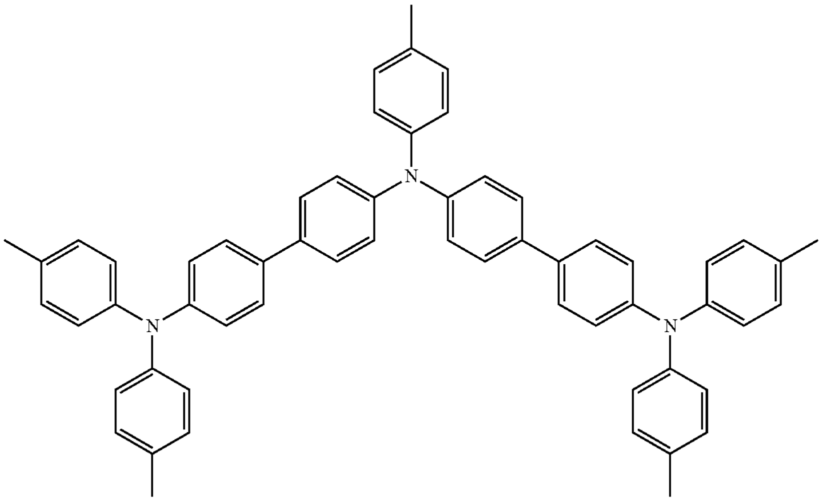

-continued
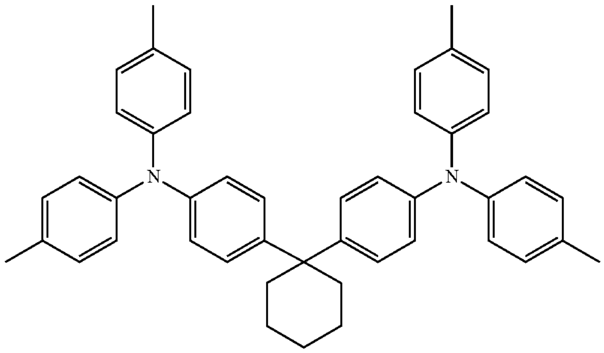
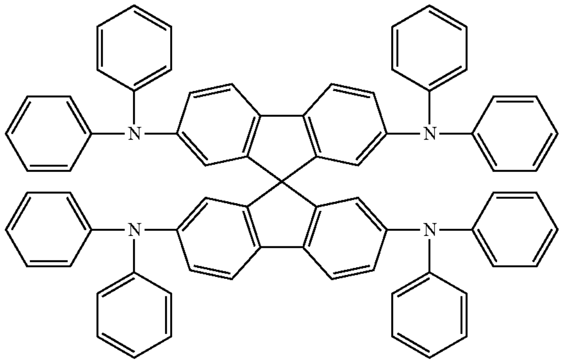
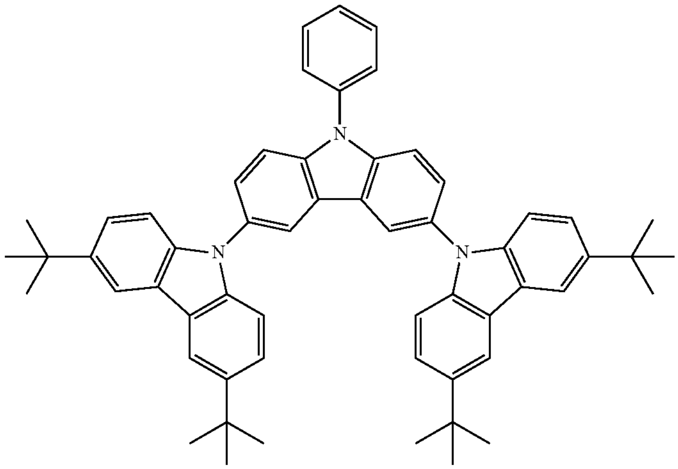
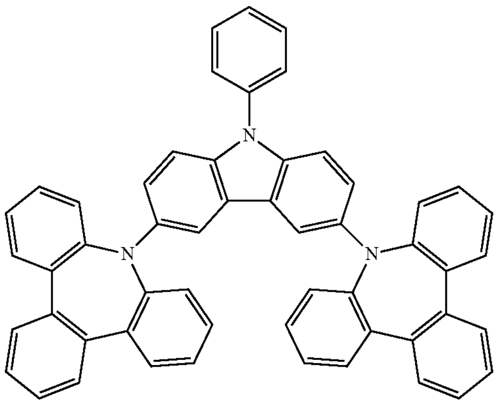
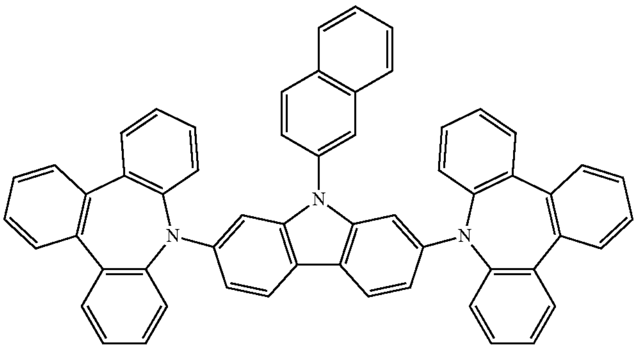

-continued
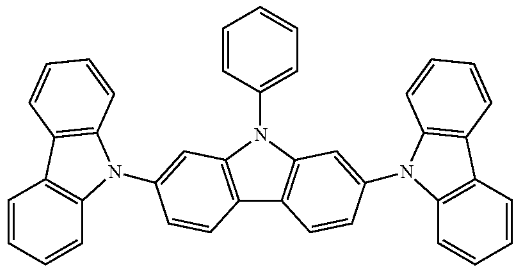
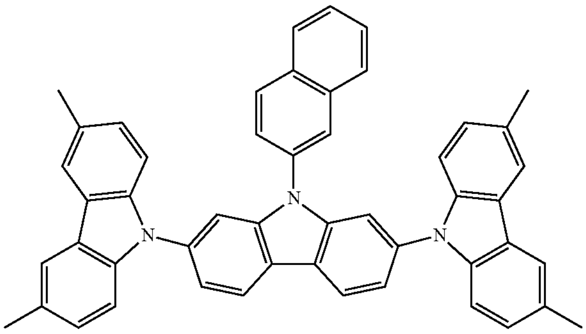
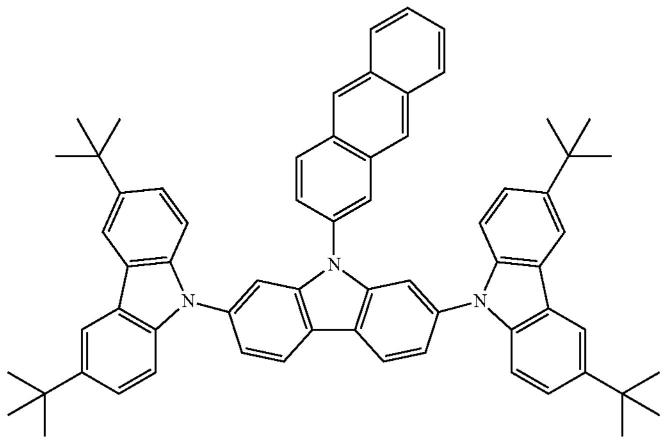
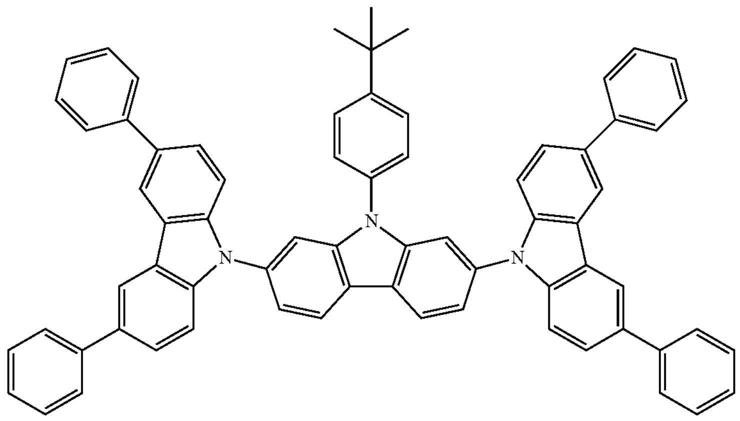
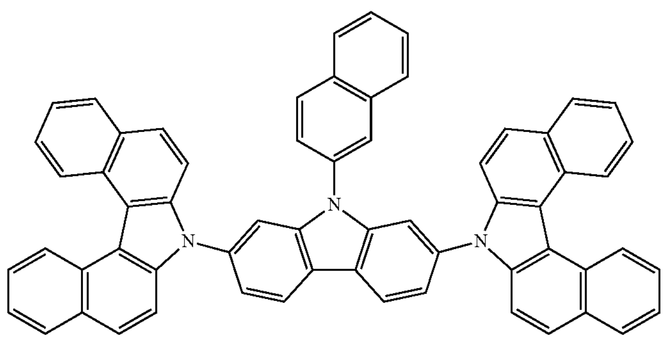

-continued
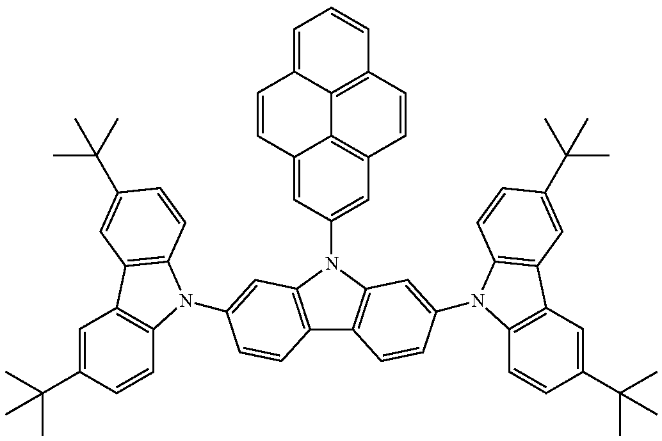
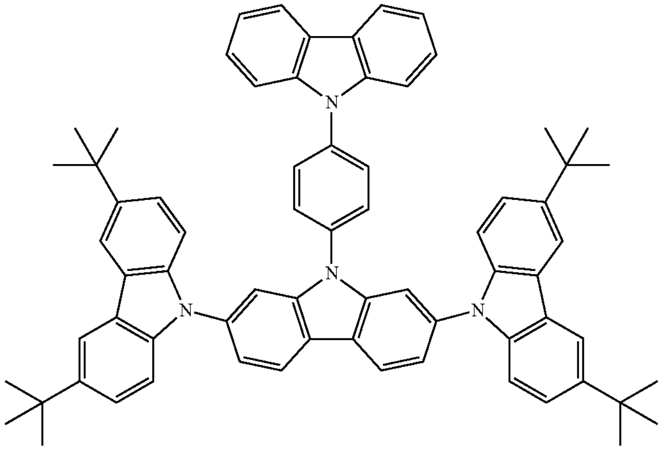
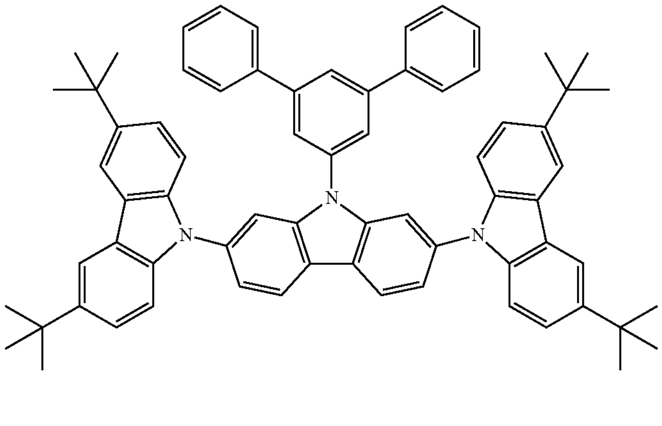

-continued
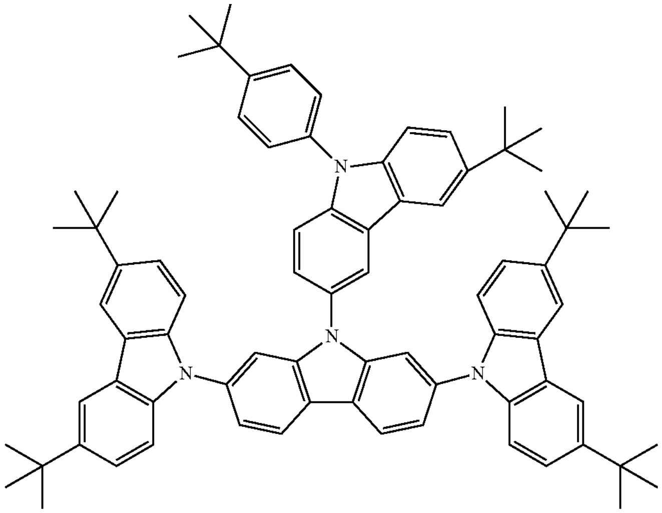
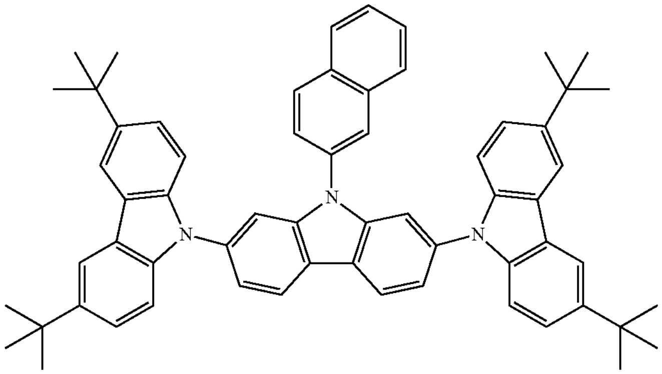
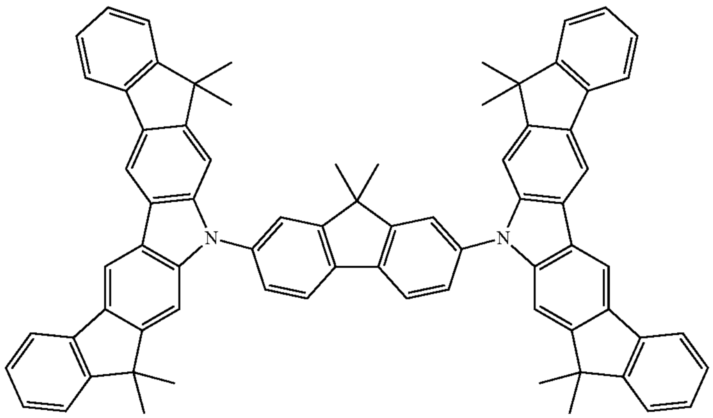
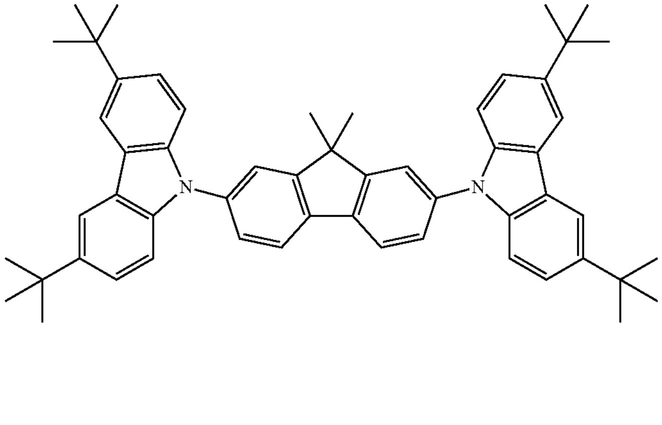

-continued
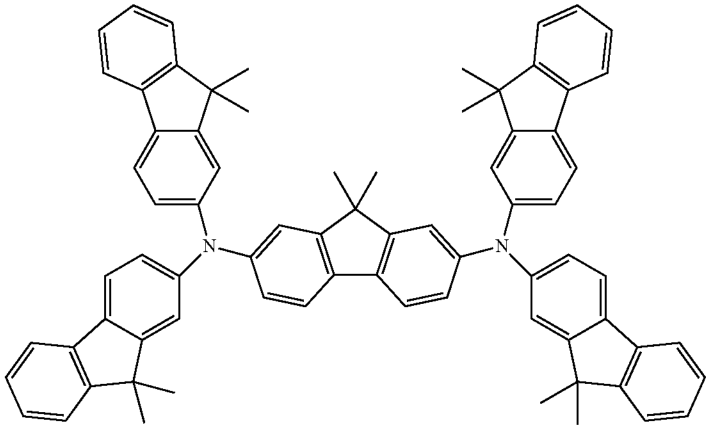
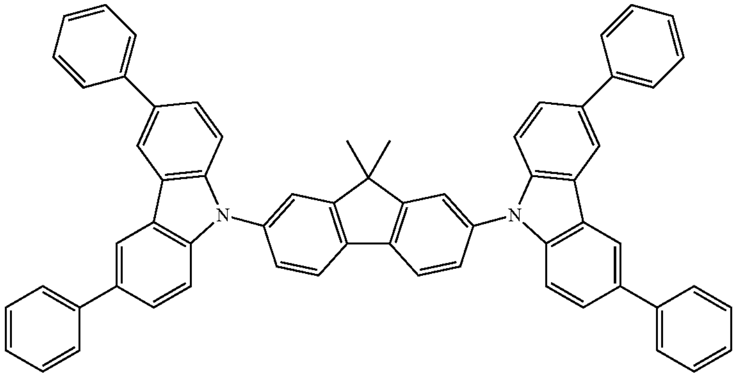
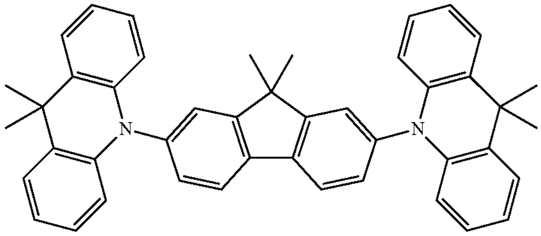
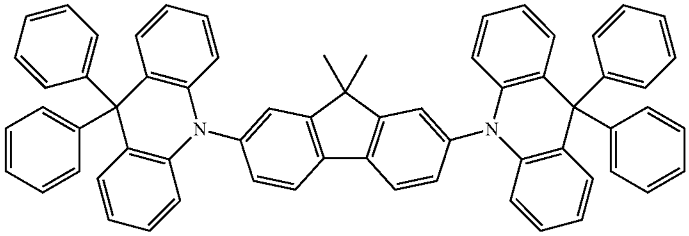
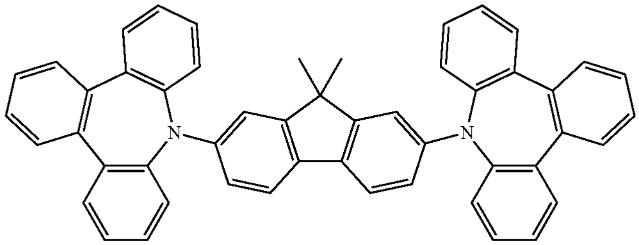

-continued
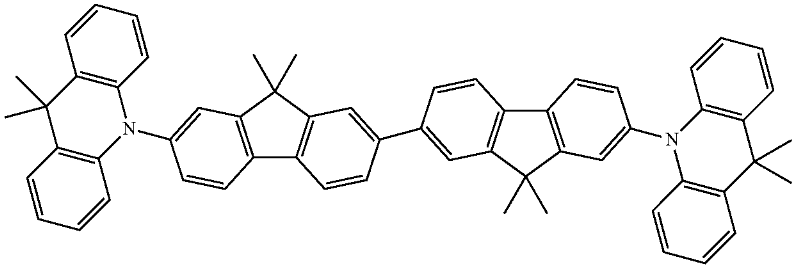
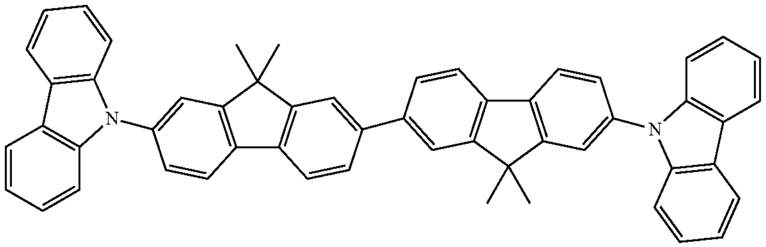
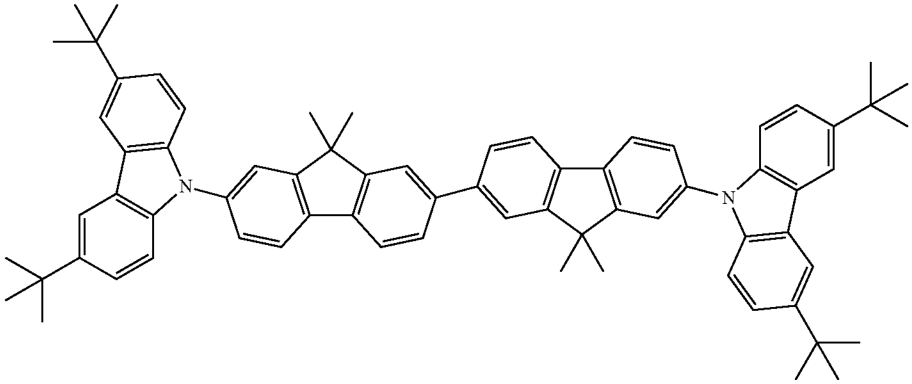
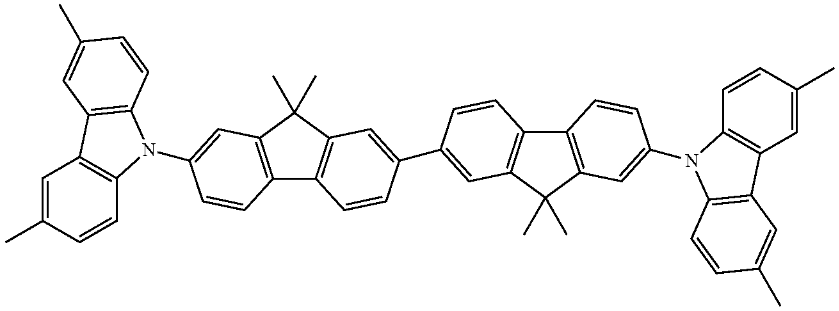
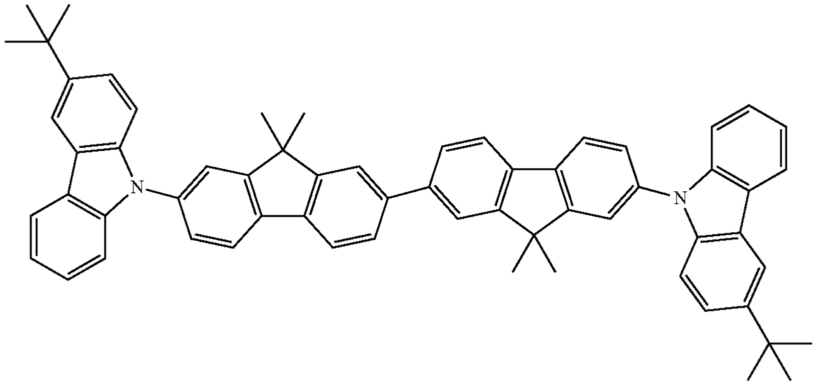

-continued
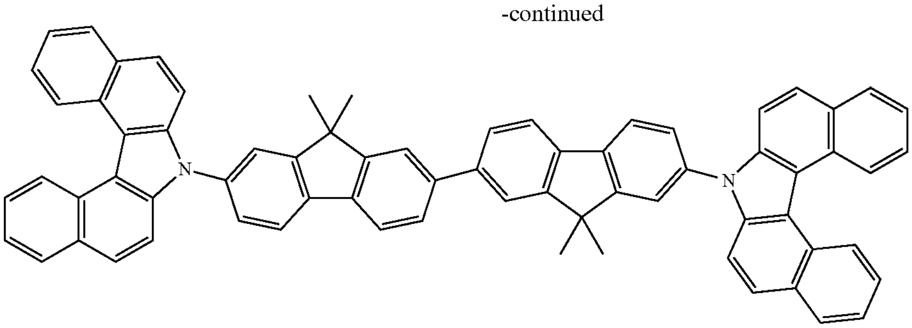
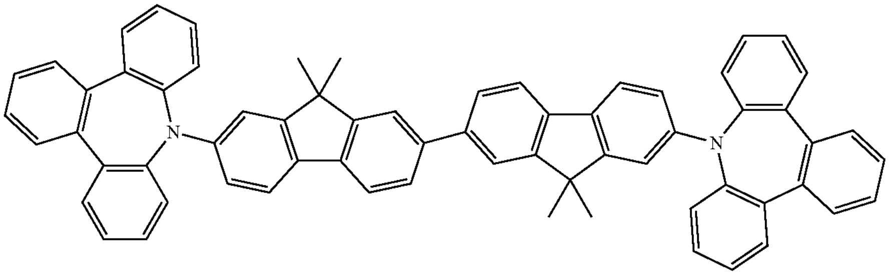
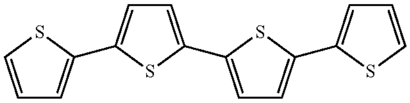
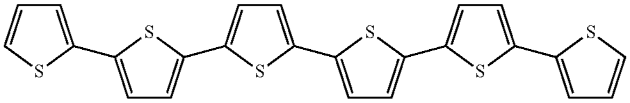
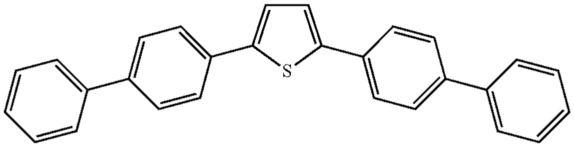
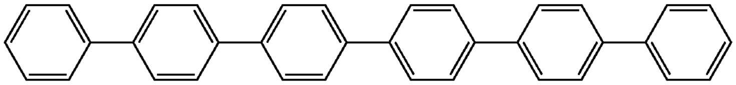
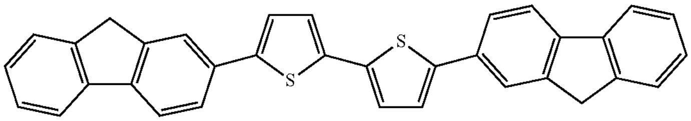
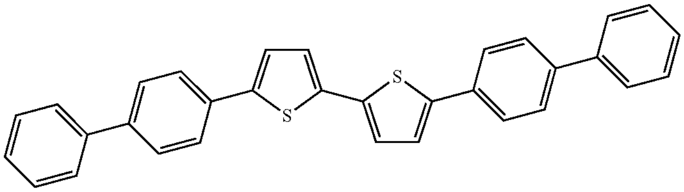
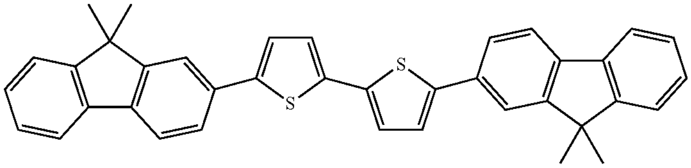
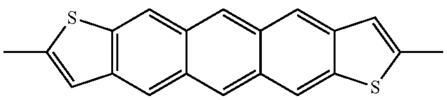
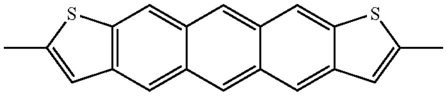
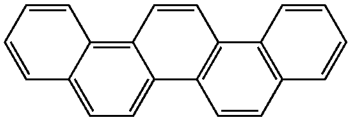
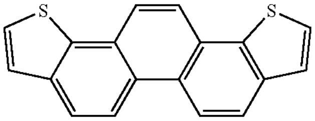
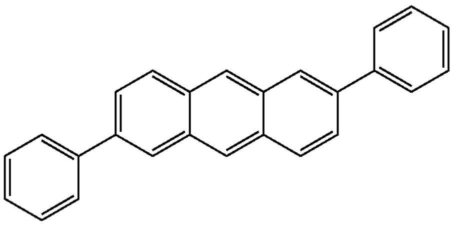
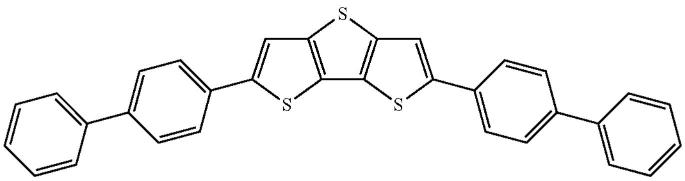

-continued
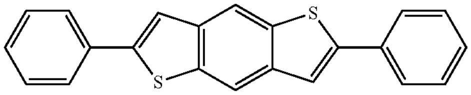
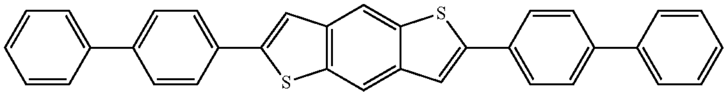
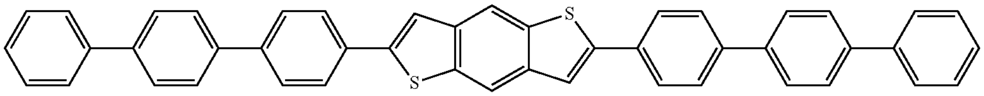
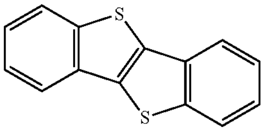
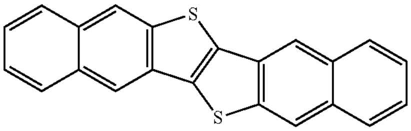
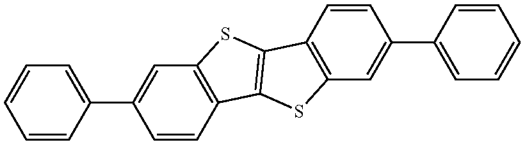
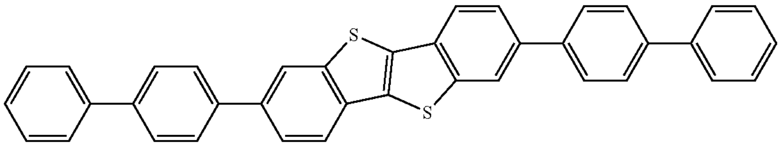
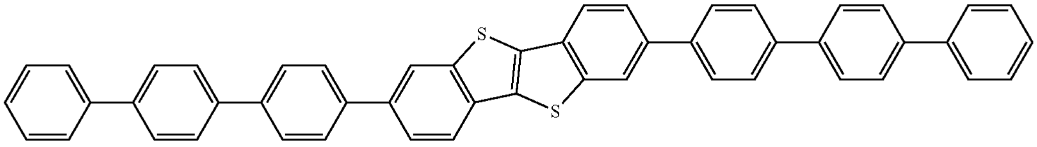
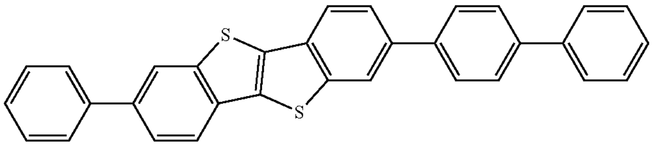
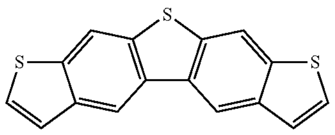
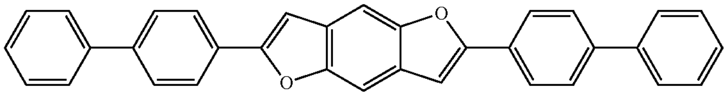
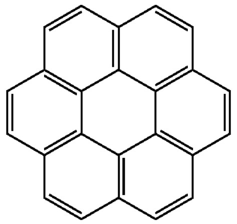
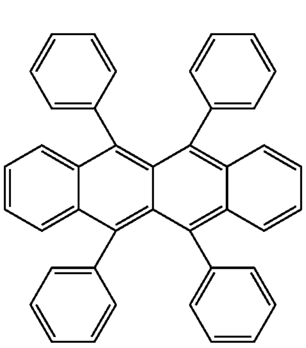
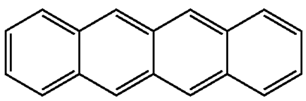
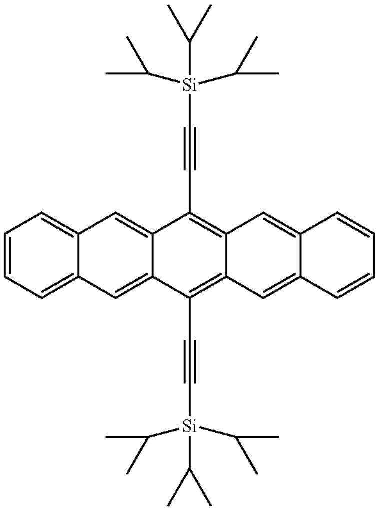

-continued
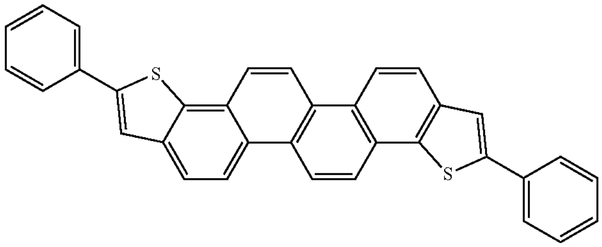
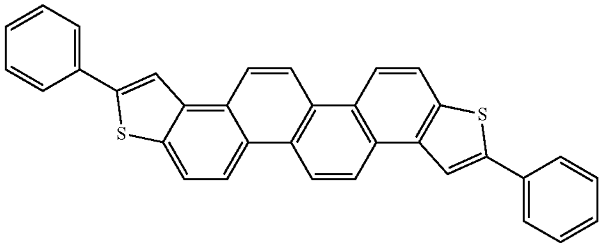
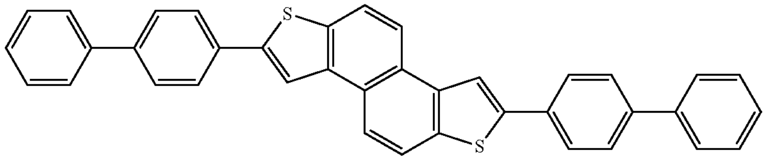
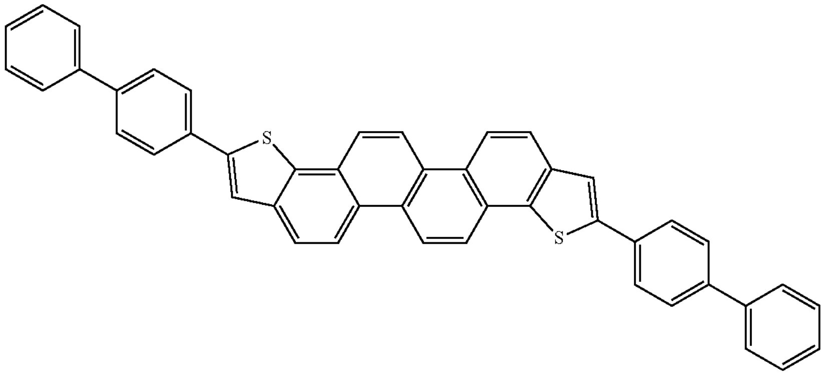
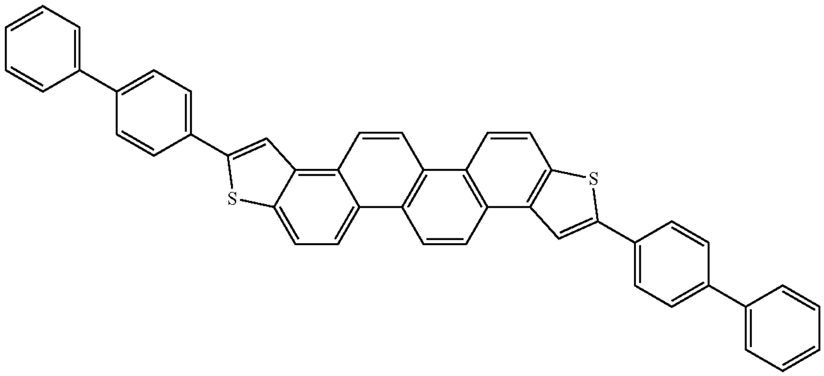

-continued
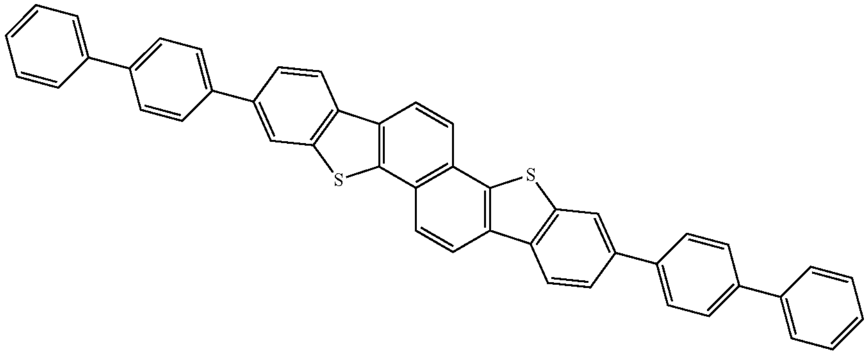
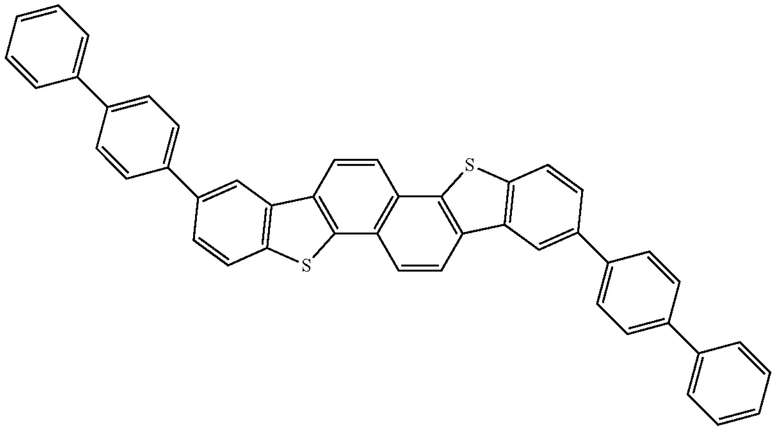
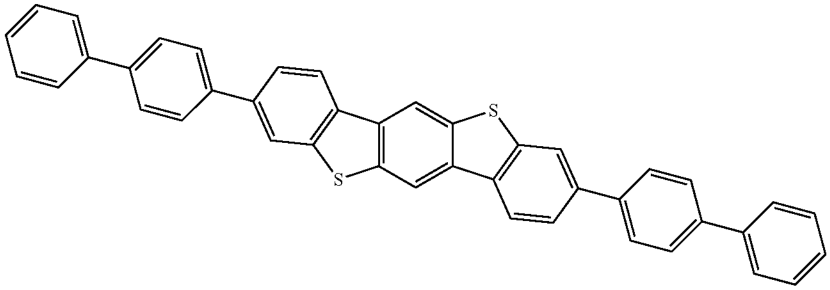
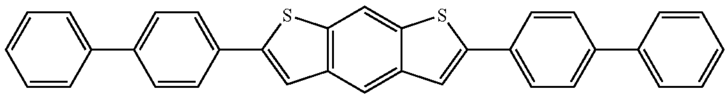

-continued
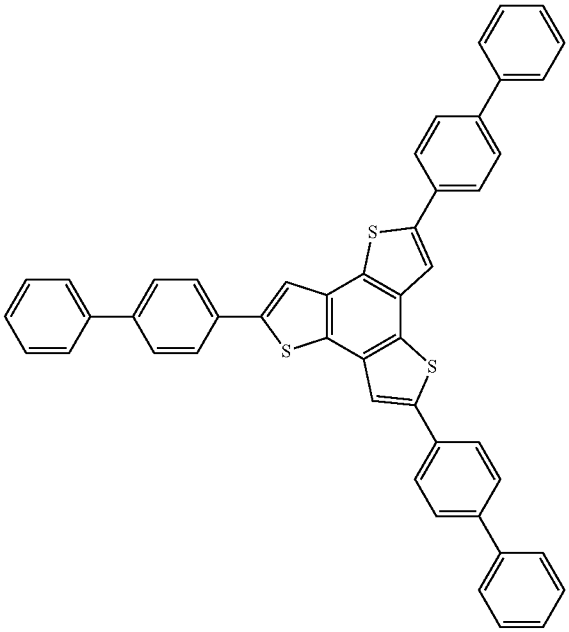
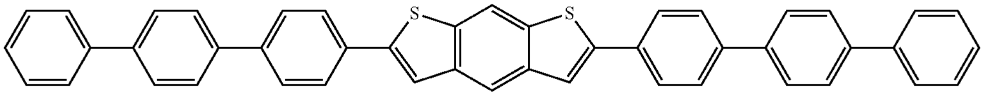
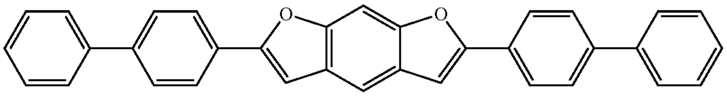
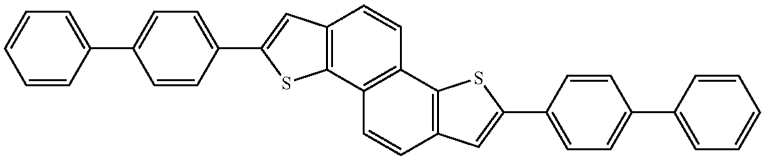
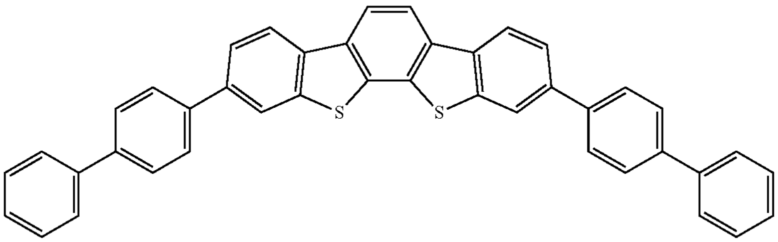
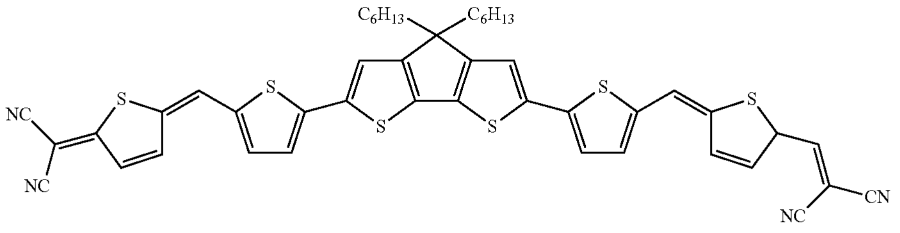
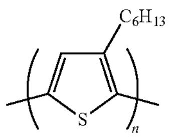

-continued
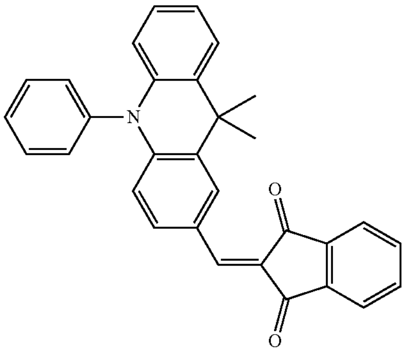
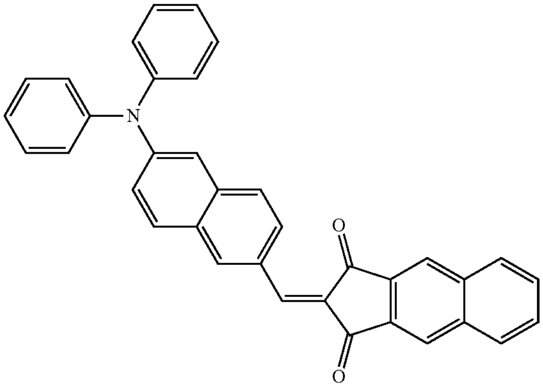
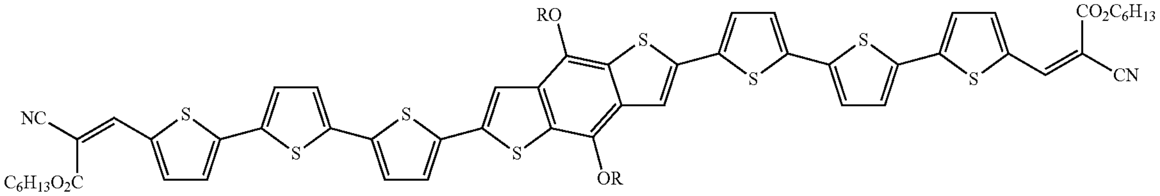
R = 2-ethylhexyl
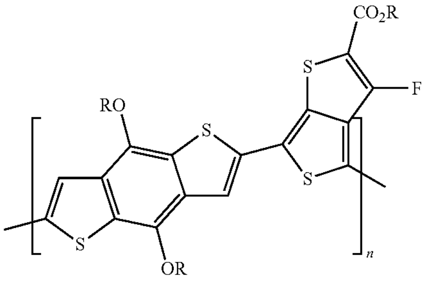
R = 2-ethylhexyl
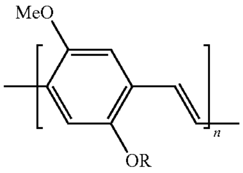
R = 2-ethylhexyl
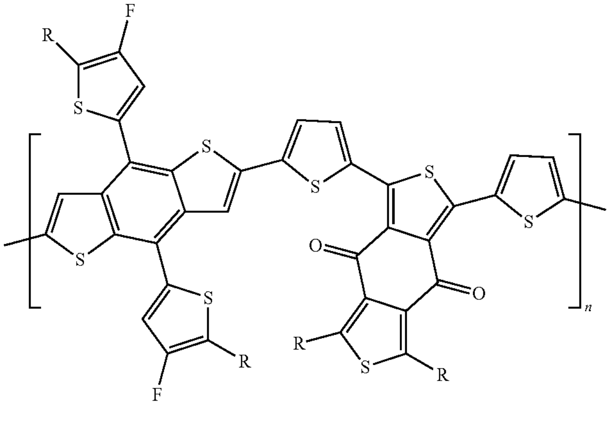
R = 2-ethylhexyl
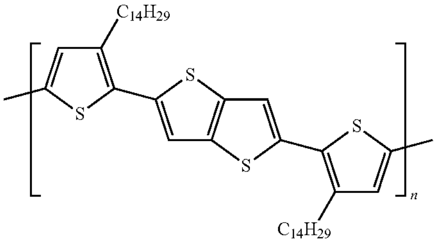
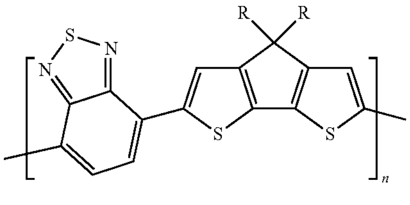
R = 2-ethylhexyl
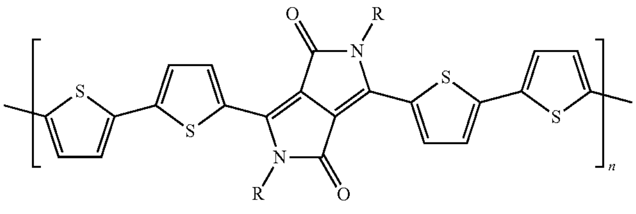
R = 2-decyltetradecyl -continued

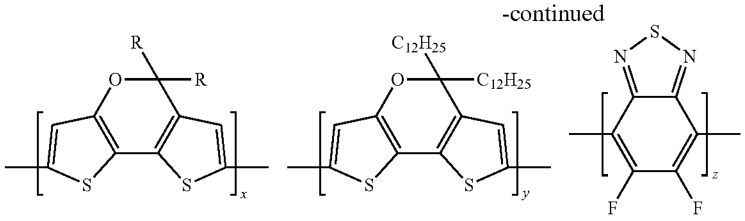

R = 3,7-dimethyloctyl

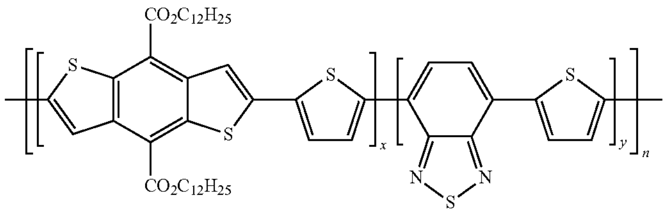

A content of the p-type semiconductor material in the photoelectric conversion film (=(film thickness of p-type semiconductor material in terms of single layer/film thickness of entire photoelectric conversion film)×100) is preferably 5% to 80% by volume, more preferably 10% to 70% by volume, and still more preferably 20% to 60% by volume.

The p-type semiconductor material contained in the photoelectric conversion film may be used alone, or two or more thereof may be used in combination.

<n-Type Semiconductor Material>

The photoelectric conversion film also preferably includes the n-type semiconductor material as another component in addition to the specific compound. In this case, it is preferable that the specific compound functions as the p-type semiconductor.

The n-type semiconductor material is an acceptor-property organic semiconductor material (a compound), and refers to an organic compound having a property of easily accepting an electron.

Further specifically, the n-type semiconductor material is an organic compound having further excellent electron transport properties than the specific compound. The n-type semiconductor material preferably has a high electron affinity for the specific compound.

In the present specification, the electron transport properties (electron carrier mobility) of a compound can be evaluated by, for example, a time-of-flight method (a TOF method) or by using a field effect transistor element.

The electron carrier mobility of the n-type semiconductor material is preferably $10^{-4}$ $cm^2/V·s$ or more, more preferably $10^{-3}$ $cm^2/V·s$ or more, and still more preferably $10^{-2}$ $cm^2/V·s$ or more. The upper limit of the electron carrier mobility described above is not particularly limited, but is preferably 10 $cm^2/V·s$ or less, for example, from the viewpoint of suppressing the flow of a small amount of current without light irradiation.

In the present specification, a value (value multiplied by −1) of a reciprocal number of the LUMO value obtained by the calculation of B3LYP/6-31G (d) using Gaussian '09 (software manufactured by Gaussian, Inc.) as a value of the electron affinity.

The electron affinity of the n-type semiconductor material is preferably 3.0 to 5.0 eV, and more preferably 3.5 to 5.0 eV.

Examples of the n-type semiconductor material include fullerenes selected from the group consisting of a fullerene and derivatives thereof, fused aromatic carbocyclic compounds (for example, a naphthalene derivative, an anthracene derivative, a phenanthrene derivative, a tetracene derivative, a pyrene derivative, a perylene derivative, and a fluoranthene derivative); a heterocyclic compound having a 5- to 7-membered ring having at least one of a nitrogen atom, an oxygen atom, or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, and thiazole); polyarylene compounds; fluorene compounds; cyclopentadiene compounds; silyl compounds; 1,4,5,8-naphthalenetetracarboxylic acid anhydride; 1,4,5,8-naphthalenetetracarboxylic acid anhydride imide derivative, 3,4,9,10-perylenetetracarboxylic dianhydride, 3,4,9,10-perylenetetracarboxylic acid diimide, compounds disclosed in JP2018-6745A; oxadiazole derivative; anthraquinodimethane derivatives; diphenylquinone derivatives; bathocuproine, bathophenanthroline, and derivatives thereof; triazole compounds; a distyrylarylene derivative; a metal complex having a nitrogen-containing heterocyclic compound as a ligand; a silole compound; and compounds disclosed in paragraphs [0056] to [0057] of JP2006-100767A.

Examples of the fullerenes include a fullerene $C_{60}$, a fullerene $C_{70}$, a fullerene $C_{76}$, a fullerene $C_{78}$, a fullerene $C_{80}$, a fullerene $C_{82}$, a fullerene $C_{84}$, a fullerene $C_{90}$, a fullerene $C_{96}$, a fullerene $C_{240}$, a fullerene $C_{540}$, and a mixed fullerene.

Examples of the fullerene derivatives include compounds in which a substituent is added to the above fullerenes. The substituent is preferably an alkyl group, an aryl group, or a heterocyclic group. The fullerene derivative is preferably compounds described in JP2007-123707A.

In a case where the n-type semiconductor material includes fullerenes, a content of the fullerenes to a total content of the n-type semiconductor materials in the photoelectric conversion film (=(film thickness of fullerenes in terms of single layer/film thickness of total n-type semiconductor material in terms of single layer)×100) is preferably 15% to 100% by volume, more preferably 35% to 100% by volume.

An organic coloring agent may be used in place of the n-type semiconductor material described in the upper row or together with the n-type semiconductor material described in the upper row.

By using an organic coloring agent, it is easy to control an absorption wavelength (maximum absorption wavelength) of the photoelectric conversion element to be within any wavelength range.

Examples of the organic coloring agent include a cyanine coloring agent, a styryl coloring agent, a hemicyanine coloring agent, a merocyanine coloring agent (including zeromethine merocyanine (simple merocyanine)), a rhodacyanine coloring agent, an allopolar coloring agent, an oxonol coloring agent, a hemioxonol coloring agent, a squarylium coloring agent, a croconium coloring agent, an azamethine coloring agent, a coumarin coloring agent, an arylidene coloring agent, an anthraquinone coloring agent, a triphenylmethane coloring agent, an azo coloring agent, an azomethine coloring agent, a metallocene coloring agent, a fluorenone coloring agent, a flugide coloring agent, a perylene coloring agent, a phenazine coloring agent, a phenothiazine coloring agent, a quinone coloring agent, a diphenylmethane coloring agent, a polyene coloring agent, an acridine coloring agent, an acridinone coloring agent, a diphenylamine coloring agent, a quinophthalone coloring agent, a phenoxazine coloring agent, a phthaloperylene coloring agent, a dioxane coloring agent, a porphyrin coloring agent, a chlorophyll coloring agent, a phthalocyanine coloring agent, a subphthalocyanine coloring agent, a metal complex coloring agent, compounds disclosed in paragraphs [0083] to [0089] of JP2014-082483A, compounds disclosed in paragraphs [0029] to [0033] of JP2009-167348A, compounds disclosed in paragraphs [0197] to [0227] of JP2012-077064A, compounds disclosed in paragraphs [0035] to [0038] of WO2018/105269A, compounds disclosed in paragraphs [0041] of WO2018/186389A, compounds disclosed in paragraphs [0059] to [0062] of WO2018/186397A, compounds disclosed in paragraphs [0078] to [0083] of WO2019/009249A, compounds disclosed in paragraphs [0054] to [0056] of WO2019/049946A, compounds disclosed in paragraphs [0059] to [0063] of WO2019/054327A, compounds disclosed in paragraphs [0086] to [0087] of WO2019/098161A, and compounds disclosed in paragraphs [0085] of WO2020/013246.

In a case where the photoelectric conversion film includes an organic coloring agent, a content of the organic coloring agent described above to a total content of the semiconductor material containing the specific compound in the photoelectric conversion film (=(film thickness of organic coloring agent in terms of single layer/film thickness of total semiconductor material in terms of single layer)×100) is preferably 10% to 90% by volume, more preferably 15% to 80% by volume, and particularly preferably 20% to 70% by volume.

The molecular weight of the n-type semiconductor material is preferably 250 to 1000000, and more preferably 250 to 500000.

In a case where the photoelectric conversion film includes the n-type semiconductor material, the photoelectric conversion film preferably has a bulk heterostructure formed in a state where the specific compound and the n-type semiconductor material are mixed.

A content of the n-type semiconductor material in the photoelectric conversion film (=(film thickness of n-type semiconductor material in terms of single layer/film thickness of entire photoelectric conversion film)×100) is preferably 5% to 70% by volume, more preferably 10% to 60% by volume, and still more preferably 15% to 50% by volume.

The n-type semiconductor material contained in the photoelectric conversion film may be used alone, or two or more thereof may be used in combination.

The photoelectric conversion film preferably satisfies any one of the following A to C from the viewpoint that the effect of the present invention is more excellent.

A: The photoelectric conversion film has a bulk heterostructure formed in a state in which two or more kinds of specific compounds are mixed.

B: The photoelectric conversion film has a bulk heterostructure formed in a state in which the specific compound and the p-type organic semiconductor are mixed.

C: The photoelectric conversion film has a bulk heterostructure formed in a state in which the specific compound and the n-type semiconductor are mixed.

The form of A is intended to be a form in which a specific compound having characteristics of the n-type semiconductor and another specific compound having characteristics of a relatively lower electron affinity than the specific compound are used in combination.

The bulk heterostructure in the form of A refers to a layer in which two or more kinds of specific compounds are mixed and dispersed in the photoelectric conversion film. The bulk heterostructure in the form of B refers to a layer in which the specific compound and the p-type organic semiconductor are mixed and dispersed in the photoelectric conversion film. The bulk heterostructure in the form of C refers to a layer in which the specific compound and one or more n-type semiconductors are mixed and dispersed in the photoelectric conversion film. In addition, a bulk heterostructure formed in a state in which a coloring agent is further mixed with the constitutions A to C is also preferable. The photoelectric conversion film having the bulk heterostructure can be formed by either a wet method or a dry method. The bulk heterostructure is described in detail in, for example, paragraphs [0013] and [0014] of JP2005-303266A and the like.

The photoelectric conversion film according to the embodiment of the present invention is a non-light emitting film, and has a feature different from an organic light emitting diode (OLED). The non-light emitting film is intended for a film having a light emission quantum efficiency of 1% or less, and the light emission quantum efficiency is preferably 0.5% or less, and more preferably 0.1% or less.

<Film Formation Method>

The photoelectric conversion film can be formed mostly by a coating film formation method and a dry film formation method.

Examples of the coating film formation method include a coating methods such as a drop casting method, a casting method, a dip coating method, a die coater method, a roll coater method, a bar coater method, and a spin coating method, various printing methods such as an ink jet method, a screen printing method, a gravure printing method, a flexographic printing method, an offset printing method, and a microcontact printing method, and a Langmuir-Blodgett (LB) method.

Examples of the dry film formation method include a physical vapor deposition method such as a vapor deposition method (in particular, a vacuum vapor deposition method), a sputtering method, and an ion plating method, a molecular beam epitaxy (MBE) method, and a chemical vapor deposition (CVD) method such as plasma polymerization. Among these, as the dry film formation method, a vacuum vapor deposition method is preferable. In a case where the photoelectric conversion film is formed by the vacuum vapor deposition method, manufacturing conditions such as a degree of vacuum and a vapor deposition temperature can be set according to the normal method.

The thickness of the photoelectric conversion film is preferably 10 to 1000 nm, more preferably 50 to 800 nm, and still more preferably 50 to 500 nm.

[Electrode]

Electrodes (the upper electrode (the transparent conductive film) 15 and the lower electrode (the conductive film) 11) are formed of conductive materials. Examples of the conductive material include metals, alloys, metal oxides, electrically conductive compounds, and mixtures thereof.

Since light is incident through the upper electrode 15, the upper electrode 15 is preferably transparent to light to be detected. Examples of the materials constituting the upper electrode 15 include conductive metal oxides such as tin oxide (antimony tin oxide (ATO), fluorine doped tin oxide (FTO)) doped with antimony, fluorine, or the like, tin oxide, zinc oxide, indium oxide, indium tin oxide (ITO), and indium zinc oxide (IZO); metal thin films such as gold, silver, chromium, and nickel; mixtures or laminates of these metals and the conductive metal oxides; organic conductive materials such as polyaniline, polythiophene, and polypyrrole; carbon materials such as carbon nanotubes and graphene. Among these, conductive metal oxides are preferable from the viewpoints of high conductivity, transparency, and the like.

In general, in a case where the conductive film is made to be thinner than a certain range, a resistance value is rapidly increased. However, in the solid-state imaging element into which the photoelectric conversion element according to the present embodiment is incorporated, the sheet resistance is preferably 100 to 10000Ω/□, and a degree of freedom of a range of the film thickness that can be thinned is large. In addition, as the thickness of the upper electrode (the transparent conductive film) 15 is thinner, the amount of light that the upper electrode absorbs is smaller, and the light transmittance usually increases. The increase in the light transmittance causes an increase in light absorbance in the photoelectric conversion film and an increase in the photoelectric conversion ability, which is preferable. Considering the suppression of leakage current, an increase in the resistance value of the thin film, and an increase in transmittance accompanied by the thinning, the film thickness of the upper electrode 15 is preferably 5 to 100 nm, and more preferably 5 to 20 nm.

There is a case where the lower electrode 11 has transparency or an opposite case where the lower electrode 11 does not have transparency and reflects light, depending on the application. Examples of a material constituting the lower electrode 11 include conductive metal oxides such as tin oxide (ATO, FTO) doped with antimony, fluorine, or the like, tin oxide, zinc oxide, indium oxide, indium tin oxide (ITO), and indium zinc oxide (IZO); metals such as gold, silver, chromium, nickel, titanium, tungsten, and aluminum, and conductive compounds (for example, titanium nitride (TiN)) such as oxides or nitrides of these metals; mixtures or laminates of these metals and conductive metal oxides; organic conductive materials such as polyaniline, polythiophene, and polypyrrole; carbon materials such as carbon nanotubes and graphene.

The method of forming electrodes is not particularly limited, and can be appropriately selected in accordance with the electrode material. Specific examples thereof include a wet method such as a printing method and a coating method; a physical method such as a vacuum vapor deposition method, a sputtering method, and an ion plating method; and a chemical method such as a CVD method and a plasma CVD method.

In a case where the material of the electrode is ITO, examples thereof include an electron beam method, a sputtering method, a resistance heating vapor deposition method, a chemical reaction method (such as a sol-gel method), and a coating method with a dispersion of indium tin oxide.

[Charge Blocking Film: Electron Blocking Film and Positive Hole Blocking Film]

It is also preferable that the photoelectric conversion element according to the embodiment of the present invention has one or more interlayers between the conductive film and the transparent conductive film, in addition to the photoelectric conversion film. An example of the interlayer includes a charge blocking film. In a case where the photoelectric conversion element has this film, the characteristics (such as photoelectric conversion efficiency and responsiveness) of the obtained photoelectric conversion element are more excellent.

Examples of the charge blocking film include an electron blocking film and a positive hole blocking film. The photoelectric conversion element preferably includes at least an electron blocking film as an interlayer.

Hereinafter, each of the films will be described in detail.

<Electron Blocking Film>

The electron blocking film is a donor organic semiconductor material (compound).

The electron blocking film preferably has an ionization potential of 4.8 to 5.8 eV.

In addition, it is preferable that the relationship between an ionization potential Ip (B) of the electron blocking film and an ionization potential Ip (P) of the p-type semiconductor material in the photoelectric conversion layer satisfies Ip (B)≤Ip (P).

As the electron blocking film, for example, a p-type semiconductor material can be used. The p-type semiconductor material may be used alone, or two or more thereof may be used in combination.

Examples of the p-type semiconductor material include a p-type organic semiconductor material, and specific examples thereof include triarylamine compounds (for example, N,N'-bis(3-methylphenyl)-(1,1'-biphenyl)-4,4'-diamine (TPD), 4,4'-bis[N-(naphthyl)-N-Phenyl-amino] biphenyl (α-NPD), compounds disclosed in paragraphs [0128] of JP2011-228614A, compounds disclosed in paragraphs [0052] to [0063] of JP2011-176259A, compounds disclosed in paragraphs [0119] to [0158] of JP2011-225544A, compounds disclosed in paragraphs [0044] to [0051] of JP2015-153910A, and compounds disclosed in paragraphs [0086] to [0090] of JP2012-094660A, pyrazoline compounds, styrylamine compounds, hydrazone compounds, polysilane compounds, thiophene compounds (for example, a thienothiophene derivative, a dibenzothiophene derivative, a benzodithiophene derivative, a dithienothiophene derivative, a [1]benzothieno[3,2-b]thiophene (BTBT) derivative, a thieno[3,2-f:4,5-f']bis[1]benzothiophene (TBBT) derivative, compounds disclosed in paragraphs [0031] to [0036] of JP2018-014474A, compounds disclosed in paragraphs [0043] to [0045] of WO2016-194630A, compounds disclosed in paragraphs [0025] to [0037], and [0099] to [0109] of WO2017-159684A, compounds disclosed in paragraphs [0029] to [0034] of JP2017-076766A, compounds disclosed in paragraphs [0015] to [0025] of WO2018-207722A, compounds disclosed in paragraphs [0045] to [0053] of JP2019-054228A, compounds disclosed in paragraphs [0045] to [0055] of WO2019-058995A, compounds disclosed in paragraphs [0063] to [0089] of WO2019-081416A, compounds disclosed in paragraphs [0033] to [0036] of JP2019-80052A, compounds disclosed in paragraphs [0044] to [0054] of WO2019-054125A, compounds disclosed in paragraphs [0041] to [0046] of WO2019-093188A, and the like), a cyanine compound, an oxonol compound, a polyamine compound, an indole compound, a pyrrole compound, a pyrazole compound, a polyarylene compound, a fused aromatic carbocyclic compound (for example, a naphthalene derivative, an anthracene derivative, a phenanthrene derivative, a tetracene derivative, a pentacene derivative, a pyrene derivative, a perylene derivative, and a fluoranthene derivative), a porphyrin compound, a phthalocyanine compound, a triazole compound, an oxadiazole compound, an imidazole compound, a polyarylalkane compound, a pyrazolone compound, an amino-substituted chalcone compound, an oxazole compound, a fluorenone compound, a silazane compound, and a metal complex having nitrogen-containing heterocyclic compounds as ligands.

Examples of the p-type semiconductor material include compounds having an ionization potential smaller than that of the n-type semiconductor material, and in a case where this condition is satisfied, the organic coloring agents exemplified as the n-type semiconductor material can be used.

A polymer material can also be used as the electron blocking film.

Examples of the polymer material include a polymer such as phenylenevinylene, fluorene, carbazole, indole, pyrene, pyrrole, picoline, thiophene, acetylene, and diacetylene, and a derivative thereof.

The electron blocking film may be formed of a plurality of films.

The electron blocking film may be formed of an inorganic material. In general, since an inorganic material has a dielectric constant larger than that of an organic material, in a case where the inorganic material is used in the electron blocking film, a large voltage is applied to the photoelectric conversion film. Therefore, the photoelectric conversion efficiency increases. Examples of the inorganic material that can be used for the electron blocking film include calcium oxide, chromium oxide, copper chromium oxide, manganese oxide, cobalt oxide, nickel oxide, copper oxide, copper gallium oxide, copper strontium oxide, niobium oxide, molybdenum oxide, copper indium oxide, silver indium oxide, and iridium oxide.

<Positive Hole Blocking Film>

A positive hole blocking film is an acceptor-property organic semiconductor material (compound), and the n-type semiconductor material described above can be used.

The method of manufacturing the charge blocking film is not particularly limited, and examples thereof include a dry film formation method and a wet film formation method. Examples of the dry film formation method include a vapor deposition method and a sputtering method. The vapor deposition method may be any of a physical vapor deposition (PVD) method and a chemical vapor deposition (CVD) method, and the physical vapor deposition method such as a vacuum vapor deposition method is preferable. Examples of the wet film formation method include an ink jet method, a spray method, a nozzle printing method, a spin coating method, a dip coating method, a casting method, a die coating method, a roll coating method, a bar coating method, and a gravure coating method, and an ink jet method is preferable from the viewpoint of high accuracy patterning.

Each thickness of the charge blocking films (the electron blocking film and the positive hole blocking film) is preferably 3 to 200 nm, more preferably 5 to 100 nm, and still more preferably 5 to 30 nm.

[Substrate]

The photoelectric conversion element may further include a substrate. Types of the substrate to be used are not particularly limited, and examples of the substrate include a semiconductor substrate, a glass substrate, and a plastic substrate.

A position of the substrate is not particularly limited, and in general, the conductive film, the photoelectric conversion film, and the transparent conductive film are laminated on the substrate in this order.

[Sealing Layer]

The photoelectric conversion element may further include a sealing layer. The performance of a photoelectric conversion material may deteriorate noticeably due to the presence of deterioration factors such as water molecules. The deterioration can be prevented by coating and sealing the entirety of the photoelectric conversion film with the sealing layer such as diamond-like carbon (DLC) or ceramics such as metal oxide, or metal nitride, and metal nitride oxide which are dense and into which water molecules do not permeate.

The material of the sealing layer may be selected and the sealing layer may be manufactured according to the description in paragraphs [0210] to [0215] of JP2011-082508A.

In the photoelectric conversion element according to the embodiment of the present invention, the photoelectric conversion film may have a configuration of only one layer or a multilayer structure with two or more layers. In a case where the photoelectric conversion film in the photoelectric conversion element according to the embodiment of the present invention has a multilayer structure with two or more layers, at least one layer may contain the specific compound.

In a case where the photoelectric conversion element according to the embodiment of the present invention is applied to an imaging element and an optical sensor described later, the photoelectric conversion film in the photoelectric conversion element is preferably composed as a laminate including, for example, a layer containing the specific compound and a layer having photosensitivity in the near-infrared region and infrared region. Configurations of photoelectric conversion elements disclosed in JP2019-208026A, JP2018-125850A, JP2018-125848A, and other related arts can apply to such a configuration of the photoelectric conversion element, for example.

[Imaging Element]

An example of the application of the photoelectric conversion element includes an imaging element having a photoelectric conversion element. The imaging element is an element that converts optical information of an image into an electric signal. In general, a plurality of the photoelectric conversion elements are arranged in a matrix on the same plane, and an optical signal is converted into an electric signal in each photoelectric conversion element (pixel) to sequentially output the electric signal to the outside of the imaging element for each pixel. Therefore, each pixel is formed of one or more photoelectric conversion elements and one or more transistors.

The imaging element is mounted on an imaging element such as a digital camera and a digital video camera, an electronic endoscope, and imaging modules such as a cellular phone.

The photoelectric conversion element according to the embodiment of the present invention is also preferably used for an optical sensor including the photoelectric conversion element of the present invention. The photoelectric conversion element may be used alone as the optical sensor, and the photoelectric conversion element may be used as a line sensor in which the photoelectric conversion elements are linearly arranged or as a two-dimensional sensor in which the photoelectric conversion elements are arranged in plane.

[Compound]

The present invention also relates to a compound.

The compound according to an embodiment of the present invention is a compound (specific compound) represented by the above-described Formula (1), and the suitable embodiments thereof are also the same.

The specific compound is particularly useful as a material of the photoelectric conversion film used for the optical sensor, the imaging element, or a photoelectric cell. In addition, the specific compound usually functions as the n-type organic semiconductor in the photoelectric conversion film in many cases. The specific compound can also be used as a coloring material, a liquid crystal material, an organic semiconductor material, a charge transport material, a pharmaceutical material, and a fluorescent diagnostic material.

EXAMPLES

The present invention will be described in more detail below based on Examples. Materials, used amounts, ratios, treatment contents, treatment procedures, and the like described in the following Examples can be appropriately changed within the range that does not depart from the gist of the present invention. Therefore, the range of the present invention should not be limitatively interpreted by the following Examples.

Synthesis Examples

Synthesis of Compounds (1-1) to (1-12), Compounds (2-1) to (2-3), Compounds (3-1) to (3-8)

Synthesis of Compound (1-1)

A compound (1-1) was synthesized according to the following scheme.

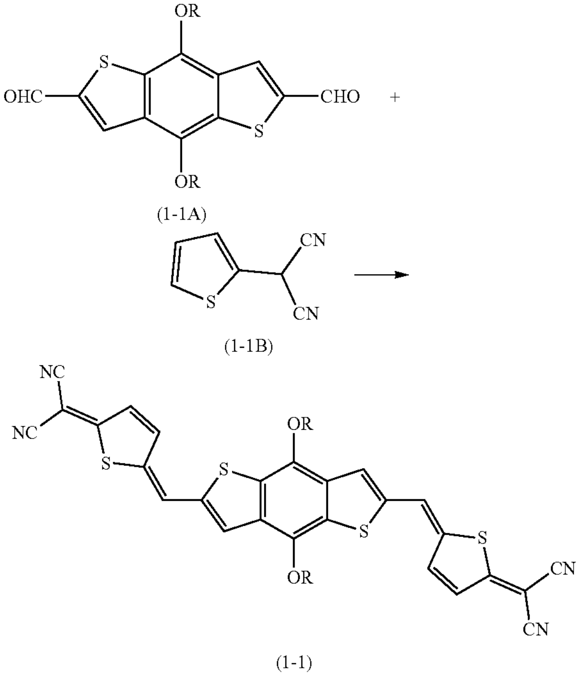

(1-1A)

(1-1B)

(1-1)

R = 2-ethylhexyl 2.0 mmol of a dialdehyde compound (1-1A), 4.0 mmol of a compound (1-1B), and 80 mL of acetic anhydride were charged into a glass reaction container, and the mixture was reacted at 100° C. for 10 hours under a nitrogen atmosphere. After being left to cool to room temperature, acetic anhydride was distilled off under reduced pressure. A concentrate was purified by silica gel column chromatography to obtain 1.02 mmol (yield 51%) of a compound (1-1). Compound (1-1): MS m/z 763.3 ($M^+$+1)

Synthesis of Compounds (1-2) to (1-12), Compounds (2-1) to (2-3), Compounds (3-1) to (3-8)

With reference to the above-described method for synthesizing the compound (1-1), compounds (1-2) to (1-12), compounds (2-1) to (2-3), and compounds (3-1) to (3-8) were synthesized.

Specific structures of individual compounds of the compounds (1-1) to (1-12) are shown in Table 1, specific structures of the compounds (2-1) to (2-3) are shown in Table 2, and specific structures of the compounds (3-1) to (3-8) are shown in Table 3.

The structures of the compounds (1-2) to (1-12), the compounds (2-1) to (2-3), and the compounds (3-1) to (3-8) described below include both cis- and trans-isomers. That is, in a case where the compounds (1-2) to (1-12), the compounds (2-1) to (2-3), and the compounds (3-1) to (3-8) were applied to Formula (1), it is intended to include both cis- and trans-isomers, which can be distinguished based on a C═C double bond composed of a carbon atom in $T^{11}$ at a bonding position where $Q^{11}$ is bonded and a carbon atom in $Q^{11}$ at a bonding position where $T^{11}$ is bonded. In addition, in Formula (1) described below, it is intended to include both cis- and trans-isomers, which can be distinguished based on a C═C double bond composed of a carbon atom to which $R^{11}$ and $A^{11}$ are bonded and a carbon atom in $Q^{11}$ at a bonding position where the carbon atom is bonded. Furthermore, in Formula (1) described below, it is intended to include both cis- and trans-isomers, which can be distinguished based on a C═C double bond composed of a carbon atom in $T^{12}$ at a bonding position where $Q^{12}$ is bonded and a carbon atom in $Q^{12}$ at a bonding position where $T^{12}$ is bonded. Furthermore, in Formula (1) described below, it is intended to) include both cis- and trans-isomers, which can be distinguished based on a C═C double bond composed of a carbon atom to which $R^{12}$ and $A^{11}$ are bonded and a carbon atom in $Q^{12}$ at a bonding position where the carbon atom is bonded.

Production of Photoelectric Conversion Element (1)_Production by Coating and Evaluation

Production of Photoelectric Conversion Elements in Examples 1-1 to 1-14

The photoelectric conversion element was produced using the obtained compounds. Here, the photoelectric conversion element includes a lower electrode 11, a positive hole blocking film 16B, a photoelectric conversion film 12, an electron blocking film 16A, and an upper electrode 15.

Specifically, an amorphous ITO was formed into a film on a glass substrate by a sputtering method to form the lower electrode 11 (thickness: 30 nm). Furthermore, zinc oxide was spin-coated on the lower electrode and dried at 120° C.

for 10 minutes to form a positive hole blocking layer. Next, an o-dichlorobenzene solution (concentration: 2.5% by mass) obtained by dissolving the p-type semiconductor material and the n-type semiconductor material shown in Table 1 at each blending ratio shown in Table 1 was spin-coated on the zinc oxide layer to form a photoelectric conversion film having a bulk heterostructure (thickness: about 100 nm). Furthermore, a compound (B-1) described below was formed into a film by vapor deposition on the photoelectric conversion film to form the electron blocking film 16A (thickness: 10 nm). Furthermore, amorphous ITO was formed into a film on the electron blocking film 16A by a sputtering method to form the upper electrode 15 (the transparent conductive film) (thickness: 10 nm). After the SiO film was formed as the sealing layer on the upper electrode 15 by a vacuum vapor deposition method, an aluminum oxide ($Al_2O_3$) layer was formed thereon by an atomic layer chemical vapor deposition (ALCVD) method to produce a photoelectric conversion element.

B-1

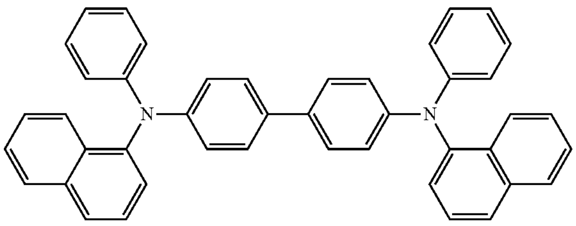

Production of Photoelectric Conversion Element in Comparative Example 1-1

A photoelectric conversion element of Comparative Example 1-1 was prepared by the same method as that of Example 1-1, except that the compound 1-1 was replaced with the comparative compound C1-1. The comparative compound C1-1 is shown in Table 1.

Evaluations

Evaluation of Dark Current

The dark current of each of the photoelectric conversion elements thus obtained in Examples and Comparative Examples was measured by the following method. A voltage was applied to the lower electrode and the upper electrode of each of the photoelectric conversion elements to have an electric field strength of $2.5\times10^5$ V/cm and current values (dark current) in a dark place were measured. As a result, it was found that all of the photoelectric conversion elements obtained in Examples and Comparative Examples had a dark current of 50 $nA/cm^2$ or less, which indicates that all of the photoelectric conversion elements had a sufficiently low dark current.

Evaluation of Photoelectric Conversion Efficiency (External Quantum Efficiency)

The drive of each of the photoelectric conversion elements thus obtained in Examples and Comparative Examples was confirmed. A voltage was applied to each photoelectric conversion element to have an electric field strength of $2.0\times10^5$ V/cm. Thereafter, light was emitted from the upper electrode (transparent conductive film) side to evaluate the photoelectric conversion efficiency (external quantum efficiency). As a result, all of the photoelectric conversion elements obtained in Examples exhibited an external quantum efficiency of 50% or more at a wavelength having the highest external quantum efficiency in a wavelength range of 400 nm to 700 nm. The external quantum efficiency in the same wavelength range in Comparative Example 1-1 was 45%.

Evaluation of Variation in Response

Ten photoelectric conversion elements of Examples and Ten photoelectric conversion elements of Comparative Examples were prepared, and the variation in response was evaluated.

Specifically, a voltage was applied to each element to have a strength of $2.0\times10^5$ V/cm. Thereafter, light emitting diodes (LEDs) were turned on momentarily to emit light from the upper electrode (transparent conductive film) side, a photocurrent at this time was measured with an oscilloscope, a rise time of signal intensity from 0% to 97% was calculated, and a response ratio was calculated by Expression (S) described below to evaluate variation. The results are shown in Table 1.

Response ratio=(shortest response time in 10 elements)/(longest response time in 10 elements) Expression (S):

A: Response ratio is 0.9 or more.
B: Response ratio is 0.8 or more and less than 0.9.
C: Response ratio is 0.7 or more and less than 0.8.
D: Response ratio is less than 0.7.
Table 1 is described below.

TABLE 1

| Table 1 | p-type semiconductor | n-type semiconductor<br>Compound number | Structure | p-type:n-type (mass ratio) | Variation in response |
|---|---|---|---|---|---|
| Example 1-1 | 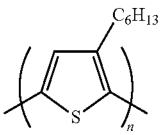 | Compound 1-1 | 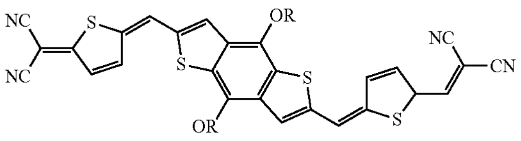<br>R = 2-ethylhexyl | 1:1.1 | B |

TABLE 1-continued
| Table 1 | p-type semiconductor | n-type semiconductor: Compound number | n-type semiconductor: Structure | p-type:n-type (mass ratio) | Variation in response |
|---|---|---|---|---|---|
| Example 1-2 | 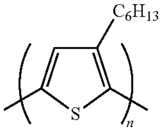 | Compound 1-2 | 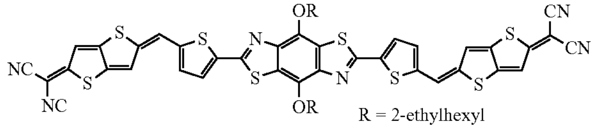 R = 2-ethylhexyl | 1:1 | B |
| Example 1-3 | 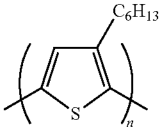 | Compound 1-3 | 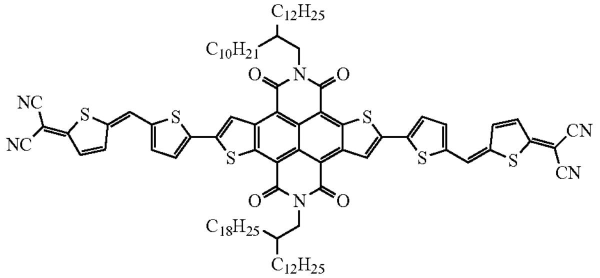 | 1:1.2 | B |
| Example 1-4 | 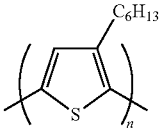 | Compound 1-4 | 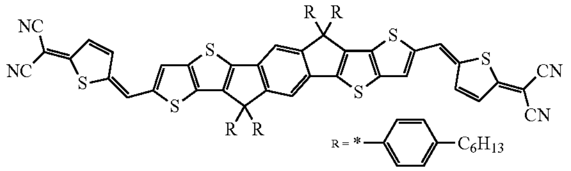 | 1:1.1 | A |
| Example 1-5 | 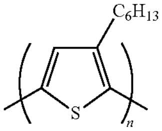 | Compound 1-5 | 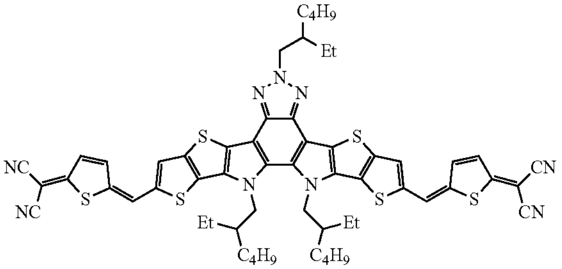 | 1:1.3 | A |
| Example 1-6 | 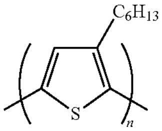 | Compound 1-6 | 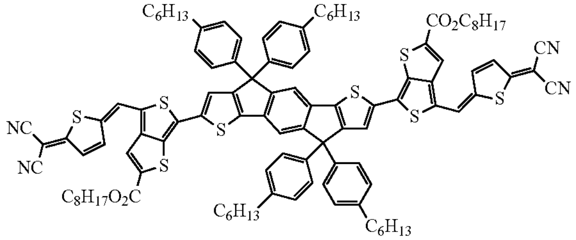 | 1:1.3 | A |
| Example 1-7 | 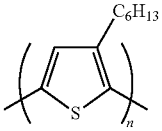 | Compound 1-7 | 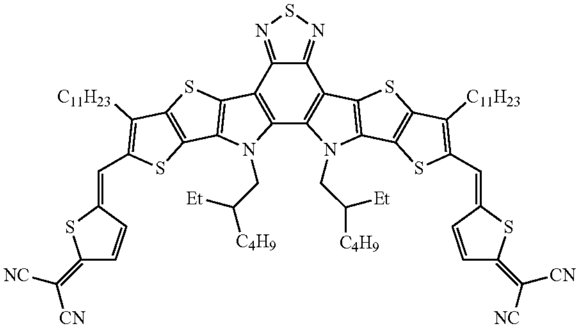 | 1:1 | A |

TABLE 1-continued
| Table 1 | p-type semiconductor | n-type semiconductor Compound number | Structure | p-type:n-type (mass ratio) | Variation in response |
|---|---|---|---|---|---|
| Example 1-8 | 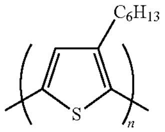 | Compound 1-8 | 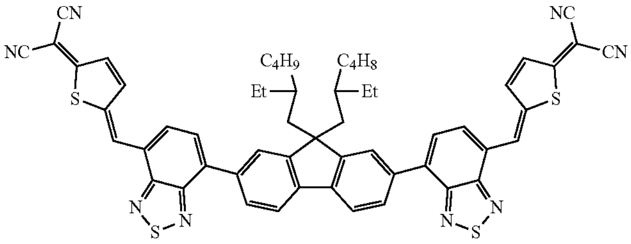 | 1:1 | B |

TABLE 2
| Table 1 (continued) | p-type semiconductor | n-type semiconductor Com-pound number | Structure | p-type:n-type (mass ratio) | Variation in response |
|---|---|---|---|---|---|
| Example 1-9 | 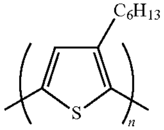 | Com-pound 1-9 | 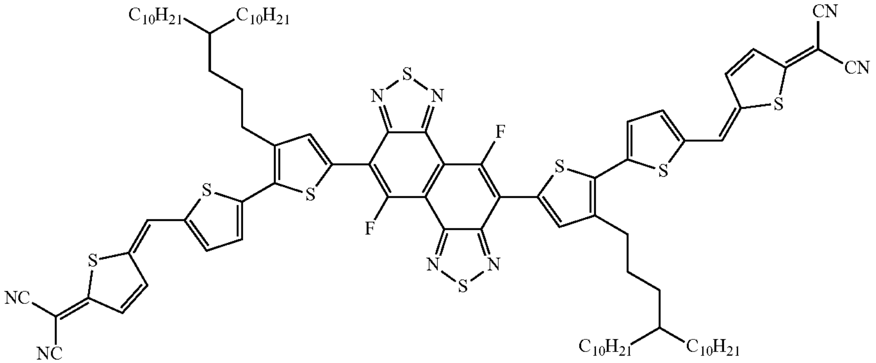 | 1:1.1 | A |
| Example 1-10 | 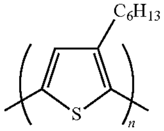 | Com-pound 1-10 | 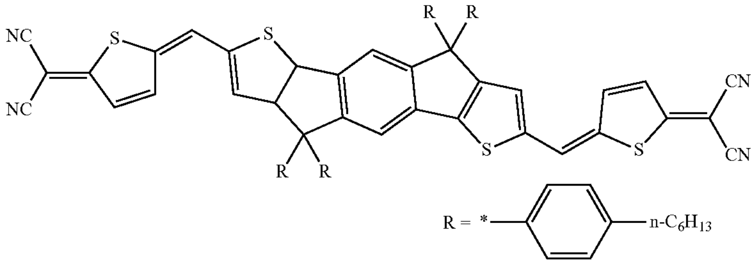 | 1:1.2 | A |

TABLE 2-continued
| Table 1 (continued) | p-type semiconductor | n-type semiconductor: Compound number | n-type semiconductor: Structure | p-type:n-type (mass ratio) | Variation in response |
|---|---|---|---|---|---|
| Example 1-11 | 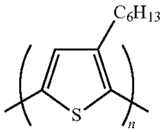 | Compound 1-11 | 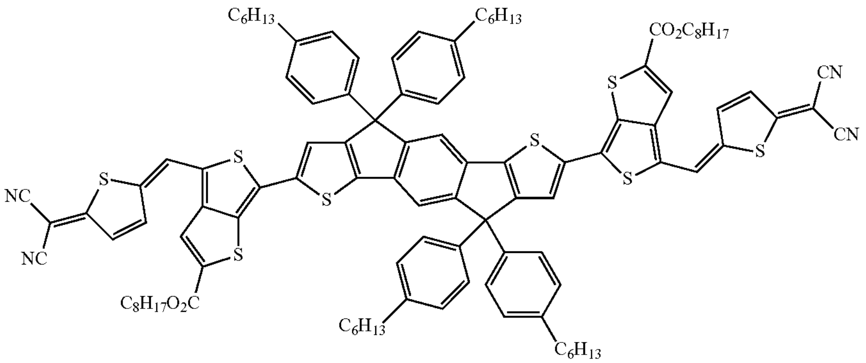 | 1:1.1 | A |
| Example 1-12 | 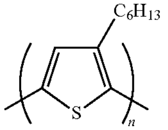 | Compound 1-12 | 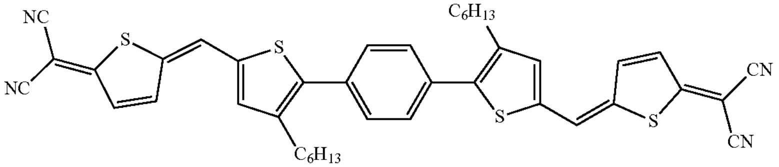 | 1:1 | C |
| Example 1-13 | Compound PC-1 described below | Comound 1-10 | 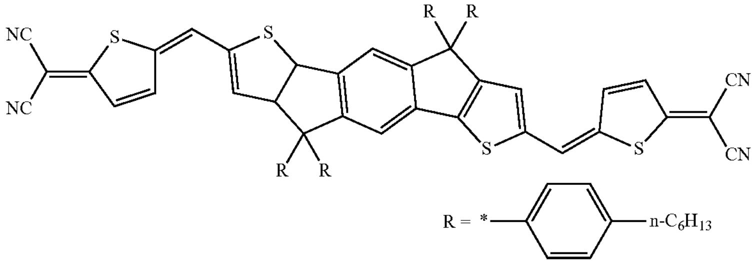 | 1:1 | A |

TABLE 2-continued
| Table 1 (continued) | p-type semiconductor | n-type semiconductor: Compound number | n-type semiconductor: Structure | p-type:n-type (mass ratio) | Variation in response |
|---|---|---|---|---|---|
| Example 1-14 | 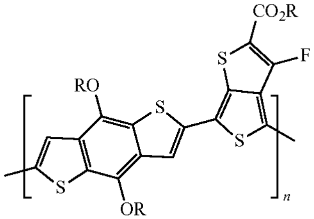 R = 2-ethylhexyl | Compound 1-10 | 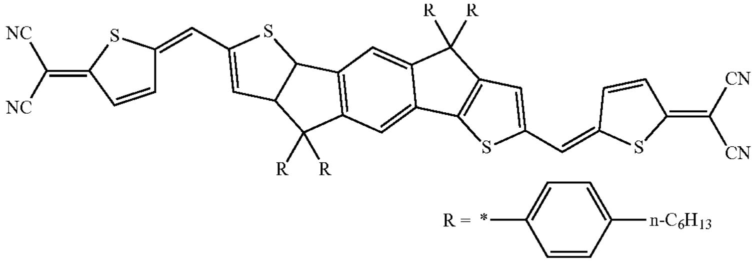 | 1:1.5 | A |
| Comparative Example 1-1 | 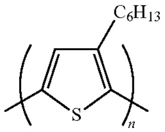 | Compound C1-1 | 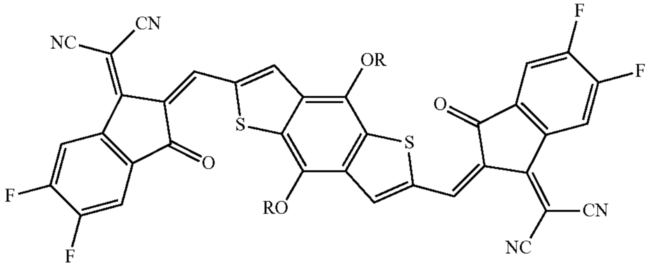 R = 2-ethylhexyl | 1:1 | D |
Compound PC-1
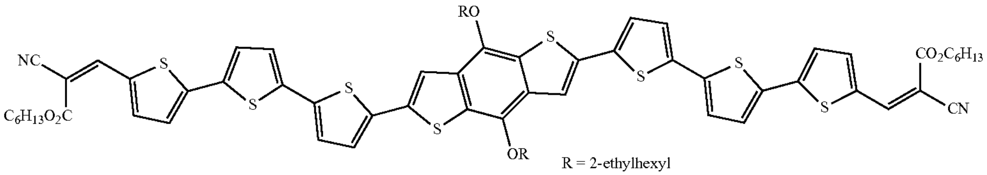
R = 2-ethylhexyl From the above results, it was clarified that all of the photoelectric conversion elements formed by a coating production method in Examples had a high external quantum efficiency and small variation in response.

Among these, regarding the photoelectric conversion element formed by the coating production method, it was confirmed that in a case where the conjugate group corresponding to $A^{11}$ in the case where the n-type semiconductor compound is applied to Formula (1) contains a conjugate fused ring, the variation in response was reduced (see comparison between Examples 1-12 and other Examples). In addition, it was confirmed that in a case where the conjugate group corresponding to $A^{11}$ in the case where the n-type semiconductor compound is applied to Formula (1) contains the conjugate fused ring represented by Formula (AX) described above, the variation in the response was reduced in a case where in the above-described conjugate fused ring, p was 1 or more, and an aryl group was contained as a substituent (see comparison between Example 1-1, Example 1-2, and Example 1-8, and Example 1-4, Example 1-6, Example 1-10, Example 1-11, Example 1-13, and Example 1-14).

Production of Photoelectric Conversion Element (2)_Production by Vapor Deposition and Evaluation

Production of Photoelectric Conversion Elements in Examples 2-1 to 2-3

The photoelectric conversion element of the form illustrated in FIG. 2 was produced using the obtained compounds. Here, the photoelectric conversion element includes a lower electrode 11, an electron blocking film 16A, a photoelectric conversion film 12, a positive hole blocking film 16B, and an upper electrode 15.

Specifically, an amorphous ITO was formed into a film on a glass substrate by a sputtering method to form the lower electrode 11 (thickness: 30 nm). Furthermore, a compound (B-1) described below was formed into a film on the lower electrode 11 by a vacuum thermal vapor deposition method to form the electron blocking film 16A (thickness: 30 nm). Furthermore, the p-type semiconductor material and the n-type semiconductor material shown in Table 1 were vapor-deposited on the electron blocking film 16A at each speed ratio shown in Table 1 to form a photoelectric conversion film 12 having a bulk heterostructure. Furthermore, a compound (B-2) described below was vapor-deposited on the photoelectric conversion film 12 to form the positive hole blocking film 16B (thickness: 10 nm). Amorphous ITO was formed into a film on the positive hole blocking film 16B by a sputtering method to form the upper electrode 15 (the transparent conductive film) (thickness: 10 nm). A SiO film was formed, as a sealing layer, on the upper electrode 15 by a vacuum vapor deposition method, and thereafter, an aluminum oxide ($Al_2O_3$) layer is formed on the SiO film by an ALCVD method to produce a photoelectric conversion element.

B-1

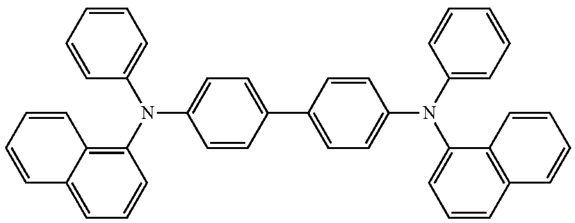

-continued

B-2

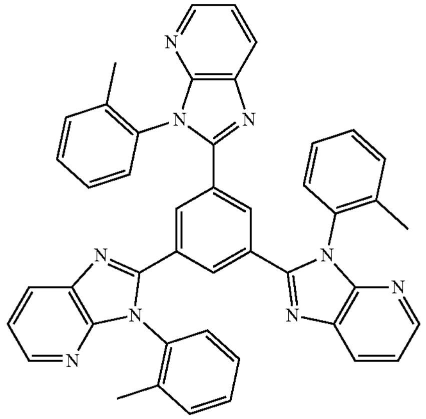

Production of Photoelectric Conversion Element in Comparative Example 2-1

A photoelectric conversion element of Comparative Example 2-1 was prepared by the same method as that of Example 2-1, except that the compound 2-1 was replaced with the comparative compound C2-1. The comparative compound C2-1 is shown in Table 1.

Evaluations

Evaluation of Dark Current

Regarding each of the photoelectric conversion elements obtained in Examples and Comparative Examples, a dark current was measured by the same method as in <Evaluation of Dark Current> of [Production of Photoelectric Conversion Element (1)_Production by Coating and Evaluation] described above. As a result, it was found that all of the photoelectric conversion elements obtained in Examples and Comparative Examples had a dark current of 50 $nA/cm^2$ or less, which indicates that all of the photoelectric conversion elements had a sufficiently low dark current.

Evaluation of Photoelectric Conversion Efficiency (External Quantum Efficiency)

As a result of confirming a drive in each of the photoelectric conversion elements obtained in Examples and Comparative Examples by the same method as in <Evaluation of Photoelectric Conversion Efficiency (External Quantum Efficiency)> of [Production of Photoelectric Conversion Element (1)_Production by Coating and Evaluation] described above, all of the photoelectric conversion elements obtained in Examples exhibited an external quantum efficiency of 40% or more at a wavelength having the highest external quantum efficiency in a wavelength range of 400 nm to 700 nm. The external quantum efficiency in the same wavelength range in Comparative Example 2-1 was 30%.

Evaluation of Variation in Response

Ten photoelectric conversion elements of Examples and ten photoelectric conversion elements of Comparative Examples were produced, and each variation in response was evaluated by the same method as in <Evaluation of Variation in Response> of [Production of Photoelectric Conversion Element (1)_Production by Coating and Evaluation] described above. The results are shown in Table 2.

TABLE 3

| Table 2 | p-type semiconductor | n-type semiconductor: Compound number | n-type semiconductor: Structure | p-type:n-type (volume ratio) | Variation in response |
|---|---|---|---|---|---|
| Example 2-1 | 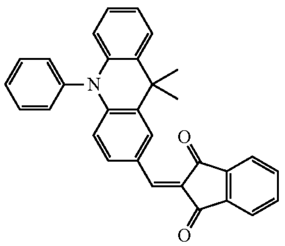 [SMILES: CC1(C)c2ccccc2N(c2ccccc2)c2ccc(C=C3C(=O)c4ccccc4C3=O)cc21] | Compound 2-1 | 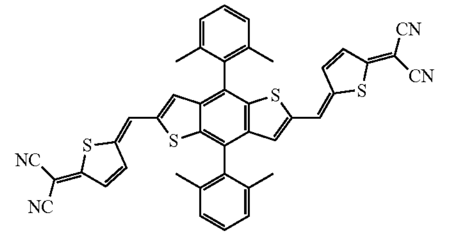 [SMILES: Cc1cccc(C)c1-c1c2cc(/C=c3\ccc(=C(C#N)C#N)s3)sc2c(-c2c(C)cccc2C)c2cc(/C=c3\ccc(=C(C#N)C#N)s3)sc12] | 1:1 | A |
| Example 2-2 | 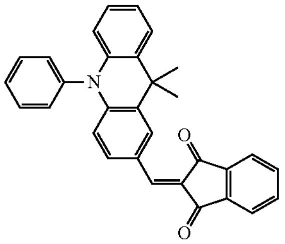 [SMILES: CC1(C)c2ccccc2N(c2ccccc2)c2ccc(C=C3C(=O)c4ccccc4C3=O)cc21] | Compound 2-2 | 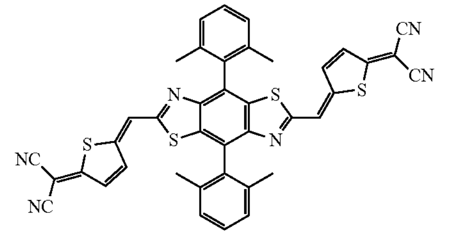 [SMILES: Cc1cccc(C)c1-c1c2nc(/C=c3\ccc(=C(C#N)C#N)s3)sc2c(-c2c(C)cccc2C)c2nc(/C=c3\ccc(=C(C#N)C#N)s3)sc12] | 1:1.1 | A |
| Example 2-3 | 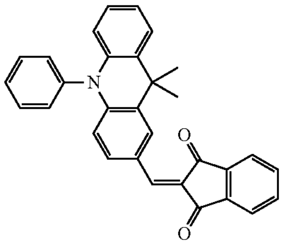 [SMILES: CC1(C)c2ccccc2N(c2ccccc2)c2ccc(C=C3C(=O)c4ccccc4C3=O)cc21] | Compound 2-3 | 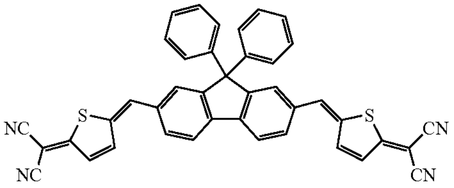 [SMILES: N#CC(C#N)=c1cc/c(=C\c2ccc3c(c2)C(c2ccccc2)(c2ccccc2)c2cc(/C=c4\ccc(=C(C#N)C#N)s4)ccc2-3)s1] | 1.1:1 | A |
| Comparative Example 2-1 | 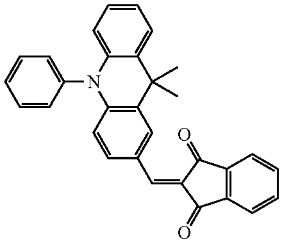 [SMILES: CC1(C)c2ccccc2N(c2ccccc2)c2ccc(C=C3C(=O)c4ccccc4C3=O)cc21] | Compound C2-1 | 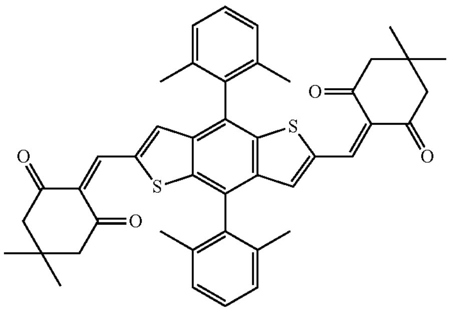 | 1:1 | D |

From the above results, it was clarified that all of the photoelectric conversion elements formed by a vapor deposition production method in Examples had a high external quantum efficiency and small variation in response.

Production of Photoelectric Conversion Element (3)_Production by Coating and Evaluation

Production of Photoelectric Conversion Elements in Examples 3-1 to 3-8

Photoelectric conversion elements of Examples 3-1 to 3-8 were produced by the same method as in Examples 1-1 to 1-14, except that the kind and blending ratio of the p-type semiconductor material and the n-type semiconductor material were changed as shown in Table 3.

Evaluations

Evaluation of Dark Current

In addition, it was found that in a case where a dark current was evaluated using each of the obtained photoelectric conversion elements by the same method as in <Evaluation of Dark Current> of [Production of Photoelectric Conversion Element (1)_Production by Coating and Evaluation] described above, all of the photoelectric conversion elements had a dark current of 50 $nA/cm^2$ or less and exhibited a sufficiently low dark current.

Evaluation of Photoelectric Conversion Efficiency (External Quantum Efficiency)

The drive of each photoelectric conversion element thus obtained in Examples was confirmed. A voltage was applied to each photoelectric conversion element to have an electric field strength of $2.0\times10^1$ V/cm. Thereafter, light was emitted from the upper electrode (transparent conductive film) side to evaluate the photoelectric conversion efficiency (external quantum efficiency). As a result, it was found that all of the elements exhibited photoelectric conversion of 750 nm or more in the near infrared range, and exhibited a highest external quantum efficiency of 20% or more.

Evaluation of Variation in Response

Ten photoelectric conversion elements of Examples and ten photoelectric conversion elements of Comparative Examples were produced, and each variation in response was evaluated by the same method as in (Evaluation of Variation in Response> of [Production of Photoelectric Conversion Element (1)_Production by Coating and Evaluation] described above, except that near-infrared LEDs were used.

TABLE 4
| | | n-type semiconductor | | | Variation |
|---|---|---|---|---|---|
| Table 3 | p-type semiconductor | Compound number | Structure | p-type:n-type (mass ratio) | in response |
| Example 3-1 | 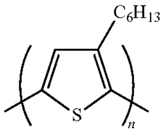 | Compound 3-1 | 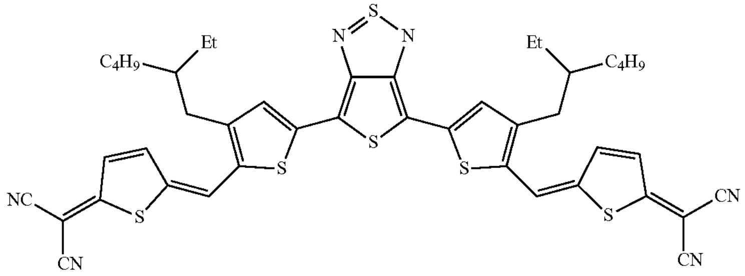 | 1:1.1 | A |
| Example 3-2 | 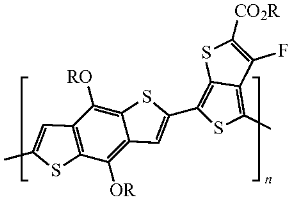 R = 2-ethylhexyl | Compound 3-2 | 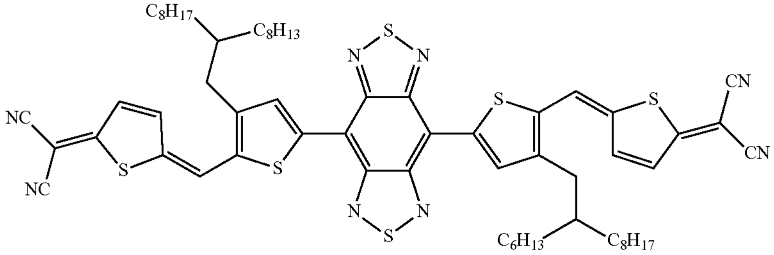 | 1:1 | A |

TABLE 4-continued
| Table 3 | p-type semiconductor | n-type semiconductor: Compound number | n-type semiconductor: Structure | p-type:n-type (mass ratio) | Variation in response |
|---|---|---|---|---|---|
| Example 3-3 | 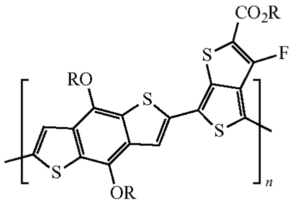 R = 2-ethylhexyl | Compound 3-3 | 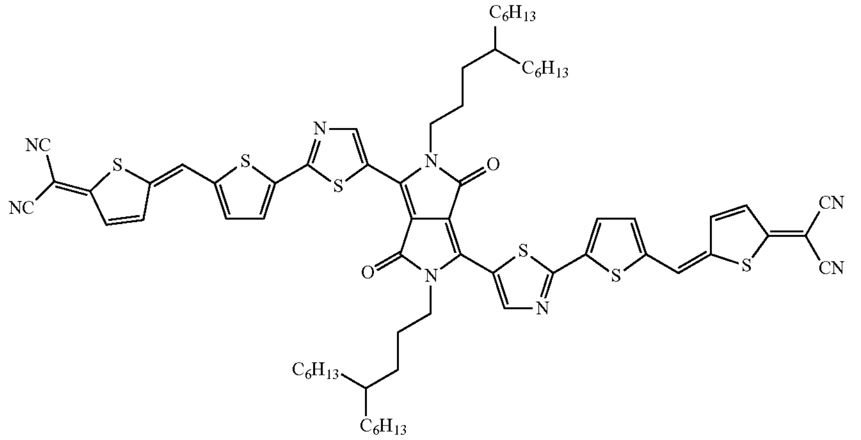 | 1:15 | A |
| Example 3-4 | 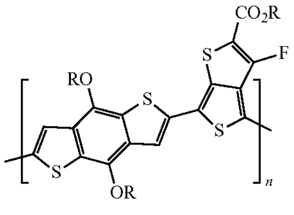 R = 2-ethylhexyl | Compound 3-4 | 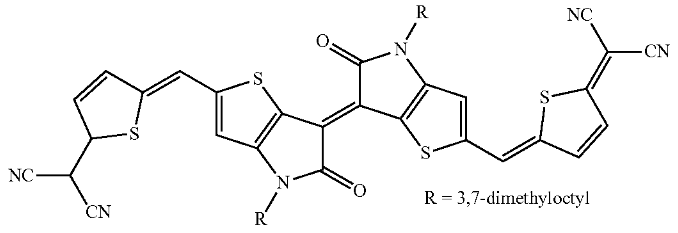 R = 3,7-dimethyloctyl | 1:1 | A |

TABLE 4-continued
| Table 3 | p-type semiconductor | n-type semiconductor: Compound number | n-type semiconductor: Structure | p-type:n-type (mass ratio) | Variation in response |
|---|---|---|---|---|---|
| Example 3-5 | 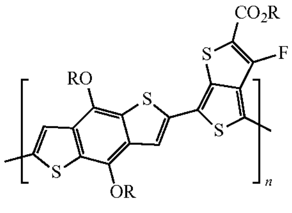 R = 2-ethylhexyl | Compound 3-5 | 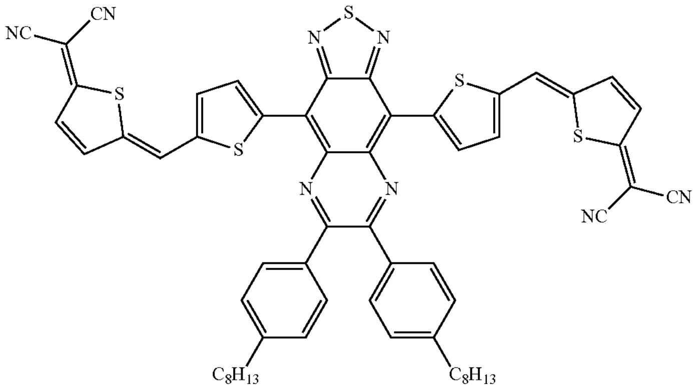 | 1:1 | A |
| Example 3-6 | 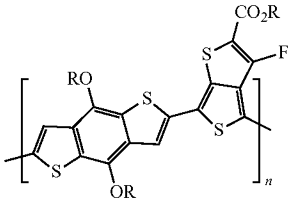 R = 2-ethylhexyl | Compound 3-6 | 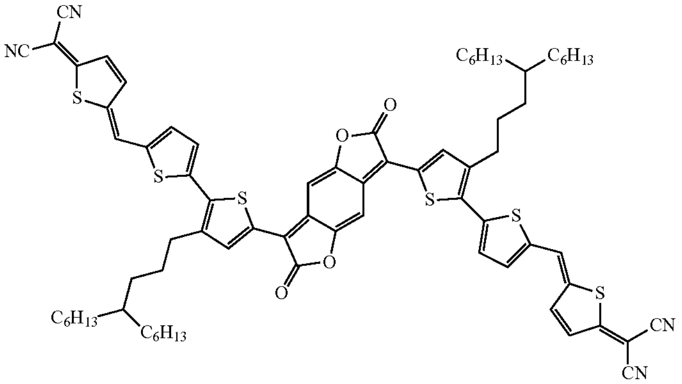 | 1:1.4 | A |

TABLE 4-continued
| Table 3 | p-type semiconductor | n-type semiconductor: Compound number | n-type semiconductor: Structure | p-type:n-type (mass ratio) | Variation in response |
|---|---|---|---|---|---|
| Example 3-7 | 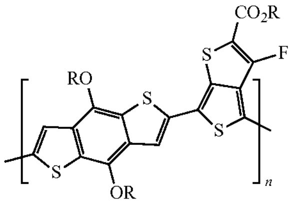 R = 2-ethylhexyl | Compound 3-7 | 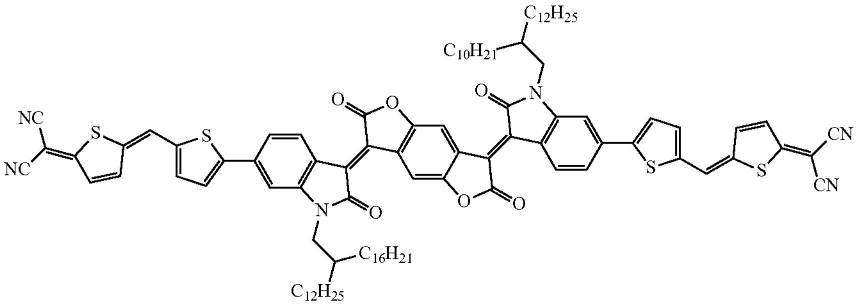 | 1:1.5 | A |
| Example 3-8 | 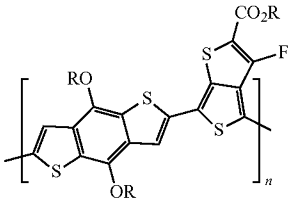 R = 2-ethylhexyl | Compound 3-8 | 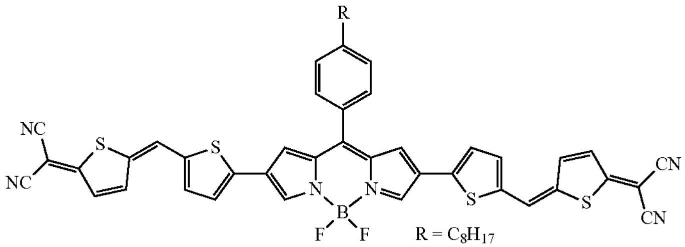 R = $C_8H_{17}$ | 1:1.2 | B |

From the results in Table 3, it was clarified that each of the photoelectric conversion elements in Examples had a high external quantum efficiency and small variation in response.

Production of Photoelectric Conversion Element (4)_Production by Coating and Vapor Deposition Production of Photoelectric Conversion Elements in Examples 4-3 to 4-9

Photoelectric conversion elements of Example 4-1 and Examples 4-3 to 4-9 were produced by the same method as in Examples 2-1 to 2-3, except that the kind and blending ratio of the p-type semiconductor material and the n-type semiconductor material were changed as shown in Table 4, and optionally, a third component was added.

Evaluations

It was confirmed that in a case where the evaluations were carried out by the same method as in <Evaluation of Dark Current>, <Evaluation of Photoelectric Conversion Efficiency (External Quantum Efficiency)>, and <Evaluation of Variation in Response> of [Production of Photoelectric Conversion Element (1)_Production by Coating and Evaluation], by using each of the obtained photoelectric conversion elements, the same photoelectric conversion ability as in Examples 2-1 to 2-3 was exhibited.

Production of Photoelectric Conversion Elements in Examples 4-1 and 4-2

Photoelectric conversion elements of Example 4-1 and Example 4-2 were produced by the same method as in Examples 1-1 to 1-14, except that the kind and blending ratio of the p-type semiconductor material and the n-type semiconductor material were changed as shown in Table 4, and optionally, a third component was added.

Evaluations

It was confirmed that in a case where the evaluations were carried out by the same method as in <Evaluation of Dark Current>, <Evaluation of Photoelectric Conversion Efficiency (External Quantum Efficiency)>, and <Evaluation of Variation in Response> of [Production of Photoelectric Conversion Element (1)_Production by Coating and Evaluation], by using each of the obtained photoelectric conversion elements, the same photoelectric conversion ability as in Examples 1-1 to 1-14 was exhibited.

TABLE 5

| Table 4 | p-type semiconductor |
| --- | --- |
| Example 4-1 | 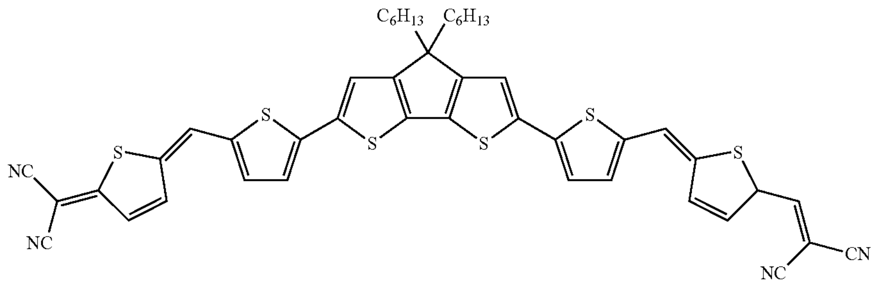 |
| Example 4-2 | 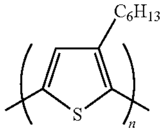 |
| Example 4-3 | 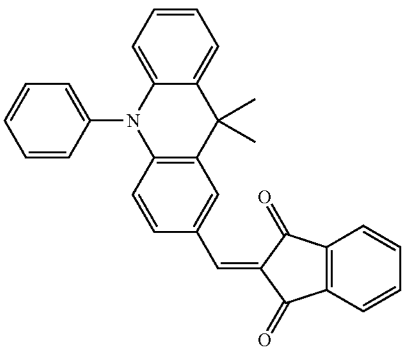 [SMILES: CC1(C)c2ccccc2N(c2ccccc2)c2ccc(C=C3C(=O)c4ccccc4C3=O)cc21] |

TABLE 5-continued
| | |
|---|---|
| Example 4-4 | 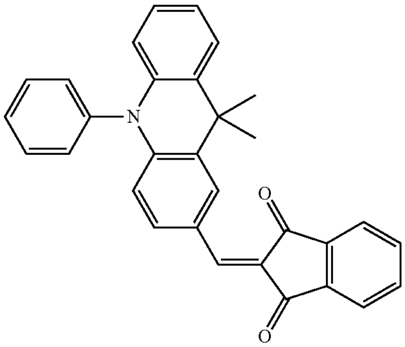 [SMILES: CC1(C)c2ccccc2N(c2ccccc2)c2ccc(C=C3C(=O)c4ccccc4C3=O)cc21] |
| Example 4-5 | 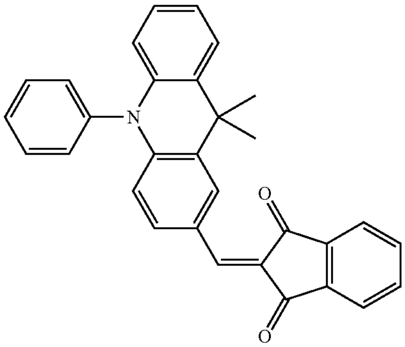 [SMILES: CC1(C)c2ccccc2N(c2ccccc2)c2ccc(C=C3C(=O)c4ccccc4C3=O)cc21] |
| Table 4 | n-type semiconductor |
|---|---|
| Example 4-1 | 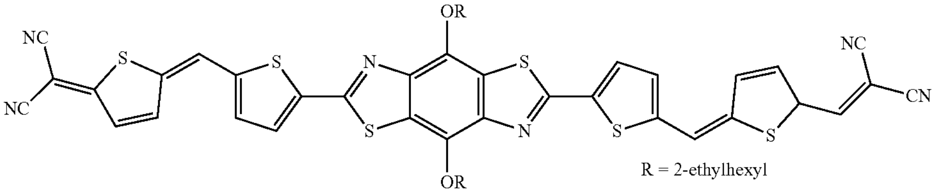 R = 2-ethylhexyl |
| Example 4-2 | 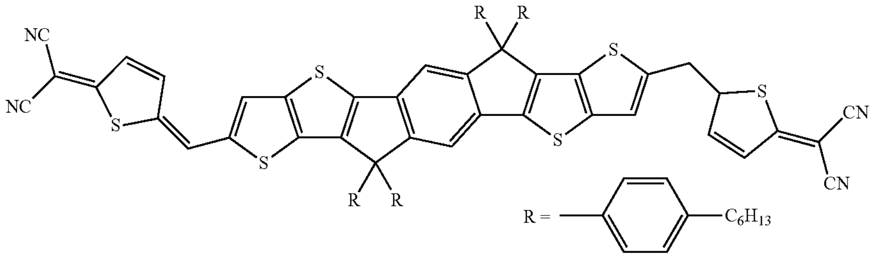 |
| Example 4-3 | 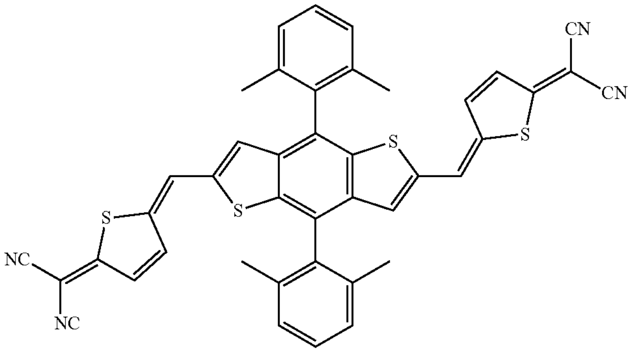 |

TABLE 5-continued
| | |
|---|---|
| Example 4-4 | 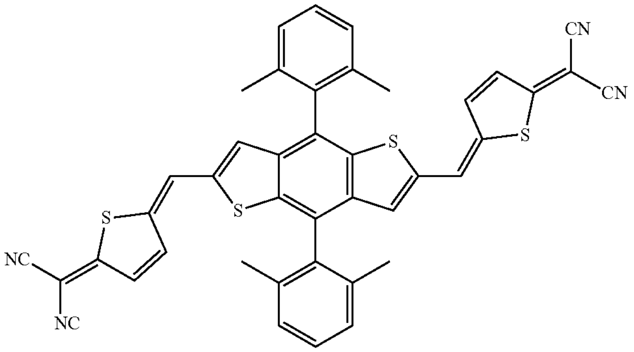 |
| Example 4-5 | 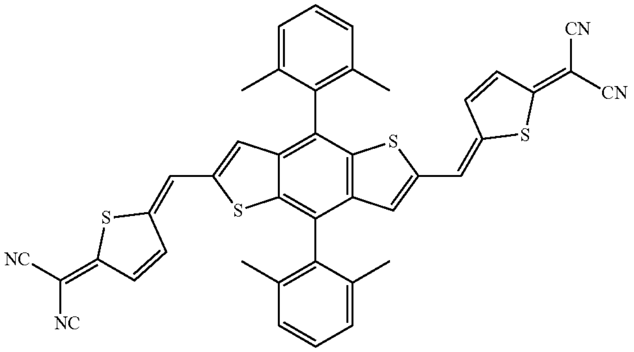 |
| Table 4 | Third component | | Method of forming photoelectric conversion layer | Ratio |
|---|---|---|---|---|
| Example 4-1 | — | — | Spin coat | 1:1 (mass ratio) |
| Example 4-2 | 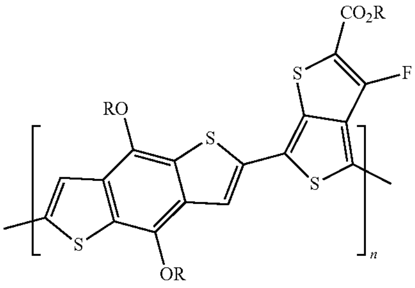 R = 2-ethylhexyl | p-type semiconductor | Spin coat | 1:2:1 (mass ratio) |
| Example 4-3 | 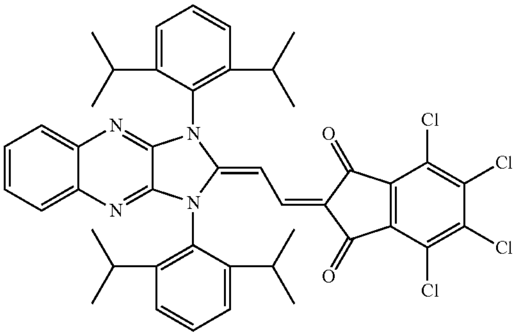 [SMILES: CC(C)c1cccc(C(C)C)c1N1C(=CC=C2C(=O)c3c(Cl)c(Cl)c(Cl)c(Cl)c3C2=O)N(c2c(C(C)C)cccc2C(C)C)c2nc3ccccc3nc21] | Coloring agent | Vapor deposition | 1:2:1 (volume ratio) |

TABLE 5-continued
| | | | | |
|---|---|---|---|---|
| Example 4-4 | 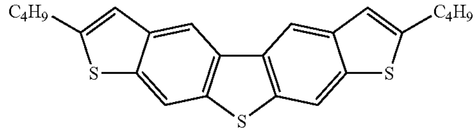 | p-type semiconductor | Vapor deposition | 1:2:1 (volume ratio) |
| Example 4-5 | 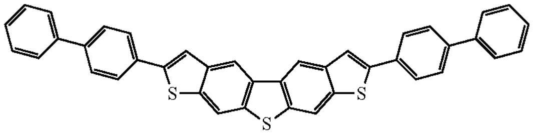 [SMILES: c1ccc(-c2ccc(-c3cc4cc5c(cc4s3)sc3cc4sc(-c6ccc(-c7ccccc7)cc6)cc4cc35)cc2)cc1] | p-type semiconductor | Vapor deposition | 1:2:1 (volume ratio) |
TABLE 6
| Table 4 (continued) | p-type semiconductor | n-type semiconductor |
|---|---|---|
| Example 4-6 | 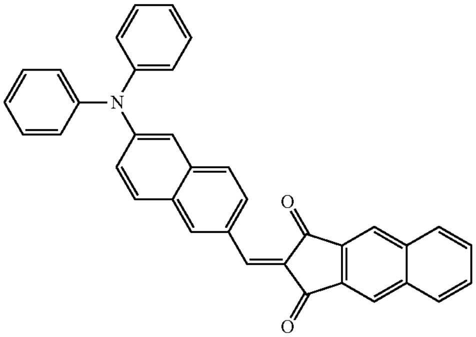 [SMILES: O=C1C(=Cc2ccc3cc(N(c4ccccc4)c4ccccc4)ccc3c2)C(=O)c2cc3ccccc3cc21] | 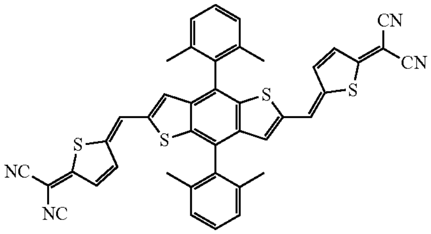 |
| Example 4-7 | 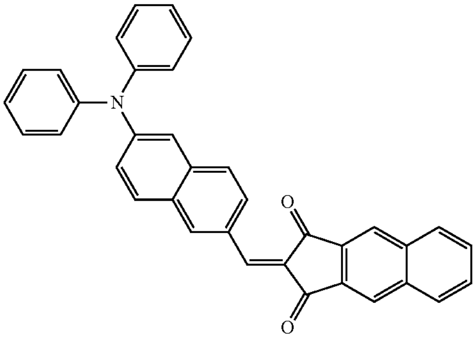 [SMILES: O=C1C(=Cc2ccc3cc(N(c4ccccc4)c4ccccc4)ccc3c2)C(=O)c2cc3ccccc3cc21] | 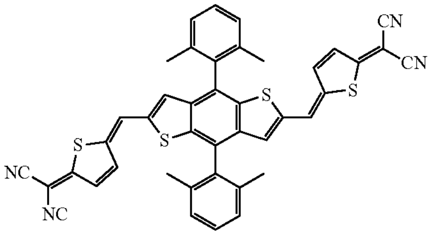 |
| Example 4-8 | 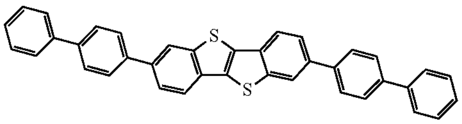 [SMILES: c1ccc(-c2ccc(-c3ccc4c(c3)sc3c5ccc(-c6ccc(-c7ccccc7)cc6)cc5sc43)cc2)cc1] | 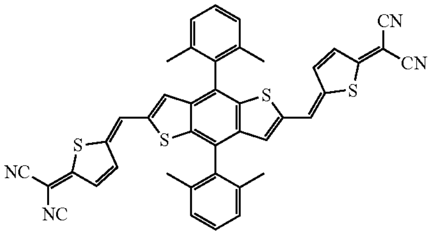 |
| Example 4-9 | 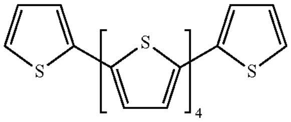 | 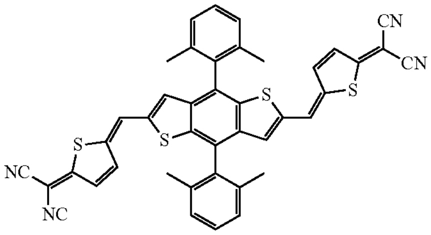 |

TABLE 6-continued

| Table 4 (continued) | Third component | | Method of forming photoelectric conversion layer | Ratio |
|---|---|---|---|---|
| Example 4-6 | 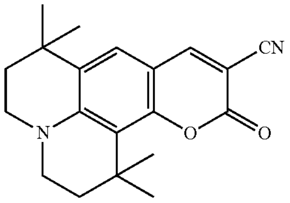 [SMILES: CC1(C)CCN2CCC(C)(C)c3c2c1cc1cc(C#N)c(=O)oc31] | Coloring agent | Vapor deposition | 1:1:02 (volume ratio) |
| Example 4-7 | Fullereue | p-type semi-conductor | Vapor deposition | 2:1:1 (volume ratio) |
| Example 4-8 | 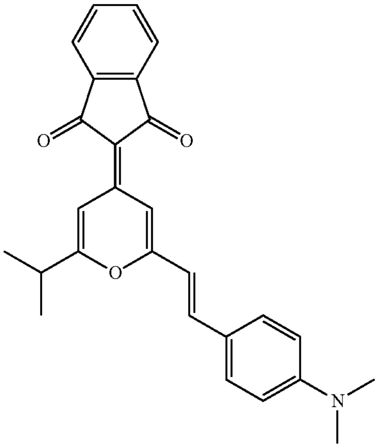 [SMILES: CC(C)C1=CC(=C2C(=O)c3ccccc3C2=O)C=C(/C=C/c2ccc(N(C)C)cc2)O1] | Coloring agent | Vapor deposition | 1:1:06 (volume ratio) |
| Example 4-9 | 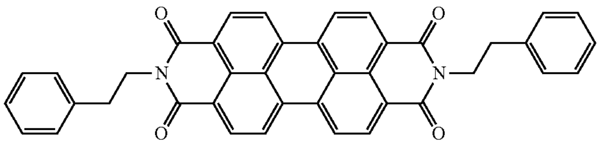 [SMILES: O=C1c2ccc3c4ccc5c6c(ccc(c7ccc(c2c37)C(=O)N1CCc1ccccc1)c64)C(=O)N(CCc1ccccc1)C5=O] | n-type-semi-conductor | Vapor deposition | 8:1.5:05 (volume ratio) |

EXPLANATION OF REFERENCES

10*a*, 10*b*: photoelectric conversion element

11: conductive film (lower electrode)

12: photoelectric conversion film

15: transparent conductive film (upper electrode)

16A: electron blocking film

16B: positive hole blocking film

What is claimed is:

1. A photoelectric conversion element comprising, in the following order:

a conductive film;

a photoelectric conversion film; and a transparent conductive film, wherein the photoelectric conversion film contains a compound represented by Formula (1), (1)

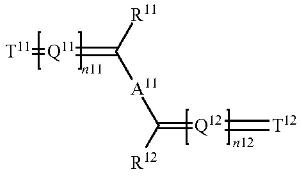

in Formula (1), $A^{11}$ represents a divalent conjugate group having a cyclic structure, $R^{11}$ and $R^{12}$ each independently represent a hydrogen atom or a monovalent substituent, $T^{11}$ and $T^{12}$ each independently represent a group represented by any of Formulae (T1) to (T3), (T1)

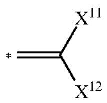

-continued (T2)

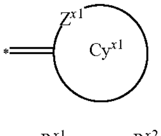

(T3)

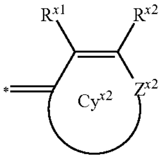

in Formula (T1), $X^{11}$ and $X^{12}$ each independently represent-CN, $—S(=O)_2R^{13}$, $—S(=O)R^{13}$, $—C(=O)R^{14}$, $—C(=O)OR^{14}$, $—C(=S)R^{14}$, $—C(=S)OR^{14}$, $—C(=O)SR_{14}$, $—C(=O)N(R^{15})_2$, $—C(=S)N(R^{15})_2$, or $—S(=O)_2N(R^{15})_2$, $R^{13}$ and $R^{14}$ each independently represent a monovalent substituent, $R^{15}$ represents a hydrogen atom or a monovalent substituent, in Formula (T2) and Formula (T3), $Z^{x1}$ and $Z^{x2}$ each independently represent $>C=O$, $>C=S$, $>C=C(CN)_2$, $>S(=O)_2$, $>S(=O)$, $>C=C[S(=O)_2R^{15}]^2$, $>C=C[S(=O)R^{15}]^2$, $>C=C[C(=O)R^{15}]^2$, $>C=C[CN][S(=O)_2R^{15}]$, $>C=C[CN][S(=O)R^{15}]$, $>C=C[CN][C(=O)R^{15}]$, $>C=C[C(=O)R^{15}][S(=O)_2R^{15}]$, or $>C=C[C(=O)R^{15}][S(=O)R^{15}]$, $R^{15}$ represents a monovalent substituent, in Formula (T2), $Cy^{x1}$ represents a ring containing at least one carbon atom and a ring-constituting atom in $Z^{x1}$, which may have a substituent, in Formula (T3), $Cy^{x2}$ represents a ring containing at least three carbon atoms and a ring-constituting atom in $Z^{x2}$, which may have a substituent, in Formula (T3), $R^{x1}$ and $R^{x2}$ each independently represent a hydrogen atom or a monovalent substituent, in Formulae (T1) to (T3), * represents a bonding position, $Q^{11}$ and $Q^{12}$ each independently represent a quinoid-type conjugate linking group represented by Formula (Q), (Q)

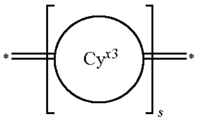

in Formula (Q), $Cy^{x3}$ represents a 5- to 10-membered ring containing at least one or more double bonds, * represents a bonding position, s represents an integer of 1 to 10, where, in a case where s $Cy^{x3}$'s in Formula (Q) are represented as $N_1$ to $N_s$ from one double bond toward the other double bond, Formula (Q) satisfies conditions (A) to (D) as follows:

(A) in a case where s represents 1, $Cy^{x3}$ of $N_1$ forms a quinoid structure together with two double bonds bonded to $Cy^{x3}$ of $N_1$;

(B) in a case where s represents 2, $Cy^{x3}$ of $N_1$ and $Cy^{x3}$ of $N_2$ are fused with each other, $Cy^{x3}$ of $N_1$ forms a quinoid structure together with a double bond bonded to $Cy^{x3}$ of $N_1$ and a double bond contained in $Cy^{x3}$ of $N_2$, and $Cy^{x3}$ of $N_2$ forms a quinoid structure together with a double bond contained in $Cy^{x3}$ of $N_1$ and contributing to the formation of the quinoid structure by $Cy^{x3}$ of $N_1$, and a double bond bonded to $Cy^{x3}$ of $N_2$;

(C) in a case where s represents an integer of 3 or more, $Cy^{x3}$'s of $N_1$ to $N_s$ are fused with each other, $Cy^{x3}$ of $N_1$ forms a quinoid structure together with a double bond bonded to $Cy^{x3}$ of $N_1$ and a double bond contained in $Cy^{x3}$ of $N_2$, in a case where t is an integer of 2 to (s−1), $Cy^{x3}$'s of $N_t$ each form a quinoid structure together with a double bond contained in $Cy^{x3}$ of $N_{t-1}$ and contributing to a formation of a quinoid structure by $Cy^{x3}$ of $N_{t-1}$ and a double bond contained in $Cy^{x3}$ of $N_{t+1}$, and $Cy^{x3}$ of $N_s$ forms a quinoid structure together with a double bond contained in $Cy^{x3}$ of $N_{s-1}$ and contributing to a formation of a quinoid structure by $Cy^{x3}$ of $N_{s-1}$, and a double bond bonded to $Cy^{x3}$ of $N_s$; and (D) Formula (Q) does not contain the following structures,

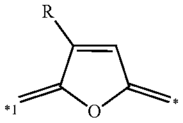

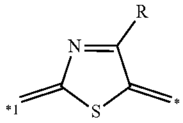

in Formulae, R represents an organic group, *1 represents a bonding position with $T^{11}$ or $T^{12}$, * represents another bonding position, and n11 and n12 each independently represent an integer of 1 or more, where the compound represented by Formula (1) does not contain a carboxy group, a sulfonic acid group, and a phosphoric acid group, and salts thereof.

2. The photoelectric conversion element according to claim 1, wherein $A^{11}$ is a group represented by any of Formula ($A^1$) to Formula ($A^2$), $$*—Ar^{11}—* \quad (A1)$$

in Formula ($A^1$), $Ar^{11}$ represents a divalent monocyclic aromatic ring group, which may have a substituent, a divalent conjugate fused ring group, which may have a substituent, or a divalent conjugate group represented by any of Formulae (a21) to (a24), and * represents a bonding position, $$*—(Ar^{12}\text{-}L^{11})_{m11}\text{-}Ar^{13}—* \quad (A^2)$$

in Formula ($A^2$), $Ar^{12}$ and $Ar^{13}$ each independently represent a divalent monocyclic aromatic ring group, which may have a substituent, a divalent conjugate fused ring group, which may have a substituent, or a divalent conjugate group represented by any of Formulae (a21) to (a24), $L^{11}$ represents a single bond or a divalent conjugate linking group, m11 represents an integer of 1 or more, and * represents a bonding position, (a21)

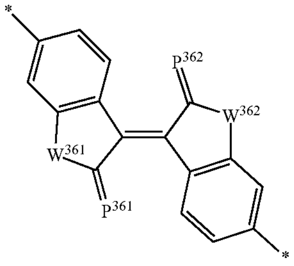

-continued (a22)

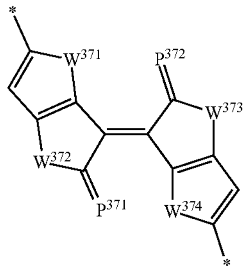

(a23)

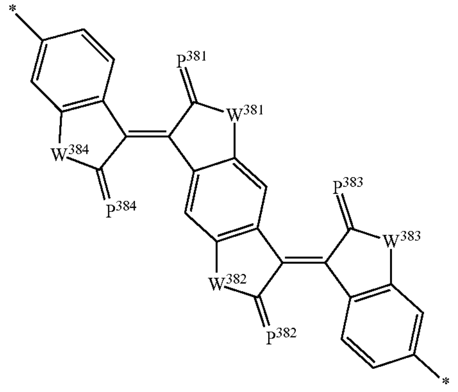

(a24)

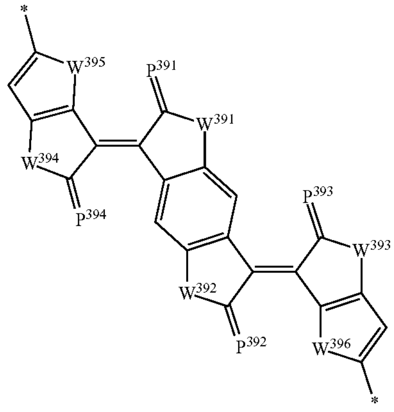

in Formulae (a21) to (a24), $W^{361}$, $W^{362}$, $W^{371}$ to $W^{374}$, $W^{381}$ to $W^{384}$, and $W^{391}$ to $W^{396}$ each independently represent a sulfur atom, an oxygen atom, a selenium atom, or $>NR^U$, $R^U$ represents a hydrogen atom or a monovalent substituent, $P^{361}$, $P^{362}$, $P^{371}$, $P^{372}$, $P^{381}$ to $P^{384}$, and $P^{391}$ to $P^{394}$ each independently represent an oxygen atom, a sulfur atom, $=C(CN)_2$, $=C[S(=O)_2 R^{2U}]$ 2, $=C[S(=O) R^{2U}]_2$, $=C[C(=O) R^{2U}]_2$, $-C[CN][S(=O)_2R^{2U}]$, $-C[CN][S(=O) R^{2U}]$, $=C[CN][C(=O) R^{2U}]$, $-C[C(=O) R^{2U}]$ $[S(=O)_2 R^{2U}]$, or $-C[C(=O) R^{2U}]$ $[S(=O) R^{2U}]$, $R^{2U}$ represents a monovalent substituent, and * represents a bonding position.

3. The photoelectric conversion element according to claim 1, wherein Formula (Q) represents any quinoid-type conjugate linking group selected from the group consisting of Formulae (Q1) to (Q11), (Q1)

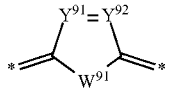

(Q2)

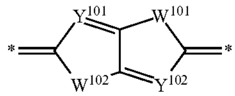

(Q3)

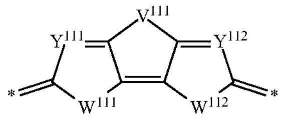

(Q4)

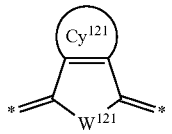

(Q5)

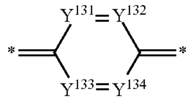

(Q6)

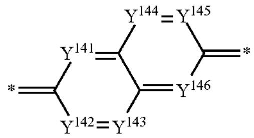

(Q7)

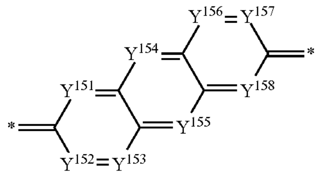

(Q8)

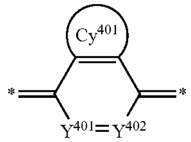

(Q9)

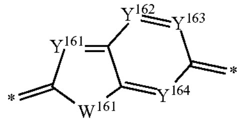

(Q10)

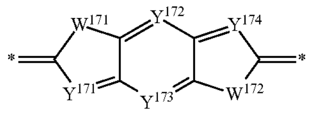

(Q11)

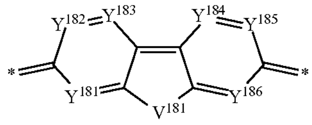

in Formula (Q1), $W^{91}$ represents a sulfur atom, a selenium atom, or $>NR^L$, in Formulae (Q2) to (Q4), (Q9), and (Q10), $W^{101}$, $W^{102}$, $W^{111}$, $W^{112}$, $W^{121}$, $W^{161}$, $W^{171}$, and $W^{172}$ each independently represent a sulfur atom, an oxygen atom, a selenium atom, or $>NR^L$, $R^L$ represents a hydrogen atom or a monovalent substituent, in Formulae (Q1) to (Q3) and Formulae (Q5) to (Q11), $Y^{91}$, $Y^{92}$, $Y^{101}$, $Y^{102}$, $Y^{111}$, $Y^{112}$, $Y^{131}$ to $Y^{134}$, $Y^{141}$ to $Y^{146}$, $Y^{151}$ to $Y^{158}$, $Y^{401}$, $Y^{402}$, $Y^{161}$ to $Y^{164}$, $Y^{171}$ to $Y^{174}$, and $Y^{181}$ to $Y^{186}$ each independently represent $=C(R^M)-$ or a nitrogen atom, $R^M$ represents a hydrogen atom or a monovalent substituent, in Formula (Q4), $Cy^{121}$ represents an aromatic ring containing at least two carbon atoms, which may have a substituent, in Formula (Q8), $Cy^{401}$ represents an aromatic ring containing at least two carbon atoms, which may have a substituent, in Formulae (Q3) and (Q11), $V^{111}$ and $V^{181}$ each independently represent a sulfur atom, an oxygen atom, a selenium atom, $>NR^{2L}$, $>C(R^{2L})_2$, $>Si(R^{2L})_2$, or $>Ge(R^{2L})_2$, $R^{2L}$ represents a hydrogen atom or a monovalent substituent, and in Formulae (Q1) to (Q11), * represents a bonding position, where in Formula (Q1), in a case where $W^{91}$ represents a sulfur atom, one of $Y^{91}$ or $Y^{92}$ represents $=CR^M$, another one represents a nitrogen atom, $R^M$ represents a hydrogen atom.

4. The photoelectric conversion element according to claim 3, wherein $Q^{11}$ and $Q^{12}$ each independently represent a quinoid-type conjugate linking group represented by any of Formulae (Q1) to (Q5).

5. The photoelectric conversion element according to claim 1, wherein $R^{11}$ and $R^{12}$ each independently represent a hydrogen atom or an alkyl group, an aryl group, or a heteroaryl group, which may have a substituent.

6. The photoelectric conversion element according to claim 1, wherein $T^{11}$ and $T^{12}$ each independently represent Formula (T1), and $X^{11}$ and $X^{12}$ each independently represent-CN.

7. The photoelectric conversion element according to claim 1, wherein $T^{11}$ and $T^{12}$ each independently represent a group represented by any of Formula (T21), Formula (T22), and Formula (T25), (T21)

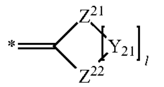

(T22)

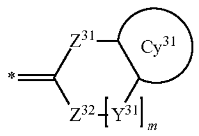

(T25)

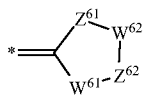

in Formula (T21), Formula (T22), and Formula (T25), $Z^{21}$, $Z^{22}$, $Z^{31}$, $Z^{32}$, $Z^{61}$, and $Z^{62}$ each independently represent $>C=O$, $>C=S$, $>C=C(CN)_2$, $>S(=O)_2$, $>S(=O)$, $>C=C[S(=O)_2R^{15}]^2$, $>C=C[S(=O)\ R^{15}]^2$, $>C=C[C(=O)\ R^{15}]^2$, $>C=C[CN][S(=O)_2R^{15}]$, $>C=C[CN][S(=O)\ R^{15}]$, $>C=C[CN][C(=O)\ R^{15}]$, $>C=C[C(=O)\ R^{15}]\ [S(=O)_2R^{15}]$, or $>C=C[C(=O)\ R^{15}]\ [S(=O)\ R^{15}]$, $R^{15}$ represents a monovalent substituent, in Formula (T21), 1 represents an integer of 0 to 4, in a case where 1 represents an integer of 2 to 4, a plurality of $Y^{21}$'s in Formula (T21) may be the same or different from each other, in Formula (T21), in a case where 1 represents 1, $Y^{21}$ represents $>C(R^{16})_2$, $>C=O$, $>C=S$, an oxygen atom, a sulfur atom, or $>NR^{17}$, in Formula (T21), in a case where 1 represents an integer of 2 to 4, $Y^{21}$ represents $>C(R^{16})_2$, $=C(R^{16})-$, $=N-$, $>C-O$, $>C=S$, an oxygen atom, a sulfur atom, or $>NR^{17}$, $R^{16}$ and $R^{17}$ each independently represent a hydrogen atom or a monovalent substituent, in Formula (T22), m represents an integer of 0 to 2, in a case where m represents 2, a plurality of $Y^{31}$'s in Formula (T22) may be the same or different from each other, in Formula (T22), in a case where m represents 1, $Y^{31}$ represents $>C(R^{16})_2$, $>C=O$, $>C=S$, an oxygen atom, a sulfur atom, or $>NR^{17}$, in Formula (T22), in a case where m represents 2, $Y^{31}$ represents $>C(R^{16})_2$, $-C(R^{16})-$, $=N-$, $>C-O$, $>C=S$, an oxygen atom, a sulfur atom, or $>NR^{17}$, $R^{16}$ and $R^{17}$ each independently represent a hydrogen atom or a monovalent substituent, in Formula (T22), $Cy^{31}$ represents an aromatic ring containing at least two or more carbon atoms, which may have a substituent, in Formula (T25), $W^{61}$ and $W^{62}$ each independently represent $>C(R^{18})_2$, an oxygen atom, a sulfur atom, or $>NR^{19}$, and $R^{18}$ and $R^{19}$ each independently represent a hydrogen atom or a monovalent substituent.

8. The photoelectric conversion element according to claim 1, wherein the photoelectric conversion film satisfies any of A to C, A: the photoelectric conversion film has a bulk heterostructure formed in a state in which two or more compounds represented by Formula (1) are mixed with each other;

B: the photoelectric conversion film has a bulk heterostructure formed in a state in which the compound represented by Formula (1) and a p-type organic semiconductor are mixed with each other; and C: the photoelectric conversion film has a bulk heterostructure formed in a state in which the compound represented by Formula (1) and a n-type semiconductor are mixed with each other.

9. The photoelectric conversion element according to claim 1, further comprising one or more interlayers between the conductive film and the transparent conductive film, in addition to the photoelectric conversion film.

10. An imaging element comprising the photoelectric conversion element according to claim 1.

11. An optical sensor comprising the photoelectric conversion element according to claim 1.

12. A compound represented by Formula (1), (1)

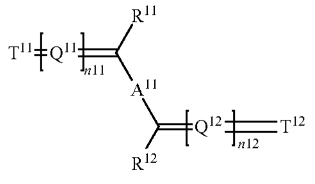

in Formula (1), $A^{11}$ represents a divalent conjugate group having a cyclic structure, $R^{11}$ and $R^{12}$ each independently represent a hydrogen atom or a monovalent substituent, $T^{11}$ and $T^{12}$ each independently represent a group represented by any of Formulae (T1) to (T3), (T1)

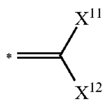

(T2)

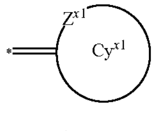

(T3)

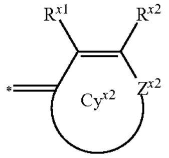

in Formula (T1), $X^{11}$ and $X^{12}$ each independently represent-CN, $—S(═O)_2R^{13}$, $—S(═O) R^{13}$, $—C(═O) R^{14}$, $—C(═O) OR^{14}$, $—C(═S) R^{14}$, $—C(═S) OR^{14}$, $—C(═O) SR_{14}$, $—C(═O) N(R^{15})_2$, $—C(═S) N(R^{15})_2$, or $—S(═O)_2N(R^{15})_2$, $R^{13}$ and $R^{14}$ each independently represent a monovalent substituent, $R^{15}$ represents a hydrogen atom or a monovalent substituent, in Formula (T2) and Formula (T3), $Z^{x1}$ and $Z^{x2}$ each independently represent $>C═O$, $>C═S$, $>C═C(CN)_2$, $>S(═O)_2$, $>S(═O)$, $>C═C[S(═O)_2R^{15}]_2$, $>C═C[S(═O) R^{15}]^2$, $>C═C[C(═O) R^{15}]^2$, $>C═C[CN][S(═O)_2R^{15}]$, $>C═C[CN][S(═O) R^{15}]$, $>C═C[CN][C(═O) R^{15}]$, $>C═C[C(═O) R^{15}] [S(═O)_2R^{15}]$, or $>C═C[C(═O) R^{15}] [S(═O) R^{15}]$, $R^{15}$ represents a monovalent substituent, in Formula (T2), $Cy^{x1}$ represents a ring containing at least one carbon atom and a ring-constituting atom in $Z^{x1}$, which may have a substituent, in Formula (T3), $Cy^{x2}$ represents a ring containing at least three carbon atoms and a ring-constituting atom in $Z^{x2}$, which may have a substituent, in Formula (T3), $R^{x1}$ and $R^{x2}$ each independently represent a hydrogen atom or a monovalent substituent, in Formulae (T1) to (T3), * represents a bonding position, $Q^{11}$ and $Q^{12}$ each independently represent a quinoid-type conjugate linking group represented by Formula (Q), (Q)

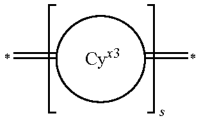

in Formula (Q), $Cy^{x3}$ represents a 5- to 10-membered ring containing at least one or more double bonds, * represents a bonding position, s represents an integer of 1 to 10, where, in a case where s $Cy^{x3}$'s in Formula (Q) are represented as $N_1$ to Ns numbers from one double bond toward the other double bond, Formula (Q) satisfies conditions (A) to (D) as follows:

(A) in a case where s represents 1, $Cy^{x3}$ of $N_1$ forms a quinoid structure together with two double bonds bonded to $Cy^{x3}$ of $N_1$;

(B) in a case where s represents 2, $Cy^{x3}$ of $N_1$ and $Cy^{x3}$ of $N_2$ are fused with each other, $Cy^{x3}$ of $N_1$ forms a quinoid structure together with a double bond bonded to $Cy^{x3}$ of $N_1$ and a double bond contained in $Cy^{x3}$ of $N_2$, $Cy^{x3}$ of $N_2$ forms a quinoid structure together with a double bond contained in $Cy^{x3}$ of $N_1$ and contributing to the formation of the quinoid structure by $Cy^{x3}$ of $N_1$, and a double bond bonded to $Cy^{x3}$ of $N_2$;

(C) in a case where s represents an integer of 3 or more, $Cy^{x3}$'s of $N_1$ to $N_s$ are fused with each other, $Cy^{x3}$ of $N_1$ forms a quinoid structure together with a double bond bonded to $Cy^{x3}$ of $N_1$ and a double bond contained in $Cy^{x3}$ of $N_2$, in a case where t is an integer of 2 to (s−1), $Cy^{x3}$'s of $N_t$ each form a quinoid structure together with a double bond contained in $Cy^{x3}$ of $N_{t-1}$ and contributing to a formation of a quinoid structure by $Cy^{x3}$ of $N_{t-1}$ and a double bond contained in $Cy^{x3}$ of $N_{t+1}$, and $Cy^{x3}$ of $N_s$ forms a quinoid structure together with a double bond contained in $Cy^{x3}$ of $N_{s-1}$ and contributing to a formation of a quinoid structure by $Cy^{x3}$ of $N_{s-1}$, and a double bond bonded to $Cy^{x3}$ of $N_s$; and (D) Formula (Q) does not contain the following structures,

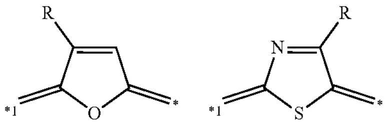

in Formulae, R represents an organic group, *1 represents a bonding position with $T^{11}$ or $T^{12}$, * Represents another bonding position, n11 and n12 each independently represent an integer of 1 or more, and where the compound represented by Formula (1) does not contain a carboxy group, a sulfonic acid group, and a phosphoric acid group, and salts thereof.

13. The compound according to claim 12, wherein $A^{11}$ is a group represented by any of Formula ($A^1$) to Formula ($A^2$), $$*—Ar^{11}—* \quad (A1)$$

in Formula (A1), $Ar^{11}$ represents a divalent monocyclic aromatic ring group, which may have a substituent, a divalent conjugate fused ring group, which may have a substituent, or a divalent conjugate group represented by any of Formulae (a21) to (a24), and * represents a bonding position, $$*\text{-}(Ar^{12}\text{-}L^{11})_{m11}\text{-}Ar^{13}\text{—}* \quad \text{(A2)}$$

in Formula (A2), $Ar^{12}$ and $Ar^{13}$ each independently represent a divalent monocyclic aromatic ring group, which may have a substituent, a divalent conjugate fused ring group, which may have a substituent, or a divalent conjugate group represented by any of Formulae (a21) to (a24), $L^{11}$ represents a single bond or a divalent conjugate linking group, m11 represents an integer of 1 or more, and * represents a bonding position, (a21)

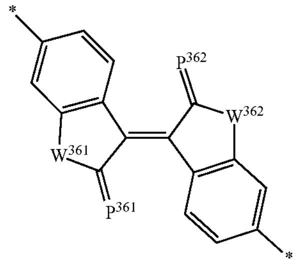

(a22)

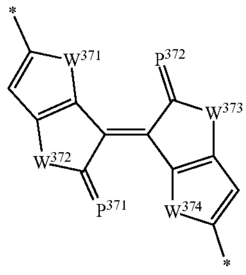

(a23)

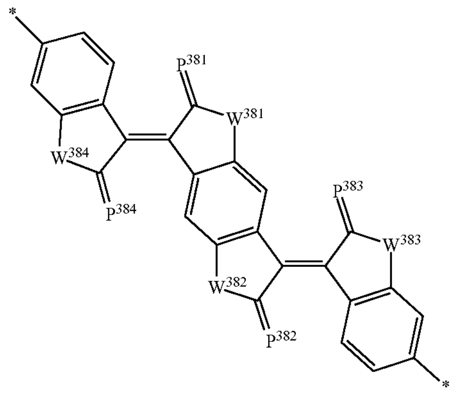

-continued (a24)

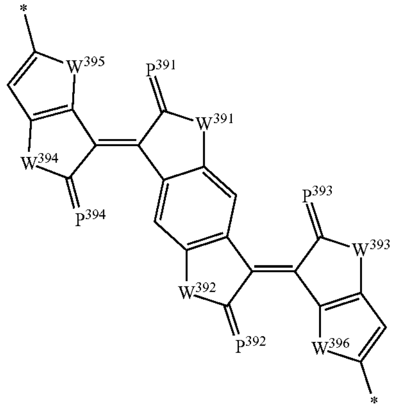

in Formulae (a21) to (a24), $W^{361}$, $W^{362}$, $W^{371}$ to $W^{374}$, $W^{381}$ to $W^{384}$, and $W^{391}$ to $W^{396}$ each independently represent a sulfur atom, an oxygen atom, a selenium atom, or $>NR^U$, $R^U$ represents a hydrogen atom or a monovalent substituent, $P^{361}$, $P^{362}$, $P^{371}$, $P^{372}$, $P^{381}$ to $P^{384}$, and $P^{391}$ to $P^{394}$ each independently represent an oxygen atom, a sulfur atom, $=C(CN)_2$, $=C[S(=O)_2 R^{2U}]_2$, $=C[S(=O) R^{2U}]_2$, $=C[C(=O) R^{2U}]_2$, $=C[CN][S(=O)_2R^{2U}]$, $=C[CN][S(=O) R^{2U}]$, $=C[CN][C(=O) R^{2U}]$, $=C[C(=O) R^{2U}] [S(=O)_2 R^{2U}]$, or $=C[C(=O) R^{2U}] [S(=O) R^{2U}]$, $R^{2U}$ represents a monovalent substituent, and * represents a bonding position.

14. The compound according to claim 12, wherein Formula (Q) represents any quinoid-type conjugate linking group selected from the group consisting of Formulae (Q1) to (Q11), (Q1)

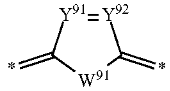

(Q2)

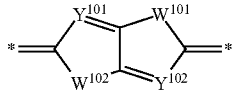

(Q3)

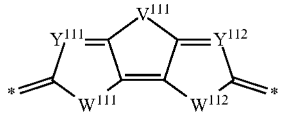

(Q4)

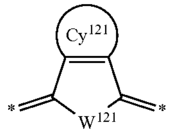

(Q5)

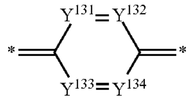

-continued (Q6)

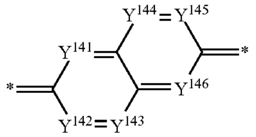

(Q7)

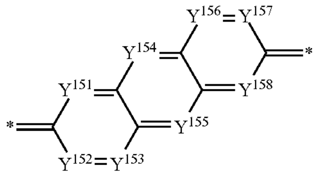

(Q8)

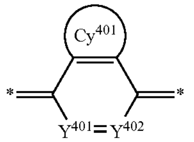

(Q9)

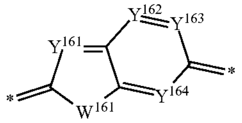

(Q10)

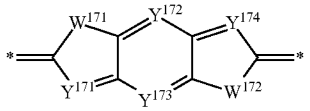

(Q11)

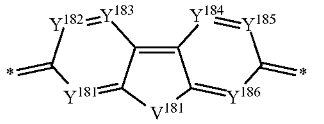

in Formula ($Q^1$), $W^{91}$ represents a sulfur atom, a selenium atom, or $>NR^L$, in Formulae ($Q^2$) to ($Q^4$), ($Q^9$), and ($Q^{10}$), $W^{101}$, $W^{102}$, $W^{111}$, $W^{112}$, $W^{121}$, $W^{161}$, $W^{171}$, and $W^{172}$ each independently represent a sulfur atom, an oxygen atom, a selenium atom, or $>NR^L$, $R^L$ represents a hydrogen atom or a monovalent substituent, in Formulae (Q1) to (Q3) and Formulae (Q5) to (Q11), $Y^{91}$, $Y^{92}$, $Y^{101}$, $Y^{102}$, $Y^{111}$, $Y^{112}$, $Y^{131}$ to $Y^{134}$, $Y^{141}$ to $Y^{146}$, $Y^{151}$ to $Y^{158}$, $Y^{401}$, $Y^{402}$, $Y^{161}$ to $Y^{164}$, $Y^{171}$ to $Y^{174}$, and $Y^{181}$ to $Y^{186}$ each independently represent $=C(R^M)$— or a nitrogen atom, $R^M$ represents a hydrogen atom or a monovalent substituent, in Formula (Q4), $Cy^{121}$ represents an aromatic ring containing at least two carbon atoms, which may have a substituent, in Formula (Q8), $Cy^{401}$ represents an aromatic ring containing at least two carbon atoms, which may have a substituent, in Formulae (Q3) and (Q11), $V^{111}$ and $V^{181}$ each independently represent a sulfur atom, an oxygen atom, a selenium atom, $>NR^{2L}$, $>C(R^{2L})_2$, $>Si(R^{2L})_2$, or $>Ge(R^{2L})_2$, $R^{2L}$ represents a hydrogen atom or a monovalent substituent, and in Formulae (Q1) to (Q11), * represents a bonding position, where in Formula (Q1), in a case where $W^{91}$ represents a sulfur atom, one of $Y^{91}$ or $Y^{92}$ represents $=CR^M$, another one represents a nitrogen atom, $R^M$ represents a hydrogen atom.

15. The compound according to claim 14, wherein $Q^{11}$ and $Q^{12}$ each independently represent a quinoid-type conjugate linking group represented by any of Formulae (Q1) to (Q5).

16. The compound according to claim 12, wherein $R^{11}$ and $R^{12}$ each independently represent a hydrogen atom or an alkyl group, an aryl group, or a heteroaryl group, which may have a substituent.

17. The compound according to claim 12, wherein $T^{11}$ and $T^{12}$ each independently represent Formula (T1), and $X^{11}$ and $X^{12}$ each independently represent-CN.

18. The compound according to claim 12, wherein $T^{11}$ and $T^{12}$ each independently represent a group represented by any of Formula (T21), Formula (T22), and Formula (T25), (T21)

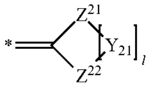

(T22)

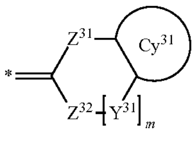

(T25)

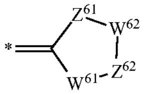

in Formula (T21), Formula (T22), and Formula (T25), $Z^{21}$, $Z^{22}$, $Z^{31}$, $Z^{32}$, $Z^{61}$, and $Z^{62}$ each independently represent $>C{-}O$, $>C{=}S$, $>C{=}C(CN)_2$, $>S({=}O)_2$, $>S({=}O)$, $>C{=}C[S({=}O)_2R^{15}]^2$, $>C{=}C[S({=}O)R^{15}]_2$, $>C{=}C[C({=}O)R^{15}]_2$, $>C{=}C[CN][S({=}O)_2R^{15}]$, $>C{=}C[CN][S({=}O)R^{15}]$, $>C{=}C[CN][C({=}O)R^{15}]$, $>C{=}C[C({=}O)R^{15}][S({=}O)_2R^{15}]$, or $>C{=}C[C({=}O)R^{15}][S({=}O)R^{15}]$, $R^{15}$ represents a monovalent substituent, in Formula (T21), 1 represents an integer of 0 to 4, in a case where l represents an integer of 2 to 4, a plurality of $Y^{21}$'s in Formula (T21) may be the same or different from each other, in Formula (T21), in a case where 1 represents 1, $Y^{21}$ represents $>C(R^{16})_2$, $>C{=}O$, $>C{=}S$, an oxygen atom, a sulfur atom, or $>NR^{17}$, in Formula (T21), in a case where l represents an integer of 2 to 4, $Y^{21}$ represents $>C(R^{16})_2$, $-C(R^{16})-$, $=N-$, $>C{=}O$, $>C{=}S$, an oxygen atom, a sulfur atom, or $>NR^{17}$, $R^{16}$ and $R^{17}$ each independently represent a hydrogen atom or a monovalent substituent, in Formula (T22), m represents an integer of 0 to 2, in a case where m represents 2, a plurality of $Y^{31}$'s in Formula (T22) may be the same or different from each other, in Formula (T22), in a case where m represents 1, $Y^{31}$ represents $>C(R^{16})_2$, $>C{=}O$, $>C{=}S$, an oxygen atom, a sulfur atom, or $>NR^{17}$, in Formula (T22), in a case where m represents 2, $Y^{31}$ represents $>C(R^{16})_2$, $=C(R^{16})-$, $=N-$, $>C{=}O$, $>C{=}S$, an oxygen atom, a sulfur atom, or $>NR^{17}$, $R^{16}$ and $R^{17}$ each independently represent a hydrogen atom or a monovalent substituent, in Formula (T22), $Cy^{31}$ represents an aromatic ring containing at least two or more carbon atoms, which may have a substituent, in Formula (T25), $W^{61}$ and $W^{62}$ each independently represent $>C(R^{18})_2$, an oxygen atom, a sulfur atom, or $>NR^{19}$, and $R^{18}$ and $R^{19}$ each independently represent a hydrogen atom or a monovalent substituent.

* * * * *